US012559671B2

(12) United States Patent
Shin et al.

(10) Patent No.: US 12,559,671 B2
(45) Date of Patent: Feb. 24, 2026

(54) LIGHT-EMITTING DEVICE

(71) Applicant: Samsung Display Co., Ltd., Yongin-si (KR)

(72) Inventors: Sujin Shin, Yongin-si (KR); Soobyung Ko, Yongin-si (KR); Haejin Kim, Yongin-si (KR); Eunsoo Ahn, Yongin-si (KR); Jaesung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1117 days.

(21) Appl. No.: 17/477,903

(22) Filed: Sep. 17, 2021

(65) Prior Publication Data

US 2022/0310942 A1 Sep. 29, 2022

(30) Foreign Application Priority Data

Mar. 17, 2021 (KR) ........................ 10-2021-0034858

(51) Int. Cl.

| | |
|---|---|
| ***H01L 51/00*** | (2006.01) |
| ***C07F 15/00*** | (2006.01) |
| ***C09K 11/06*** | (2006.01) |
| ***H10K 85/30*** | (2023.01) |
| *H10K 50/11* | (2023.01) |
| *H10K 59/123* | (2023.01) |

(Continued)

(52) U.S. Cl.

CPC .......... *C09K 11/06* (2013.01); *C07F 15/0086* (2013.01); *H10K 85/346* (2023.02); *C07B 2200/05* (2013.01); *C09K 2211/1059* (2013.01); *C09K 2211/1074* (2013.01); *C09K 2211/185* (2013.01); *H10K 50/11* (2023.02); *H10K 59/123* (2023.02); *H10K 85/658* (2023.02); *H10K 2101/10* (2023.02); *H10K 2101/90* (2023.02)

(58) Field of Classification Search

CPC .............. H10K 85/346; H10K 2101/10; C07F 15/0086; C09K 2211/1074

See application file for complete search history.

(56) References Cited

U.S. PATENT DOCUMENTS

| | | | |
|---|---|---|---|
| 7,381,479 | B2 | 6/2008 | Lamansky et al. |
| 7,393,599 | B2 | 7/2008 | Thompson et al. |

(Continued)

FOREIGN PATENT DOCUMENTS

| | | |
|---|---|---|
| CN | 104370974 | 2/2015 |
| JP | 2007-45742 | 2/2007 |

(Continued)

*Primary Examiner* — Michael M Dollinger

(74) *Attorney, Agent, or Firm* — Lerner David LLP

(57) ABSTRACT

Provided are an organometallic compound, a light-emitting device including the organometallic compound, and an electronic apparatus including the light-emitting device. The light-emitting device includes a first electrode, a second electrode facing the first electrode, and an interlayer disposed between the first electrode and the second electrode. The interlayer includes an emission layer. The emission layer includes a first compound which is the organometallic compound; and a second compound, a third compound, a fourth compound, or any combination thereof. The first compound, the second compound, the third compound, and the fourth compound are different from one another.

16 Claims, 2 Drawing Sheets

(51) Int. Cl.

| | |
|---|---|
| *H10K 85/60* | (2023.01) |
| *H10K 101/00* | (2023.01) |
| *H10K 101/10* | (2023.01) |

(56) References Cited

U.S. PATENT DOCUMENTS

| | | | | |
|---|---|---|---|---|
| 7,585,573 | B2 | 9/2009 | Lee et al. | |
| 7,776,458 | B2 | 8/2010 | Ragini et al. | |
| 8,106,199 | B2 | 1/2012 | Jabbour et al. | |
| 8,389,725 | B2 | 3/2013 | Li et al. | |
| 8,669,364 | B2 | 3/2014 | Li et al. | |
| 8,680,760 | B2 | 3/2014 | Cheng et al. | |
| 8,816,080 | B2 | 8/2014 | Li et al. | |
| 8,846,940 | B2 | 9/2014 | Li et al. | |
| 8,946,417 | B2 | 2/2015 | Jian et al. | |
| 9,051,344 | B2 | 6/2015 | Lin et al. | |
| 9,076,974 | B2 | 7/2015 | Li et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,238,668 | B2 | 1/2016 | Li et al. | |
| 9,312,502 | B2 | 4/2016 | Li et al. | |
| 9,324,957 | B2 | 4/2016 | Li et al. | |
| 9,382,273 | B2 | 7/2016 | Li et al. | |
| 9,425,415 | B2 | 8/2016 | Li et al. | |
| 9,698,359 | B2 | 7/2017 | Li et al. | |
| 9,711,739 | B2 | 7/2017 | Li | |
| 9,899,614 | B2 | 2/2018 | Li et al. | |
| 10,374,166 | B2 | 8/2019 | Hatakeyama et al. | |
| 11,758,804 | B2 | 9/2023 | Chen et al. | |
| 2005/0287394 | A1 | 12/2005 | Yang et al. | |
| 2008/0018221 | A1 | 1/2008 | Egen et al. | |
| 2012/0215001 | A1 | 8/2012 | Li et al. | |
| 2012/0302753 | A1* | 11/2012 | Li ........................ | H10K 85/346<br>546/4 |
| 2014/0309428 | A1 | 10/2014 | Egen et al. | |
| 2016/0028029 | A1 | 1/2016 | Li et al. | |
| 2018/0212165 | A1 | 7/2018 | Ji | |
| 2018/0337349 | A1* | 11/2018 | Li ........................ | H10K 85/341 |
| 2018/0337361 | A1* | 11/2018 | Lee ...................... | H10K 85/631 |
| 2019/0119312 | A1 | 4/2019 | Chen et al. | |
| 2021/0050530 | A1 | 2/2021 | Wu et al. | |

FOREIGN PATENT DOCUMENTS

| | | | |
|---|---|---|---|
| KR | 10-0730115 | 6/2007 | |
| KR | 10-2017-0122296 | 11/2017 | |
| KR | 10-2019-0000830 | 1/2019 | |
| WO | WO-0070655 A2 * | 11/2000 | ............. C09K 11/06 |
| WO | 2012/121936 | 9/2012 | |

* cited by examiner

LIGHT-EMITTING DEVICE

CROSS-REFERENCE TO RELATED APPLICATION(S)

This application claims priority to and benefits of Korean Patent Application No. 10-2021-0034858 under 35 U.S.C. § 119, filed on Mar. 17, 2021 in the Korean Intellectual Property Office, the entire contents of which are incorporated herein by reference.

BACKGROUND

1. Technical Field

Embodiments relate to a light-emitting device.

2. Description of the Related Art

Organic light-emitting devices (OLEDs) are self-emissive devices that have wide viewing angles, high contrast ratios, short response times, and excellent characteristics in terms of luminance, driving voltage, and response speed, compared to devices in the art.

Organic light-emitting devices may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided are a novel organometallic compound and a light-emitting device including the novel organometallic compound.

Additional aspects will be set forth in part in the description, which follows and, in part, will be apparent from the description, or may be learned by practice of the embodiments of the disclosure.

According to an embodiment, provided is a light-emitting device which may include a first electrode, a second electrode facing the first electrode, and an interlayer disposed between the first electrode and the second electrode, wherein the interlayer may include an emission layer, the emission layer may include a first compound which may be an organometallic compound represented by Formula 1, and a second compound which may include at least one π electron-deficient nitrogen-containing $C_1$-$C_{60}$ cyclic group, a third compound which may be represented by Formula 11, a fourth compound which may be capable of emitting delayed fluorescence, or any combination thereof, and the first compound, the second compound, the third compound, and the fourth compound may be different from one another.

[Formula 1]

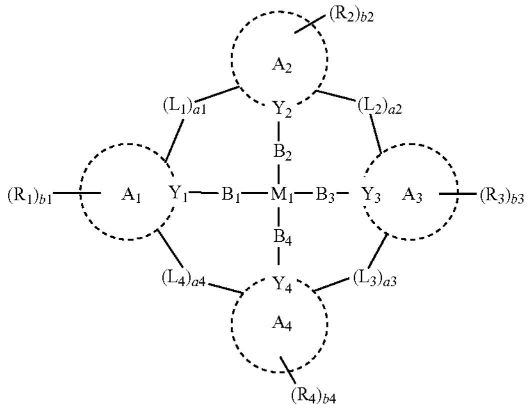

In Formula 1, $M_1$ may be a transition metal, ring $A_1$ to ring $A_4$ may each independently be a $C_5$-$C_{60}$ carbocyclic group or a $C_1$-$C_{60}$ heterocyclic group, $L_1$ and $L_2$ may each independently be a single bond, *—O—*', *—S—*', *—C($R_5$)($R_6$)—*', *—C($R_5$)=*', *=C($R_5$)—*', *—C($R_5$)=C($R_6$)—*', *—C(=O)—*', *—C(=S)—*', *—C≡C—*', *—B($R_5$)—*', *—N($R_5$)—*', *—P($R_5$)—*', *—Si($R_5$)($R_6$)—*', *—P($R_5$)($R_6$)—*', or *—Ge($R_5$)($R_6$)—*', $L_3$ may be *—N($R_7$)—*', and $L_4$ may be *—N($R_8$)—*, a1 and a2 may each independently be 0, 1, 2, or 3, and one of a1 and a2 may be 0, wherein, when a1 is 0, ring $A_1$ and ring $A_2$ may not be linked to each other, and when a2 is 0, ring $A_2$ and ring $A_3$ may not be linked to each other, a3 and a4 may each independently be 1, 2, or 3, $Y_1$ to $Y_3$ may each independently be a carbon atom (C) or a nitrogen atom (N), $Y_4$ may be a nitrogen atom (N), $B_1$ to $B_4$ may each independently be a chemical bond, *—O—*', or *—S—*', $R_1$ to $R_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —C(=O)($Q_1$), —S(=O)($Q_1$), —S(=O)$_2$($Q_1$), —P(=O)(Q)($Q_2$), or —P(=S)($Q_1$)($Q_2$), two neighboring substituents among $R_1$ to $R_8$ may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b4 may each independently be an integer from 1 to 5, and

* and *' each indicate a binding site to a neighboring atom.

[Formula 11]

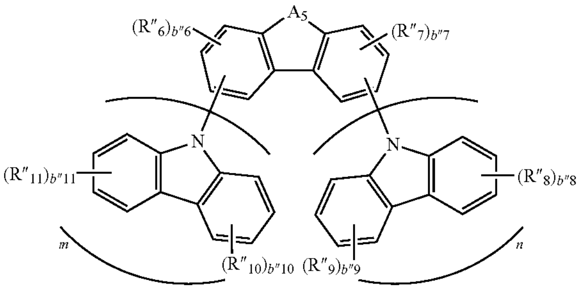

In Formula 11, $A_5$ may be O, S, N(R"$_{12}$), or C(R"$_{13}$)(R"$_{14}$), m and n may each independently be an integer from 0 to 4, R"$_6$ to R"$_{14}$ may each independently be the same as described in connection with $R_1$ in Formula 1, and b"6 to b"11 may each independently be an integer from 0 to 4, and $R_{10a}$ may be:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —C(=O)($Q_{21}$), —S(=O)$_2$($Q_{21}$), —P(=O)($Q_{21}$)($Q_{22}$), or any combination thereof, or —$Si(Q_{31})(Q_{32})(Q_{33})$, —$N(Q_{31})(Q_{32})$, —$B(Q_{31})(Q_{32})$, —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $M_1$ may be platinum (Pt), palladium (Pd), nickel (Ni), copper (Cu), zinc (Zn), silver (Ag), gold (Au), rhodium (Rh), iridium (Ir), ruthenium (Ru), rhenium (Re), osmium (Os), titanium (Ti), zirconium (Zr), hafnium (Hf), europium (Eu), terbium (Tb), or thulium (Tm).

In an embodiment, ring $A_1$ to ring $A_3$ may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, ring $A_4$ may be an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, or a quinazoline group.

In an embodiment, ring $A_4$ may be an indenopyridine group, an indolopyridine group, a benzofuropyridine group, a benzothienopyridine group, a benzosilolopyridine group, a dihydropyridine group, or a pyridine group, and ring $A_1$ to ring $A_3$ may each independently be a group represented by one of Formulae 2-1(1) to 2-1(35) and 2-2(1) to 2-2(25), which are explained below.

In an embodiment, a1 in Formula 1 may be 0, ring $A_4$ may be a group represented by one of Formulae 2-2(1) to 2-2(9), which are explained below, and $R_7$ and $R_8$ may each independently be a $C_6$-$C_{60}$ aryl group unsubstituted or substituted with at least one $R_{10a}$.

In an embodiment, the organometallic compound represented by Formula 1 may be represented by Formula 2, which is explained below.

In an embodiment, ring $A_1$ to ring $A_3$ in Formula 2 may each independently be a group represented by one of Formulae 2-1(1) to 2-1(35) and 2-2(1) to 2-2(25), which are explained below.

In an embodiment, the first compound represented by Formula 1 may be one selected from Compounds BD1 to BD91, which are explained below.

In an embodiment, the first electrode may be an anode, the second electrode may be a cathode, and the interlayer may further include a hole transport region disposed between the first electrode and the emission layer and including a hole injection layer, a hole transport layer, an emission auxiliary layer, an electron blocking layer, or any combination thereof, and/or an electron transport region disposed between the second electrode and the emission layer and including a hole blocking layer, an electron transport layer, an electron injection layer, or any combination thereof.

In an embodiment, the emission layer may include the fourth compound, and a weight ratio of the first compound to the fourth compound may be in a range of about 10:0.1 to about 10:1.0.

In an embodiment, the second compound may include a compound represented by Formula 10, which is explained below.

In an embodiment, the second compound represented by Formula 10 may be one selected from Compounds ETH1 to ETH84, which are explained below.

In an embodiment, the emission layer may include the second compound and the third compound, and a weight ratio of the second compound to the third compound may be in a range of about 3:7 to about 7:3.

In an embodiment, the third compound represented by Formula 11 may be one selected from Compounds HTH1 to HTH52, which are explained below.

In an embodiment, the fourth compound may be represented by Formula 12, which is explained below.

In an embodiment, the fourth compound represented by Formula 12 may be one selected from Compounds DFD1 to DFD12, which are explained below.

According to another aspect, provided is an electronic apparatus which may include the light-emitting device.

In an embodiment, the electronic apparatus may further include a thin film transistor. The thin-film transistor may include a source electrode and a drain electrode, and the first electrode of the light-emitting device may be electrically connected to at least one of the source electrode and the drain electrode of the thin-film transistor.

According to another aspect, provided is an organometallic compound which may be represented by Formula 1.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
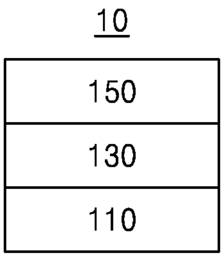
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A transition metal complex containing a phenylpyridine ligand in the central portion thereof as a blue phosphorescent light-emitting material and an organic light-emitting device using the same as a dopant exists in the related art, but luminescence efficiency and luminance thereof may not be sufficient. Although an organic light-emitting device using a homologous ligand-substituted transition metal complex containing a phenylimidazole ligand and an organic light-emitting device using a heterogeneous transition metal complex including imidazole carbine as a ligand exists in the related art, since blue color purity thereof is low, there is difficulty in implementing a deep blue color, and thus in implementing a full-color display of natural colors.

A heterogeneous transition metal complex containing an imidazole carbine ligand and a phenylpyridine ligand has been applied as a light-emitting material for an organic light-emitting device, but there is difficulty in implementing colors of a deep blue light-emitting device and in securing device characteristics.

Although various 4-coordinated organometallic complexes have been developed as a blue phosphor in recent years, color purity thereof may be low, or a device lifespan thereof may be short.

The related art in which a platinum-based organometallic complex incorporating a tridentate ligand as a blue or green phosphorescent dopant is used as a blue or green phosphorescent light-emitting material may lead to relatively low structural stability, compared to a case in which a complex incorporating a tetradentate ligand is used. The lifespan and efficiency of a light-emitting material may be reduced due to vibration in molecules.

According to an embodiment, a light-emitting device may include a first electrode, a second electrode facing the first electrode, and an interlayer disposed between the first electrode and the second electrode. The interlayer may include an emission layer. The emission layer may include: a first compound which is an organometallic compound represented by Formula 1; and a second compound which may include at least one 7 electron-deficient nitrogen-containing $C_1$-$C_{60}$ cyclic group, a third compound which may be represented by Formula 11, a fourth compound which may be capable of emitting delayed fluorescence, or any combination thereof.

The first compound, the second compound, the third compound, and the fourth compound may be different from one another:

[Formula 1]

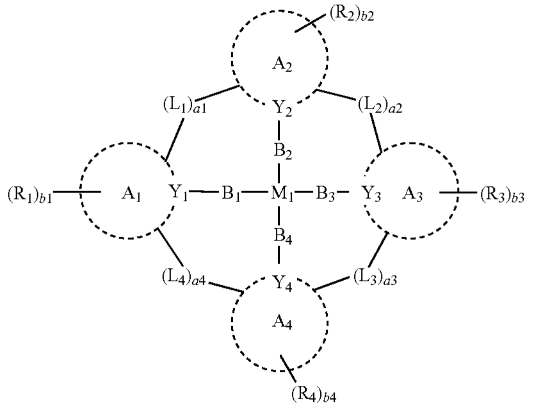

In Formula 1, $M_1$ may be a transition metal, ring $A_1$ to ring $A_4$ may each independently be a $C_5$-$C_{60}$ carbocyclic group or a $C_1$-$C_{60}$ heterocyclic group, $L_1$ and $L_2$ may each independently be a single bond, *—O—*', *—S—*', *—C($R_5$)($R_6$)—*', *—C($R_5$)=*', *=C($R_5$)—*', *—C($R_5$)=C($R_6$)—*', *—C(=O)—*', *—C(=S)—*', *—C≡C—*', *—B($R_5$)—*', *—N($R_5$)—*', *—P($R_5$)—*', *—Si($R_5$)($R_6$)—*', *—P($R_5$)($R_6$)—*', or *—Ge($R_5$)($R_6$)—*', $L_3$ may be *—N($R_7$)—*', and $L_4$ may be *—N($R_8$)—*, a1 and a2 may each independently be 0, 1, 2, or 3, and one of a1 and a2 may be 0, wherein, when a1 is 0, ring $A_1$ and ring $A_2$ may not be linked to each other, and when a2 is 0, ring $A_2$ and ring $A_3$ may not be linked to each other, a3 and a4 may each independently be 1, 2, or 3, $Y_1$ to $Y_3$ may each independently be a carbon atom (C) or a nitrogen atom (N), $Y_4$ may be a nitrogen atom (N), $B_1$ to $B_4$ may each independently be a chemical bond, *—O—*', or *—S—*', $R_1$ to $R_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), two neighboring substituents among $R_1$ to $R_8$ may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b4 may each independently be an integer from 1 to 5,

* and *' each indicate a binding site to a neighboring atom.

[Formula 11]

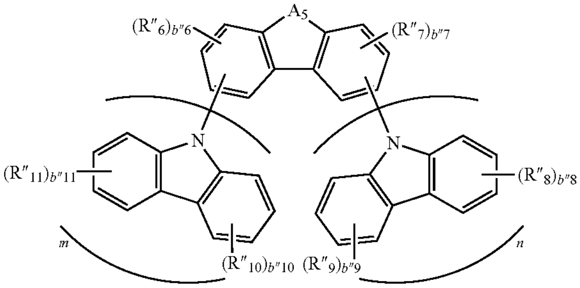

In Formula 11, $A_5$ may be O, S, N(R"$_{12}$), or C(R"$_{13}$)(R"$_{14}$), m and n may each independently be an integer from 0 to 4, R"$_6$ to R"$_{14}$ are each independently the same as described in connection with $R_1$ in Formula 1, b"6 to b"11 may each independently be an integer from 0 to 4, and $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The expression "two neighboring substituents among $R_1$ to $R_8$ may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$" will be described in detail.

When one of two neighboring substituents is hydrogen (or deuterium), a moiety linked to hydrogen and the other neighboring substituent that is not hydrogen may be fused.

In an embodiment, when neighboring $R_3$ and $R_5$ are linked and $R_3$ is hydrogen, $R_5$ and $A_3$ linked to $R_3$ may be fused to form a $C_5$-$C_{60}$ carbocyclic group or a $C_1$-$C_{60}$ heterocyclic group.

In an embodiment, $M_1$ may be platinum (Pt), palladium (Pd), nickel (Ni), copper (Cu), zinc (Zn), silver (Ag), gold (Au), rhodium (Rh), iridium (Ir), ruthenium (Ru), rhenium (Re), osmium (Os), titanium (Ti), zirconium (Zr), hafnium (Hf), europium (Eu), terbium (Tb), or thulium (Tm). In an embodiment, $M_1$ may be platinum (Pt), palladium (Pd), nickel (Ni), copper (Cu), silver (Ag), or gold (Au).

In an embodiment, ring $A_1$ to ring $A_3$ may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, ring $A_4$, as a moiety including N, may be, for example, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, or a quinazoline group.

In an embodiment, ring $A_4$ in Formula 1 may be an indenopyridine group, an indolopyridine group, a benzofuropyridine group, a benzothienopyridine group, a benzosilolopyridine group, a dihydropyridine group, or a pyridine group, and ring $A_1$ to ring $A_3$ may each independently be a group represented by one of Formulae 2-1(1) to 2-1(35) and 2-2(1) to 2-2(25):

2-1(1)

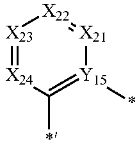

2-1(2)

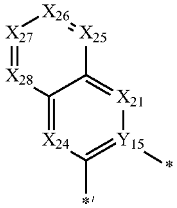

2-1(3)

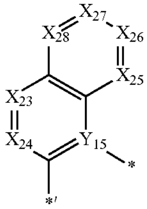

2-1(4)

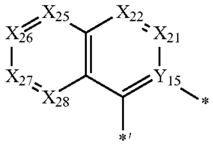

2-1(5)

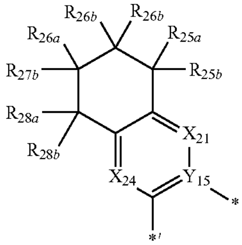

-continued 2-1(6)

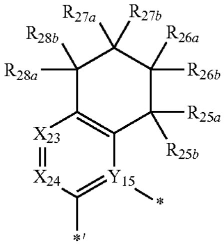

2-1(7)

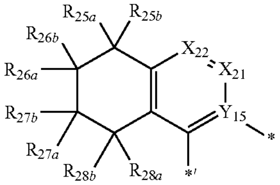

2-1(8)

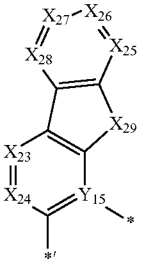

2-1(9)

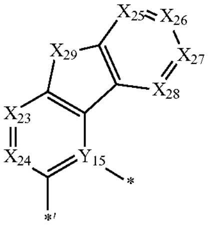

2-1(10)

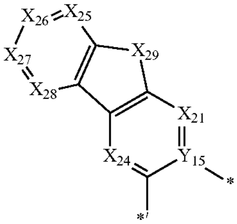

2-1(11)

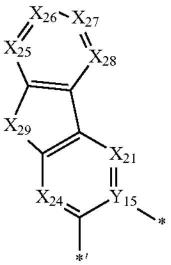

2-1(12)

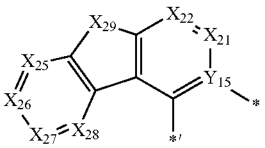

-continued
2-1(13)
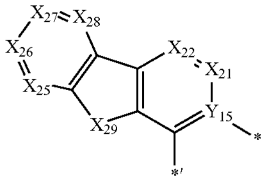
2-(1)14
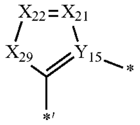
2-1(15)
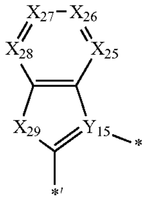
2-1(16)
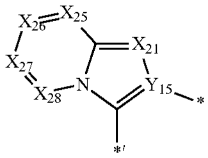
2-1(17)
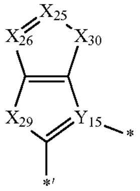
2-1(18)
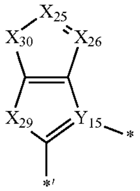
2-1(19)
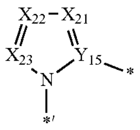
2-1(20)
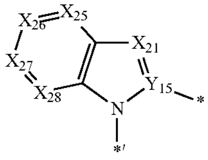
2-1(21)
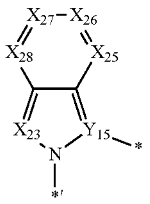
-continued
2-1(22)
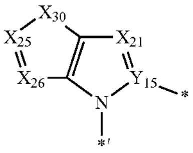
2-1(23)
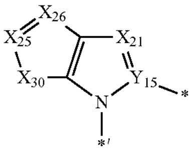
2-1(24)
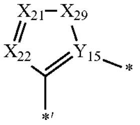
2-1(25)
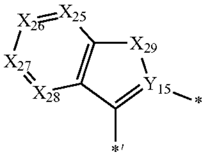
2-1(26)
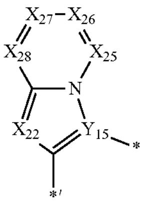
2-1(27)
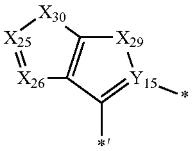
2-1(28)
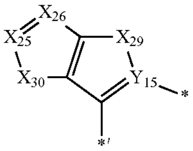
2-1(29)
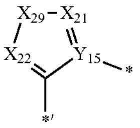
2-1(30)
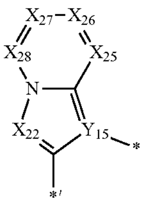

-continued
2-1(31)
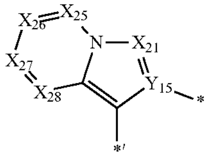
2-1(32)
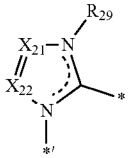
2-1(33)
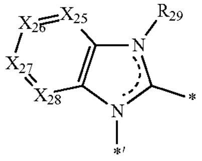
2-1(34)
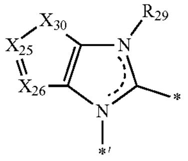
2-1(35)
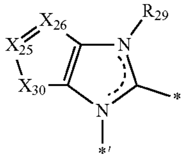
2-2(1)
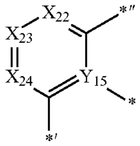
2-2(2)
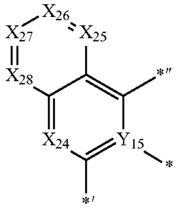
2-2(3)
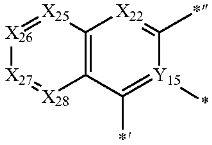
2-2(4)
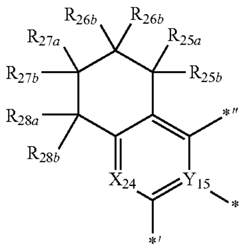
-continued
2-2(5)
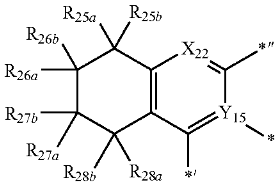
2-2(6)
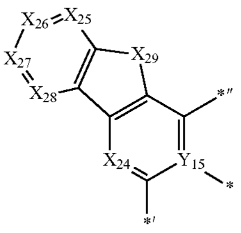
2-2(7)
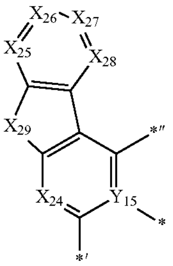
2-2(8)
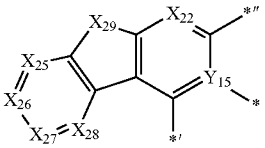
2-2(9)
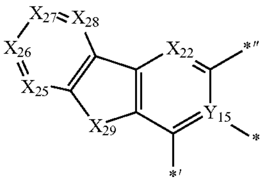
2-2(10)
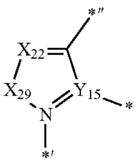
2-2(11)
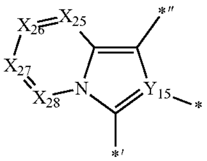
2-2(12)
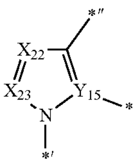

-continued 2-2(13)

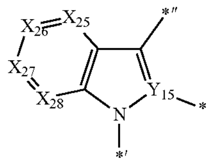

2-2(14)

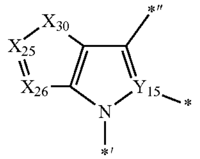

2-2(15)

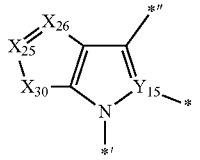

2-2(16)

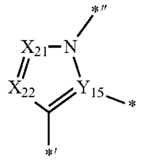

2-2(17)

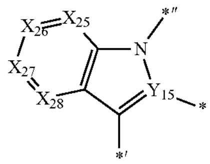

2-2(18)

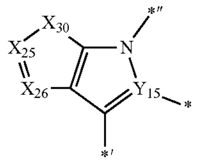

2-2(19)

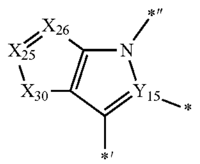

2-2(20)

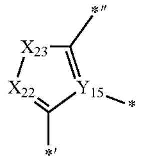

2-2(21)

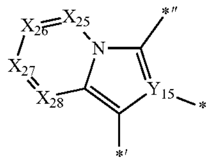

-continued 2-2(22)

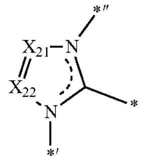

2-2(23)

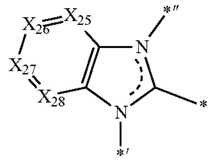

2-2(24)

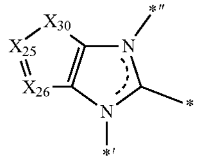

2-2(25)

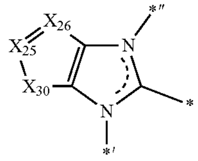

In Formulae 2-1(1) to 2-1(35) and 2-2(1) to 2-2(25), $Y_{15}$ may be a carbon atom (C) or a nitrogen atom (N), $X_{21}$ may be N or C($R_{21}$), $X_{22}$ may be N or C($R_{22}$), $X_{23}$ may be N or C($R_{23}$), $X_{24}$ may be N or C($R_{24}$), $X_{25}$ may be N or C($R_{25}$), $X_{26}$ may be N or C($R_{26}$), $X_{27}$ may be N or C($R_{27}$), and $X_{28}$ may be N or C($R_{28}$), $X_{29}$ may be C($R_{29a}$)($R_{29b}$), Si($R_{29a}$)($R_{29b}$), N($R_{29}$), O, or S, $X_{30}$ may be C($R_{30a}$)($R_{30b}$), Si($R_{30a}$)($R_{30b}$), N($R_{30}$), O, or S, $R_{21}$ to $R_{30}$ and $R_{29a}$ to $R_{30b}$ may each independently be the same as described in connection with $R_1$ in Formula 1,

* indicates a binding site to $B_1$, $B_2$, or $B_3$, and

*' and *" each indicate a binding site to a neighboring atom.

In an embodiment, in Formula 1, a1 may be 0, ring $A_4$ may be a group represented by one of Formulae 2-2(1) to 2-2(9), and $R_7$ and $R_8$ may each independently be a $C_6$-$C_{60}$ aryl group unsubstituted or substituted with at least one $R_{10a}$. $Y_{15}$ in Formulae 2-2(1) to 2-2(9) may be a nitrogen atom (N).

For example, a3 and a4 may each be 1. In an embodiment, $R_7$ and $R_8$ may each independently be a phenyl group unsubstituted or substituted with at least one $R_{10a}$.

In an embodiment, in Formula 1, b4 may be 2 or more, $R_4$ and $R_7$ may be linked to each other to form a $C_1$-$C_{60}$ heterocyclic group unsubstituted or substituted with at least one $R_{10a}$, and $R_4$ and $R_8$ may be linked each other to form a $C_1$-$C_{60}$ heterocyclic group unsubstituted or substituted with at least one $R_{10a}$. For example, multiple $R_4$(s) may be identical to or different from each other.

In an embodiment, when the $R_4$(s) are all hydrogen, $A_4$ and $R_7$ may be linked to each other to form a $C_1$-$C_{60}$ heterocyclic group unsubstituted or substituted with at least one $R_{10a}$, and $A_4$ and $R_8$ may be linked each other to form a $C_1$-$C_{60}$ heterocyclic group unsubstituted or substituted with at least one $R_{10a}$.

In an embodiment, when two of the $R_4$(s) are each an aryl group, and $R_7$ and $R_8$ are both hydrogen, one aryl group and N may be linked to each other and the other aryl group and N may be linked to each other to form one $C_1$-$C_{60}$ heterocyclic group unsubstituted or substituted with at least one $R_{10a}$. The aryl group may be, for example, a phenyl group.

In an embodiment, the organometallic compound represented by Formula 1 may be represented by Formula 2:

[Formula 2]

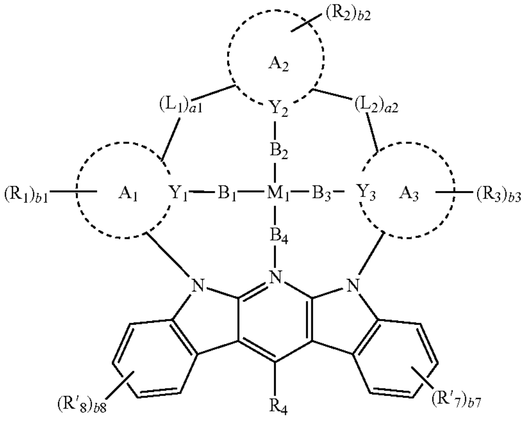

In Formula 2, $M_1$, ring $A_1$ to ring $A_3$, $L_1$, $L_2$, a1, a2, $Y_1$ to $Y_3$, $B_1$ to $B_4$, $R_1$ to $R_4$, and b1 to b3 may each be the same as described in connection with Formula 1, $R'_7$ and $R'_8$ may each independently be the same as described in connection with $R_1$ in Formula 1, and b7 and b8 may each independently be an integer from 1 to 4.

In an embodiment, ring $A_1$ to ring $A_3$ in Formula 2 may each independently be a group represented by one of Formulae 2-1(1) to 2-1(35) and 2-2(1) to 2-2(25).

In an embodiment, the first compound represented by Formula 1 may be one selected from Compounds BD1 to BD91:

BD1

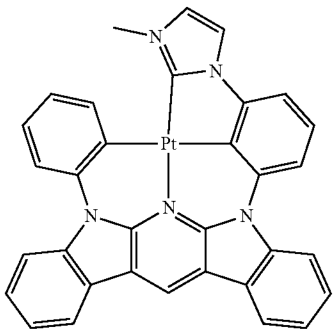

-continued

BD2

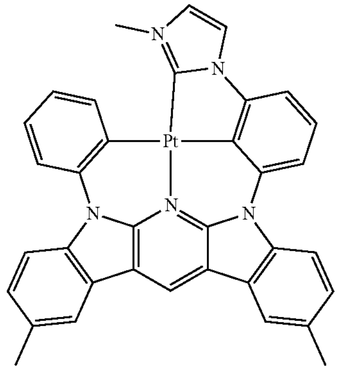

BD3

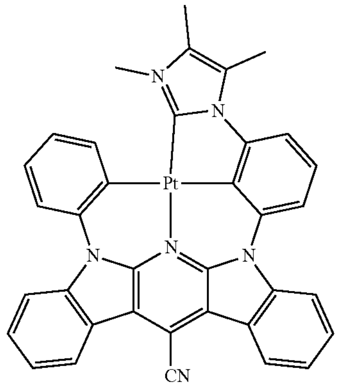

BD4

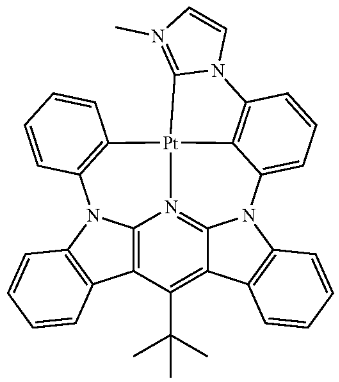

BD5

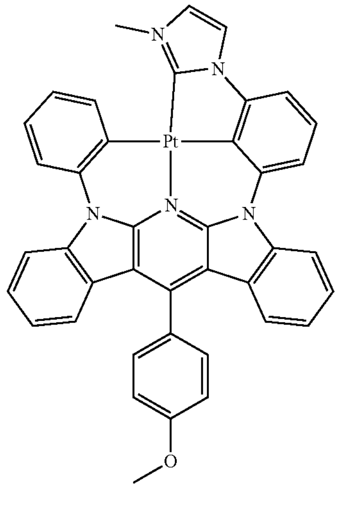

-continued
BD6
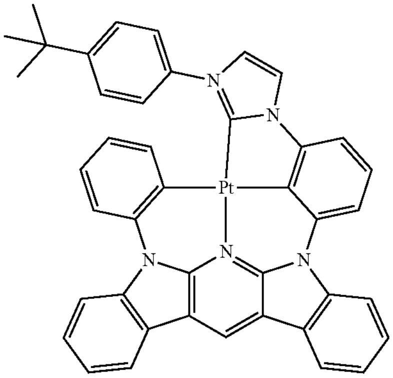
BD7
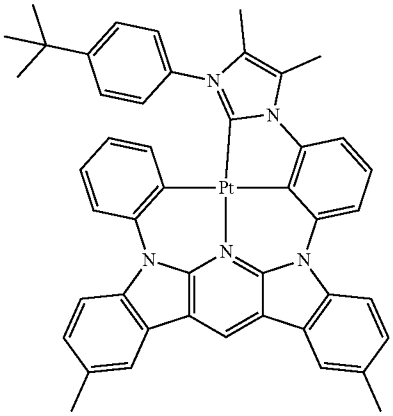
BD8
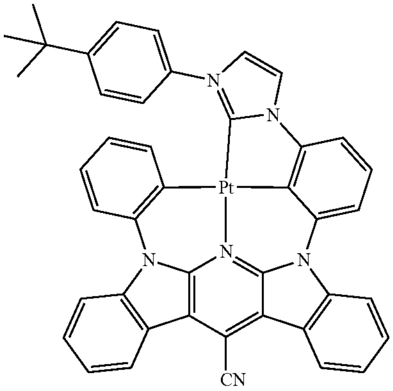
BD9
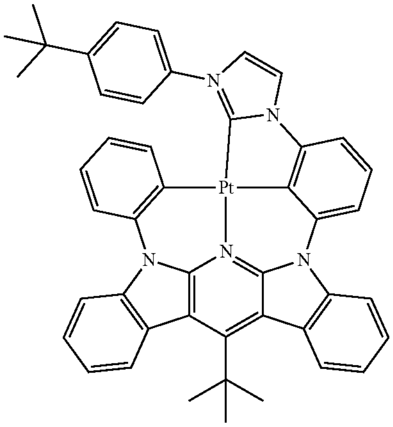
-continued
BD10
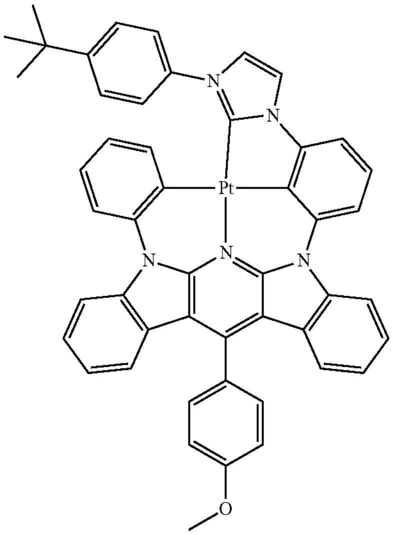
BD11
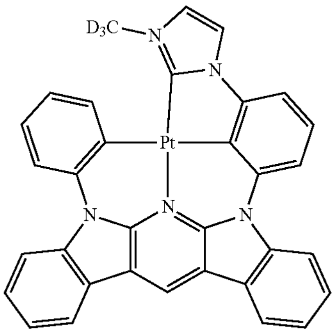
BD12
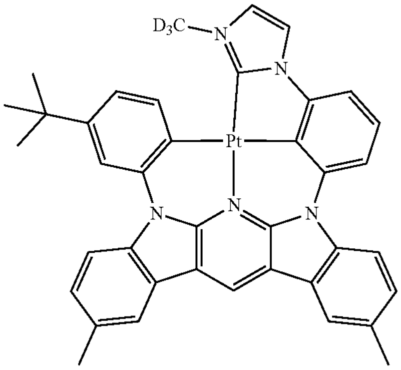
BD13
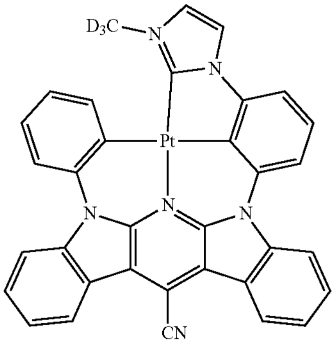

-continued
BD14
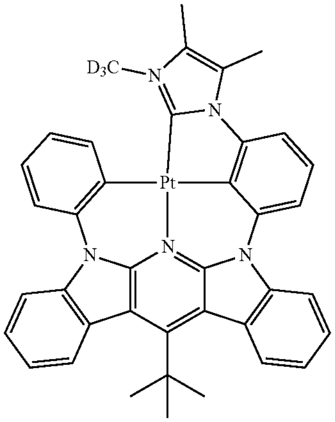
BD15
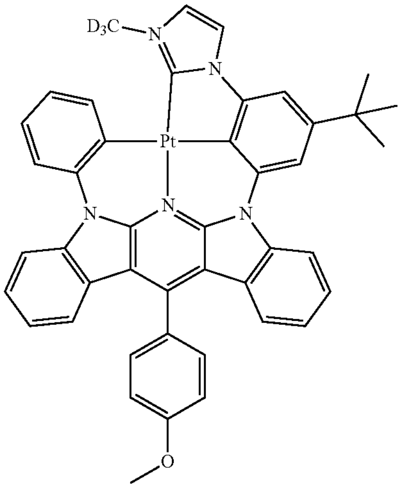
BD16
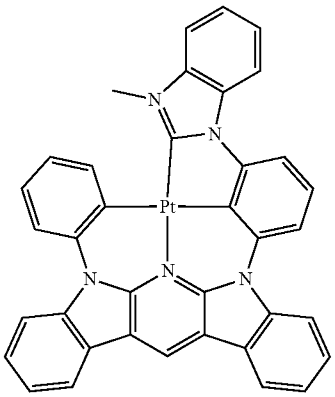
-continued
BD17
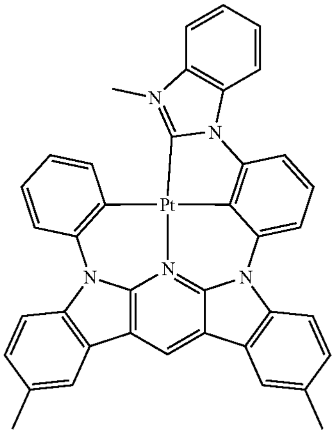
BD18
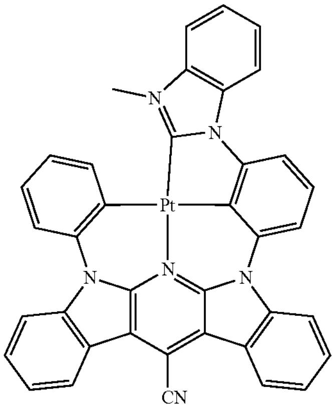
BD19
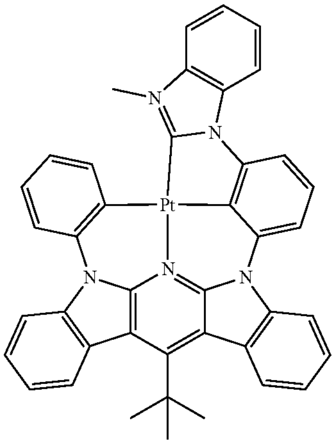

-continued
BD20
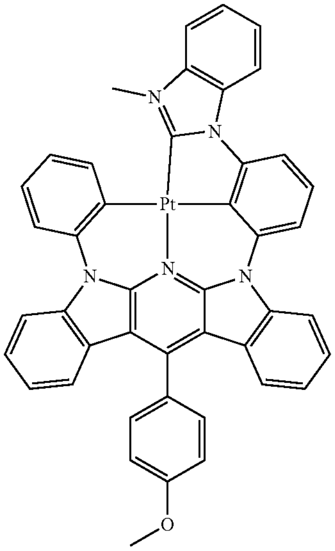
BD21
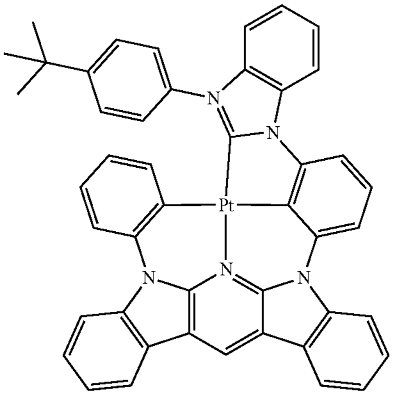
BD22
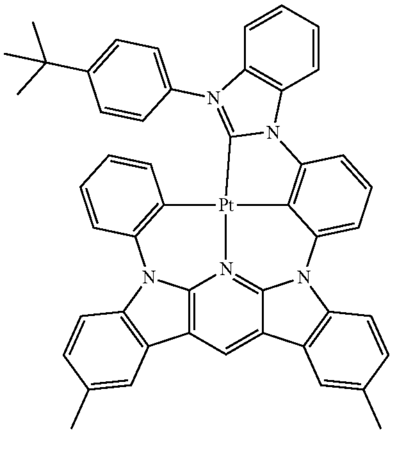
-continued
BD23
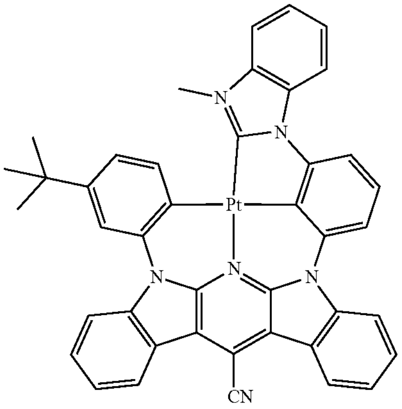
BD24
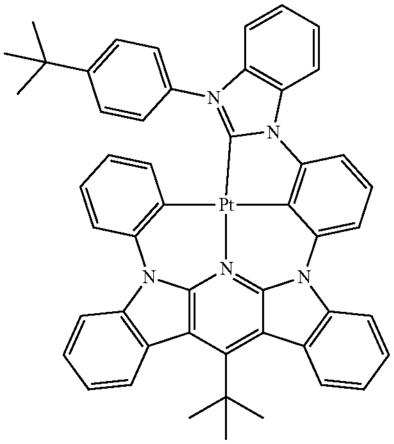
BD25
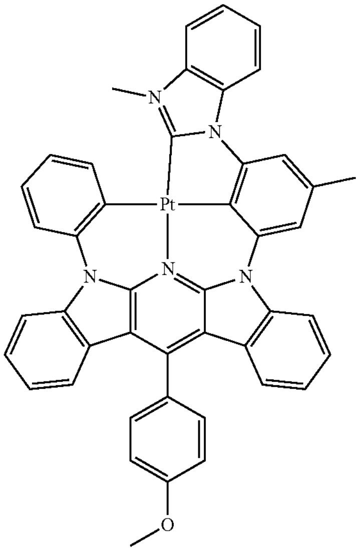

-continued
BD26
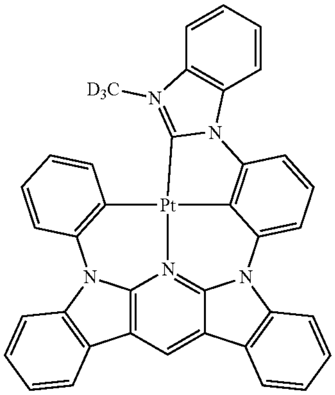
BD27
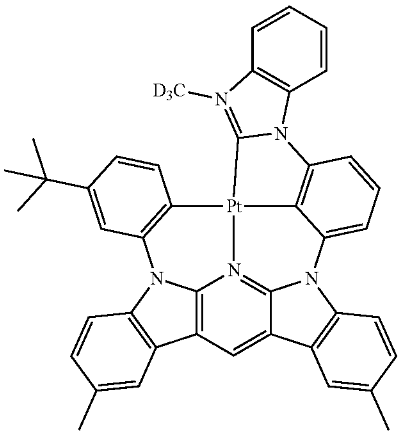
BD28
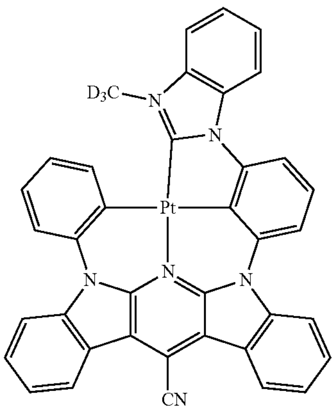
-continued
BD29
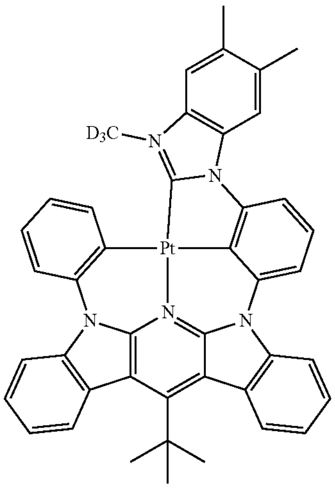
BD30
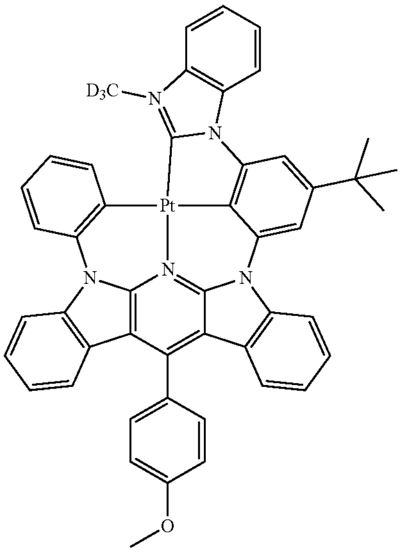
BD31
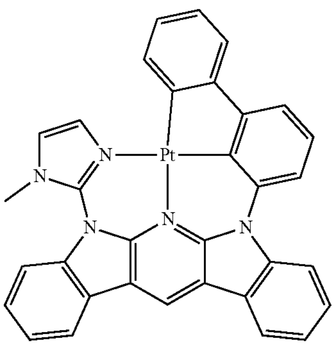

-continued
BD32
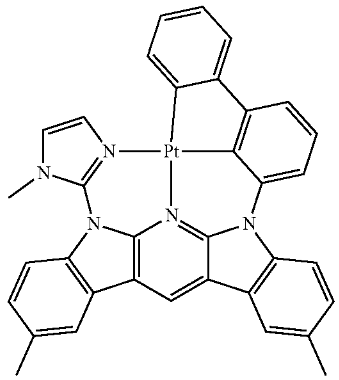
BD33
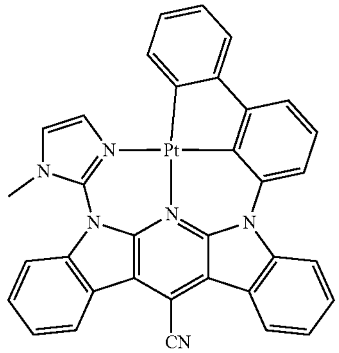
BD34
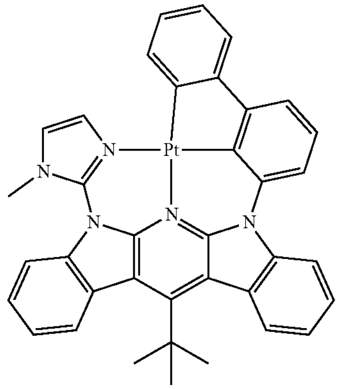
BD35
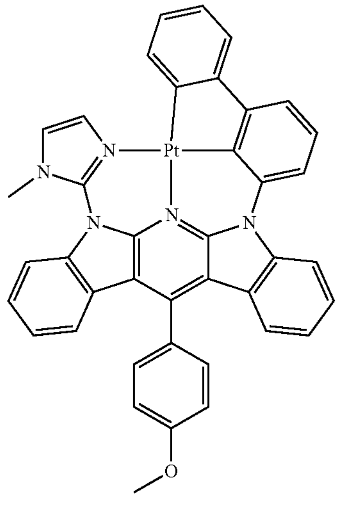
-continued
BD36
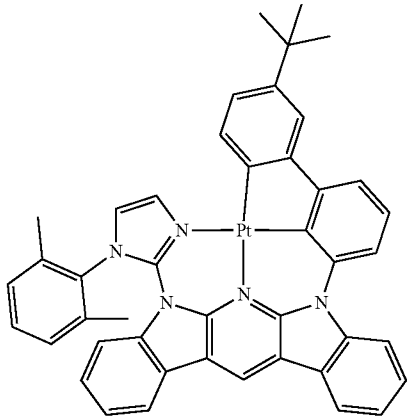
BD37
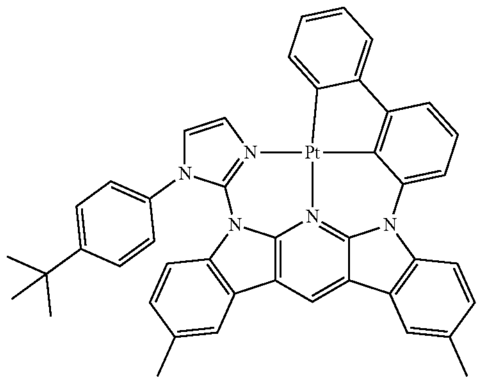
BD38
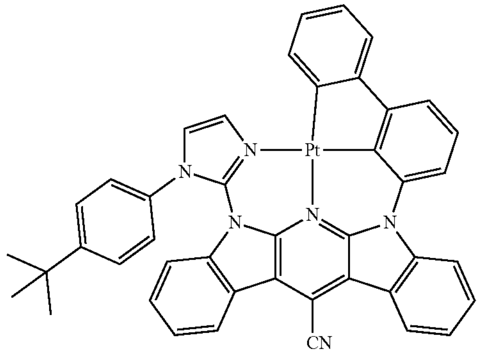
BD39
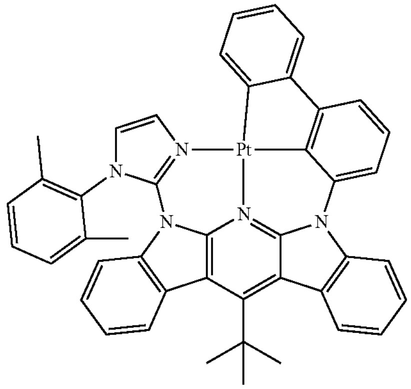

-continued
BD40
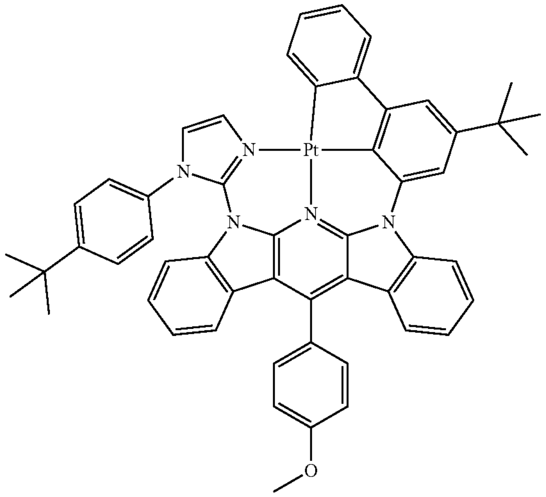
BD41
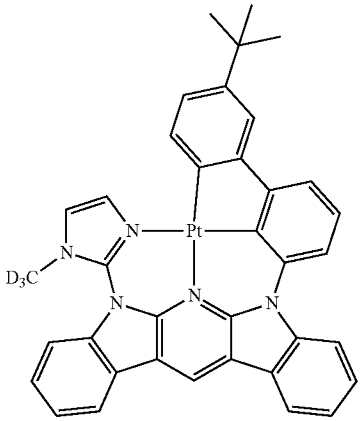
BD42
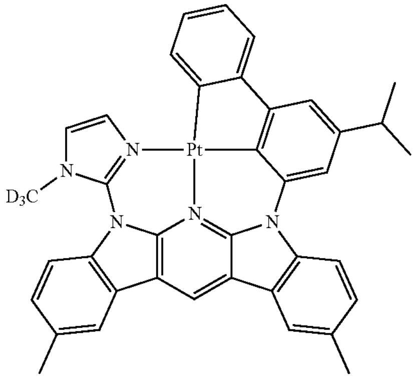
-continued
BD43
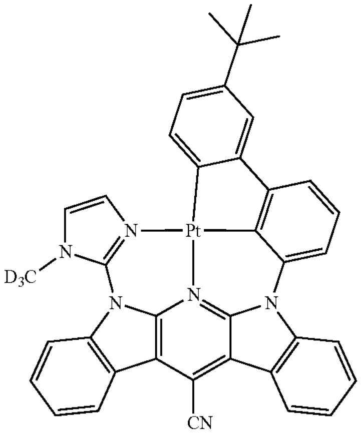
BD44
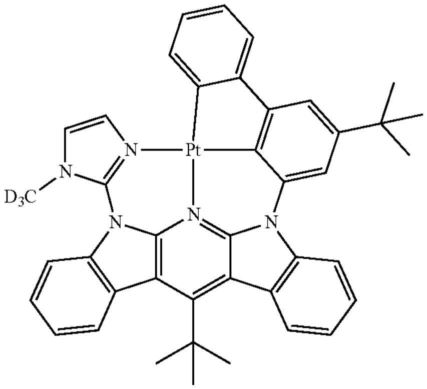
BD45
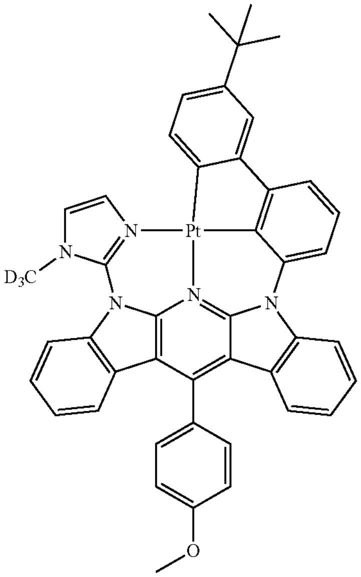

-continued
BD46
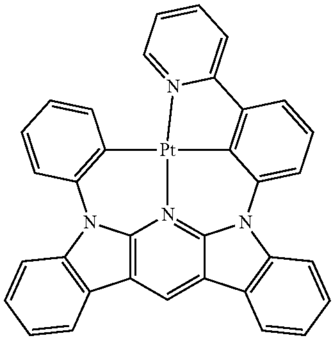
BD47
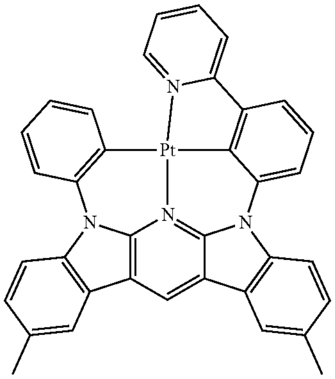
BD48
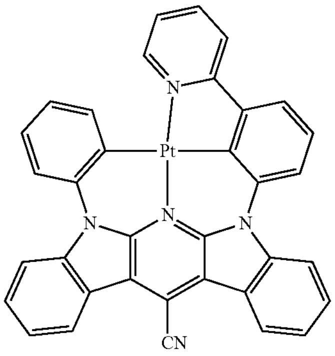
BD49
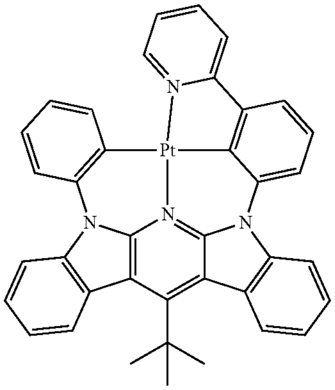
-continued
BD50
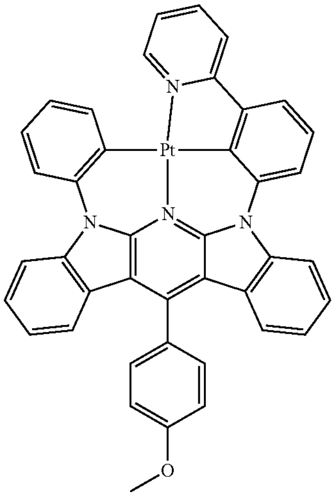
BD51
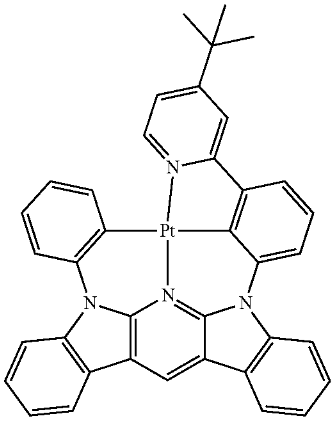
BD52
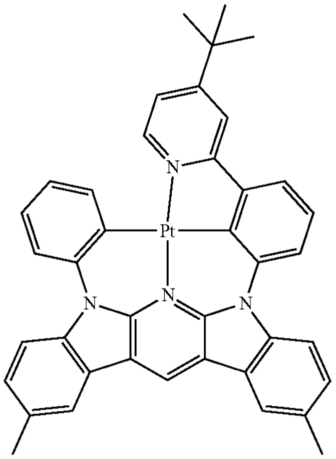

BD53
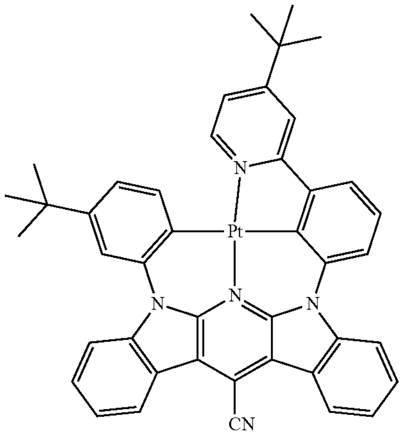
BD54
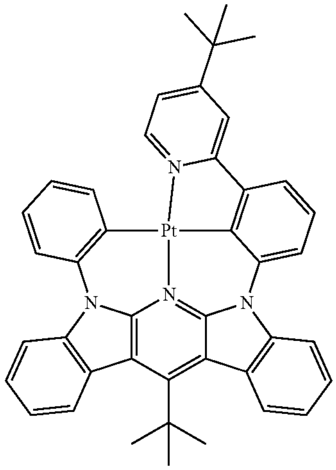
BD55
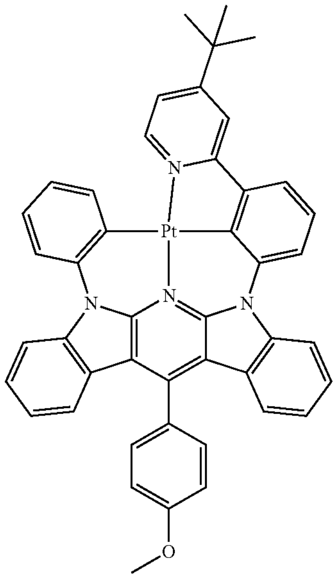
BD56
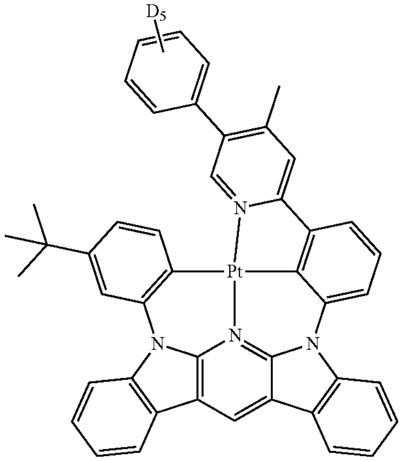
BD57
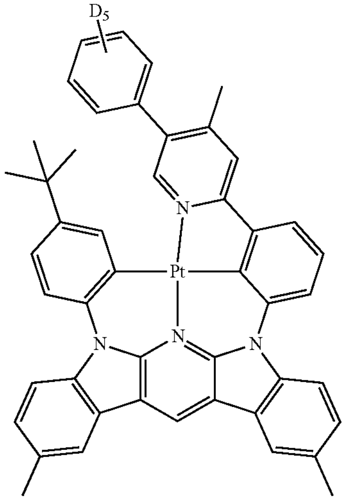
BD58
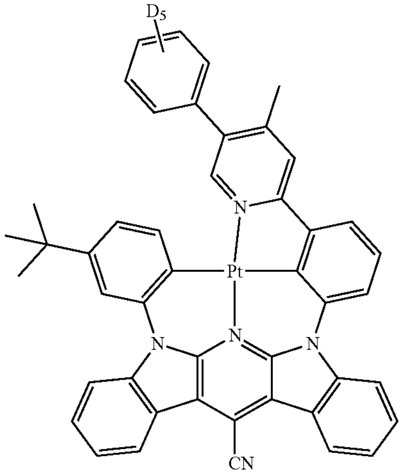

-continued
BD59
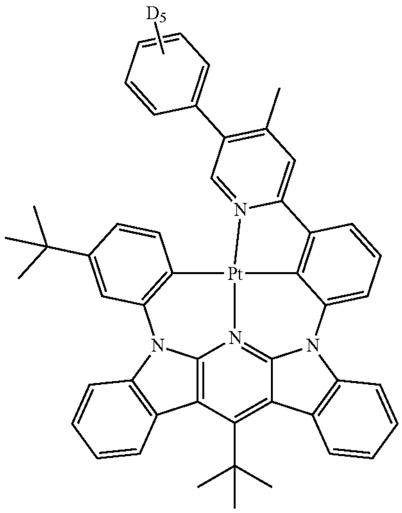
BD60
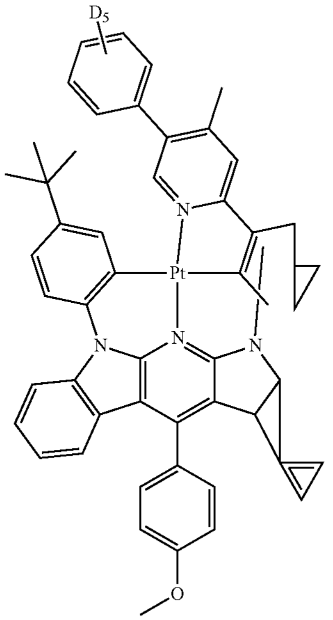
BD61
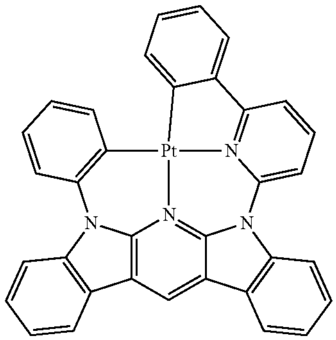
-continued
BD62
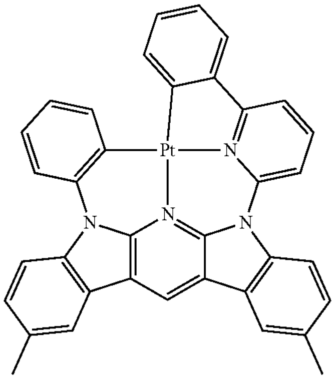
BD63
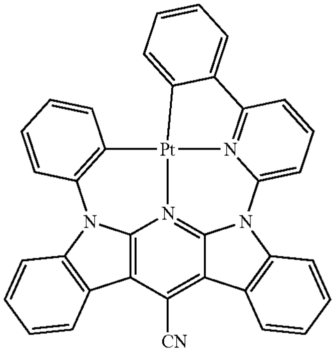
BD64
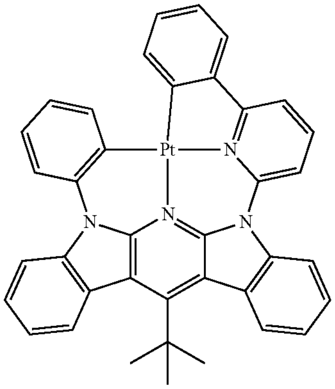
BD65
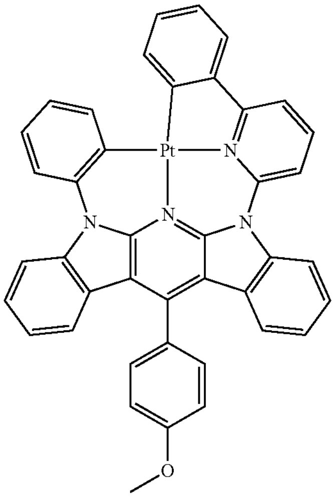

-continued
BD66
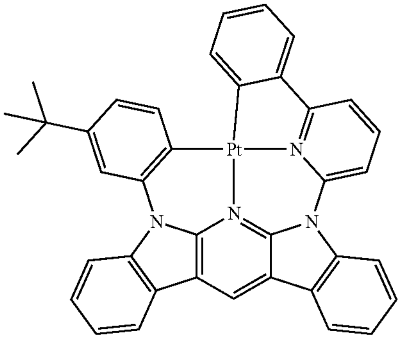
BD67
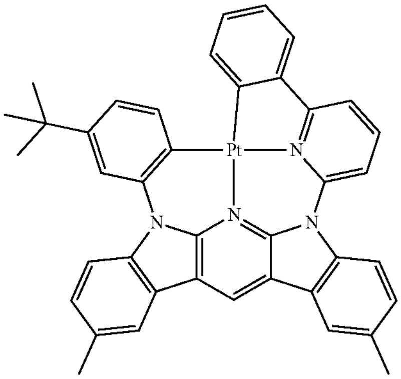
BD68
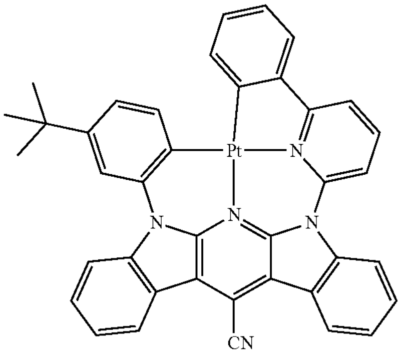
BD69
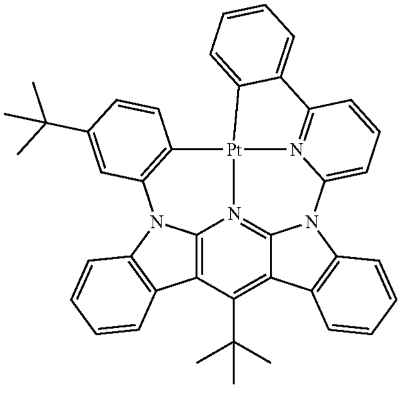
-continued
BD70
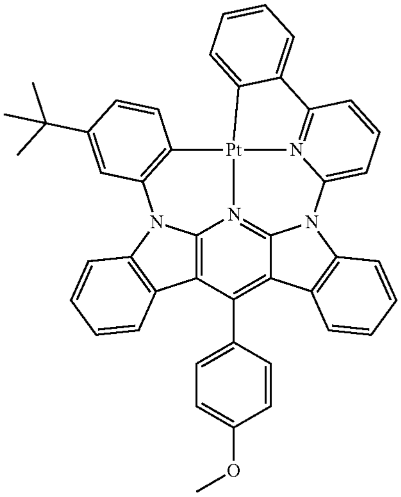
BD71
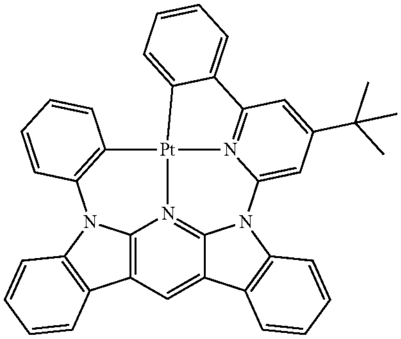
BD72
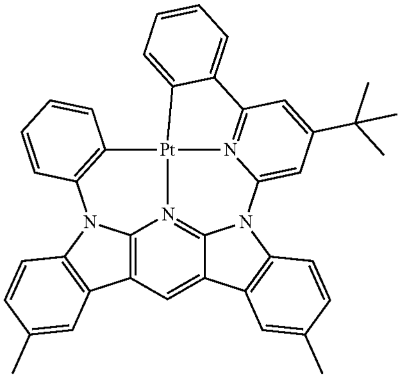
BD73
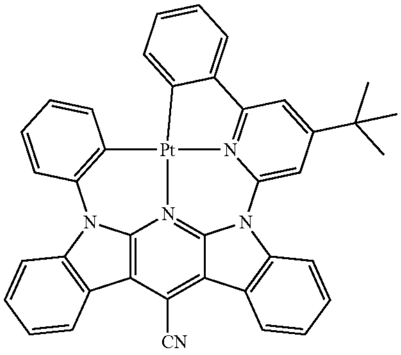

-continued
BD74
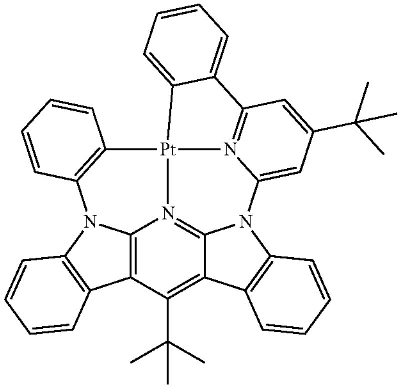
BD75
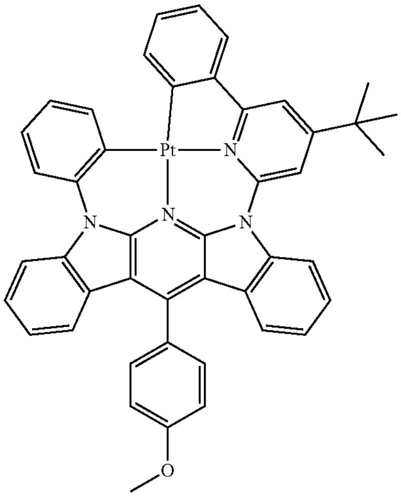
BD76
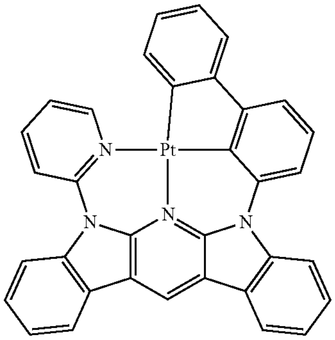
BD77
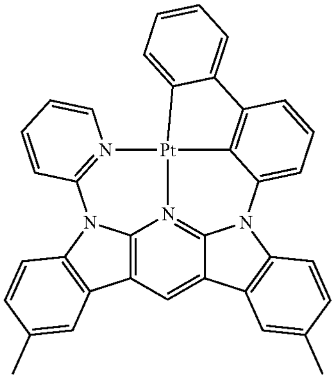
-continued
BD78
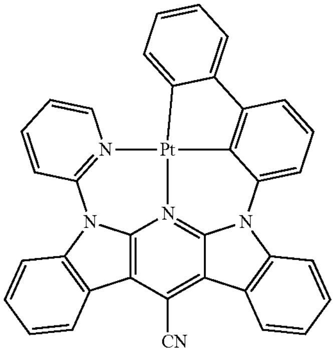
BD79
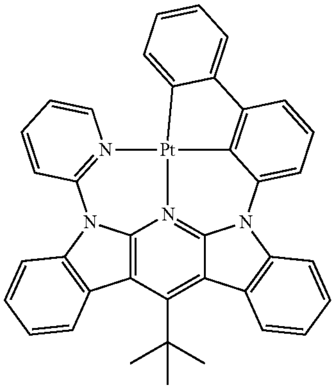
BD80
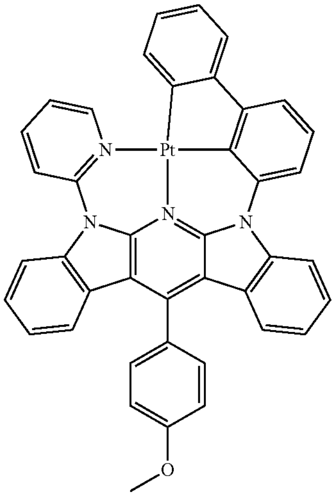
BD81
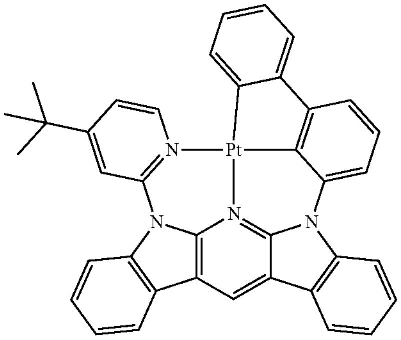

-continued
BD82
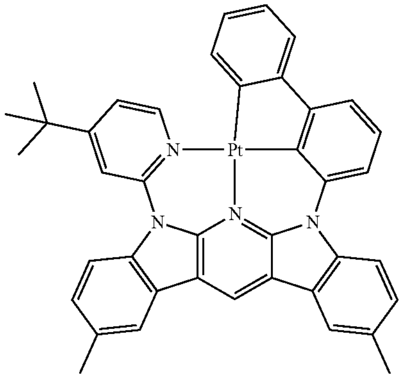
BD83
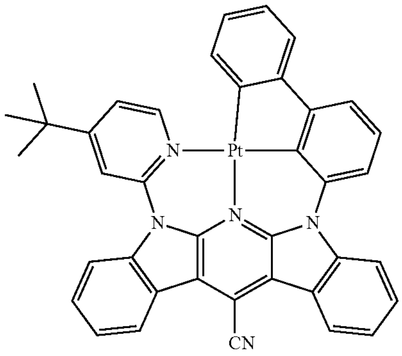
BD84
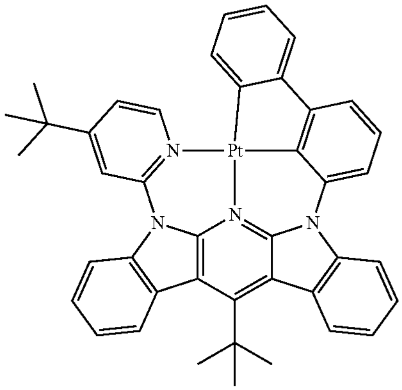
BD85
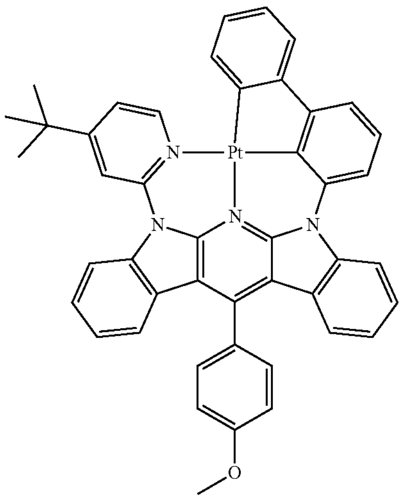
-continued
BD86
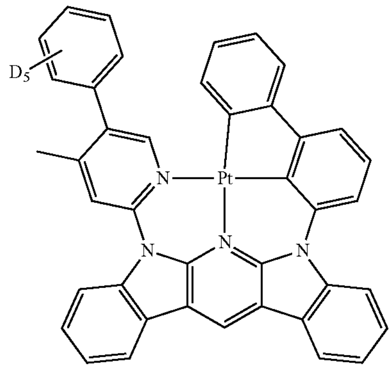
BD87
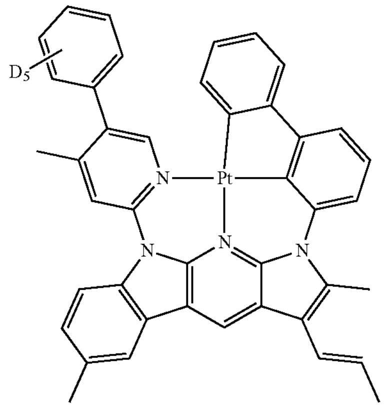
BD88
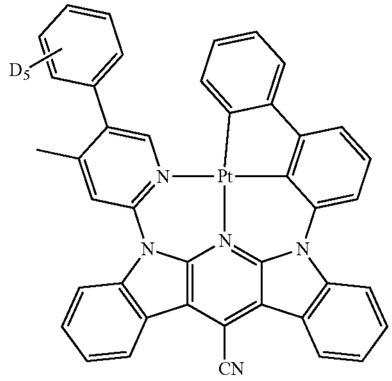
BD89
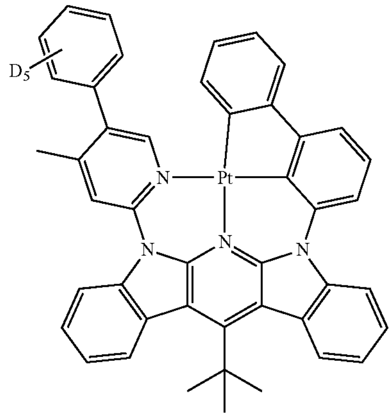

-continued

BD90

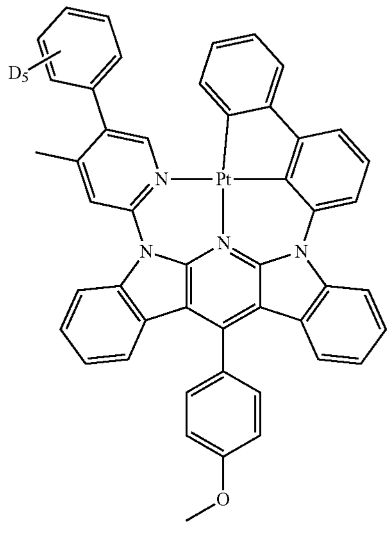

BD91

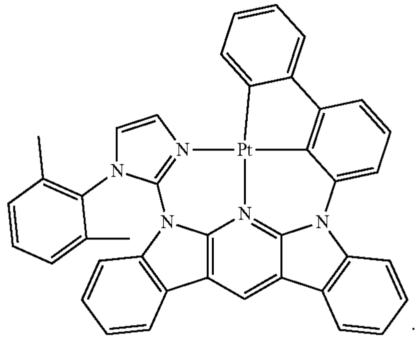

In Compounds BD1 to BD91, $D_5$ indicates that five deuterium atoms are substituted at the indicated moiety. Other cases are the same.

In an embodiment, the first electrode of the light-emitting device may be an anode, the second electrode of the light-emitting device may be a cathode, the interlayer may further include a hole transport region disposed between the first electrode and the emission layer and/or an electron transport region disposed between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the emission layer may be a phosphorescent emission layer or a fluorescent emission layer.

In an embodiment, the emission layer may include a host and a dopant, and the dopant may include a first compound represented by Formula 1.

In an embodiment, the dopant may include the first compound represented by Formula 1 alone.

In an embodiment, the dopant may include a second dopant and a first dopant. The second dopant may be a phosphorescent dopant, the first dopant may be a thermally activated delayed fluorescence dopant, and the second dopant may have more intersystem crossing (ISC) occurring than emission of light.

The second dopant in the light-emitting device may have more ISC actively occurring than emission of light. Singlet excitons generated by the host may be transferred to the first dopant via ISC.

In an embodiment, about 20% to about 30% of the phosphorescent dopant, which is the second dopant, may emit light, and ISC may occur in about 80% to about 70% of the phosphorescent dopant. Singlet excitons generated by a first host, singlet excitons generated by a second host, and/or excitons generated by the first host and the second host may be transferred to the thermally activated delayed fluorescence dopant, which is the first dopant, via ISC.

In an embodiment, the dopant may include a first compound represented by Formula 1 as a second dopant and a fourth compound represented by Formula 12 as a first dopant. The second dopant may not substantially emit light, and the first dopant may emit light. In an embodiment, the first dopant may be a thermally activated delayed fluorescence dopant.

When the dopant includes the first dopant and the second dopant, a weight ratio of the second dopant to the first dopant may be in a range of 10:0.1 to 10:1.0. In an embodiment, the weight ratio of the second dopant to the first dopant may be in a range of 10:0.1 to 10:0.5. In an embodiment, the weight ratio of the second dopant to the first dopant may be in a range of 10:0.5 to 10:1.0. In consideration of the lifespans of the first dopant and the second dopant and energy transfer to the second dopant, the efficiency and lifespan of the light-emitting device may be optimized when the weight ratio is within the above range.

In an embodiment, the host may include two or more hosts. In an embodiment, the host may include an electron transport host and a hole transport host. In an embodiment, the host may include a third compound represented by Formula 11 and a fourth compound represented by Formula 12.

In an embodiment, the emission layer may be a blue emission layer.

Another aspect of the disclosure provides an electronic apparatus including a thin-film transistor and the light-emitting device. The thin-film transistor may include a source electrode, a drain electrode, an active layer, and a gate electrode, and the first electrode of the light-emitting device may be electrically connected to one of the source electrode and the drain electrode of the thin-film transistor.

The term "an interlayer" as used herein refers to a single layer and/or multiple layers disposed between the first electrode and the second electrode of an organic light-emitting device. A material included in the interlayer is not limited to an organic material.

[Description of FIG. 1]

FIG. 1 is a schematic cross-sectional view of a light-emitting device 10 according to an embodiment of the disclosure. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

[First Electrode 110]

In FIG. 1, a substrate may be further included under the first electrode 110 or above the second electrode 150. The substrate may be a glass substrate or a plastic substrate. In embodiments, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a structure consisting of a single layer or a structure including multiple layers. In an embodiment, the first electrode 110 may have a three-layered structure of ITO/Ag/ITO.

[Interlayer 130]

The interlayer 130 may be disposed on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include, in addition to various organic materials, metal-containing compounds such as organometallic compounds, inorganic materials such as quantum dots, and the like.

In embodiments, the interlayer 130 may include two or more light-emitting units sequentially stacked between the first electrode 110 and the second electrode 150 and a charge generation layer between the two or more emitting units. When the interlayer 130 includes the two or more emitting units and the charge generation layer as described above, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a multi-layered structure including layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers may be stacked from the first electrode 110 in its respective stated order, but embodiments of the disclosure are not limited thereto.

The hole transport region may include a compound represented by Formula 201, a compound represented by Formula 202, or any combination thereof:

[Formula 201]

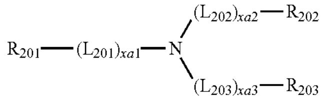

[Formula 202]

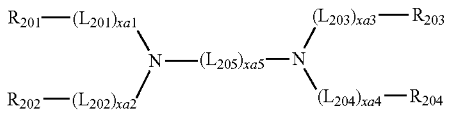

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217:

CY201

CY202

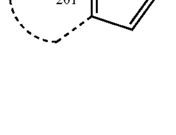

-continued

CY203

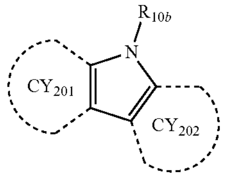

CY204

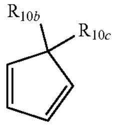

CY205

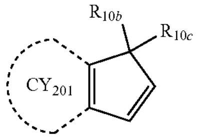

CY206

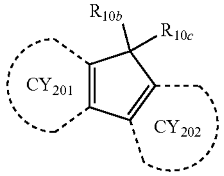

CY207

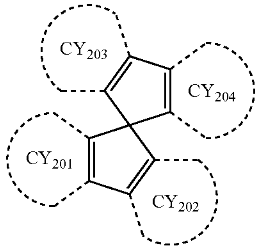

CY208

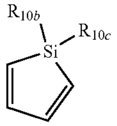

CY209

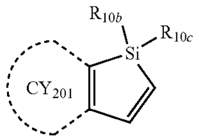

CY210

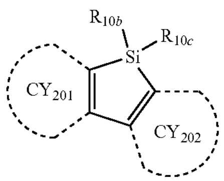

-continued

CY211

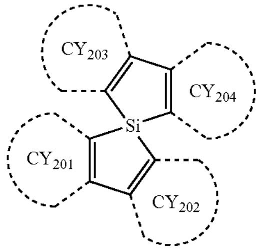

CY212

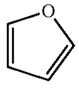

CY213

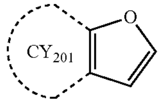

CY214

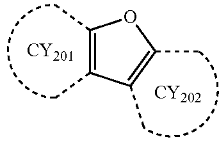

CY215

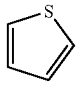

CY216

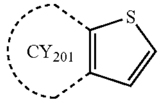

CY217

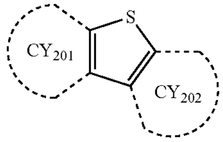

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of groups represented by Formulae CY204 to CY217.

In embodiments, each of Formulae 201 and 202 may not include a group represented by one of Formulae CY201 to CY217.

In an embodiment, the hole-transporting region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

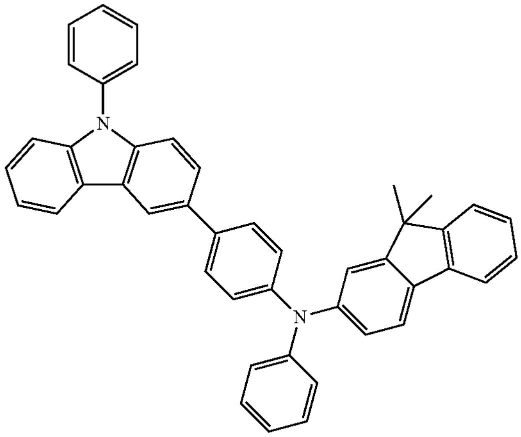

HT2

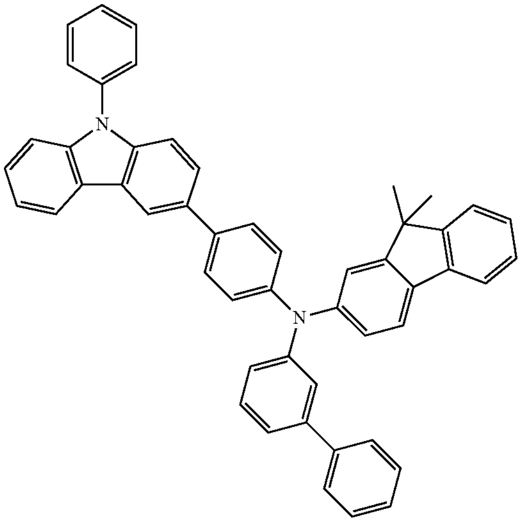

HT3

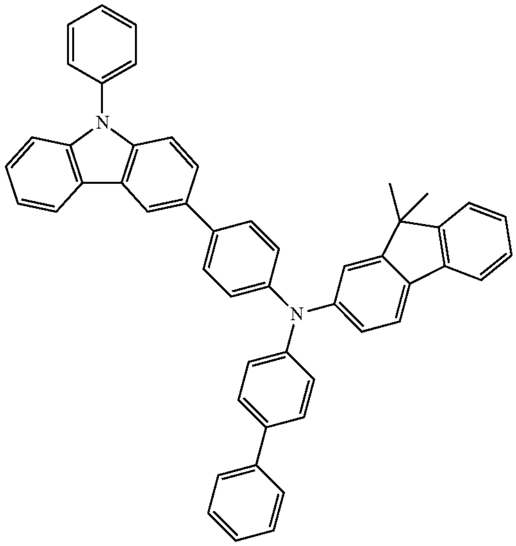

HT4

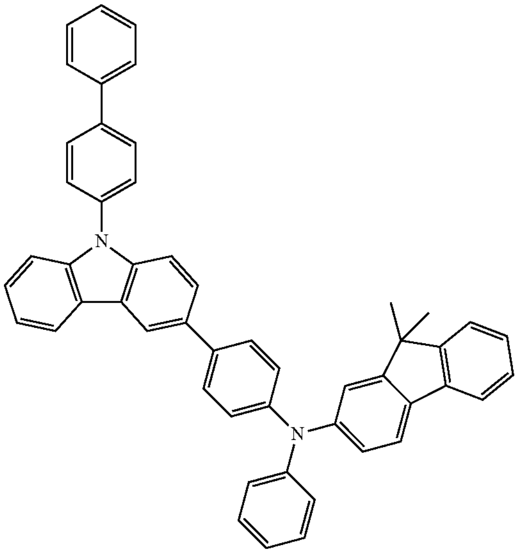

-continued
HT5
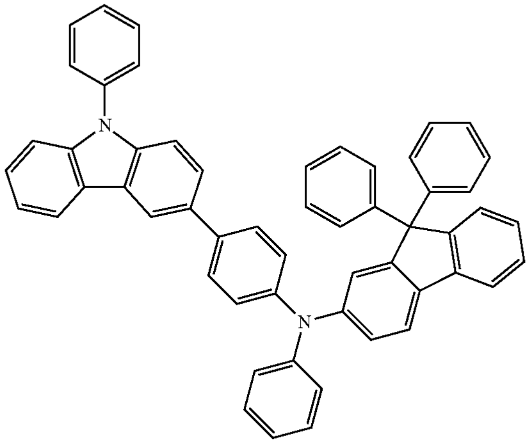
HT6
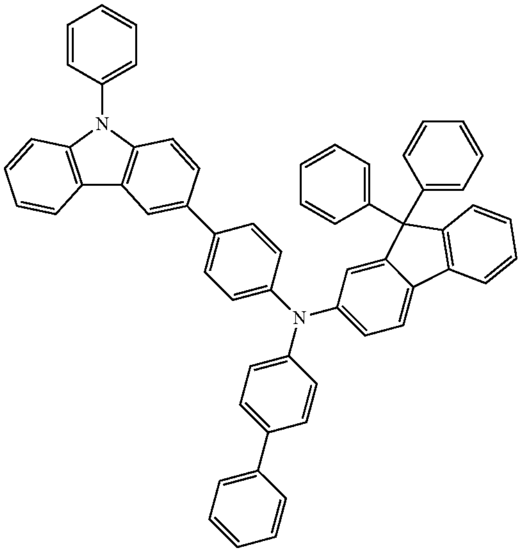
HT7
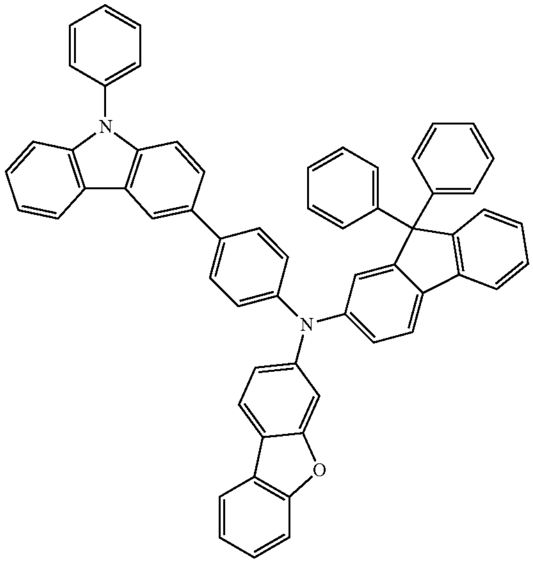
HT8
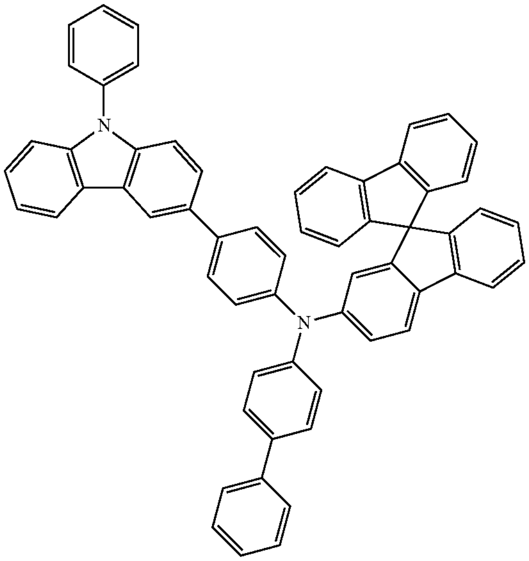

-continued
HT9
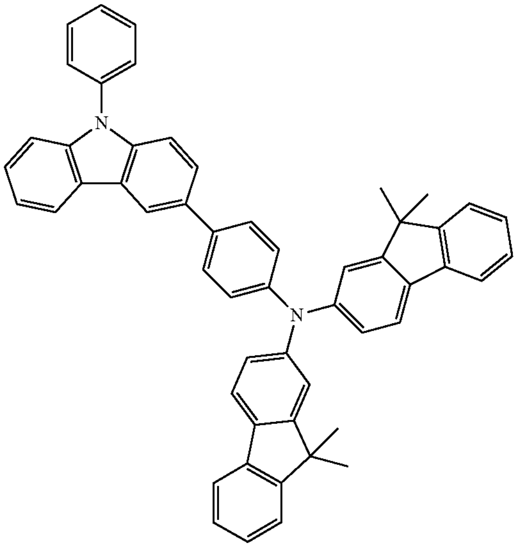
HT10
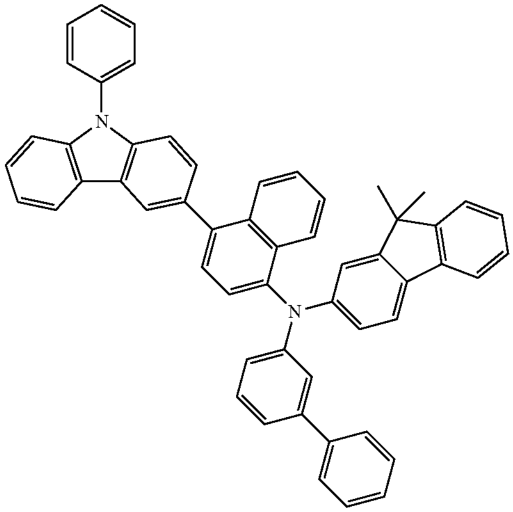
HT11
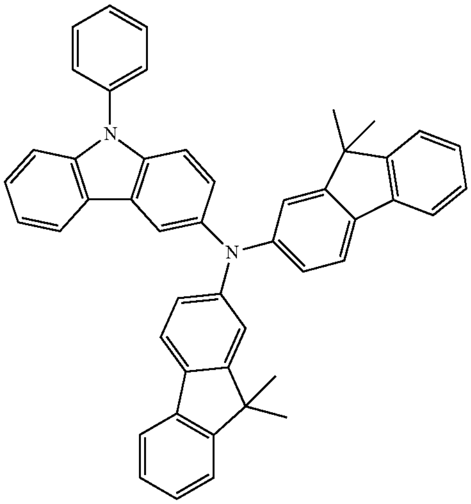
HT12
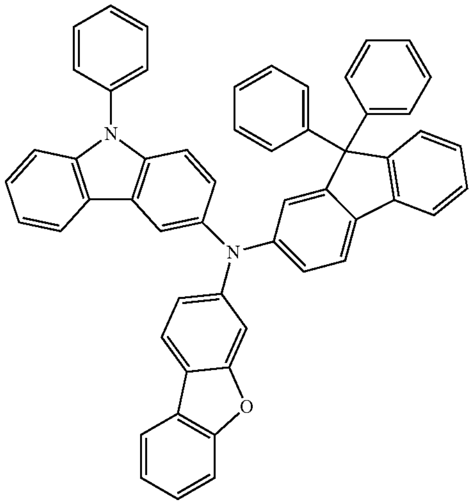
HT13
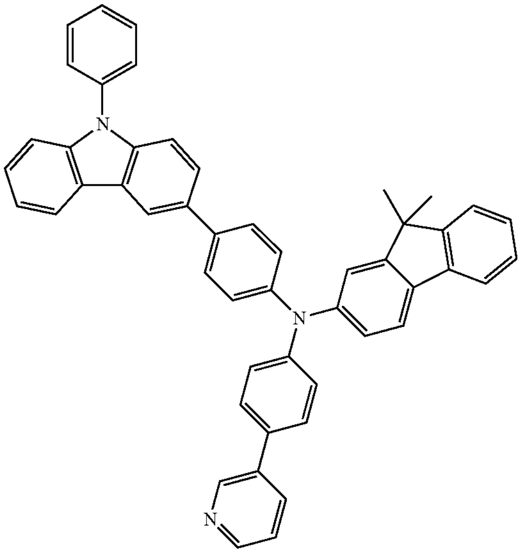
HT14
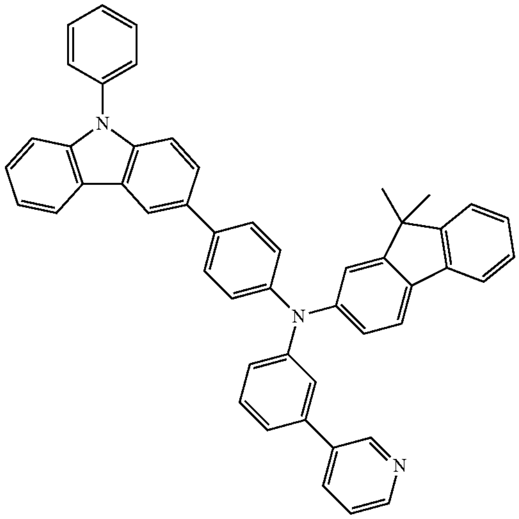

-continued
HT15
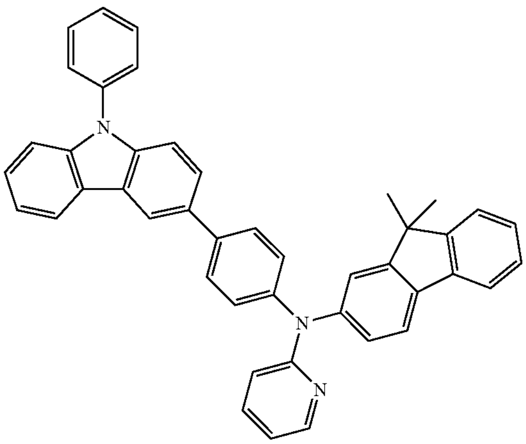
HT16
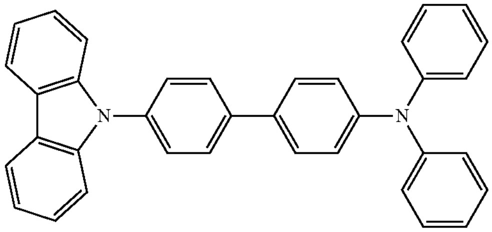
HT17
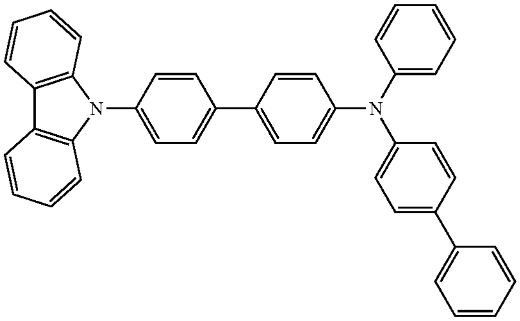
HT18
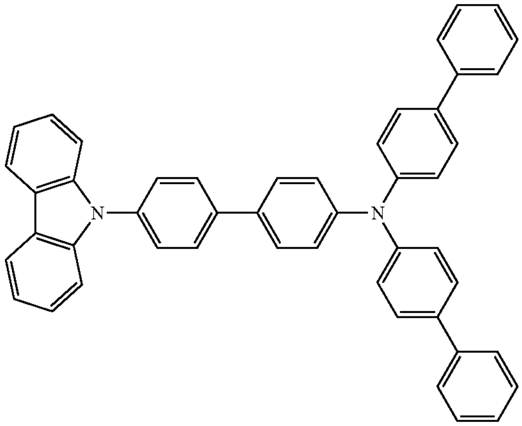
HT19
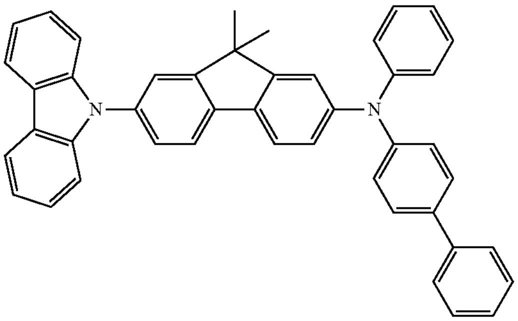
HT20
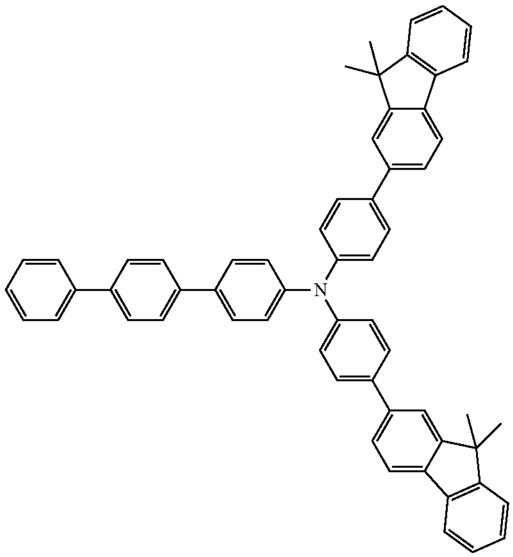

-continued
HT21
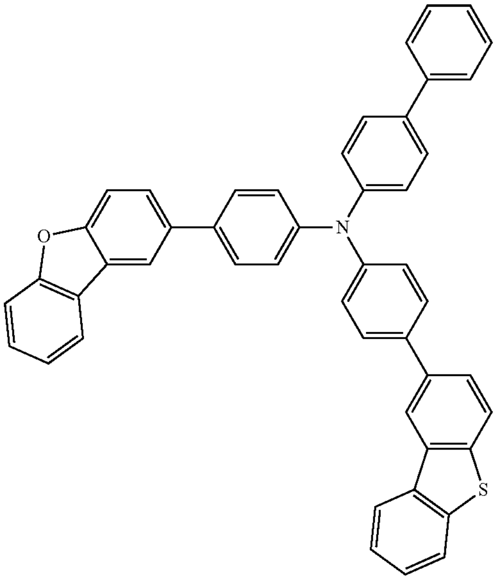
HT22
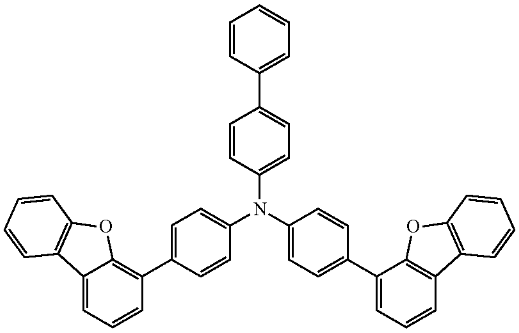
HT23
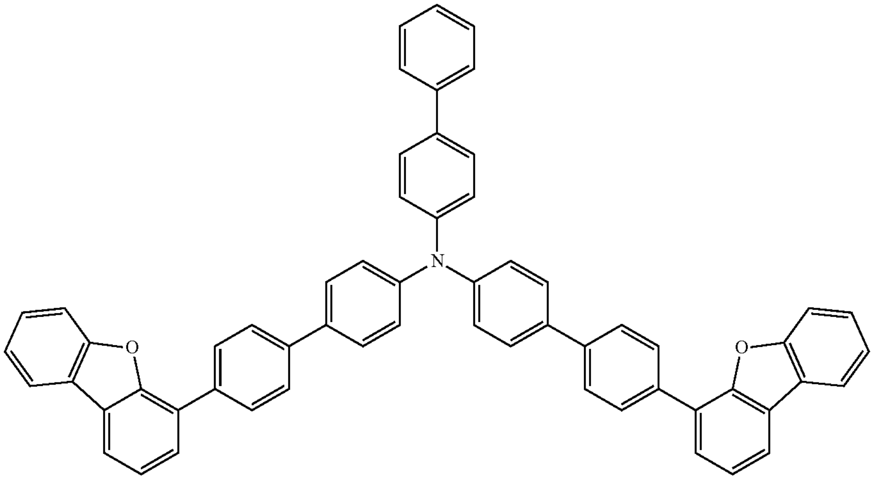
HT24
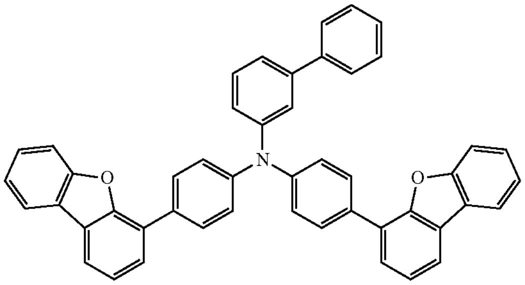
HT25
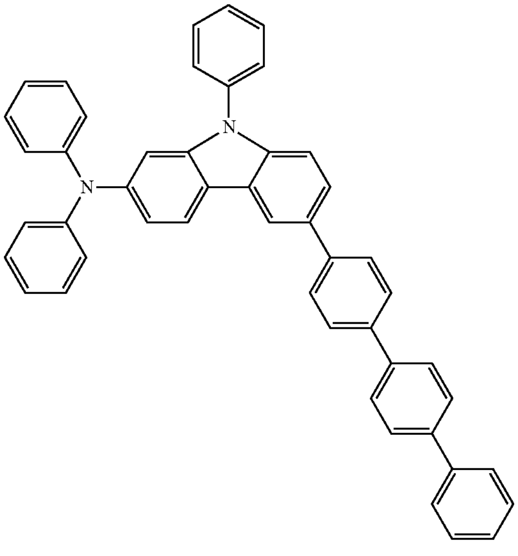

-continued
HT26
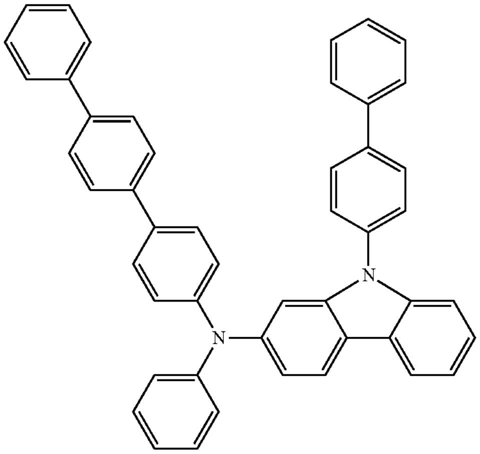
HT27
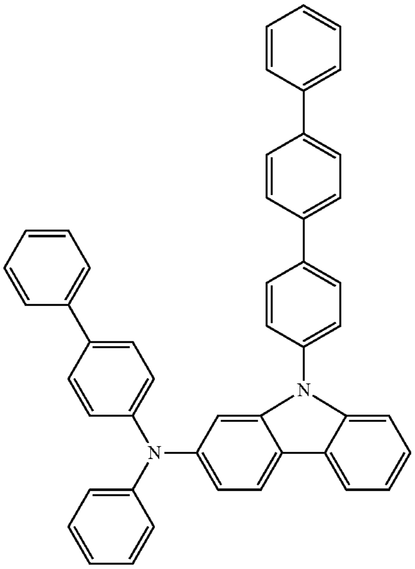
HT28
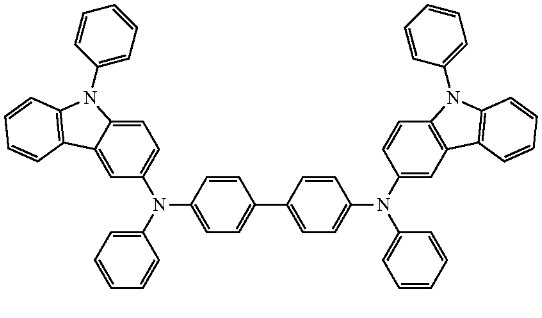
HT29
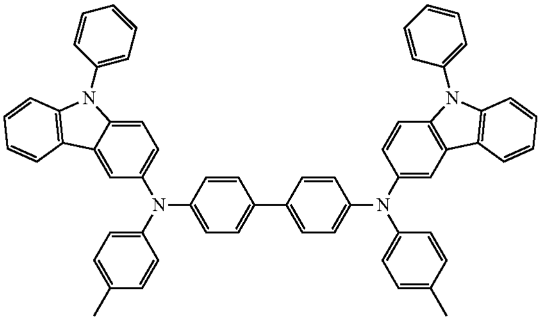
HT30
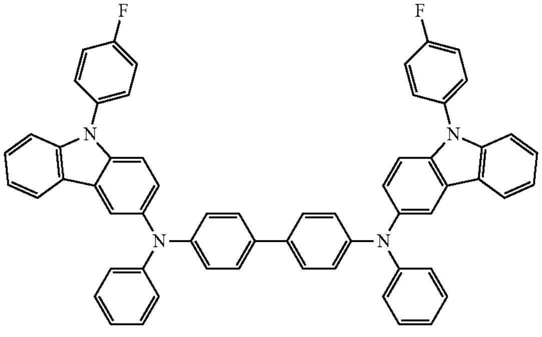
HT31
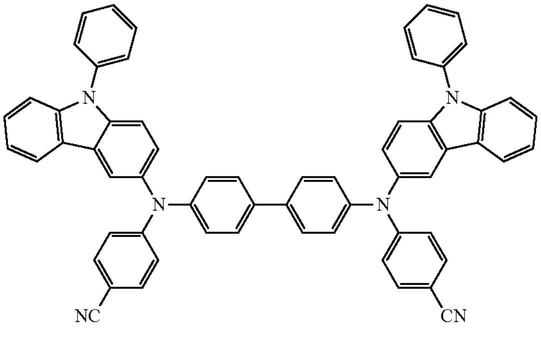

-continued
HT32
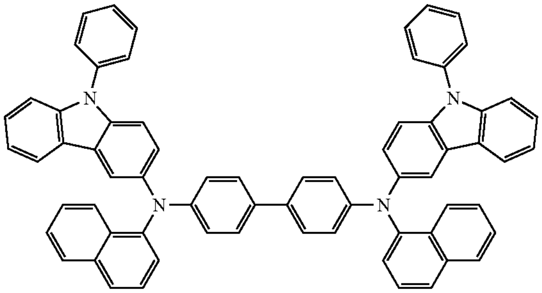
HT33
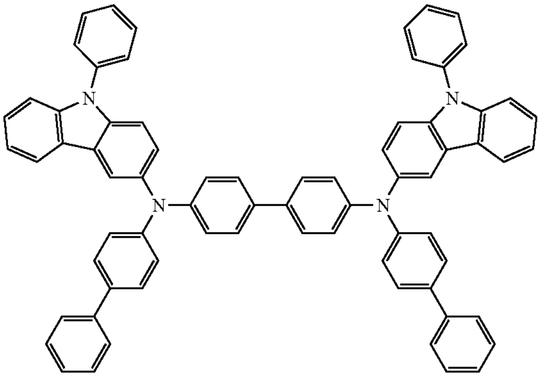
HT34
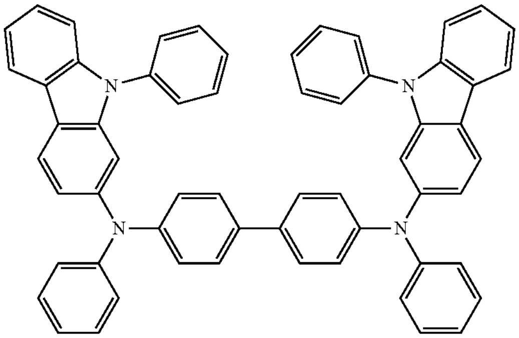
HT35
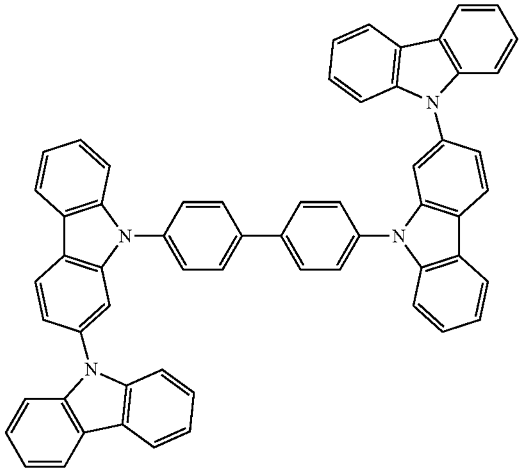
HT36
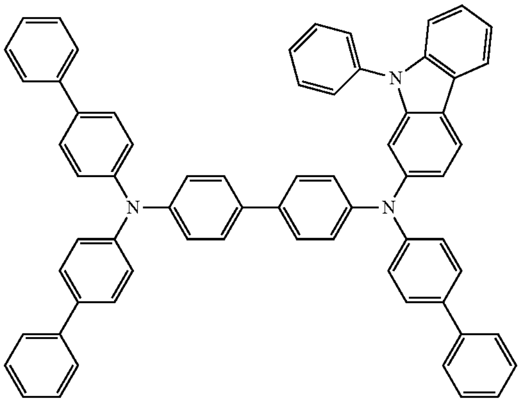
HT37
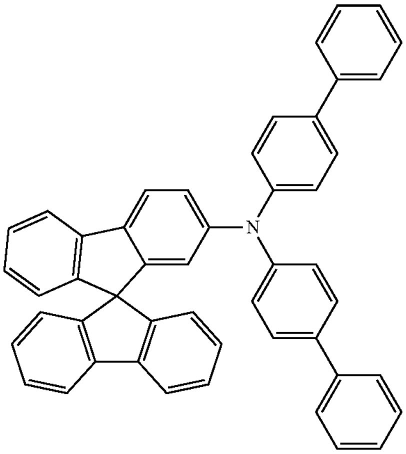

-continued
HT38
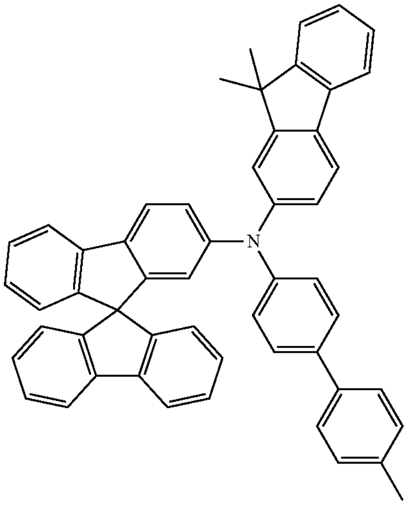
HT39
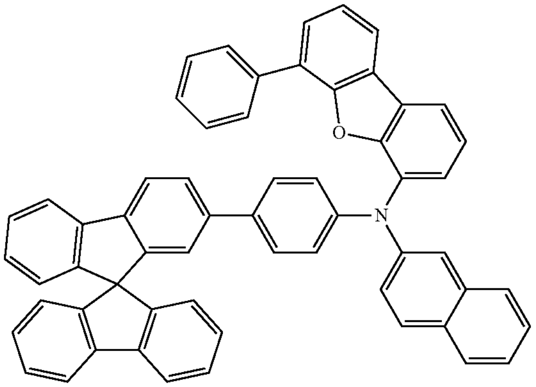
HT40
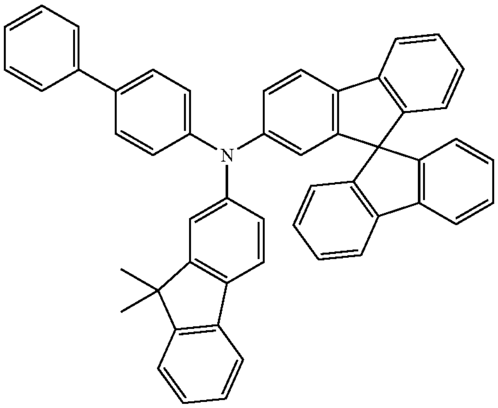
HT41
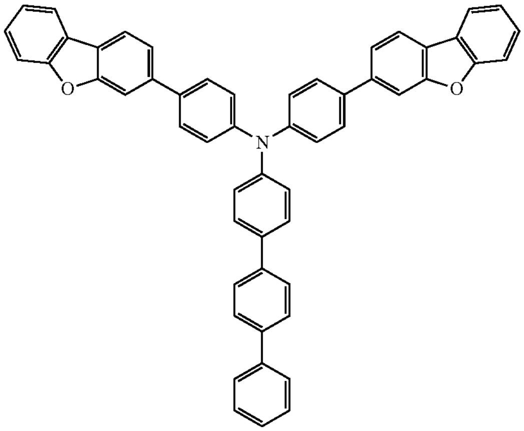
HT42
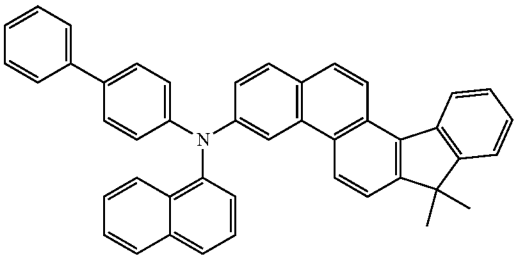
HT43
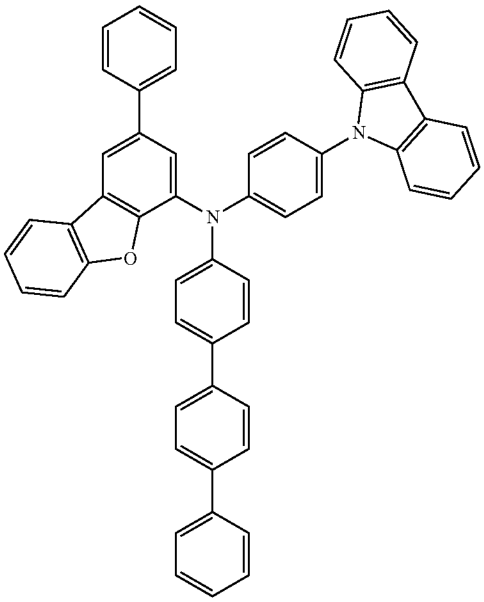

-continued
HT44
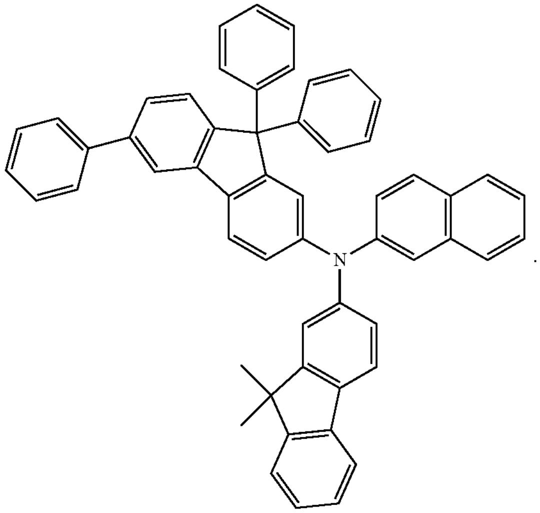
HT45
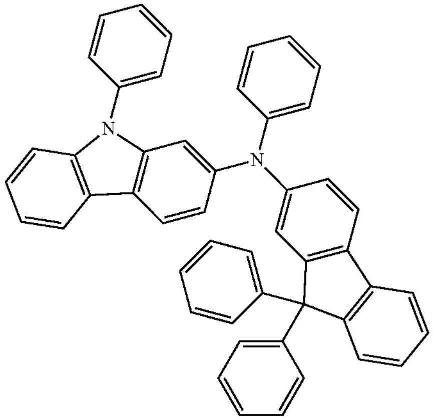
HT46
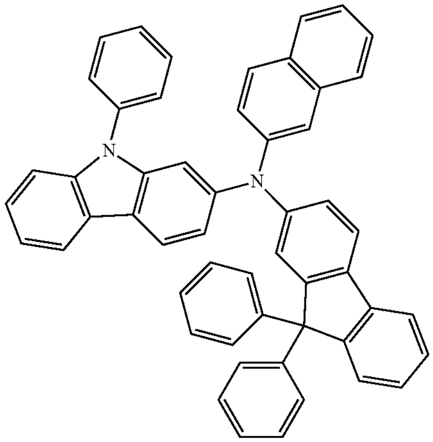
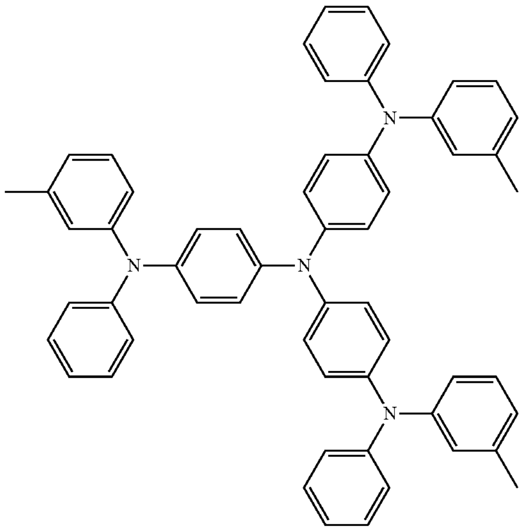
m-MTDATA
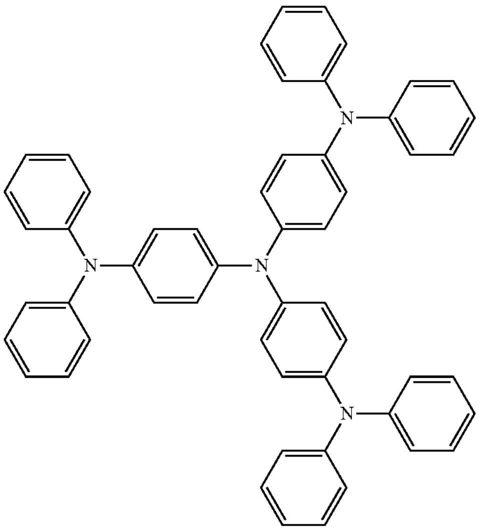
TDATA -continued
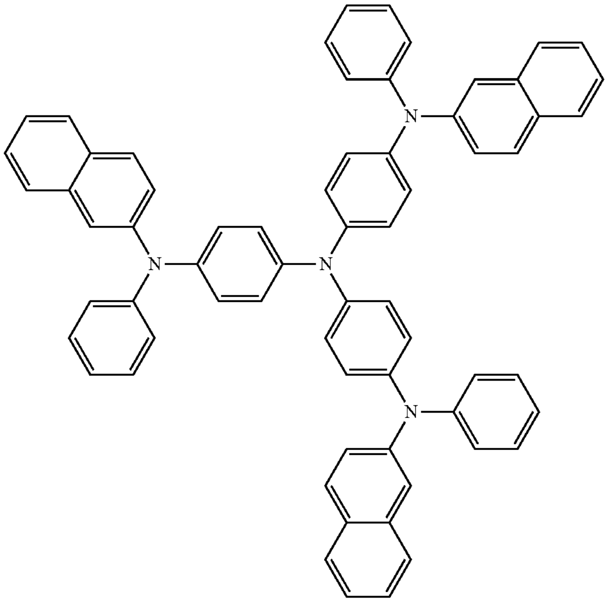
2-TNATA
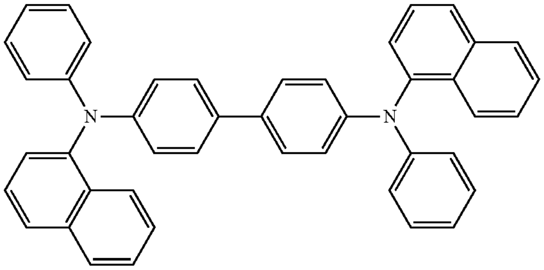
NPB
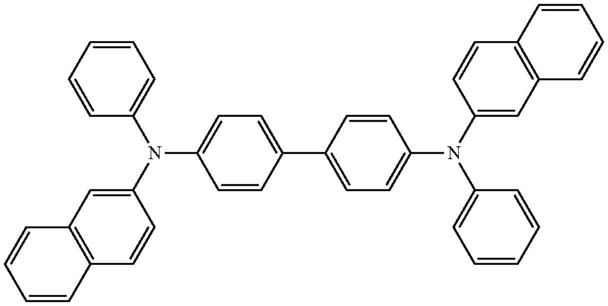
β-NPB
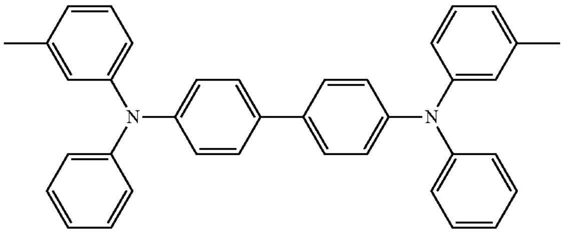
TPD
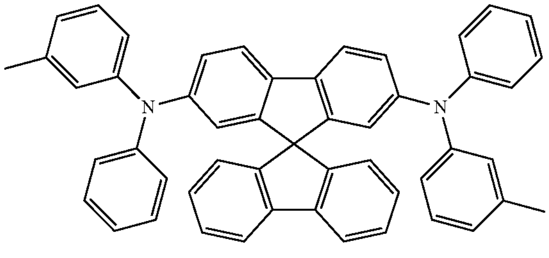
Spiro-TPD -continued

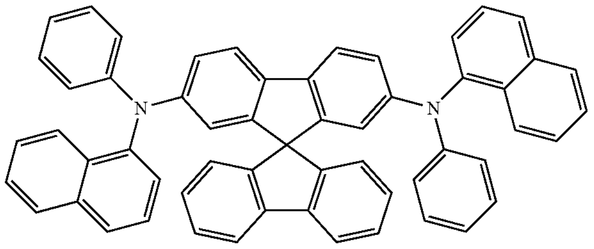

Spiro-NPB

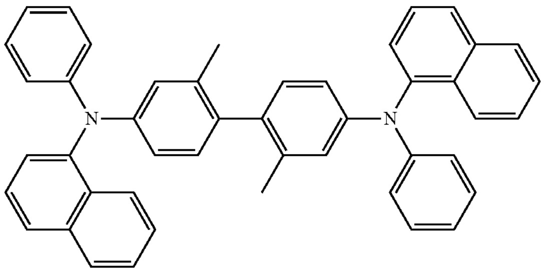

methylated-NPB

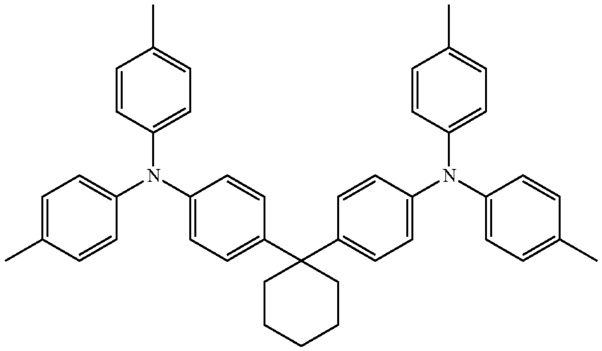

TAPC

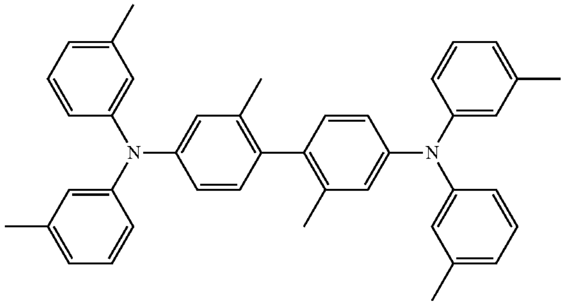

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron-blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221.

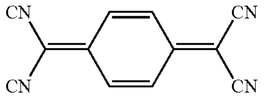

TCNQ

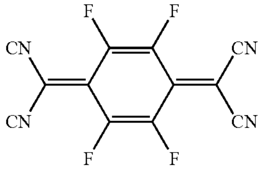

F4-TCNQ

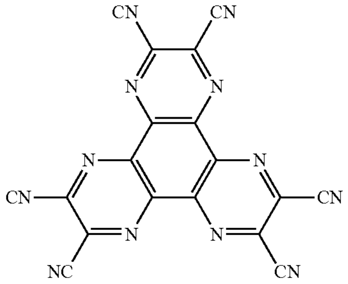

HAT-CN

[Formula 221]

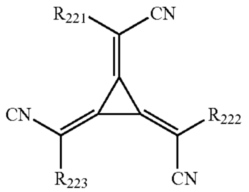

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, Tab, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers may contact each other or may be separated from each other. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The emission layer may include a first compound represented by Formula 1, according to an embodiment.

In an embodiment, the emission layer of the light-emitting device may include at least one of the first compound, the emission layer may further include a host, and an amount of the host in the emission layer may be greater than an amount of the first compound in the emission layer. In an embodiment, an amount of the first compound may be in a range of about 0.01 parts by weight to about 30 parts by weight based on 100 parts by weight of the host. In an embodiment, an amount of the first compound may be in a range of about 0.01 parts by weight to about 15 parts by weight based on 100 parts by weight of the host.

In an embodiment, the dopant may include a first compound represented by Formula 1 (as a second dopant) and a fourth compound represented by Formula 12 (as a first dopant).

In an embodiment, the host may include a second compound represented by Formula 10 (as a first host) and a third compound represented by Formula 11 (as a second host). A weight ratio of the first host to the second host may be, for example, in a range of about 3:7 to about 7:3. In an embodiment, the weight ratio of the first host to the second host may be in a range of about 3:7 to about 5:5. When the weight ratio is within the above range, transport of holes and transport of electrons may be balanced.

An amount of the dopant (the first dopant+the second dopant) may be in a range of about 0.01 parts by weight to about 30 parts by weight based on 100 parts by weight of the host (the first host+the second host). In an embodiment, the amount of the dopant may be in a range of about 0.01 parts by weight to about 15 parts by weight based on 100 parts by weight of the host. A weight ratio of the first dopant to the second dopant may be the same as described above.

In an embodiment, the emission layer may include the first compound, and the emission layer may emit blue light. In an embodiment, the emission layer may emit blue light having a maximum emission wavelength in a range of about 430 nm to about 485 nm. For example, the emission layer may emit blue light having a maximum emission wavelength in a range of about 440 nm to about 470 nm.

A thickness of the emission layer may be in a range of about 100 Å to about 1,000 Å. For example, the thickness of the emission layer may be in a range of about 200 Å to about 600 Å. When the thickness of the emission layer is within this range, excellent light-emission characteristics may be obtained without a substantial increase in driving voltage.

[Host]

The host may include a second compound represented by Formula 10:

[Formula 10]

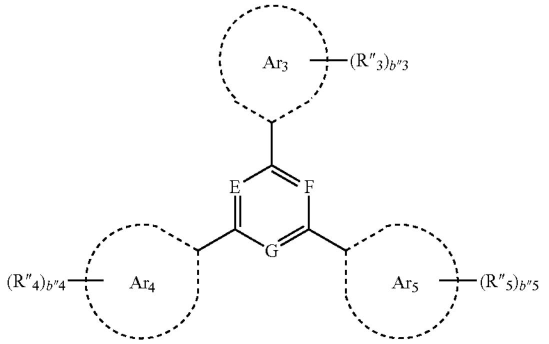

In Formula 10, ring $Ar_3$ to ring $Ar_5$ may each independently be a $C_5$-$C_{60}$ carbocyclic group or a $C_1$-$C_{60}$ heterocyclic group, E may be N or C(R"$_6$), F may be N or C(R"$_7$), and G may be N or C(R"$_8$), R"$_3$ to R"$_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), and b"3 to b"5 may each independently be an integer from 1 to 5.

When b"3 in Formula 10 is 2 or more, multiple R"$_3$(s) may be identical to or different from each other. When b"4 is 2 or more, multiple R"$_4$(s) may be identical to or different from each other. When b"5 is 2 or more, multiple R"$_5$(s) may be identical to or different from each other.

Two neighboring substituents among R"$_3$ to R"$_8$ in Formula 10 may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the second compound represented by Formula 10 may be one selected from Compounds ETH1 to ETH84:

ETH1

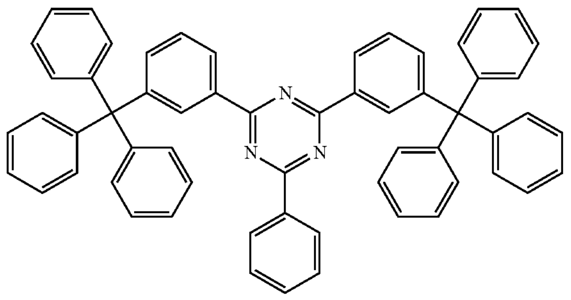

ETH2

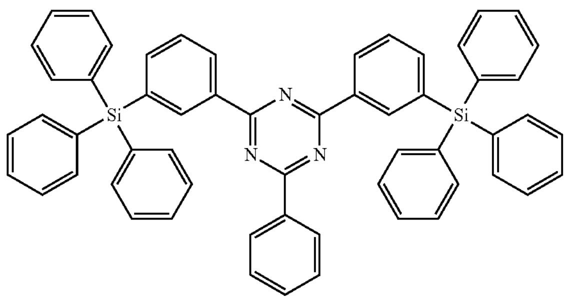

ETH3

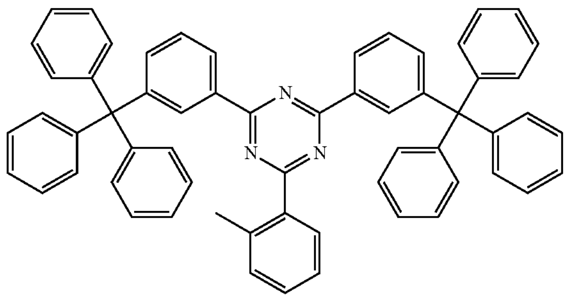

ETH4

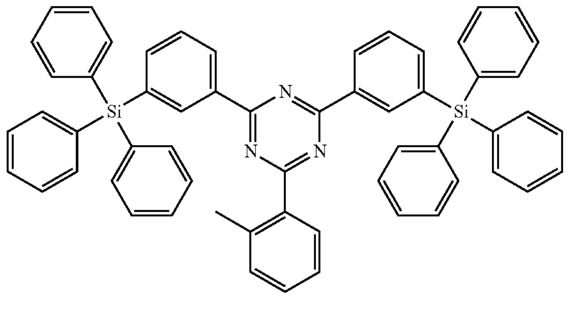

-continued

ETH5

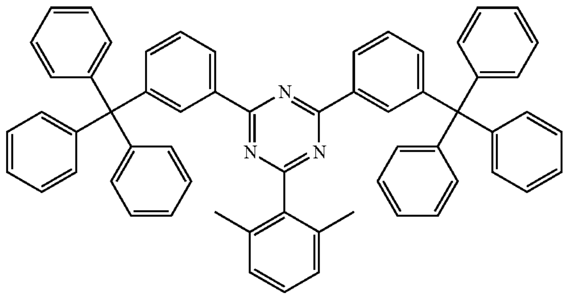

ETH6

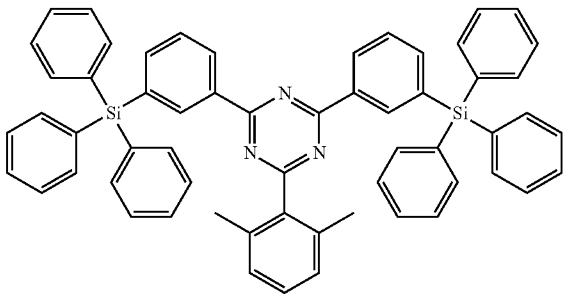

ETH7

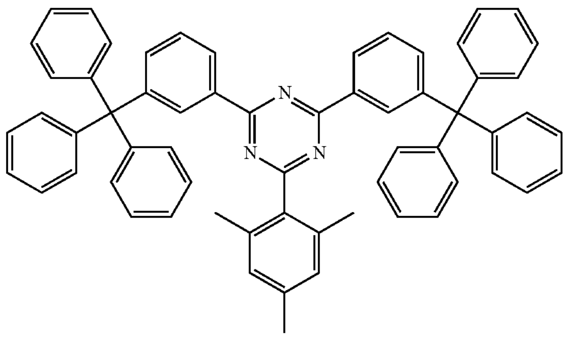

ETH8

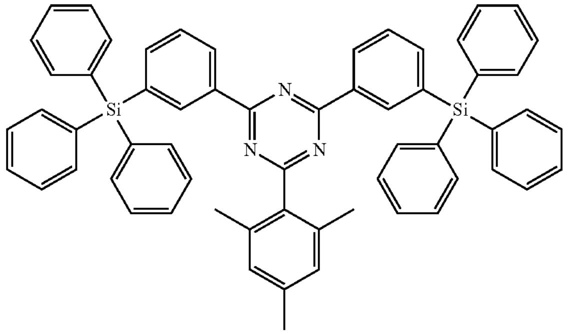

-continued
ETH9
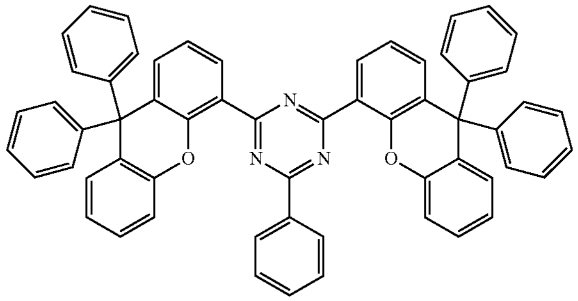
ETH10
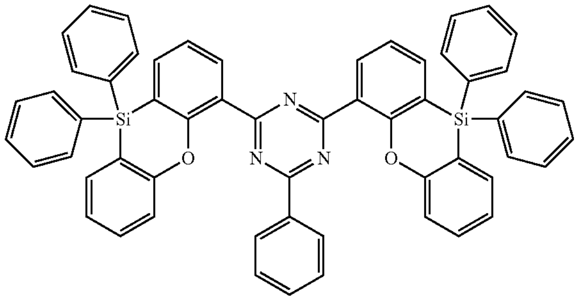
ETH11
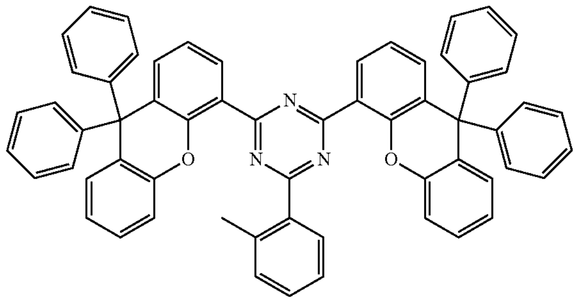
ETH12
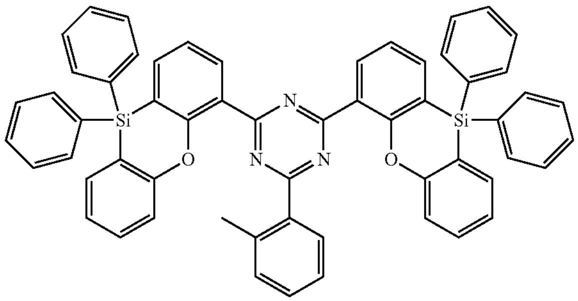
ETH13
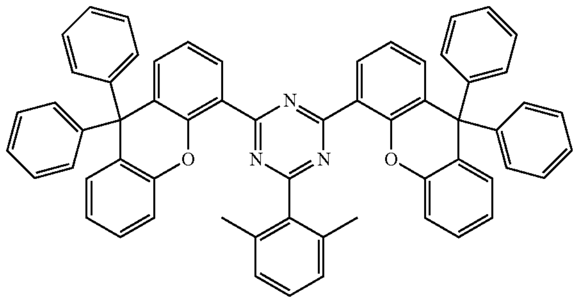
-continued
ETH14
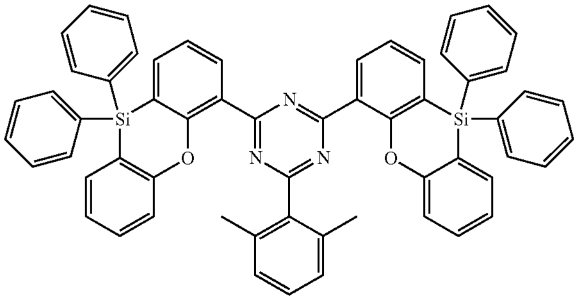
ETH15
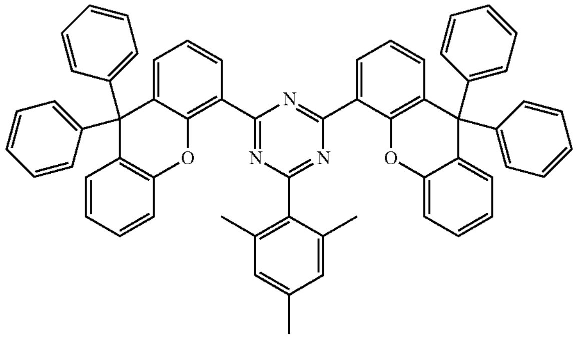
ETH16
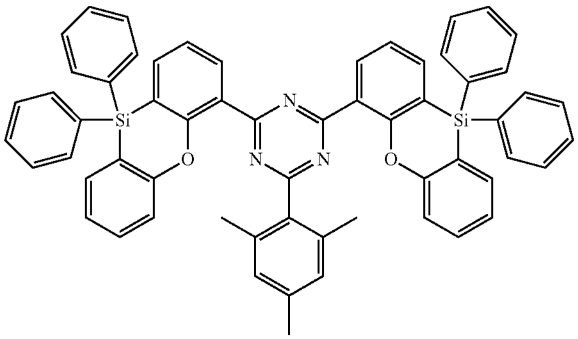
ETH17
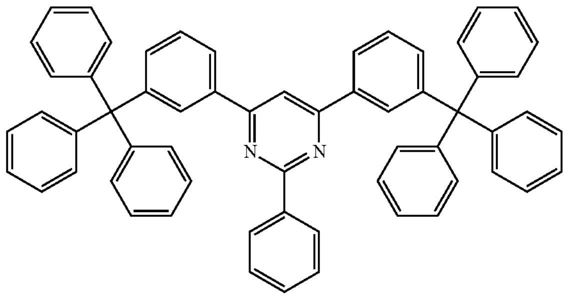

-continued
ETH18
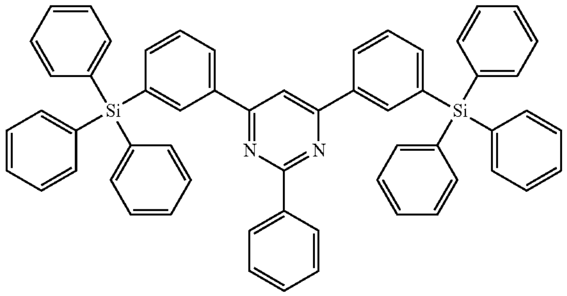
ETH19
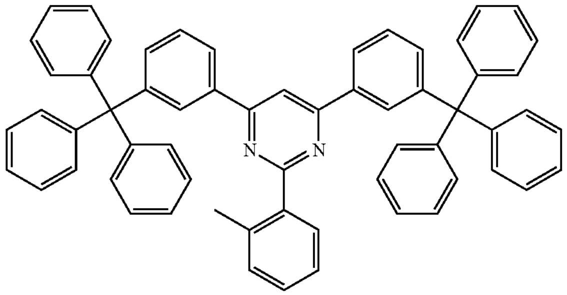
ETH20
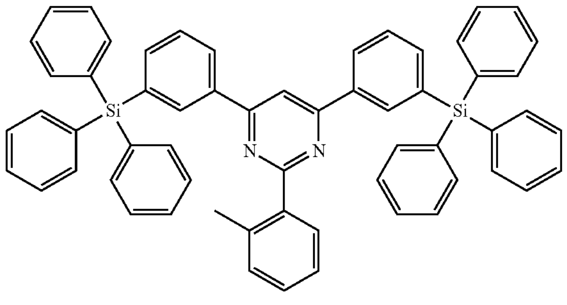
ETH21
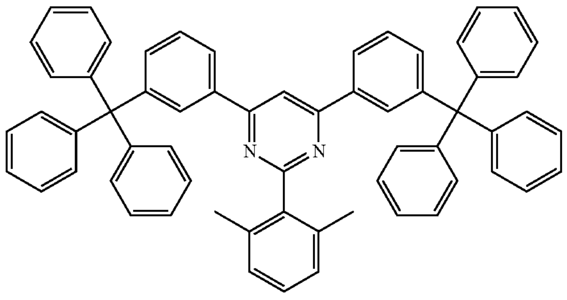
ETH22
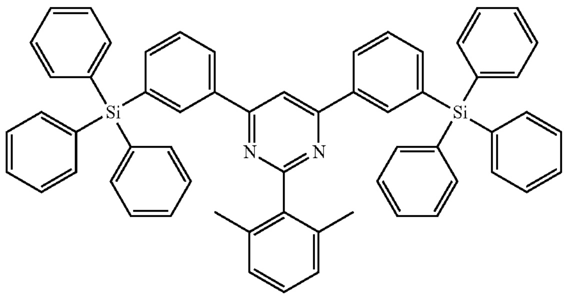
-continued
ETH23
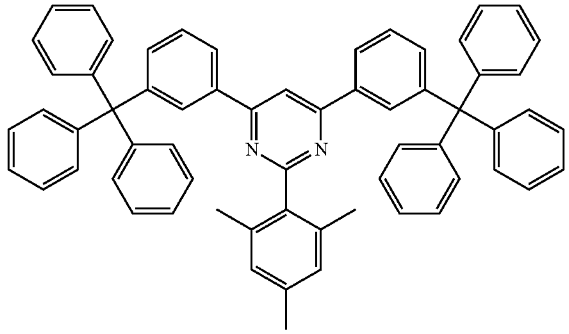
ETH24
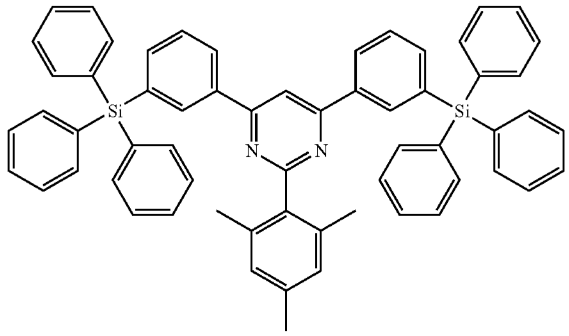
ETH25
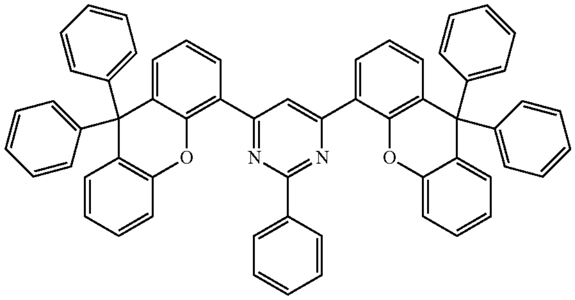
ETH26
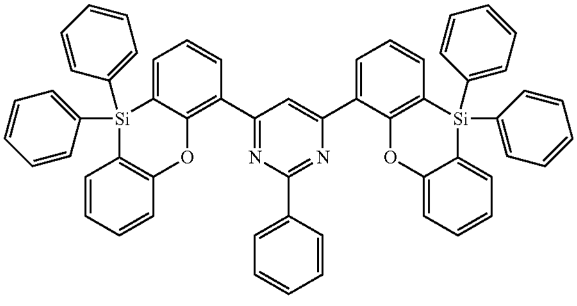

-continued
ETH27
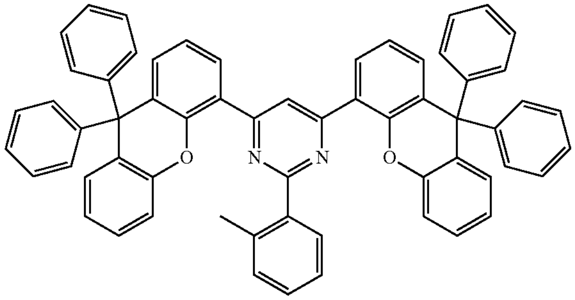
ETH28
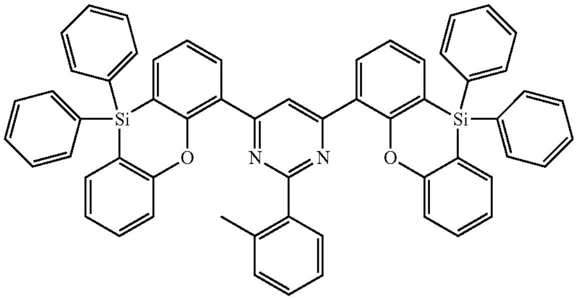
ETH29
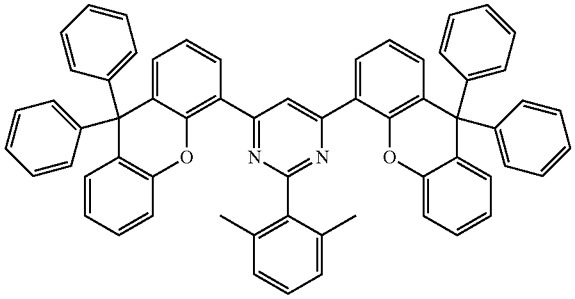
ETH30
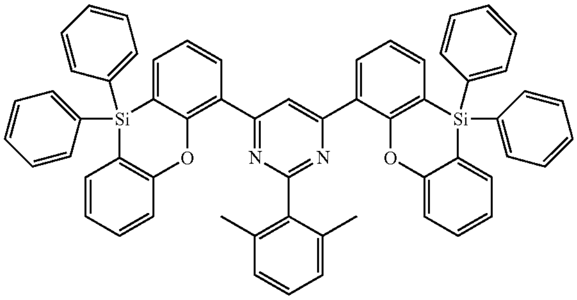
-continued
ETH31
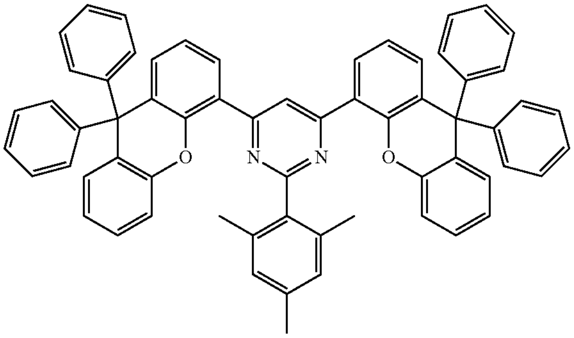
ETH32
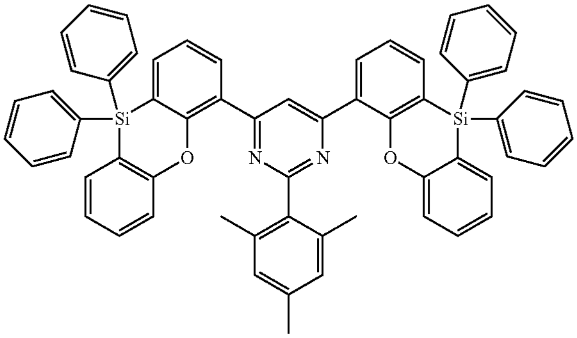
ETH33
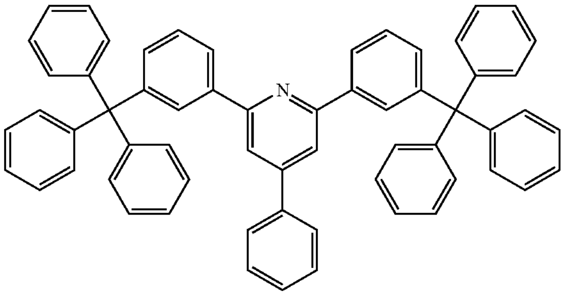
ETH34
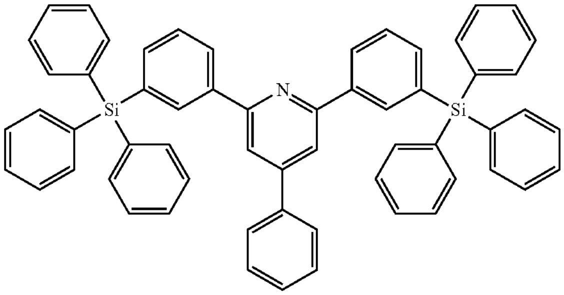

-continued
ETH35
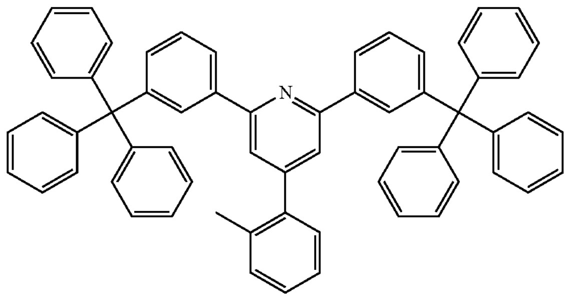
ETH36
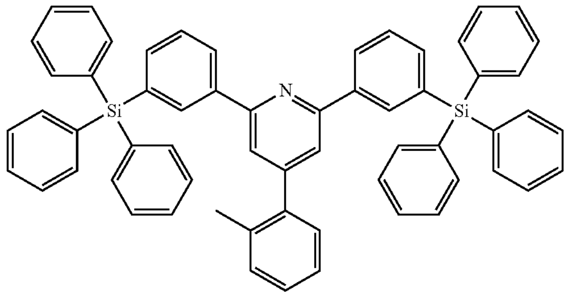
ETH37
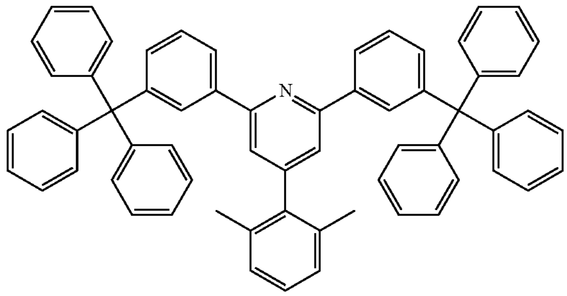
ETH38
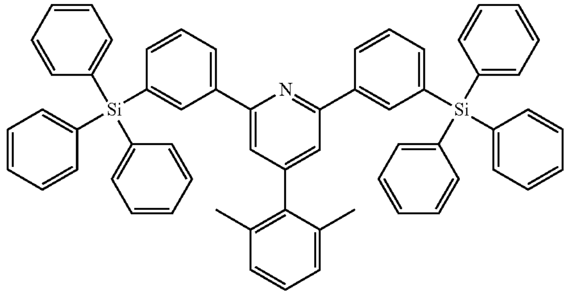
ETH39
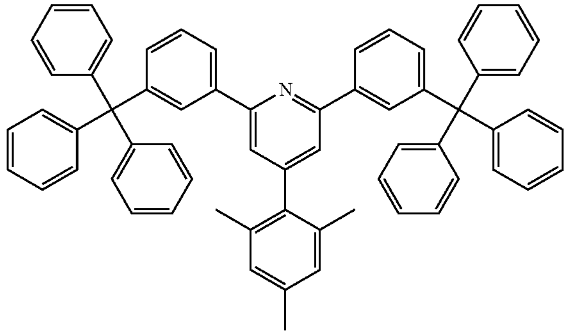
-continued
ETH40
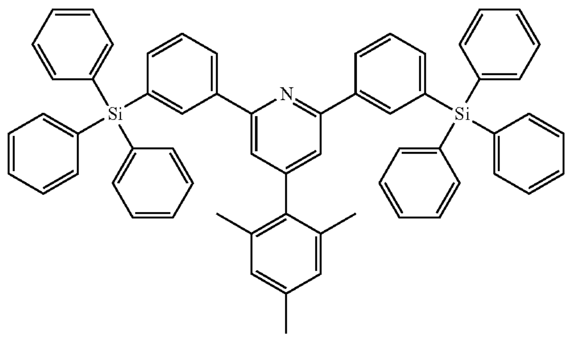
ETH41
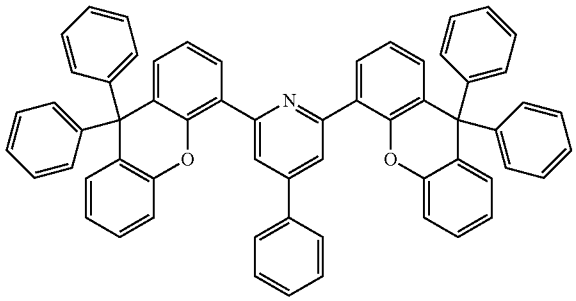
ETH42
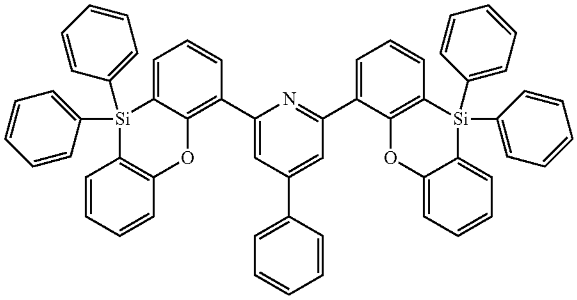
ETH43
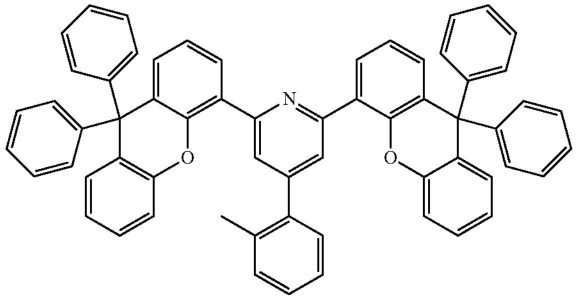
ETH44
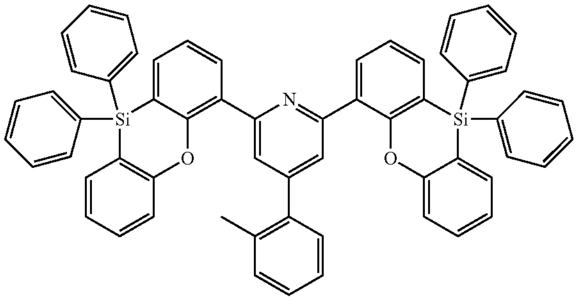

-continued
ETH45
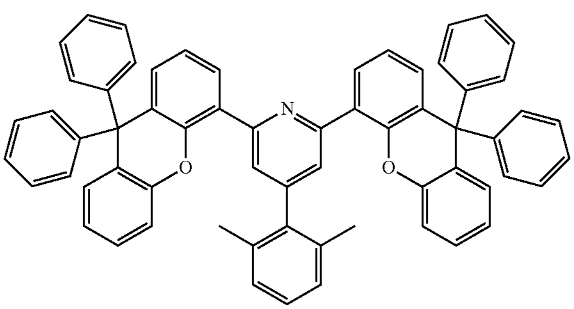
ETH46
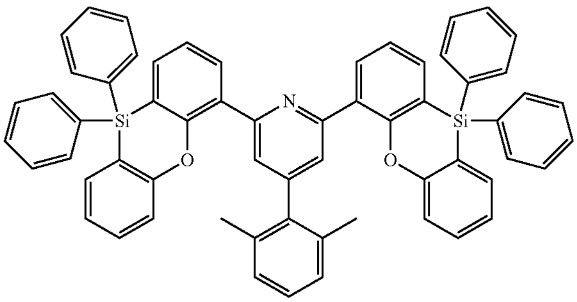
ETH47
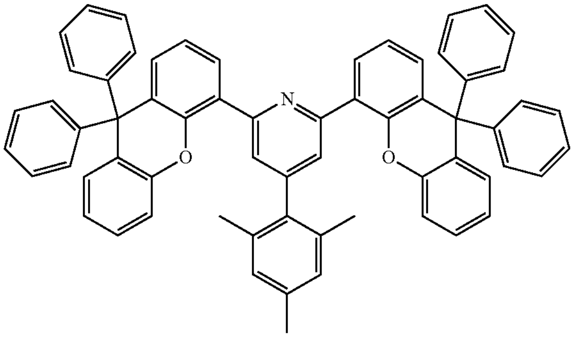
ETH48
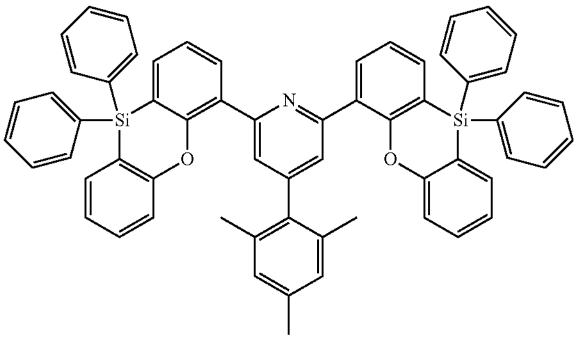
-continued
ETH49
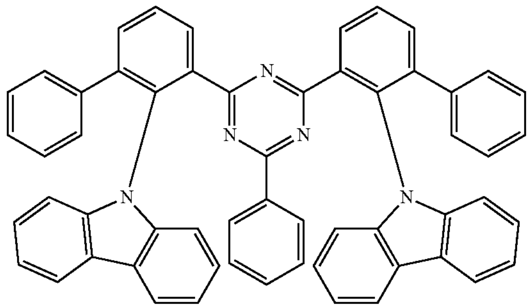
ETH50
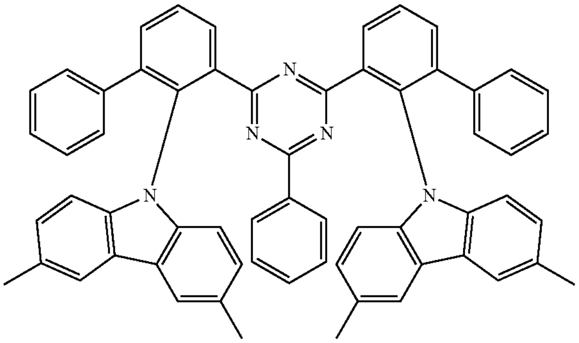
ETH51
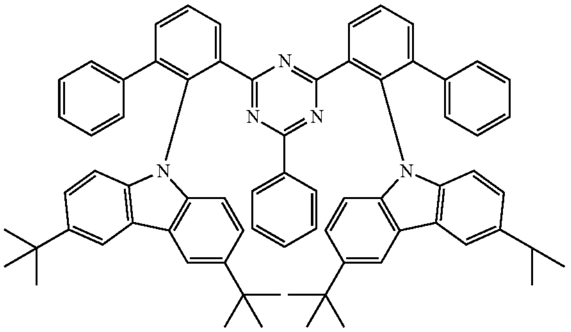
ETH52
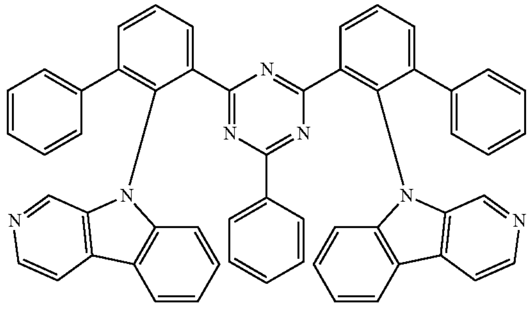

-continued
ETH53
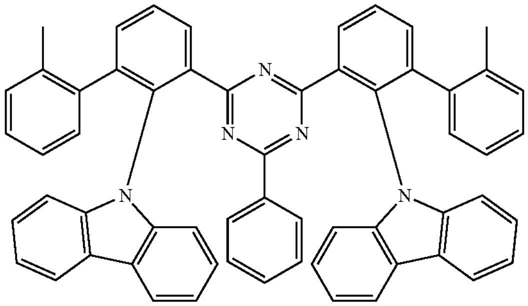
ETH54
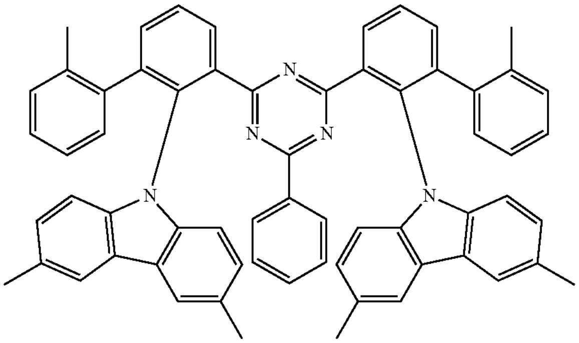
ETH55
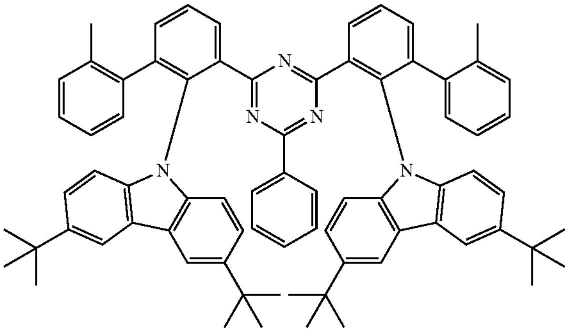
ETH56
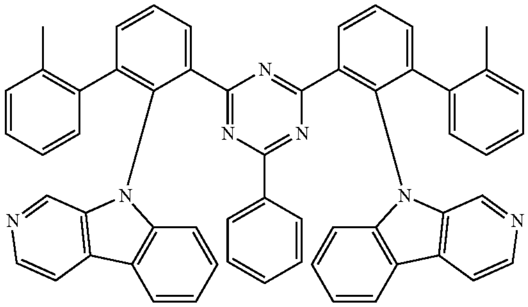
-continued
ETH57
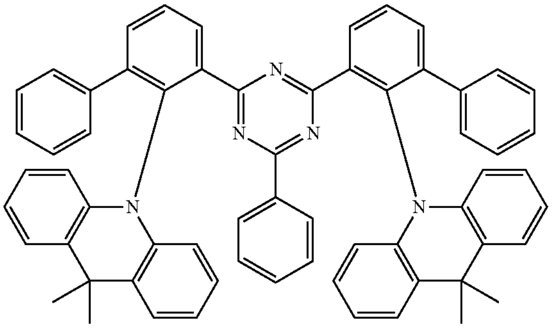
ETH58
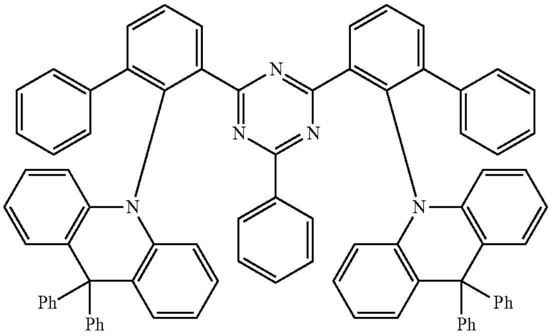
ETH59
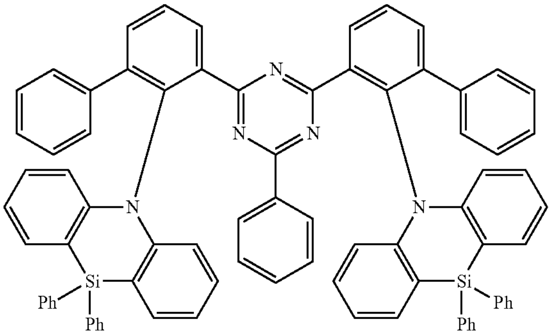
ETH60
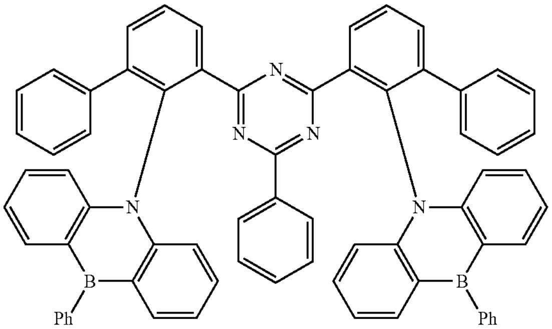

-continued
ETH61
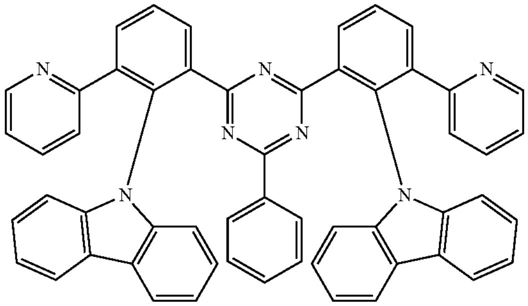
ETH62
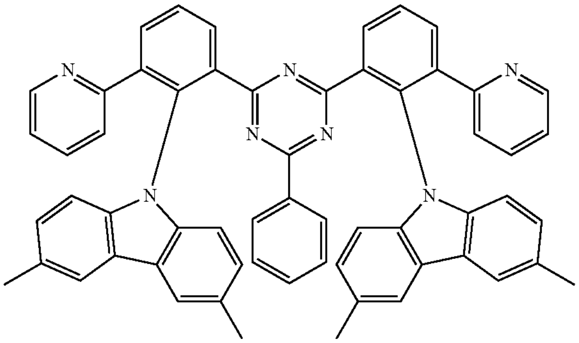
ETH63
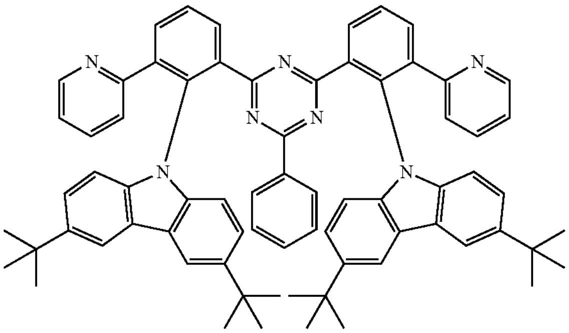
ETH64
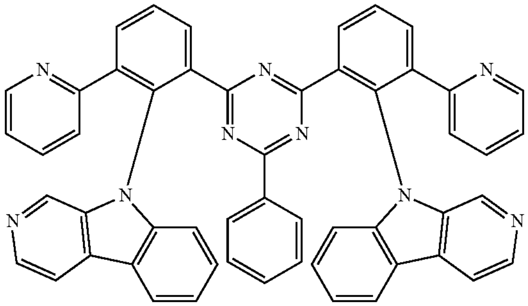
-continued
ETH65
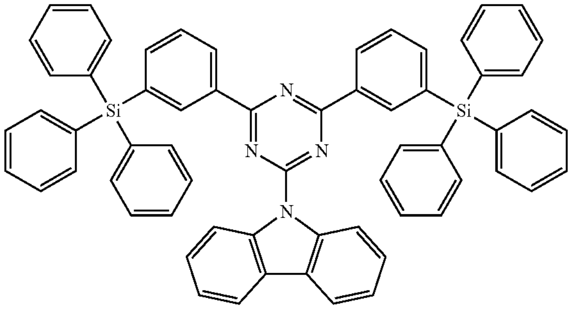
ETH66
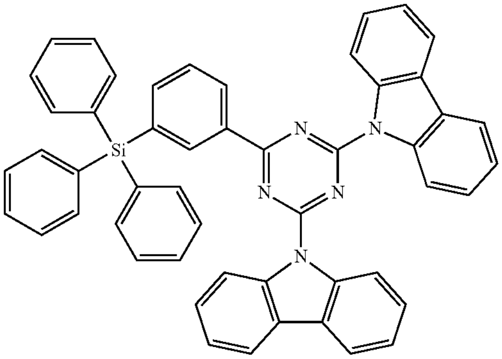
ETH67
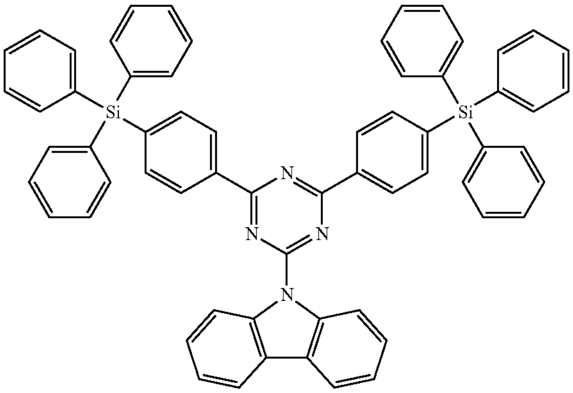
ETH68
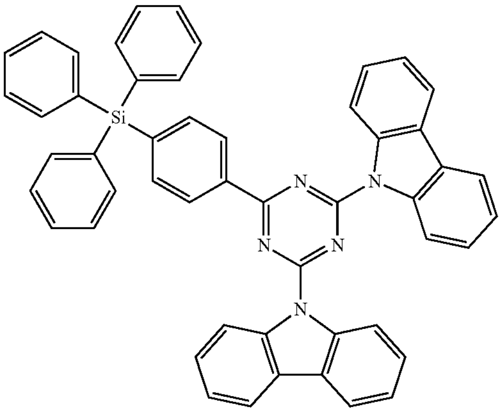

-continued
ETH69
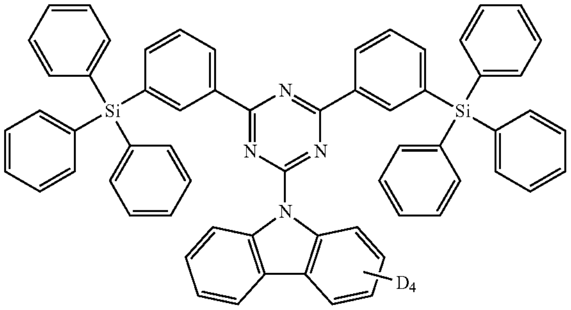
ETH70
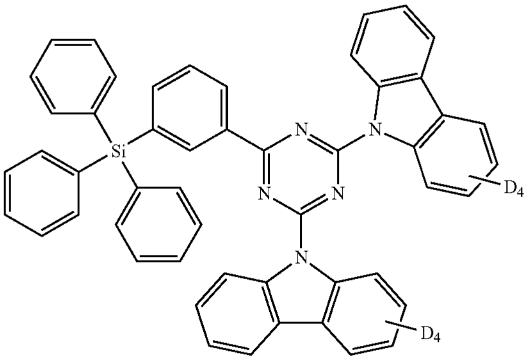
ETH71
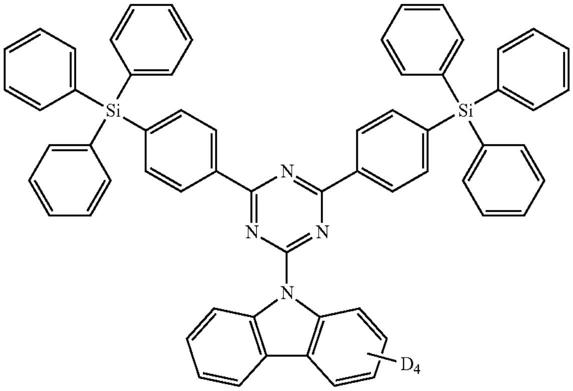
ETH72
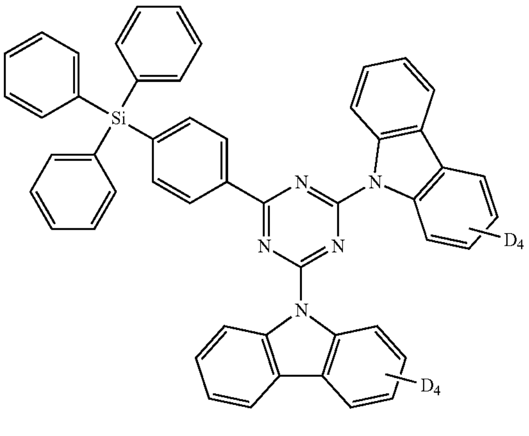
-continued
ETH73
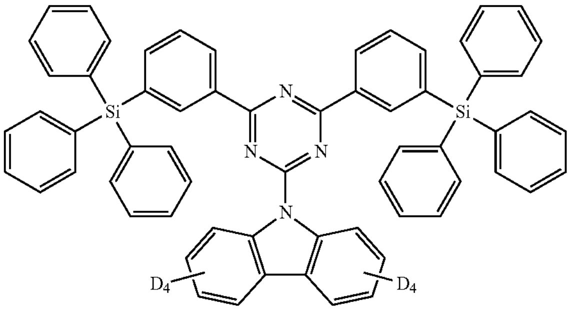
ETH74
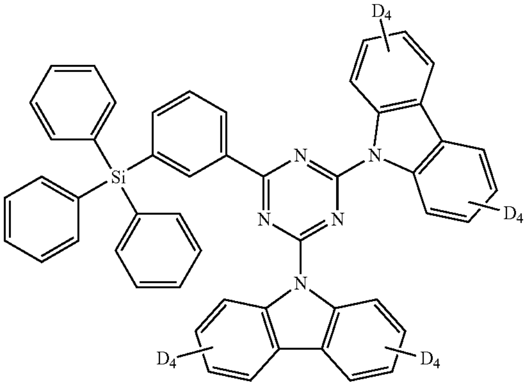
ETH75
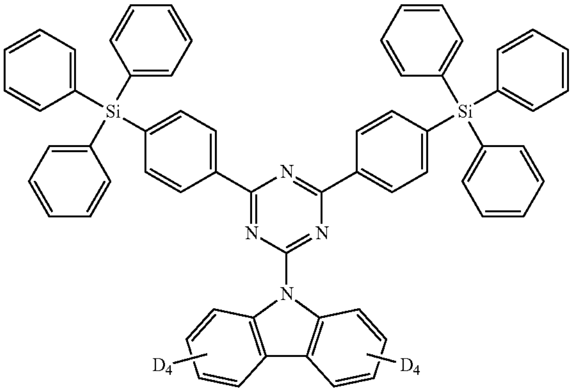
ETH76
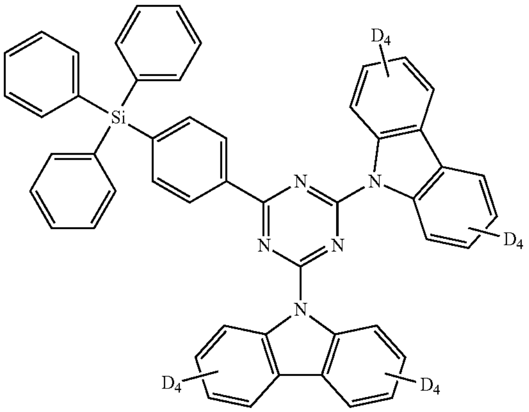

-continued
ETH77
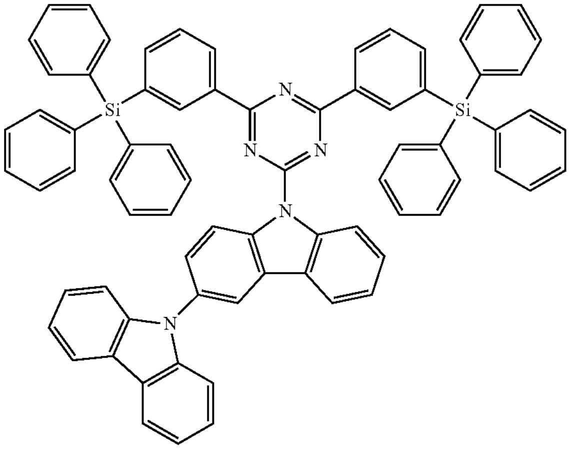
ETH78
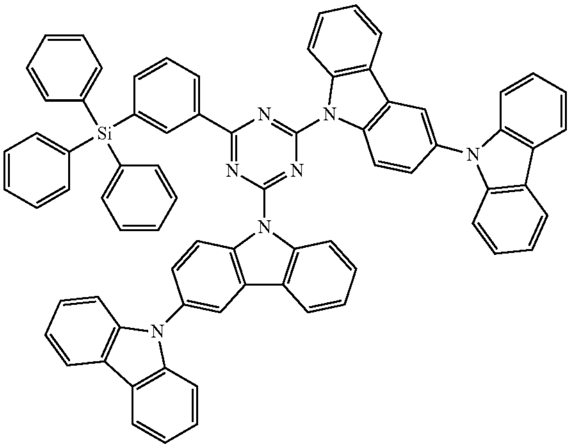
ETH79
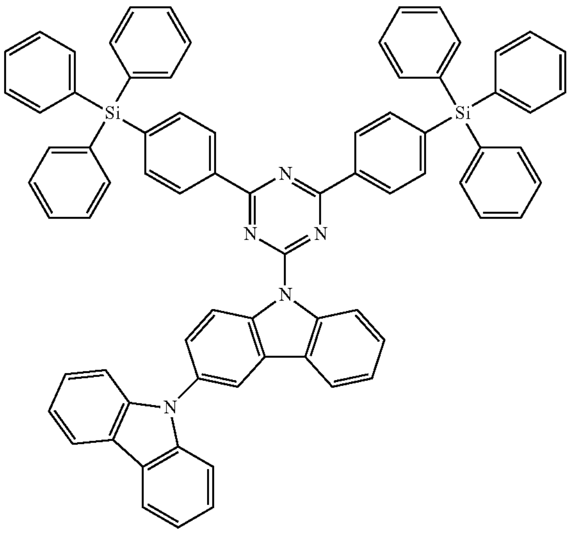
-continued
ETH80
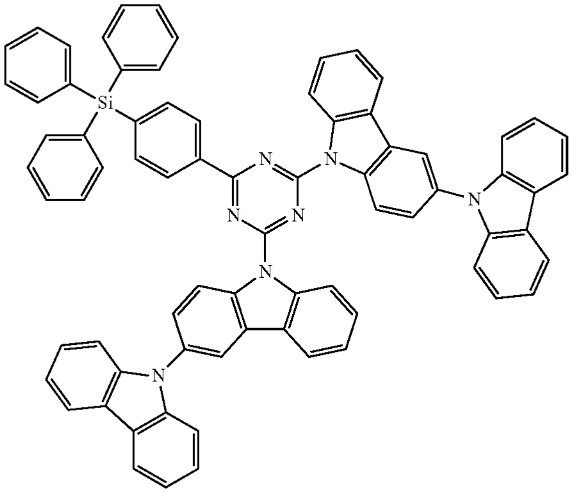
ETH81
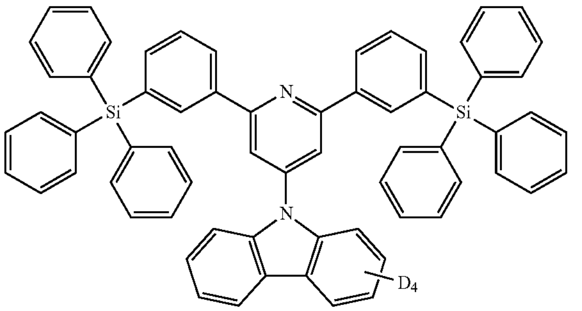
ETH82
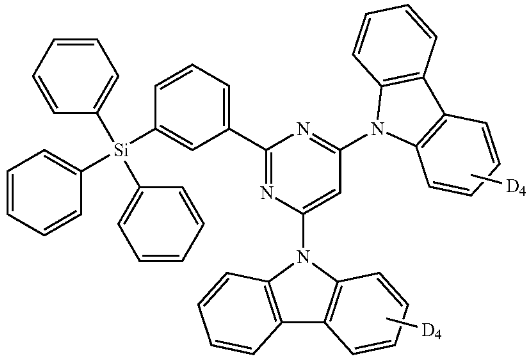
ETH83
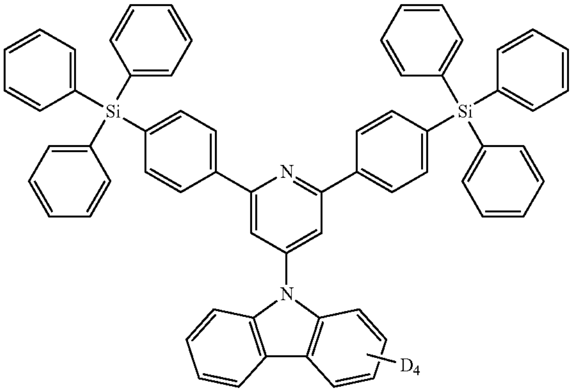

-continued

ETH84

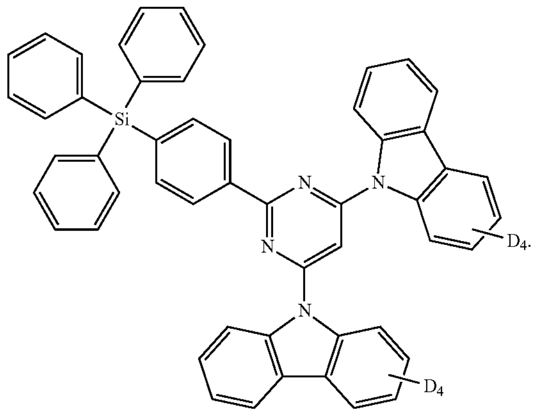

In Compounds ETH1 to ETH84, $D_4$ indicates that four deuterium atoms are substituted at the indicated moiety.

The host may include a third compound represented by Formula 11:

[Formula 11]

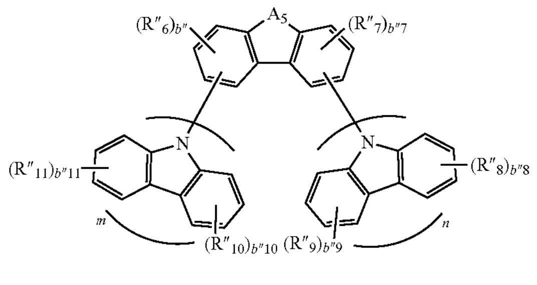

In Formula 11, $A_5$ may be O, S, N(R"$_{12}$), or C(R"$_{13}$)(R"$_{14}$), m and n may each independently be an integer from 0 to 4, R"$_6$ to R"$_{14}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), and b"6 to b"11 may each independently be an integer from 0 to 4.

When b"6 in Formula 11 is 2 or more, multiple R"$_6$(s) may be identical to or different from each other. When b"7 is 2 or more, multiple R"$_7$(s) may be identical to or different from each other. When b"8 is 2 or more, multiple R"$_8$(s) may be identical to or different from each other. When b"9 is 2 or more, multiple R"$_9$(s) may be identical to or different from each other. When b"10 is 2 or more, multiple R"$_{10}$(s) may be identical to or different from each other. When b"11 is 2 or more, multiple R"$_{11}$(s) may be identical to or different from each other.

Two neighboring substituents among R"$_6$ to R"$_{14}$ in Formula 11 may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the third compound represented by Formula 11 may be one selected from Compounds HTH1 to HTH52:

HTH1

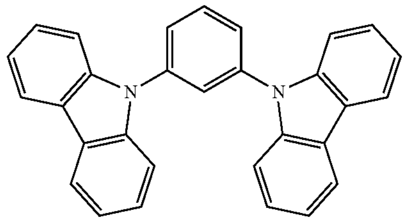

HTH2

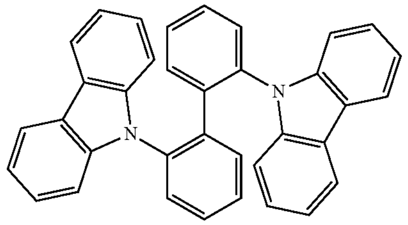

HTH3

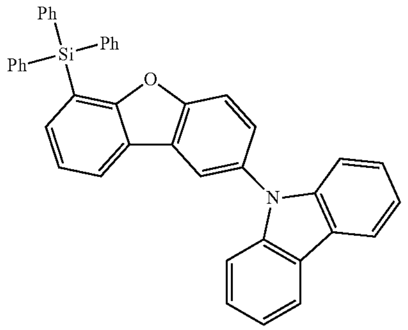

-continued
HTH4
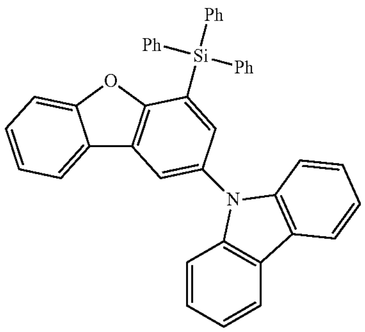
HTH5
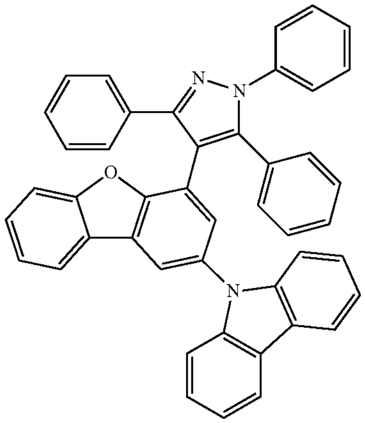
HTH6
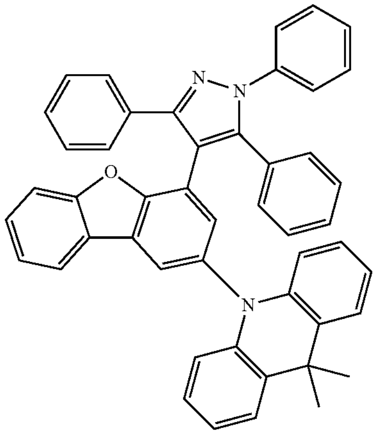
HTH7
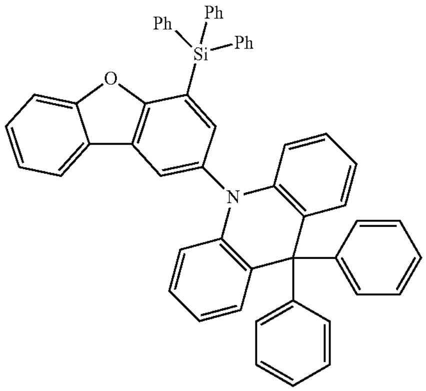
-continued
HTH8
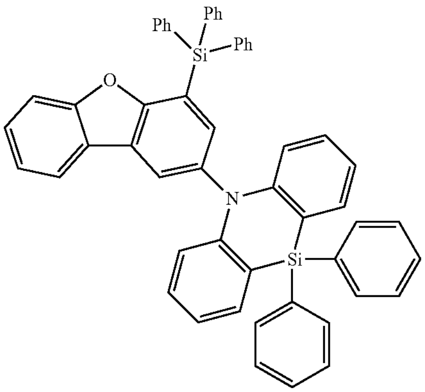
HTH9
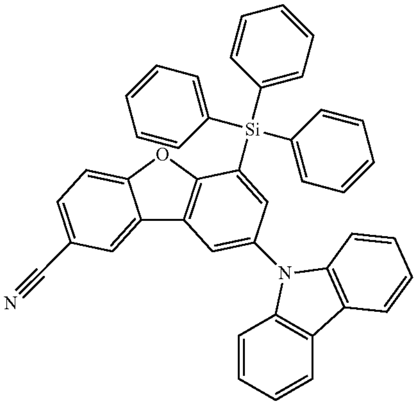
HTH10
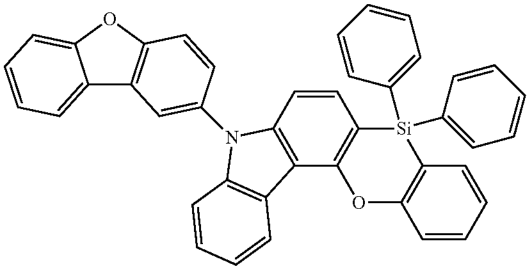
HTH11
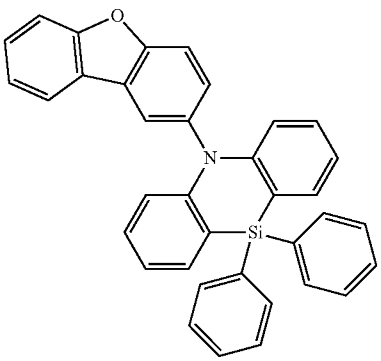

-continued
HTH12
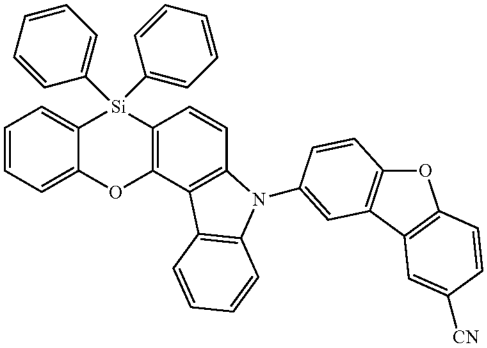
HTH13
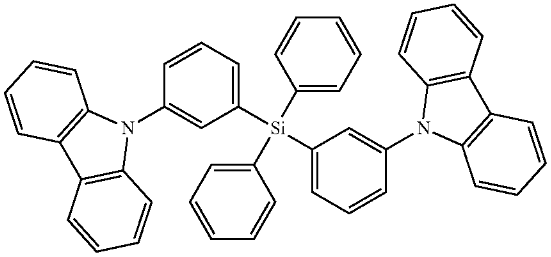
HTH14
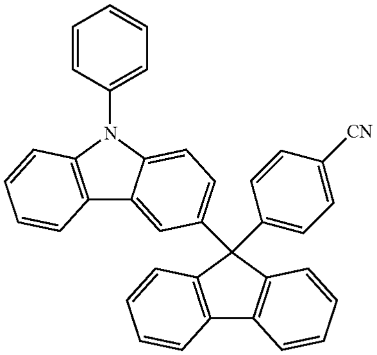
HTH15
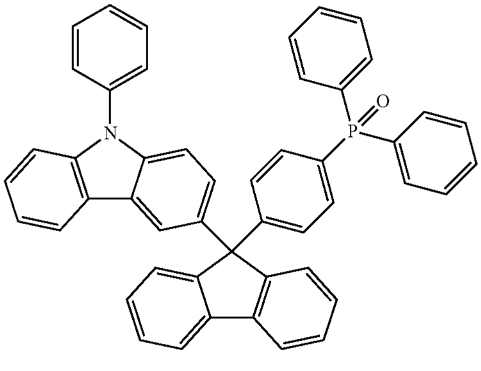
-continued
HTH16
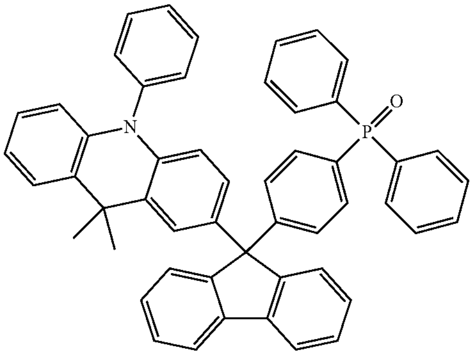
HTH17
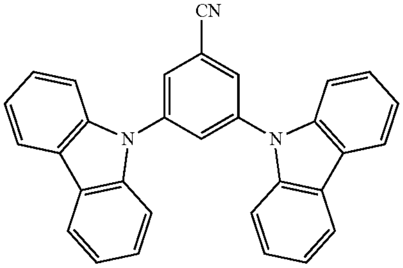
HTH18
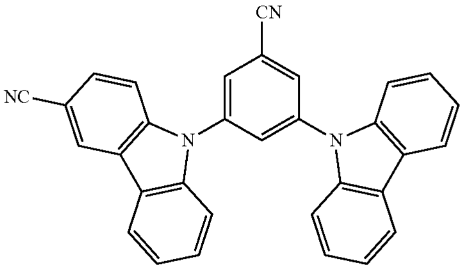
HTH19
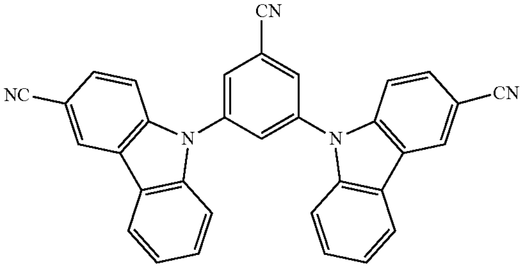
HTH20
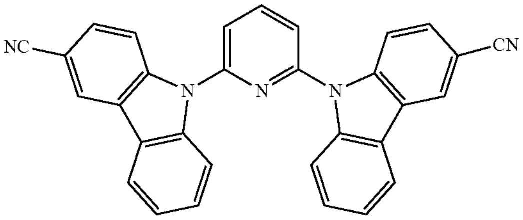

-continued
HTH21
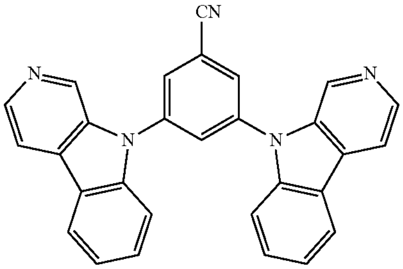
HTH22
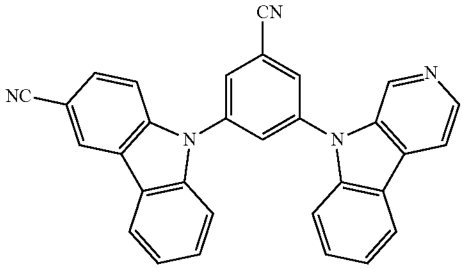
HTH23
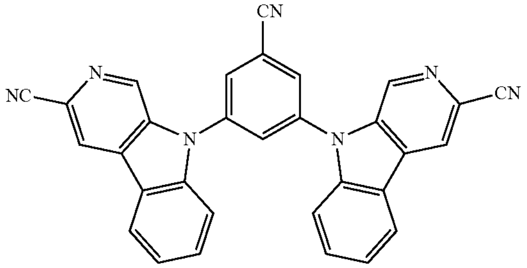
HTH24
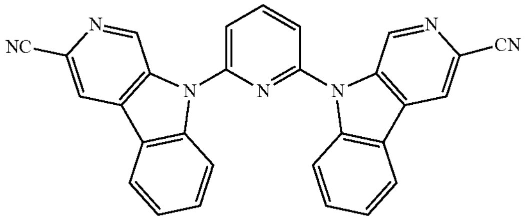
HTH25
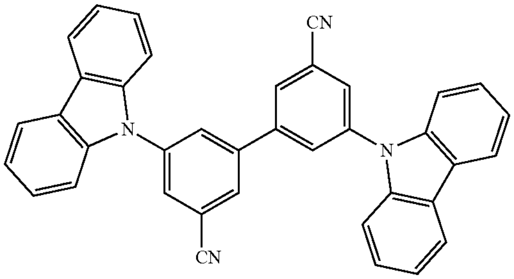
-continued
HTH26
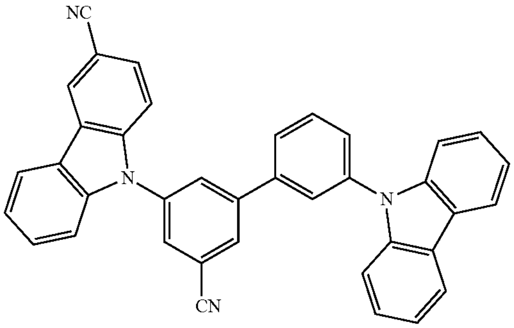
HTH27
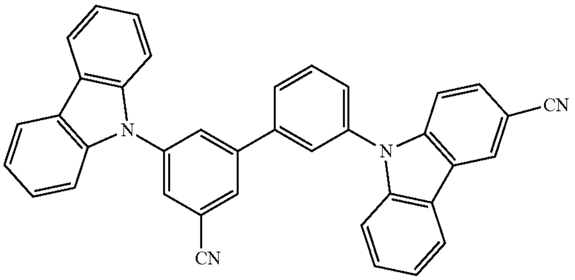
HTH28
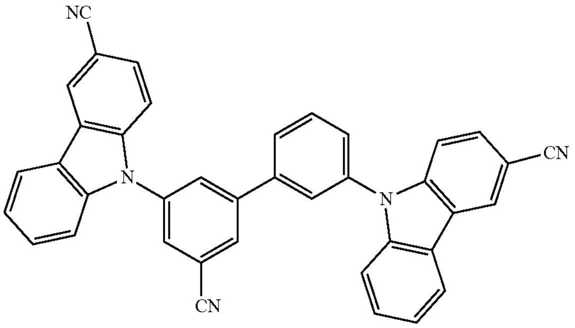
HTH29
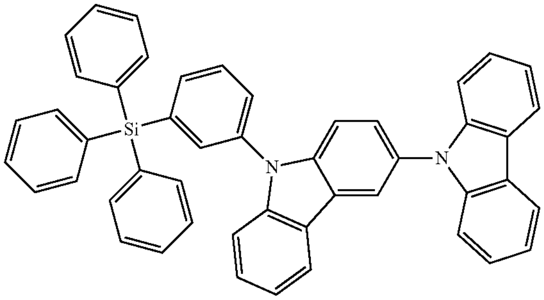

-continued
HTH30
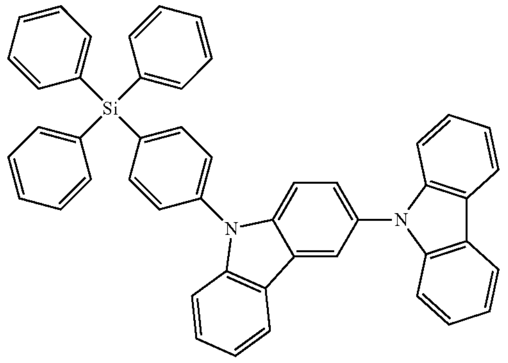
HTH31
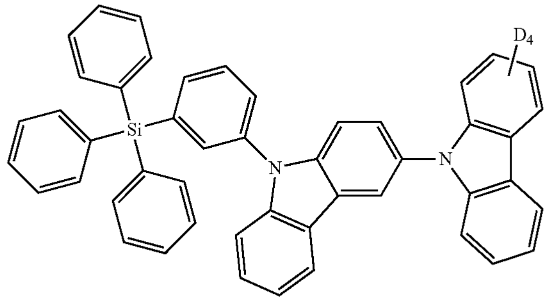
HTH32
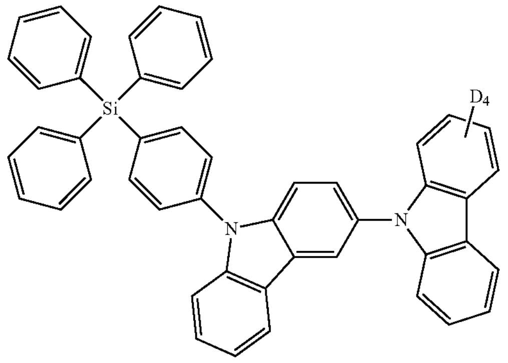
HTH33
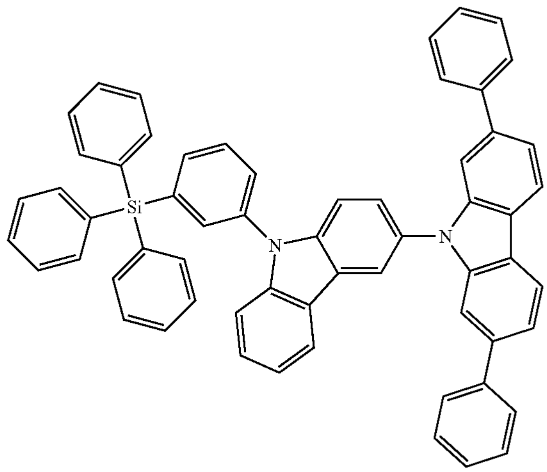
-continued
HTH34
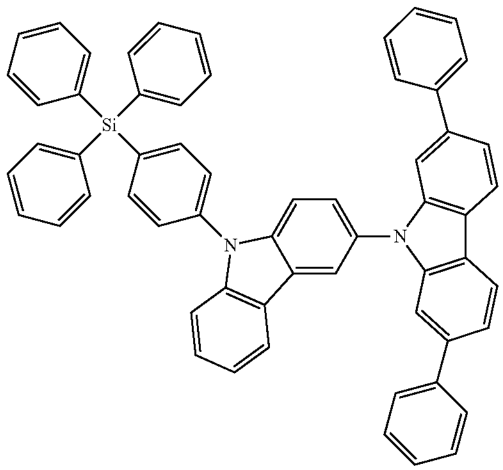
HTH35
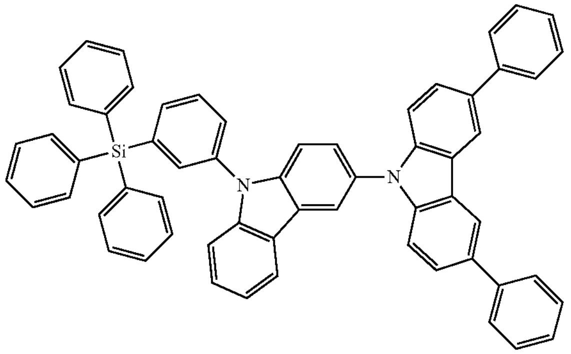
HTH36
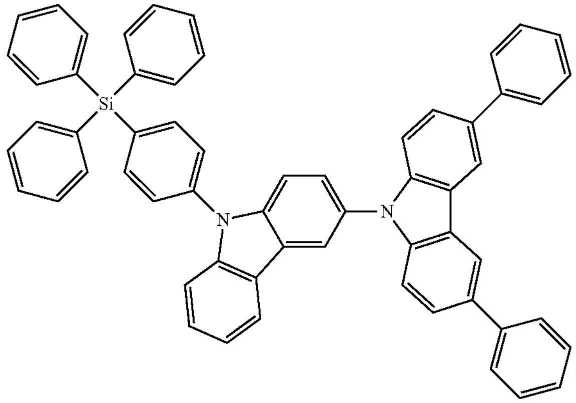
HTH37
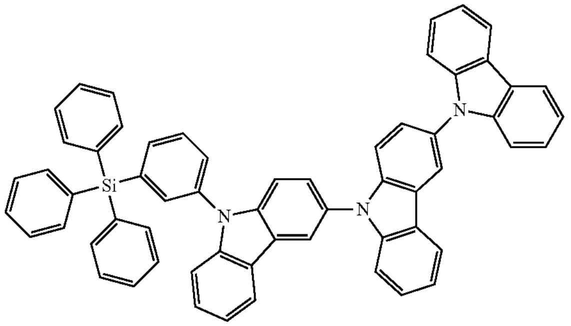

-continued
HTH38
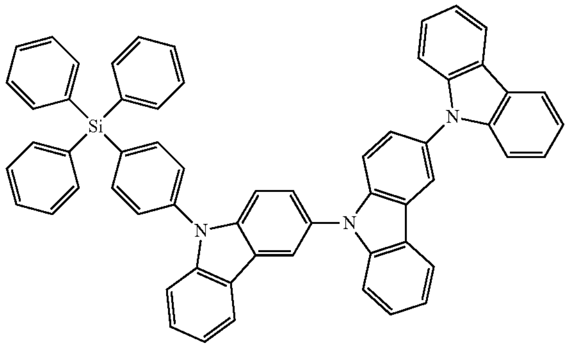
HTH39
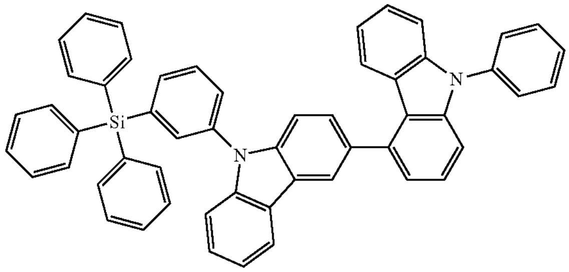
HTH40
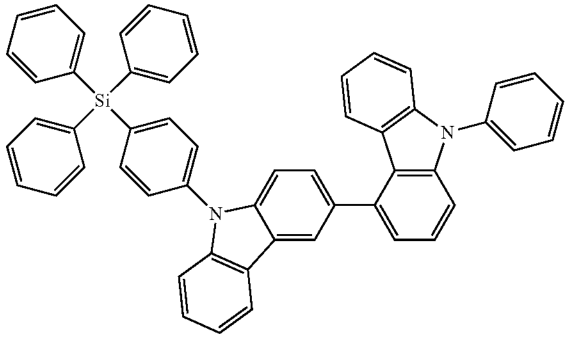
HTH41
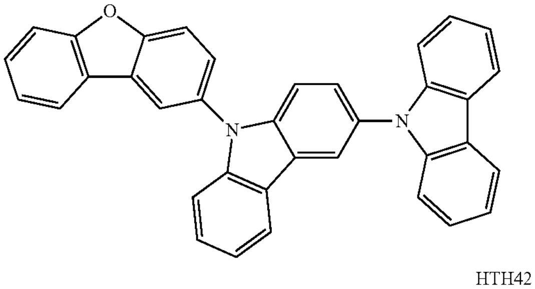
HTH42
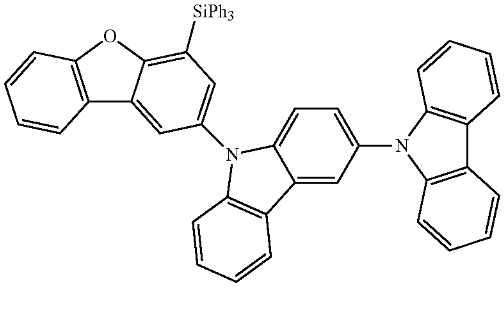
-continued
HTH43
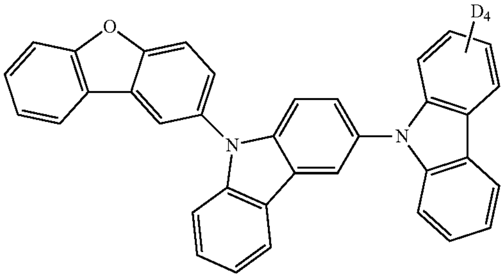
HTH44
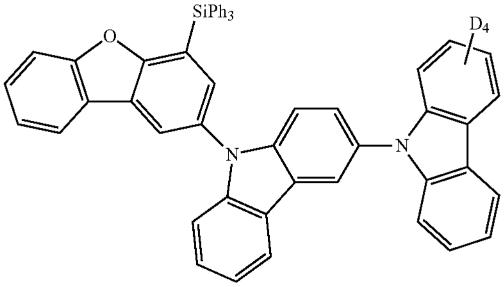
HTH45
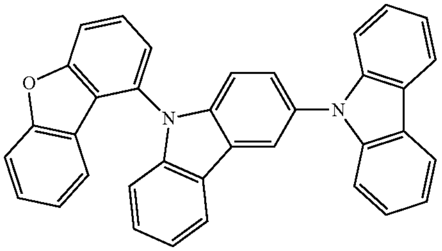
HTH46
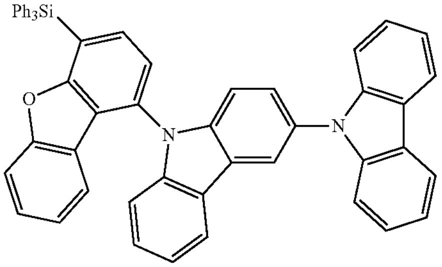
HTH47
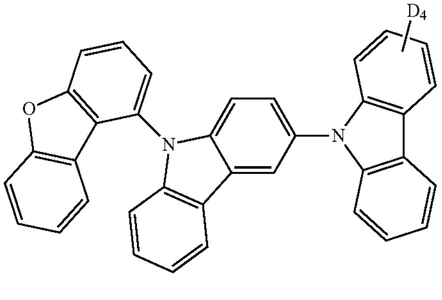

-continued

HTH48

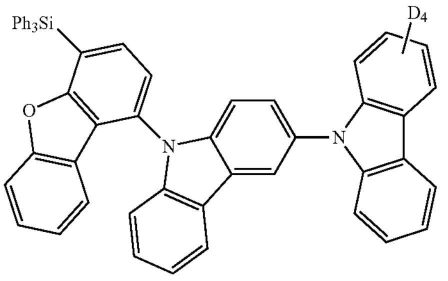

HTH49

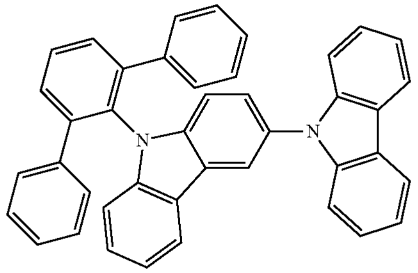

HTH50

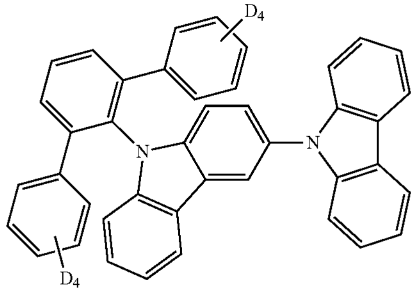

HTH51

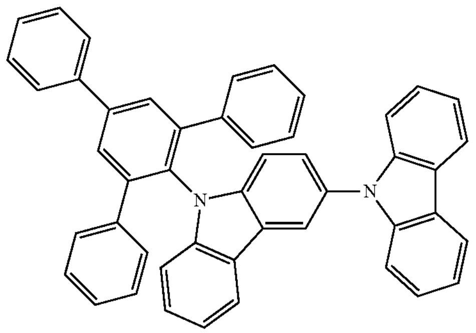

HTH52

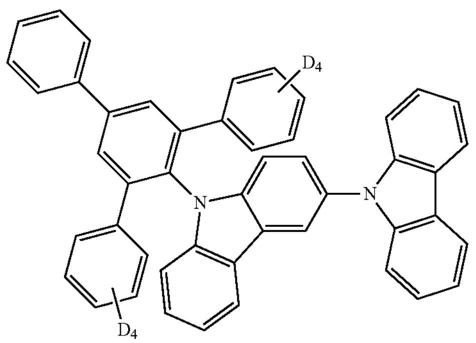

In Compounds HTH1 to HTH52, $D_4$ indicates that four deuterium atoms are substituted at the indicated moiety

[Phosphorescent Dopant]

The phosphorescent dopant may include the organometallic compound represented by Formula 1 according to an embodiment.

[Delayed Fluorescence Material]

The emission layer may include a fourth compound represented by Formula 12:

[Formula 12]

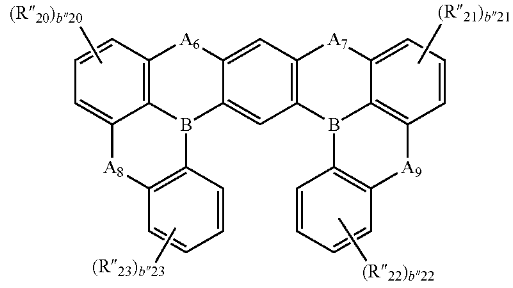

In Formula 12, $A_6$ may be O, S, N(R"$_{24}$), or C(R"$_{25}$)(R"$_{26}$), $A_7$ may be O, S, N(R"$_{27}$), or C(R"$_{28}$)(R"$_{29}$), $A_8$ may be O, S, N(R"$_{30}$), or C(R"$_{31}$)(R"$_{32}$), and $A_9$ may be O, S, N(R"$_{33}$), or C(R"$_{34}$)(R"$_{35}$), R"$_{20}$ to R"$_{35}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b"20 and b"21 may each independently be an integer from 0 to 3, and b"22 and b"23 may each independently be an integer from 0 to 4.

When b"20 in Formula 12 is 2 or more, multiple R"$_{20}$(s) may be identical to or different from each other. When b"21 is 2 or more, multiple R"$_{21}$(s) may be identical to or different from each other. When b"22 is 2 or more, multiple R"$_{22}$(s) may be identical to or different from each other. When b"23 is 2 or more, multiple R"$_{23}$(s) may be identical to or different from each other.

Two neighboring substituents among $R''_{20}$ to $R''_{35}$ in Formula 12 may optionally be linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the fourth compound represented by Formula 12 may be one of the following compounds:

DFD1

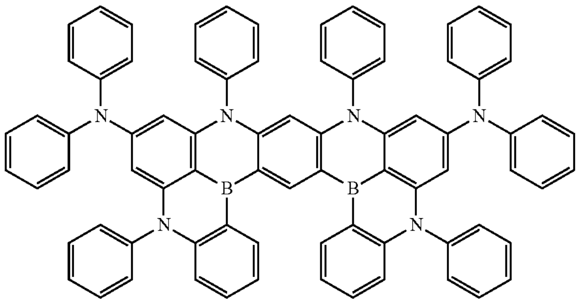

DFD2

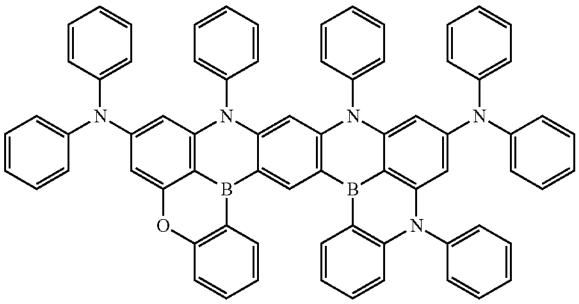

DFD3

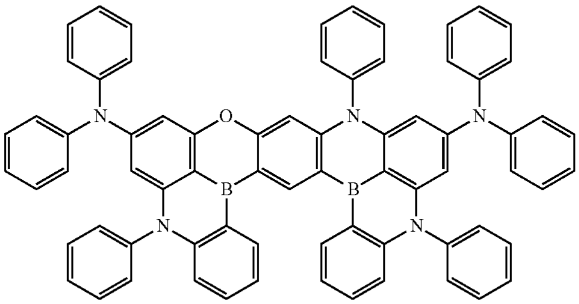

DFD4

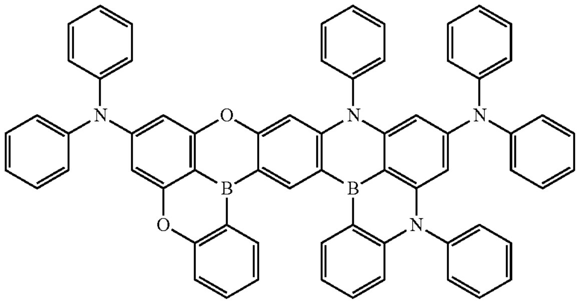

-continued

DFD5

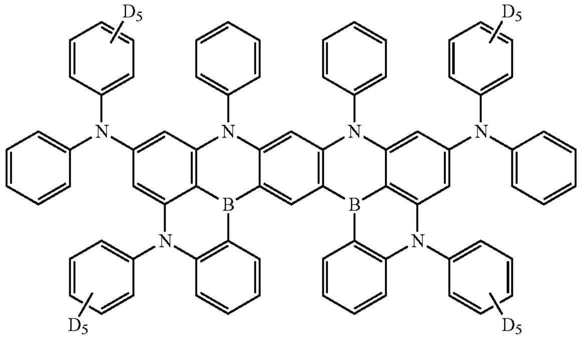

DFD6

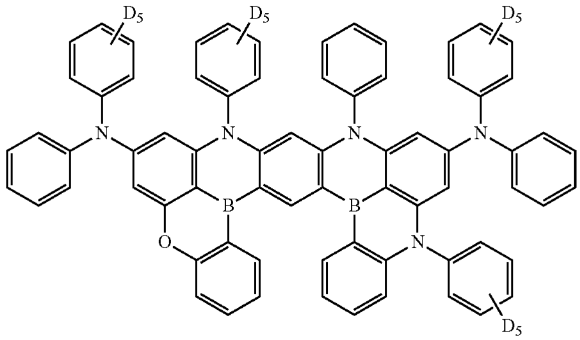

DFD7

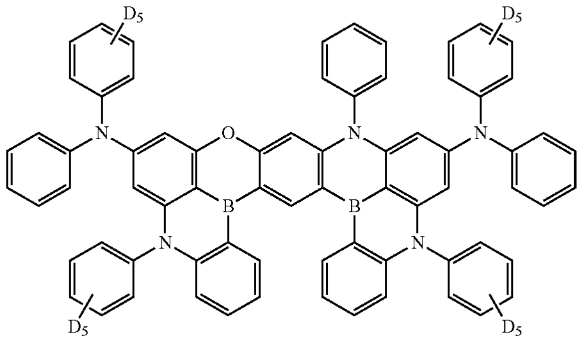

DFD8

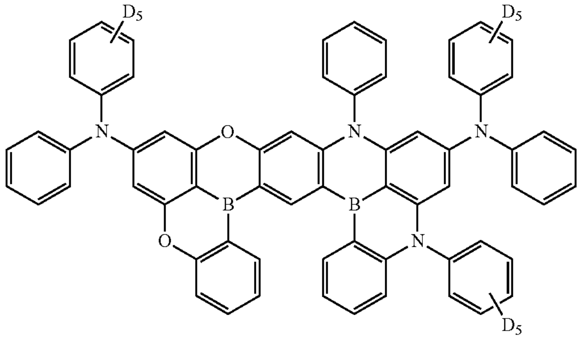

-continued

DFD9

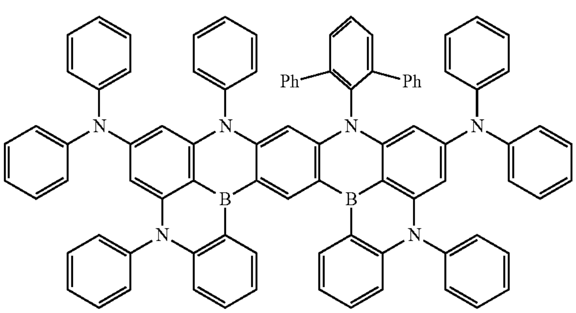

DFD10

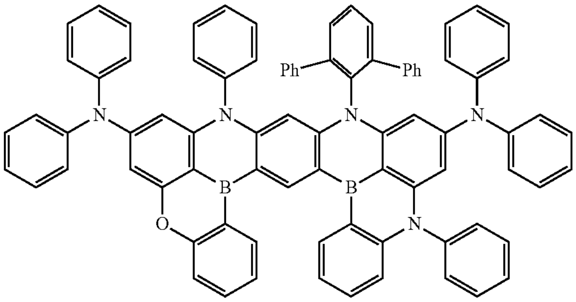

DFD11

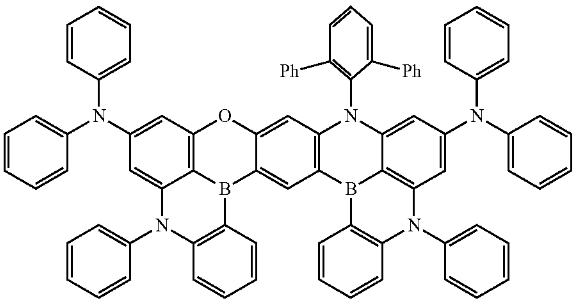

DFD12

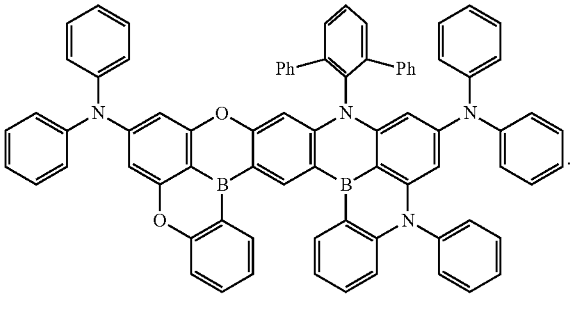

In Compounds DFD1 to DFD12, $D_5$ indicates that five deuterium atoms are substituted at the indicated moiety.

[Electron Transport Region in Interlayer 130]

The electron transport region may have a structure consisting of a layer consisting of a single material, a structure consisting of a layer consisting of different materials, or a multi-layered structure including layers including different materials.

The electron transport region may include a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or an electron transport layer/electron injection layer structure, wherein, for each structure, constituting layers may be stacked from an emission layer in its respective stated order.

The electron transport region (for example, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \quad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In embodiments, $Ar_{601}$ in Formula 601 may be a substituted or unsubstituted anthracene group.

In embodiments, the electron transport region may include a compound represented by Formula 601-1:

[Formula 601-1]

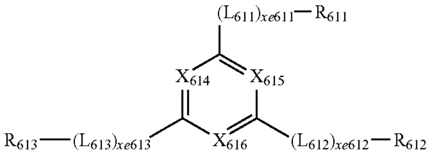

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ETH1 to ETH84, one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

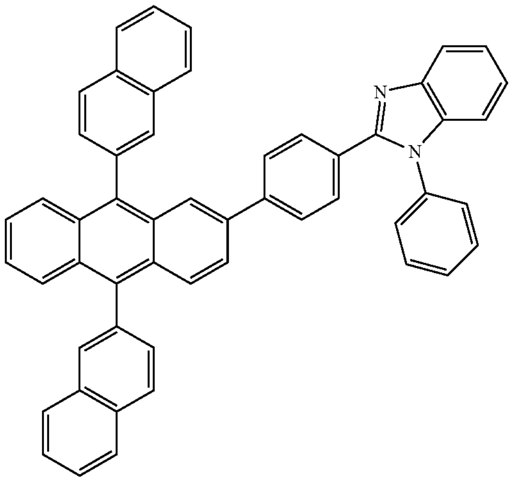

ET2

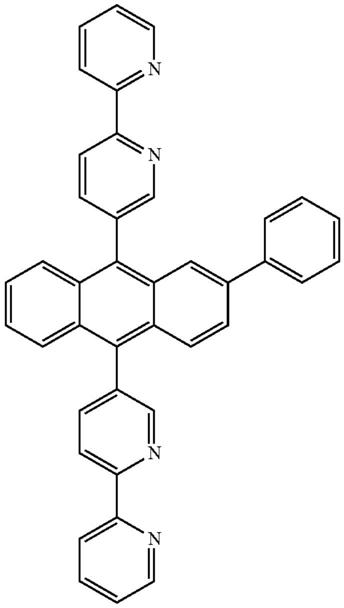

-continued

ET3

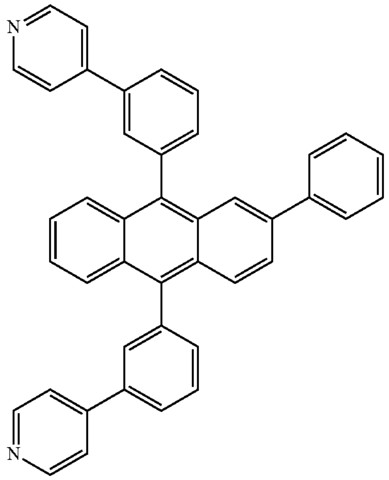

ET4

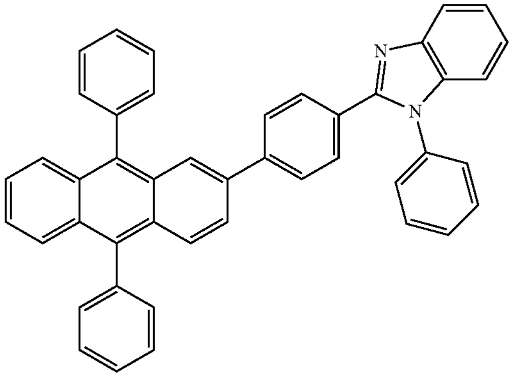

ET5

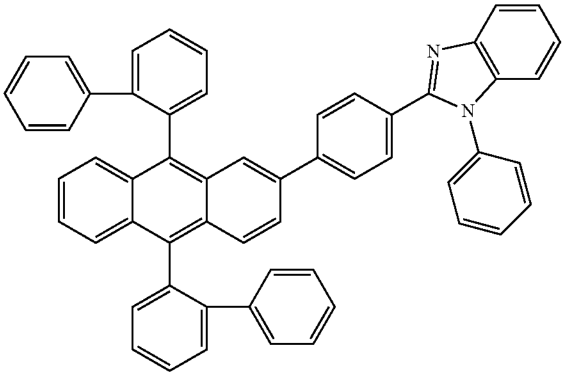

-continued
ET6
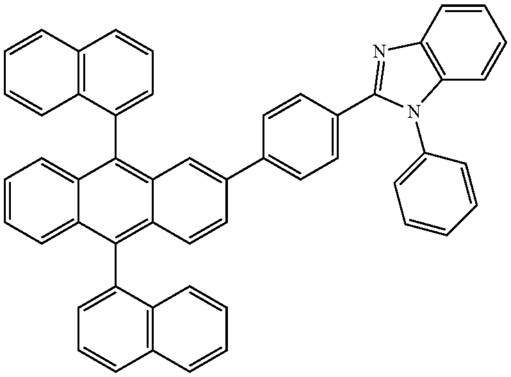
ET7
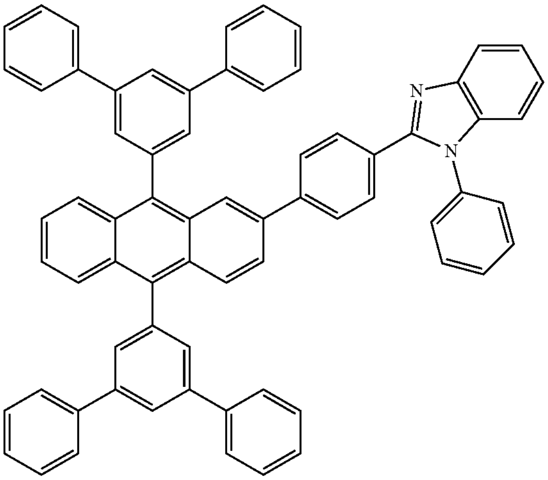
ET8
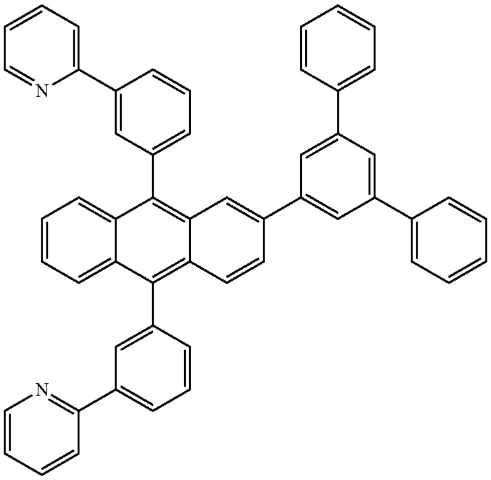
-continued
ET9
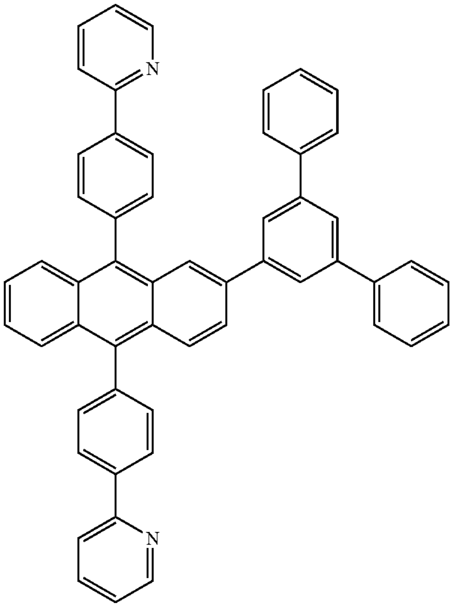
ET10
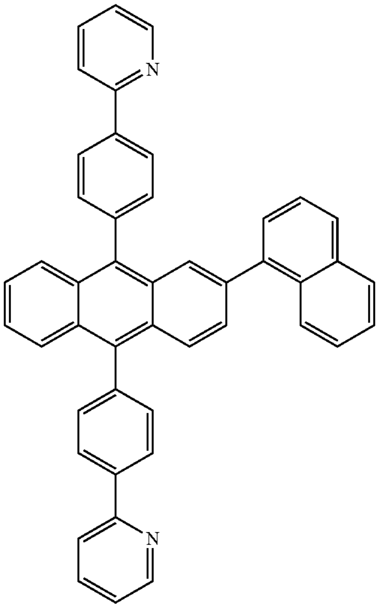

-continued
ET11
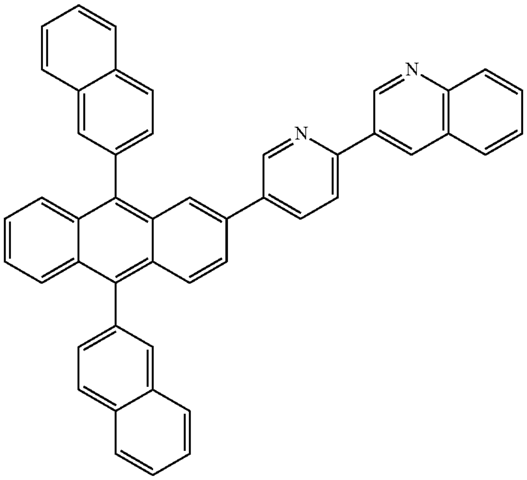
ET12
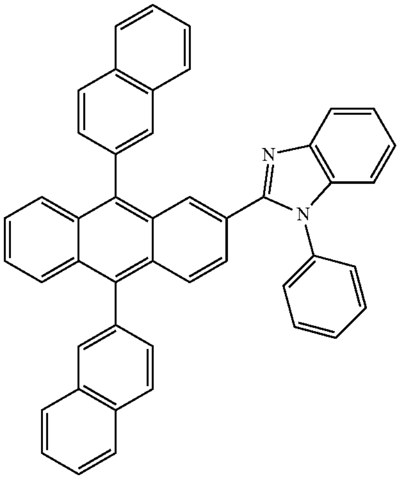
ET13
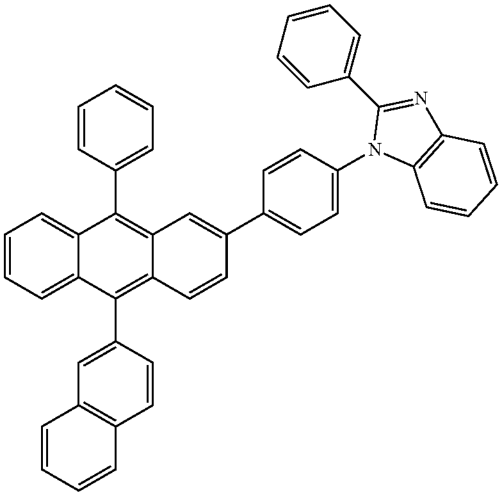
-continued
ET14
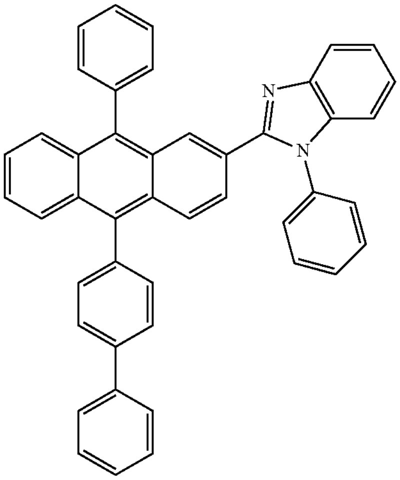
ET15
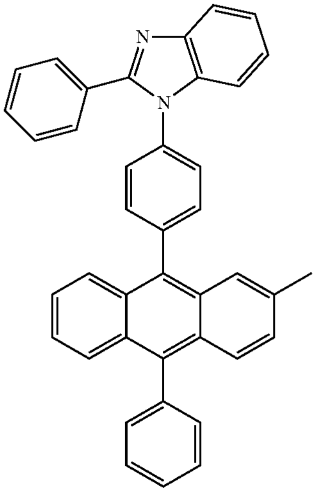
ET16
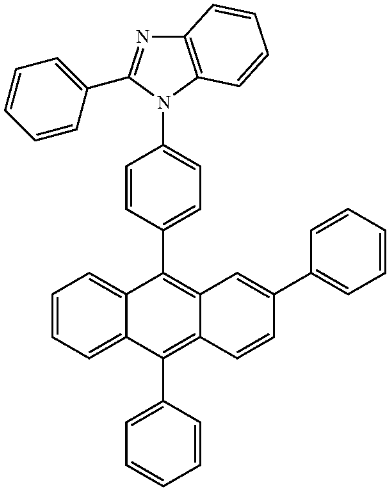

-continued
ET17
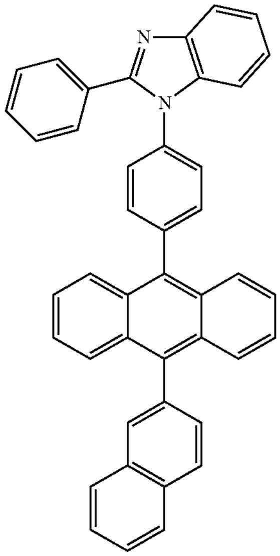
ET18
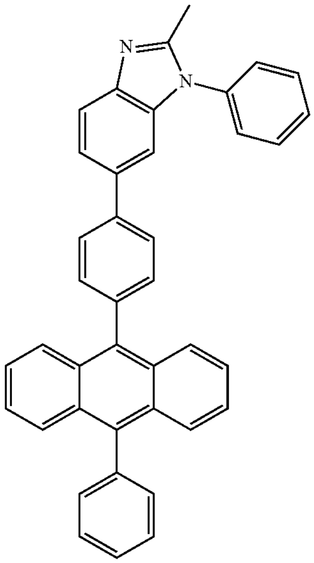
ET19
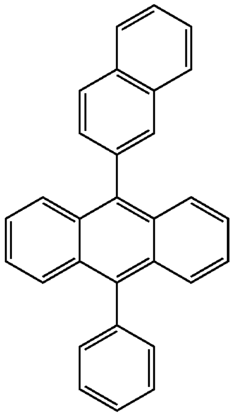
-continued
ET20
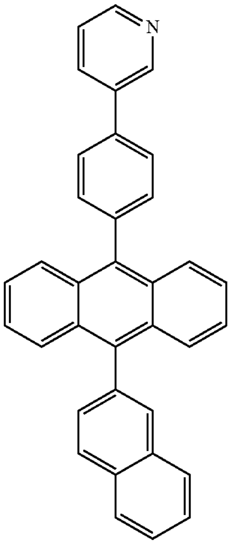
ET21
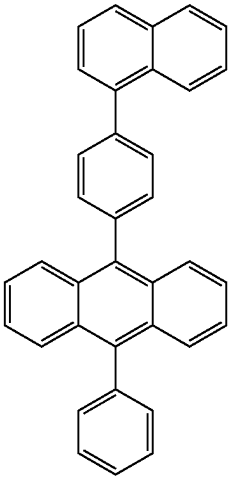
ET22
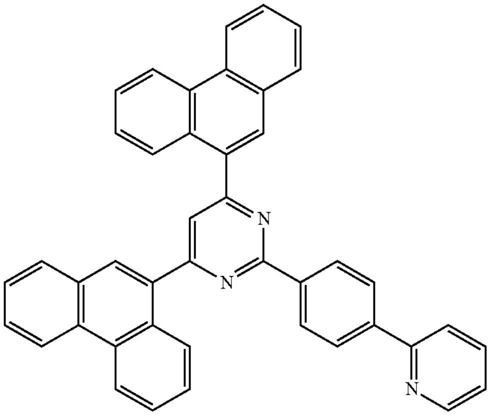

-continued
ET23
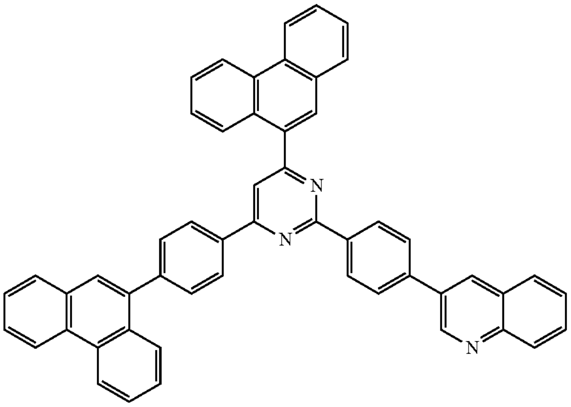
ET24
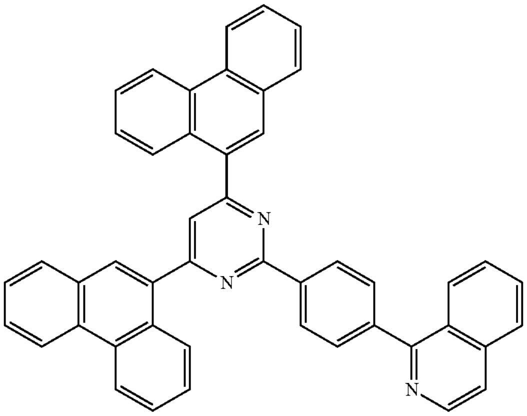
ET25
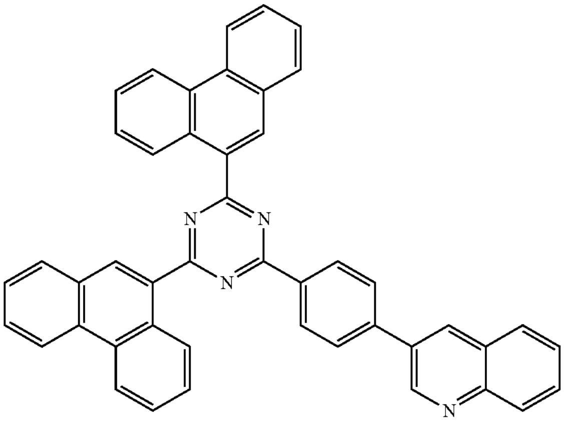
-continued
ET26
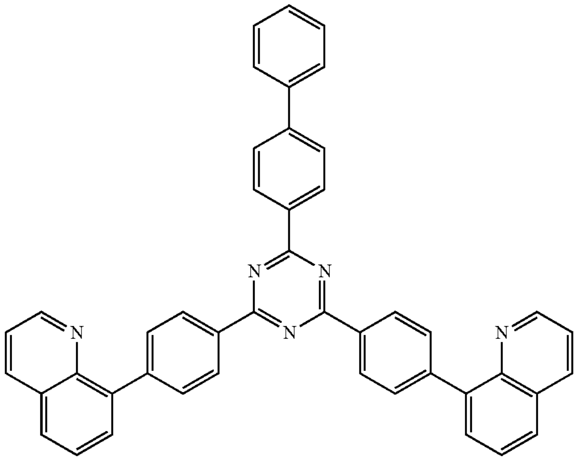
ET27
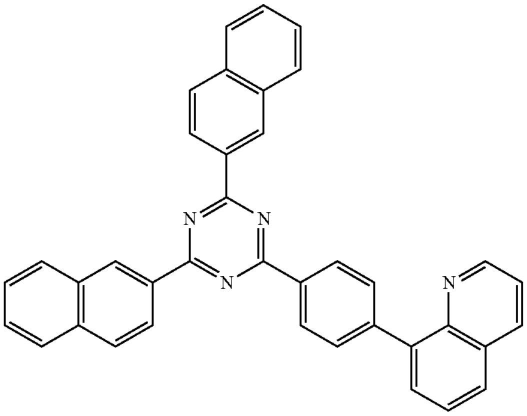
ET28
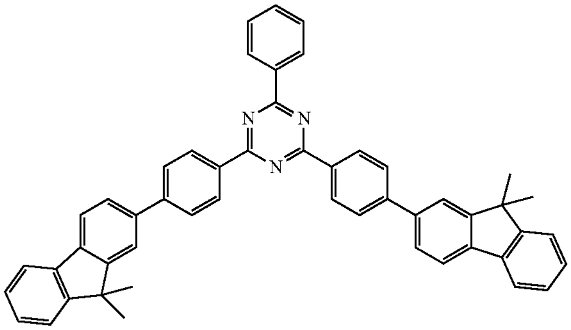

-continued
ET29
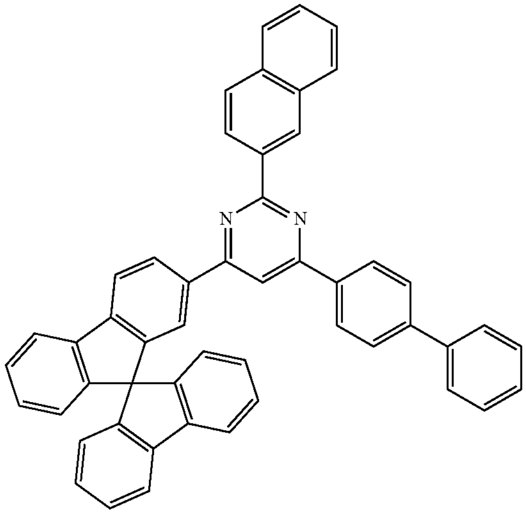
ET30
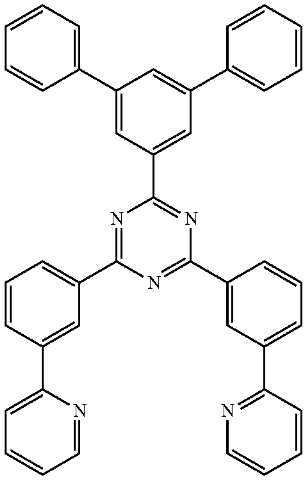
ET31
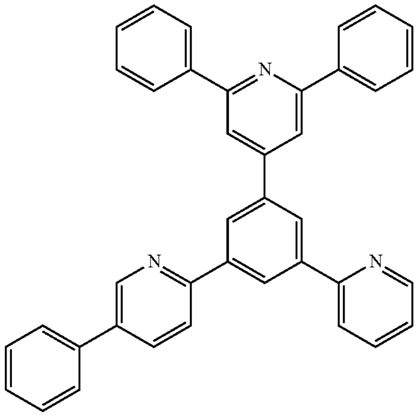
-continued
ET32
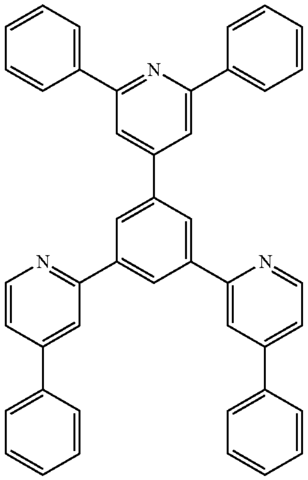
ET33
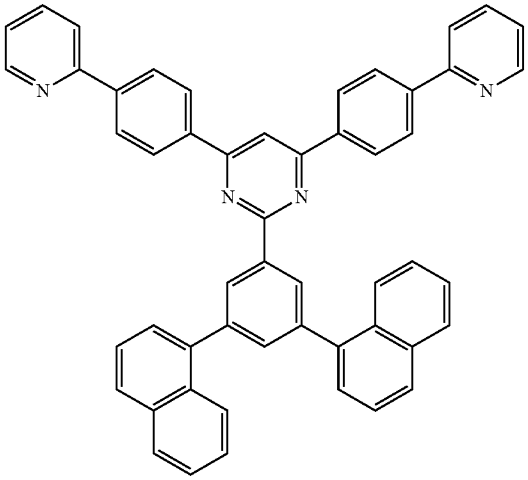
ET34
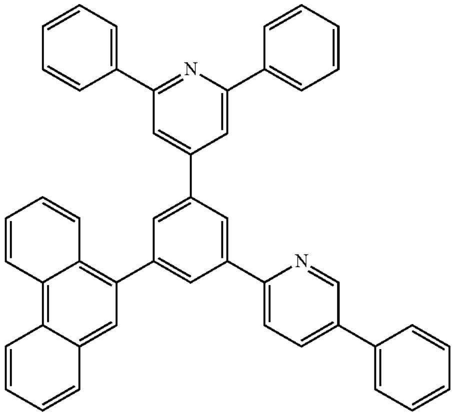

-continued
ET35
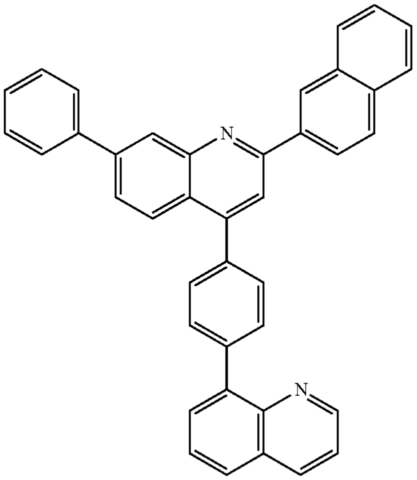
ET36
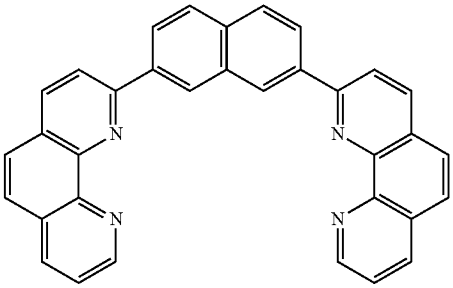
ET37
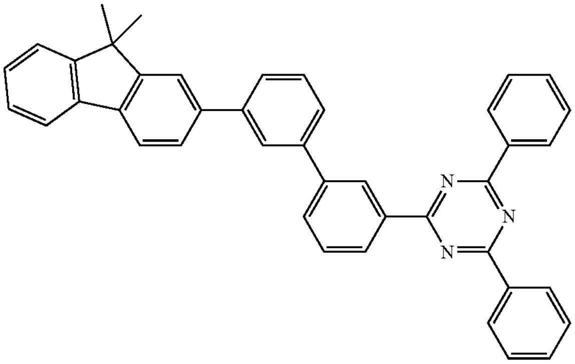
ET38
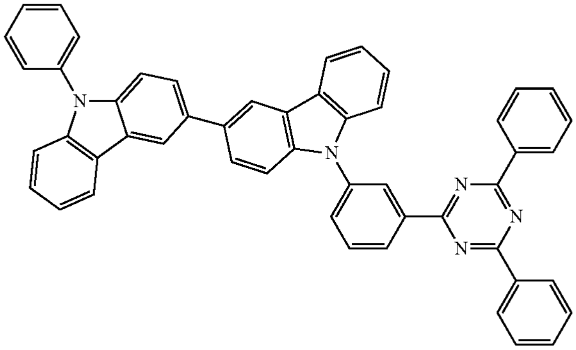
-continued
ET39
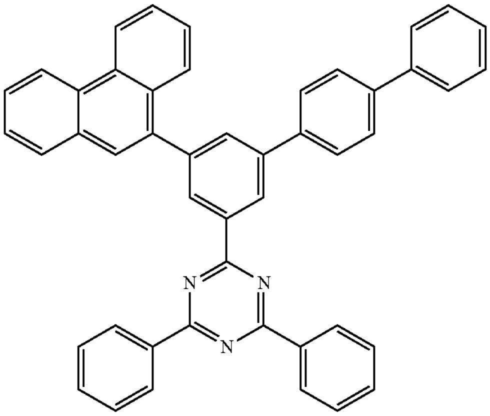
ET40
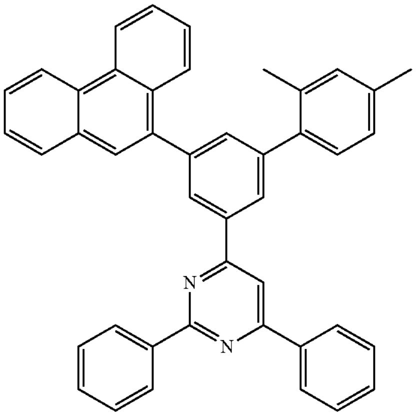
ET41
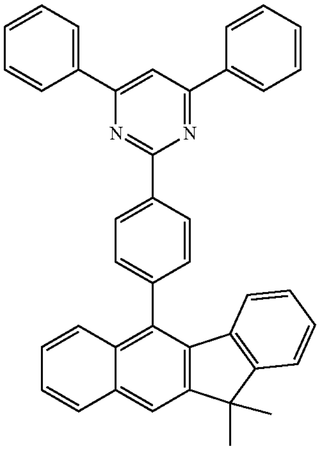

-continued

ET42

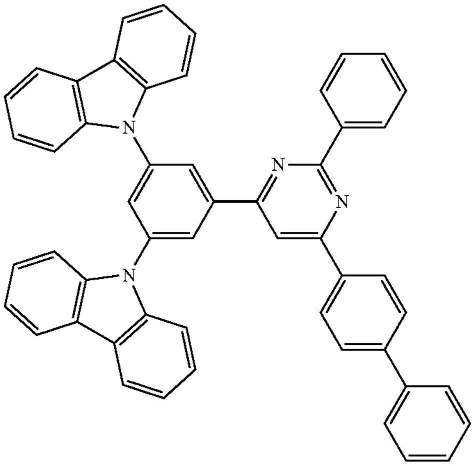

ET43

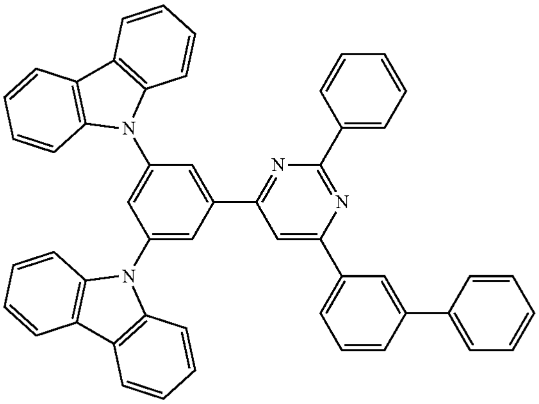

ET44

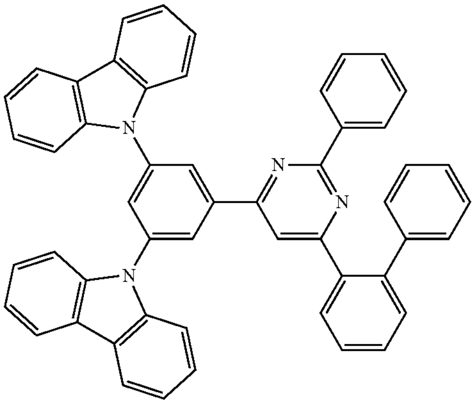

ET45

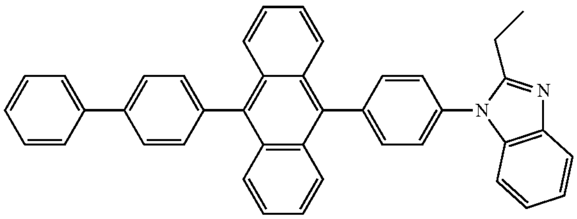

-continued

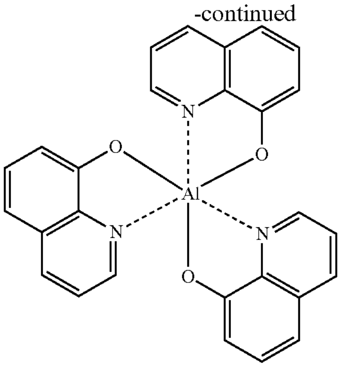

Alq3

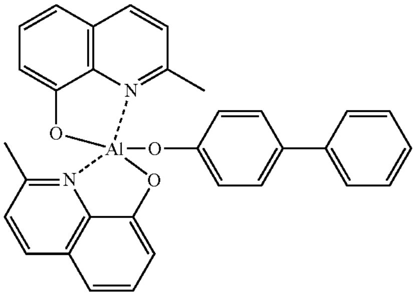

BAlq

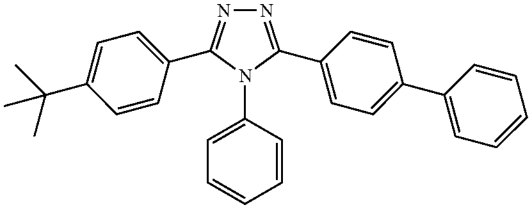

TAZ

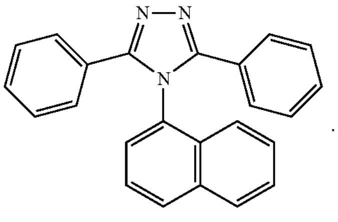

NTAZ

A thickness of the electron transport region may be in a range of about 160 Å to about 5,000 Å. For example, the thickness of the electron transport region may be in a range of about 100 Å to about 4,000 Å. When the electron transport region includes a hole blocking layer, an electron control layer, an electron transport layer, or any combination thereof, a thickness of the hole blocking layer or the electron control layer may each independently be in a range of about 20 Å to about 1,000 Å, and a thickness of the electron transport layer may be in a range of about 100 Å to about 1,000 Å. For example, the thicknesses of the hole blocking layer or the electron control layer may each independently be in a range of about 30 Å to about 300 Å. For example, the thickness of the electron transport layer may be in a range of about 150 Å to about 500 Å. When the thicknesses of the hole blocking layer, the electron control layer, the electron transport layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

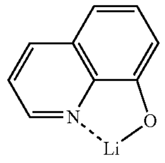

ET-D2

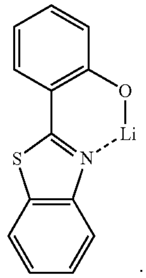

.

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a multi-layered structure including layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal and a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within this range, satisfactory electron injection characteristics may be obtained without a substantial increase in driving voltage.

[Second Electrode 150]

The second electrode 150 may be disposed on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110 (which may be a semi-transmissive electrode or a transmissive electrode) and through the first capping layer. Light generated in an emission layer of the interlayer 130 of the light-emitting device 10 may be extracted toward the outside through the second electrode 150 (which may be a semi-transmissive electrode or a transmissive electrode) and through the second capping layer.

The first capping layer and the second capping layer may each increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index (at a wavelength of about 589 nm) equal to or greater than about 1.6.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, a naphthalocyanine derivatives, alkali metal complexes, alkaline earth metal complexes, or any combination thereof. The carbocyclic compound, the heterocyclic compound, and the amine group-containing compound may each independently be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

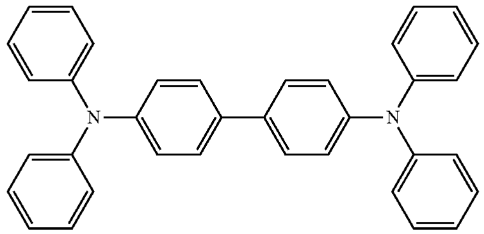

CP2

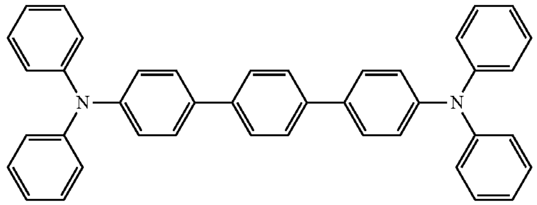

CP3

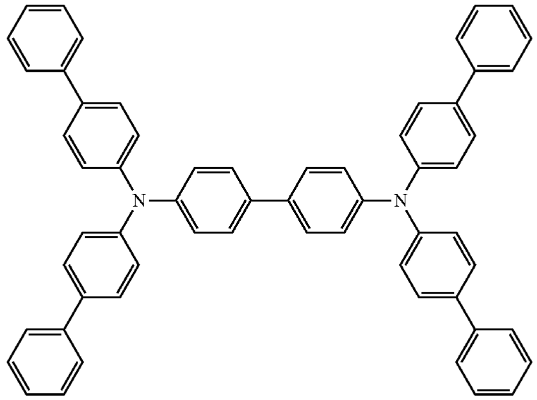

CP4

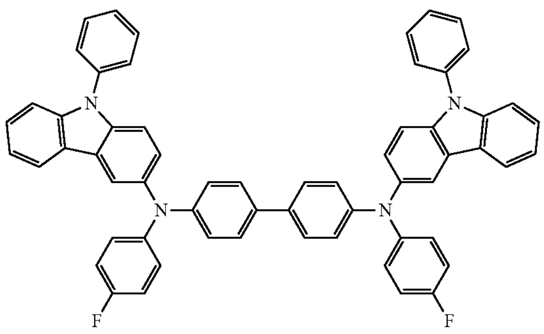

-continued

CP5

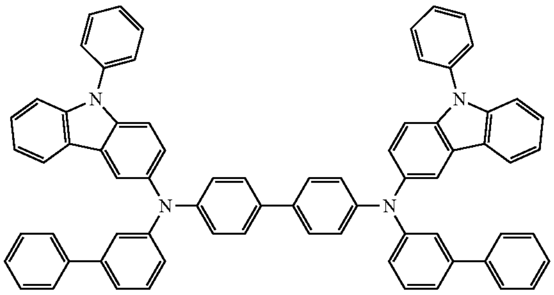

CP6

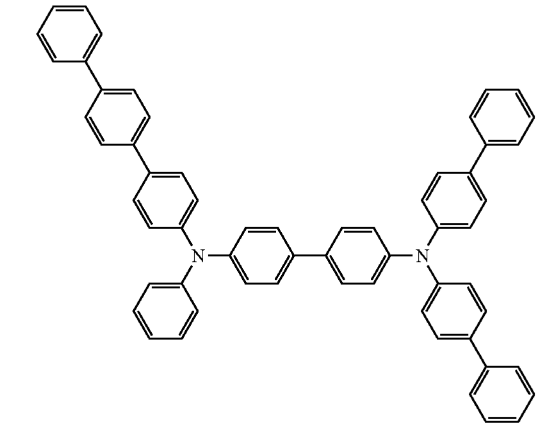

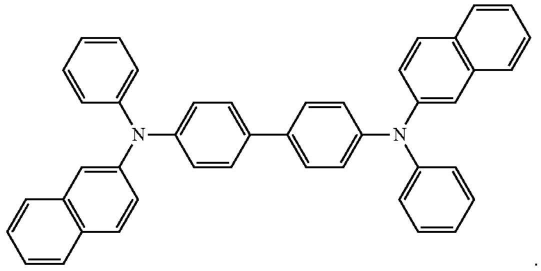

β-NPB

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located among the subpixels to define each of the subpixels.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (or the color conversion areas) may include quantum dots. In embodiments, the first area may include a red quantum dot, the second area may include a green quantum dot, and the third area may not include a quantum dot. The quantum dot may be the same as described in the specification. Each of the first area, the second area, and/or the third area may further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In embodiments, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, organic semiconductor, oxide semiconductor, or the like.

The electronic apparatus may further include a sealing portion for sealing the light-emitting device. The sealing portion and/or the color conversion layer may be located between the color filter and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, such as light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
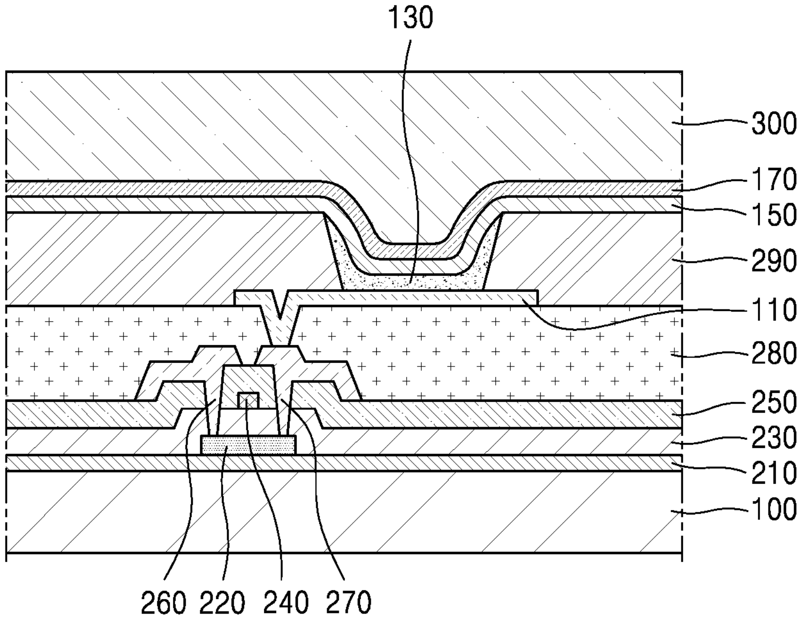
FIG. 2 is a schematic cross-sectional view of an electronic apparatus according to an embodiment.
Figure 3:
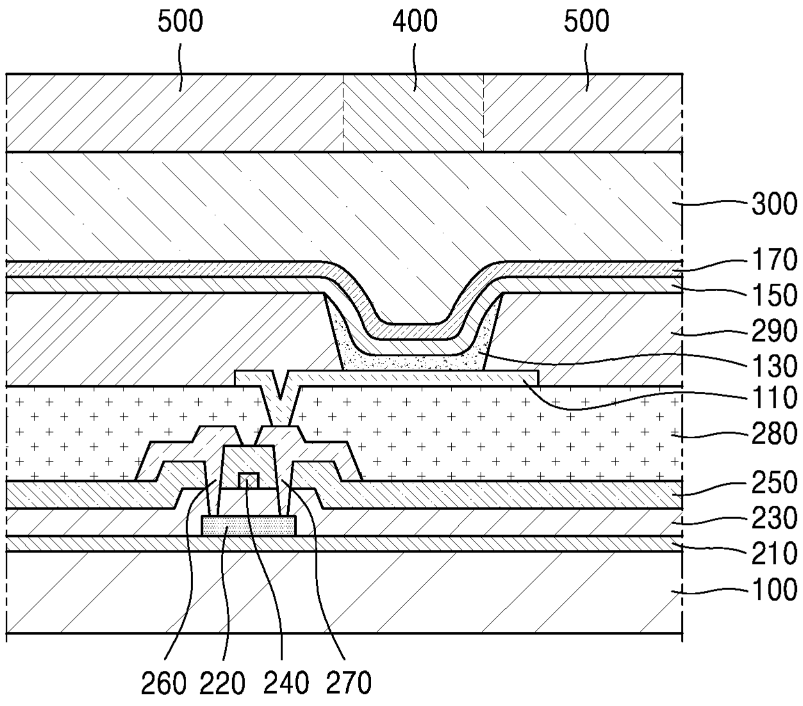
FIG. 3 is a schematic cross-sectional view of an electronic apparatus according to an embodiment.

[Description of FIGS. 2 and 3]

FIG. 2 is a schematic cross-sectional view of an electronic apparatus according to an embodiment of the disclosure.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be in contact with the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may not completely cover the drain electrode 270 and may expose a portion of the drain electrode 270, and the first electrode 110 may be electrically connected to the exposed portion of the drain electrode 270.

A pixel defining layer 290 containing an insulating material may be located on the first electrode 110. The pixel defining layer 290 may expose a portion of the first electrode 110, and the interlayer 130 may be formed in the exposed portion of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic film and the organic film.

FIG. 3 is a schematic cross-sectional view of an electronic apparatus according to an embodiment of the disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

[Manufacture Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon only as a ring-forming atom and having 3 to 60 carbon atoms, and the term "$C_1$-$C_{60}$ heterocyclic group" as used herein may be a cyclic group that has 1 to 60 carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, a $C_1$-$C_{60}$ heterocyclic group may have 3 to 61 ring-forming atoms.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein may be a cyclic group that has 3 to 60 carbon atoms and may not include *—N=*' as a ring-forming moiety, and the term "π electron-deficient nitrogen-containing $C_1$-$C_{60}$ cyclic group" as used herein may be a heterocyclic group that has 1 to 60 carbon atoms and may include *—N=*' as a ring-forming moiety.

In embodiments, the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups are condensed with each other, a T3 group, a condensed cyclic group in which two or more T3 groups are condensed with each other, or a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ cyclic group" as used herein may be a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by $—O(A_{101})$ (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having 6 to 60 carbon atoms, and the term "$C_6$-$C_{60}$ arylene group" as used herein may be a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterocondensed polycyclic group" as used herein may be a divalent group having a same structure as a monovalent non-aromatic heterocondensed polycyclic group.

The term "$C_6$-$C_{60}$ aryloxy group" as used herein may be represented by —$O(A_{102})$ (wherein $A_{102}$ is a $C_6$-$C_{60}$ aryl group), and the term "$C_6$-$C_{60}$ arylthio group" as used herein may be represented by —$S(A_{103})$ (wherein $A_{103}$ is a $C_6$-$C_{60}$ aryl group).

The term "$C_7$-$C_{60}$ aryl alkyl group" used herein may be represented by -$(A_{104})(A_{105})$ (wherein $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -$(A_{106})(A_{107})$ (wherein $A_{106}$ may be a $C_1$-$C_{59}$ alkylene group, and $A_{107}$ may be a $C_1$-$C_{59}$ heteroaryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term “heteroatom” as used herein may be any atom other than a carbon atom or a hydrogen atom. Examples of the heteroatom may include O, S, N, P, Si, B, Ge, Se, or any combination thereof.

The term “the third-row transition metal” as used herein may include hafnium (Hf), tantalum (Ta), tungsten (W), rhenium (Re), osmium (Os), iridium (Ir), platinum (Pt), or gold (Au).

The term “Ph” as used herein refers to a phenyl group, the term “Me” as used herein refers to a methyl group, the term “Et” as used herein refers to an ethyl group, the term “ter-Bu” or “$Bu^t$” as used herein refers to a tert-butyl group, and the term “OMe” as used herein refers to a methoxy group.

The term “biphenyl group” as used herein may be “a phenyl group substituted with a phenyl group.” For example, the “biphenyl group” may be a substituted phenyl group having a $C_6$-$C_{60}$ aryl group as a substituent.

The term “terphenyl group” as used herein may be “a phenyl group substituted with a biphenyl group”. For example, the “terphenyl group” may be a substituted phenyl group having, as a substituent, a $C_6$-$C_{60}$ aryl group substituted with a $C_6$-$C_{60}$ aryl group.

The number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. In an embodiment, the minimum carbon number of 12 in the $C_{12}$-$C_{60}$ heteroaryl group is an example, and the definition of the heteroaryl group is equally applied. Other cases are the same.

In the description, * and *' and *" as used herein, unless defined otherwise, each represent a binding site to a neighboring atom in a corresponding formula or moiety.

Hereinafter, a compound according to embodiments and a light-emitting device according to embodiments will be described in detail with reference to Synthesis Examples and Examples. The wording “B was used instead of A” used in describing Synthesis Examples refers to that an identical molar equivalent of B was used in place of A.

EXAMPLES

Synthesis Example 1: Synthesis of Compound BD1

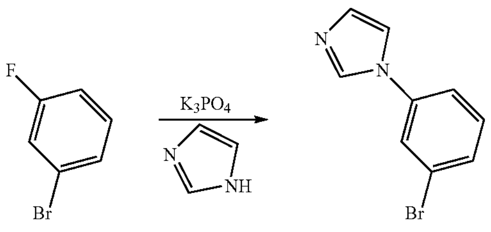

[BD1-A]

1) Synthesis of Intermediate [BD1-A]

1-bromo-3-fluorobenzene (1.0 eq), imidazole (1.3 eq), and $K_3PO_4$(2.0 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD1-A] (yield of 85%).

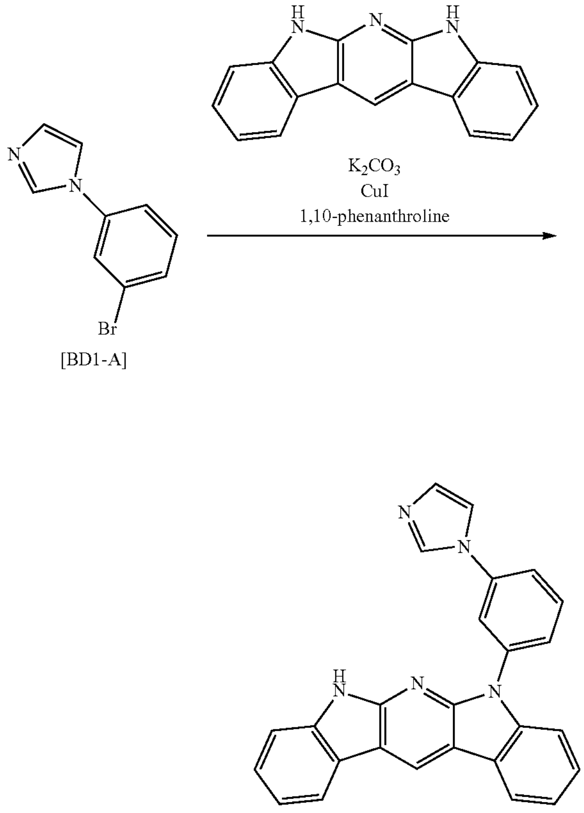

[BD1-A]

[BD1-B]

2) Synthesis of Intermediate [BD1-B]

Intermediate [BD1-A] (1.0 eq), 5,7-dihydropyrido[2,3-b:6,5-b']diindole (CAS No. 950487-75-9) (1.2 eq), $K_2CO_3$(2.0 eq), CuI (0.1 eq), and 1,10-phenanthroline (0.1 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD1-B] (yield of 62%).

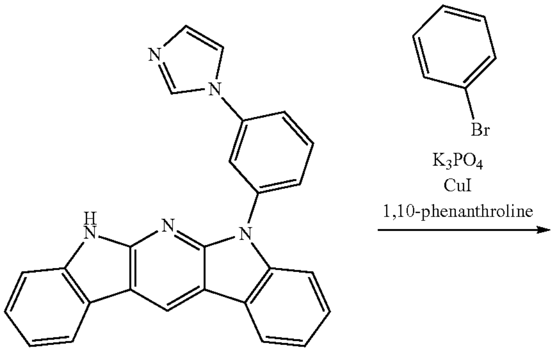

[BD1-B]

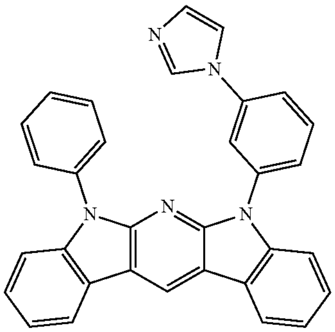

[BD1-C]

3) Synthesis of Intermediate [BD1-C]

Intermediate [BD1-B] (1.0 eq), bromobenzene (1.2 eq), $K_3PO_4$(2.0 eq), CuI (0.1 eq), and 1,10-phenanthroline (0.1 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD1-C](yield of 76%).

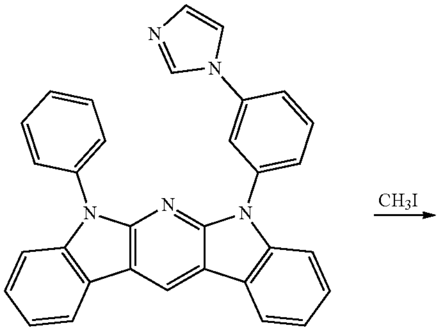

[BD1-C]

-continued

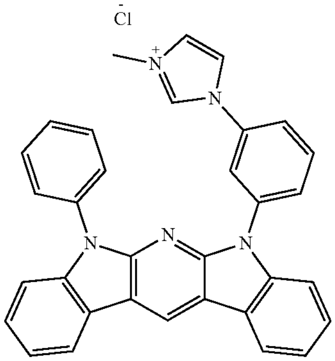

[BD1-D]

4) Synthesis of Intermediate [BD1-D]

Intermediate [BD1-C] (1.0 eq) and iodomethane (10.0 eq) were added to a reaction vessel and suspended in toluene (0.1 M). The reaction mixture was heated and stirred at 110° C. for 24 hours. After completion of the reaction, the reaction mixture was cooled to room temperature and extracted with distilled water and ethyl acetate. An organic layer extracted therefrom was dried using magnesium sulfate, and the solvent was removed therefrom to obtain Intermediate [BD1-D] (yield of 91%).

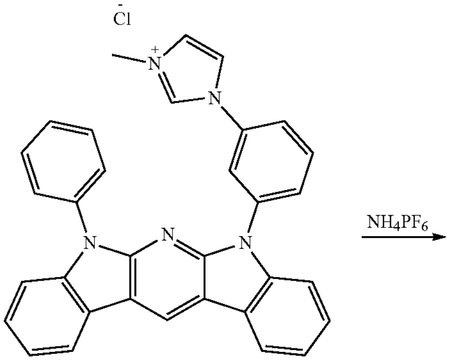

[BD1-D]

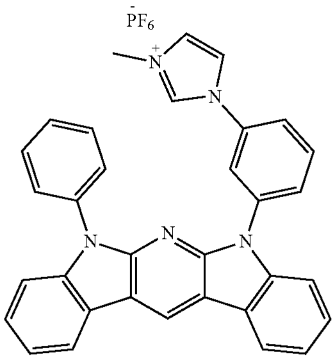

[BD1-E]

5) Synthesis of Intermediate [BD1-E]

Intermediate [BD1-D] (1.0 eq) was added to a reaction vessel and suspended in a mixed solution of methanol and distilled water at a ratio of 2:1. When the mixture was sufficiently dissolved, ammonium hexafluorophosphate (1.1 eq) was slowly added thereto, and the reaction solution was stirred at room temperature for 24 hours. After completion of the reaction, the resulting solid was filtered and washed with diethyl ether. The washed solid was dried to obtain Intermediate [BD1-E] (yield of 93%).

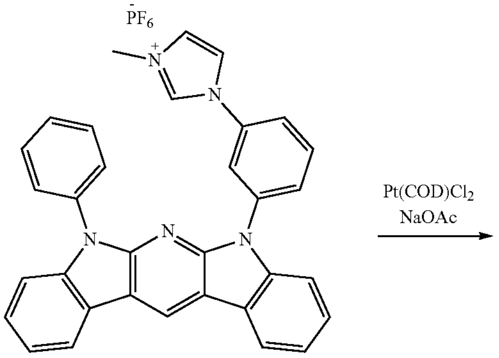

[BD1-E]

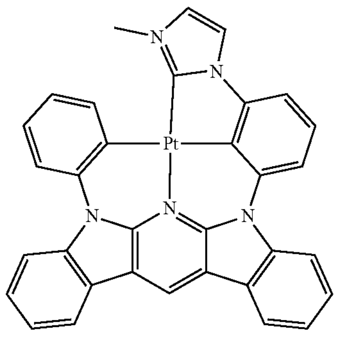

BD1

6) Synthesis of Compound BD1

Intermediate [BD1-E] (1.0 eq), dichloro(1,5-cyclooctadiene)platinum (1.1 eq), and sodium acetate (3.0 eq) were suspended in 1,4-dioxane (0.1 M). The reaction mixture was heated and stirred at 120° C. for 72 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Compound BD1 (yield of 33%).

Synthesis Example 2: Synthesis of Compound BD5

Compound BD5 was synthesized in the same manner as in Synthesis Example of Compound BD1 except that 12-p-anisole 5,7-dihydropyrido[2,3-b:6,5-b']diindoles was used instead of 5,7-dihydropyrido[2,3-b:6,5-b']diindoles.

Synthesis Example 3: Synthesis of Compound BD27

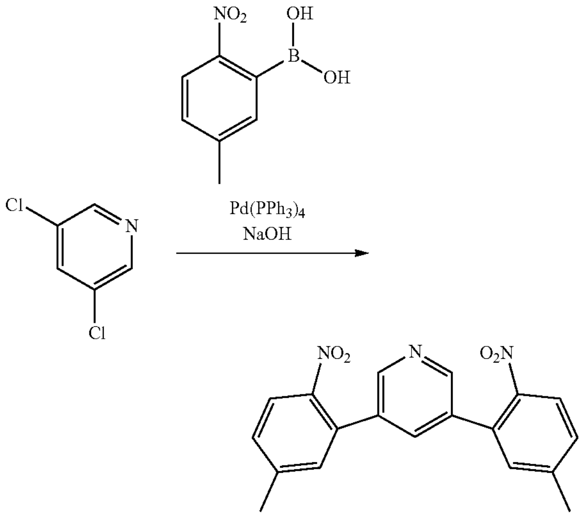

[BD27-A]

1) Synthesis of Intermediate [BD27-A]

3,5-dichloropyridine (1.0 eq), (5-methyl-2-nitrophenyl) boronic acid (3.0 eq), and NaOH (3.0 eq) were added to a reaction vessel and suspended in THF/$H_2O$ at a ratio of 2:1 (0.1 M). $Pd(PPh_3)_4$(0.05 eq) was added thereto at 40° C., and the reaction mixture was heated and stirred at 80° C. for 12 hours. After completion of the reaction, the reaction mixture was cooled to room temperature and extracted with distilled water and methylene chloride. An organic layer extracted therefrom was washed with a saturated NaCl aqueous solution and dried using magnesium sulfate. A residue obtained by removing the solvent therefrom was separated by column chromatography to obtain Intermediate [BD27-A] (yield of 65%).

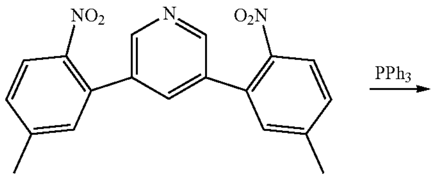

[BD27-A]

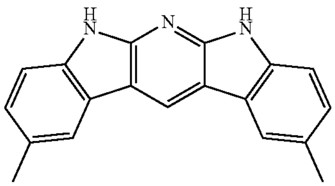

[BD27-B]

2) Synthesis of Intermediate [BD27-B]

Intermediate [BD27-A] (1.0 eq) and $PPh_3$(2.5 eq) were added to a reaction vessel and suspended in 1,2-dichlorobenzene (0.25 M). The reaction mixture was stirred 12 hours. After completion of the reaction, the reaction mixture was cooled to room temperature and extracted with distilled water and dichloromethane. An organic layer extracted therefrom was washed with a saturated NaCl aqueous solution and dried using magnesium sulfate. A residue obtained by removing the solvent therefrom was separated by column chromatography to obtain Intermediate [BD27-B] (yield of 45%).

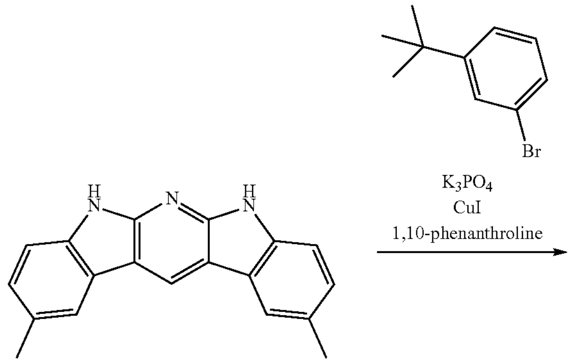

[BD27-B]

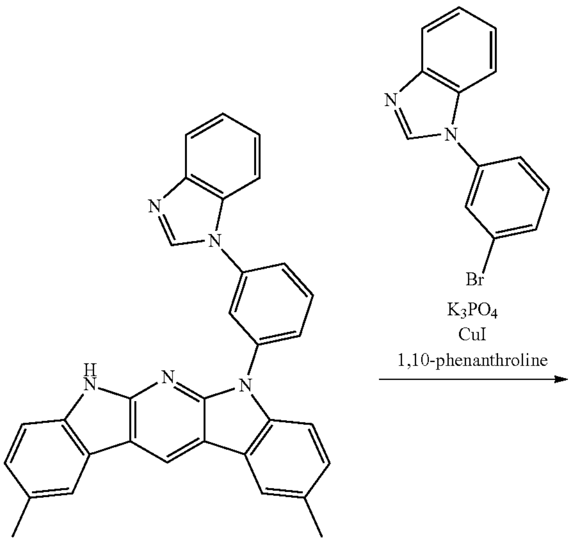

[BD27-C]

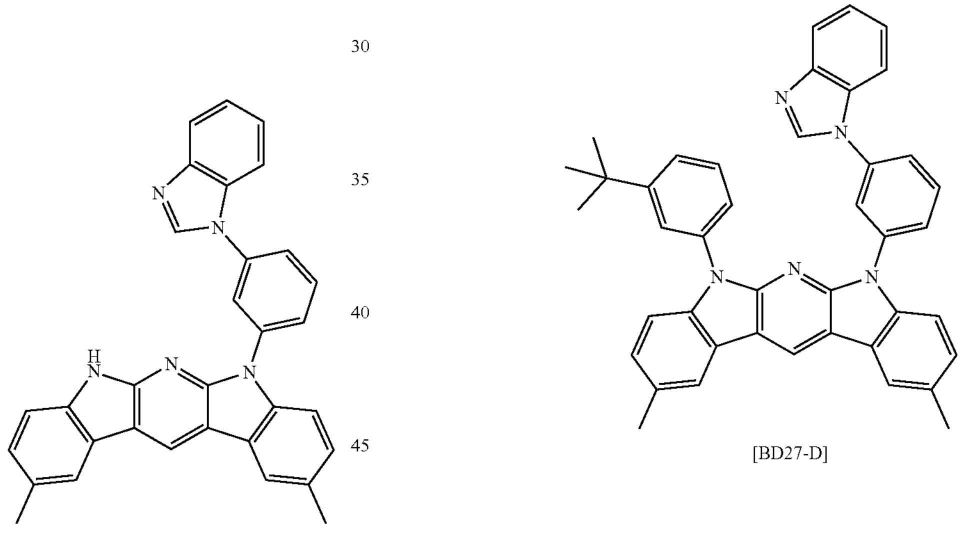

[BD27-C]

[BD27-D]

3) Synthesis of Intermediate [BD27-C]

Intermediate [BD27-B] (1.2 eq), bromobenzene (1.0 eq), $K_3PO_4$(2.0 eq), CuI (0.1 eq), and 1,10-phenanthroline (0.1 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD27-C](yield of 66%).

4) Synthesis of Intermediate [BD27-D]

Intermediate [BD27-C] (1.0 eq), 1-(3-bromophenyl)-1H-benzo[d]imidazole (1.2 eq), $K_3PO_4$(2.0 eq), CuI (0.1 eq), and 1,10-phenanthroline (0.1 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD27-D] (yield of 84%).

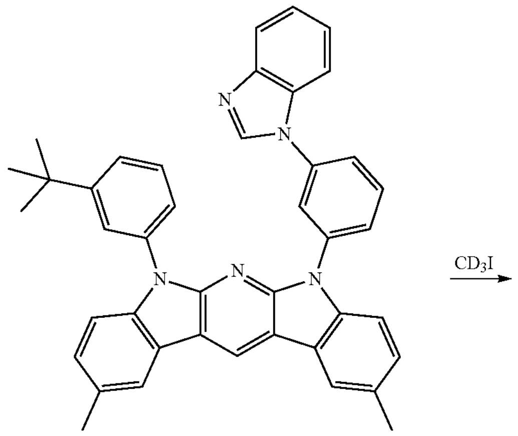

[BD27-D]

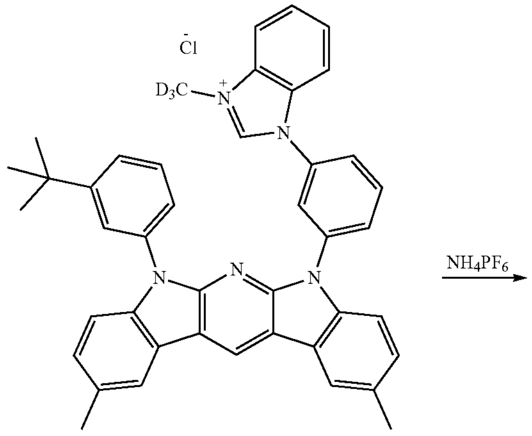

[BD27-E]

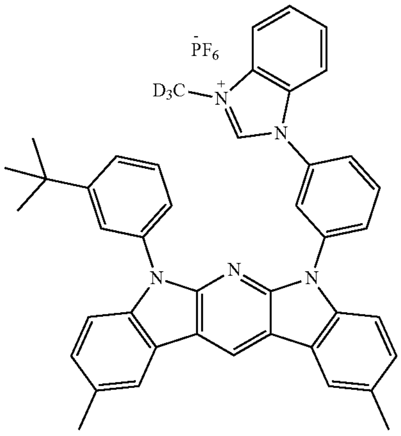

[BD27-F]

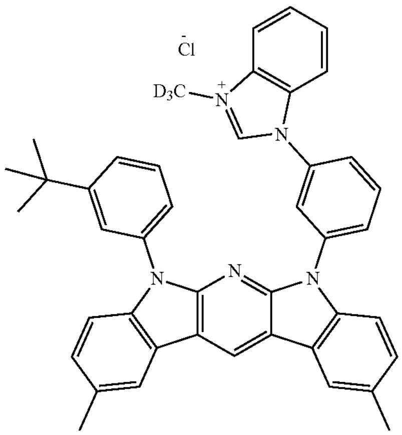

[BD27-E]

5) Synthesis of Intermediate [BD27-E]

Intermediate [BD27-D] (1.0 eq) and iodomethane (10.0 eq) were added to a reaction vessel and suspended in toluene (0.1 M). The reaction mixture was heated and stirred at 110° C. for 24 hours. After completion of the reaction, the reaction mixture was cooled to room temperature and extracted with distilled water and ethyl acetate. An organic layer extracted therefrom was dried using magnesium sulfate, and the solvent was removed therefrom to obtain Intermediate [BD27-E] (yield of 94%).

6) Synthesis of Intermediate [BD27-F]

Intermediate [BD27-F] (yield of 97%) was obtained in the same manner as in Synthesis Example of Intermediate [BD1-E], except that Intermediate [BD27-E] was used instead of Intermediate [BD1-D].

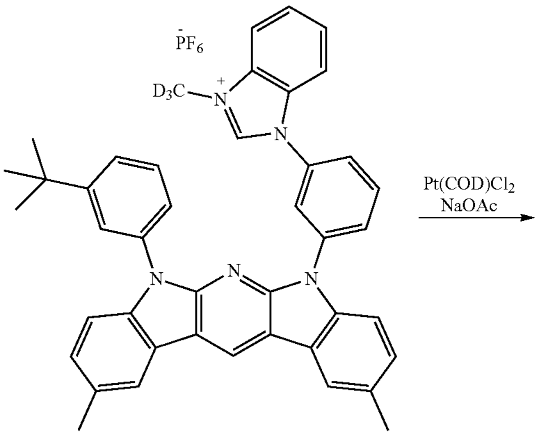

[BD27-F]

-continued

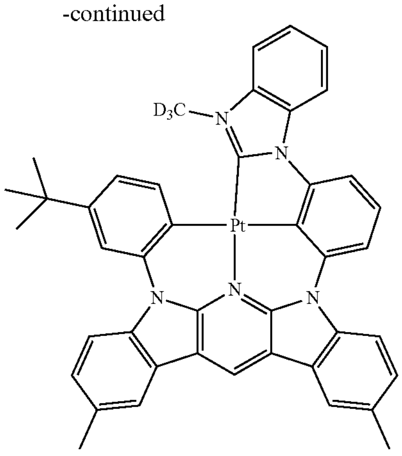

BD27

7) Synthesis of Compound BD27

Compound BD27 (yield of 31%) was obtained in the same manner as in Synthesis Example of Compound BD1, except that Intermediate [BD27-F] was used instead of Intermediate [BD1-E].

Synthesis Example 4: Synthesis of Compound BD36

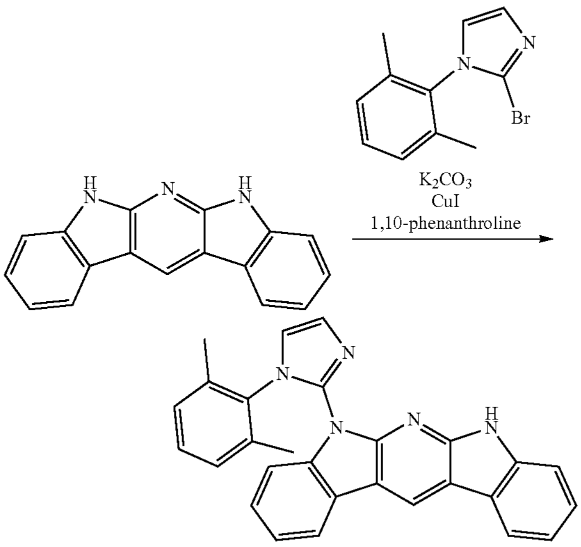

[BD36-A]

1) Synthesis of Intermediate [BD36-A]

Intermediate [BD36-A] (yield of 58%) was obtained in the same manner as in Synthesis Example of Intermediate [BD1-B], except that 2-bromo-1-(2,6-dimethylphenyl)-1H-imidazole-methane (CAS No. 1267555-81-6) was used instead of Intermediate [BD1-A].

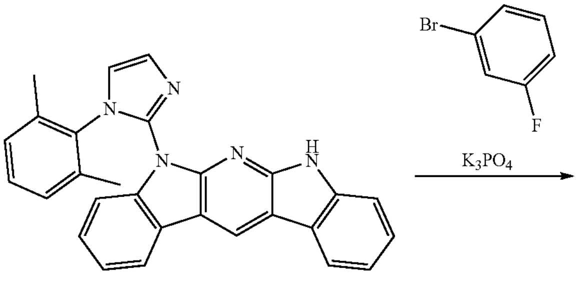

[BD36-A]

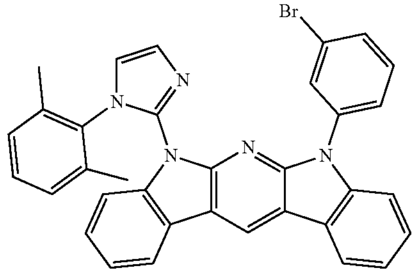

[BD36-B]

2) Synthesis of Intermediate [BD36-B]

Intermediate [BD36-A] (1.0 eq), 1-bromo-3-fluorobenzene (1.2 eq), and $K_3PO_4$(2.0 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD36-B] (yield of 65%).

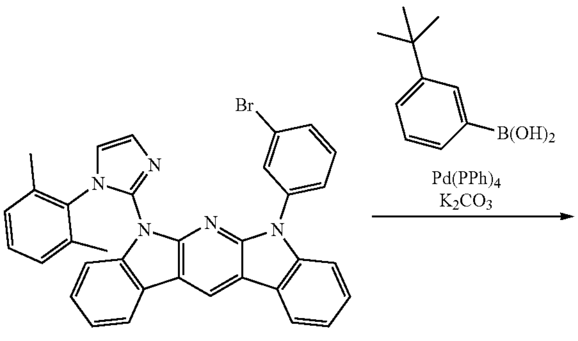

[BD36-B]

-continued

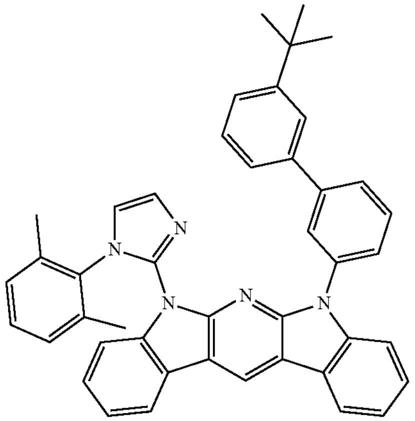

[BD36-C]

3) Synthesis of Intermediate [BD36-C]

Intermediate [BD36-B] (1.0 eq), (3-(tert-butyl)phenyl) boronic acid (1.2 eq), $Pd(PPh_3)_4$ (0.1 eq), and $K_2CO_3$(2.0 eq) were added to a reaction vessel and suspended in dioxane: $H_2O$ at a ratio of 3:1(0.1 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD36-C] (yield of 74%).

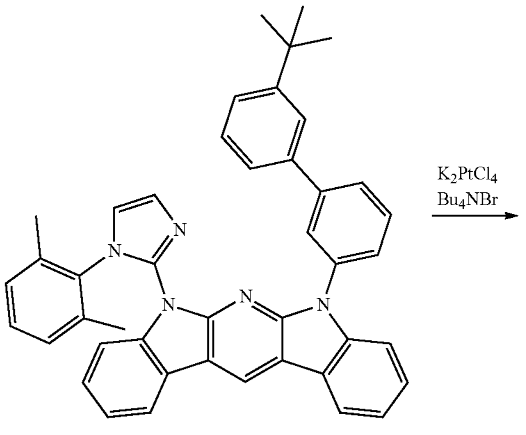

[BD36-C]

-continued

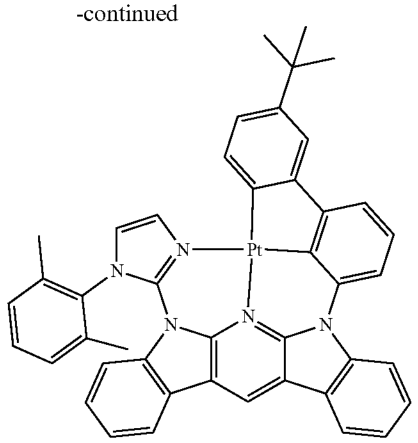

BD36

4) Synthesis of Compound BD36

Intermediate [BD36-C] (1.0 eq), potassium tetrachloroplatinate (1.1 eq), and tetrabutylammonium bromide (0.1 eq) were suspended in AcOH (0.03 M). The reaction mixture was heated and stirred at 110° C. for 72 hours. After completion of the reaction, the reaction mixture was cooled to room temperature and extracted with distilled water and dichloromethane. An organic layer extracted therefrom was washed with a saturated NaCl aqueous solution and dried using magnesium sulfate. A residue obtained by removing the solvent therefrom was separated by column chromatography to obtain Compound BD36 (yield of 29%).

Synthesis Example 5: Synthesis of Compound BD46

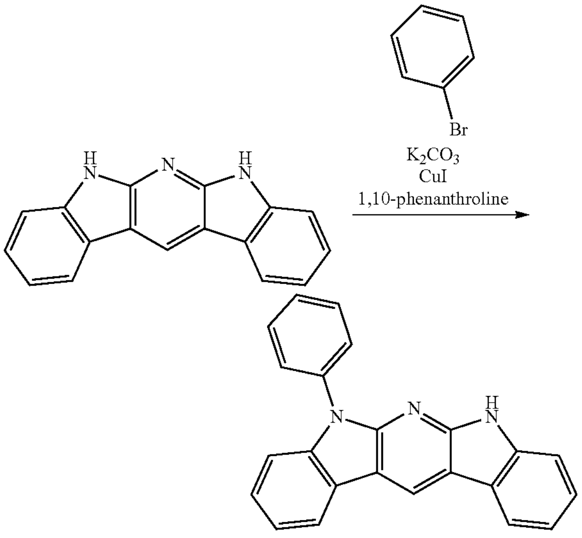

[BD46-A]

1) Synthesis of Intermediate [BD46-A]

Intermediate [BD46-A] (yield of 62%) was obtained in the same manner as in Synthesis Example of Intermediate [BD1-B], except that bromobenzene was used instead of Intermediate [BD1-A].

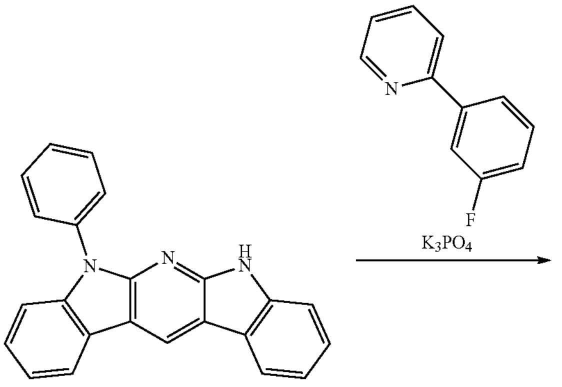

[BD46-A]

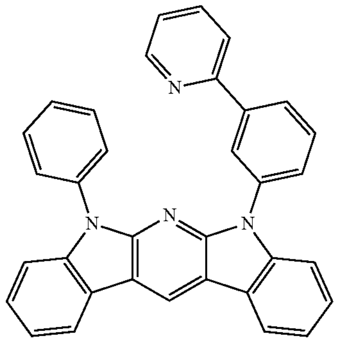

[BD46-B]

2) Synthesis of Intermediate [BD46-B]

Intermediate [BD46-A] (1.0 eq), 2-(3-fluorophenyl)pyridine (1.2 eq), and $K_3PO_4$(2.0 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD46-B] (yield of 70%).

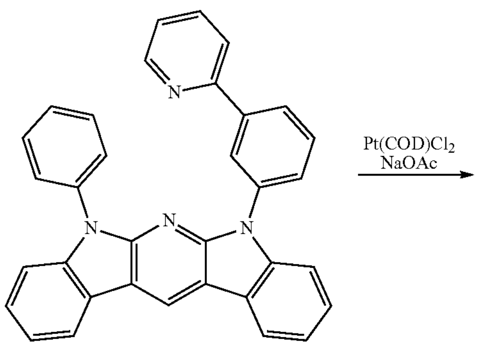

[BD46-B]

-continued

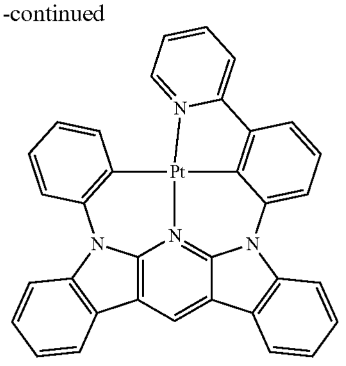

BD46

3) Synthesis of Compound BD46

Compound BD46 (yield of 35%) was obtained in the same manner as in Synthesis Example of Compound BD1, except that Intermediate [BD46-B] was used instead of Intermediate [BD1-E].

Synthesis Example 6: Synthesis of Compound BD65

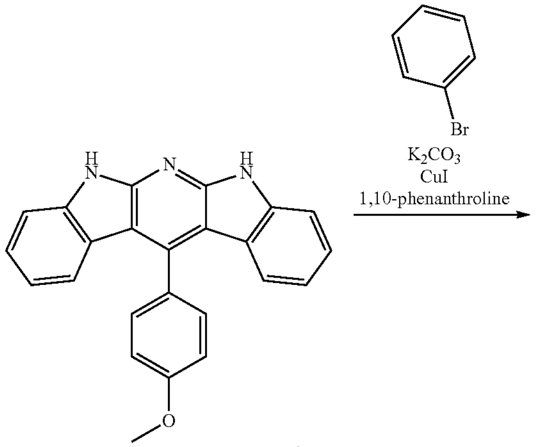

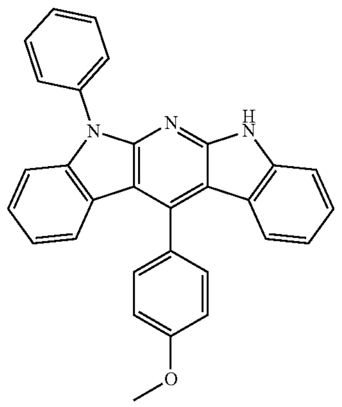

[BD65-A]

1) Synthesis of Intermediate [BD65-A]

Bromobenzene (1.0 eq), 12-(4-methoxyphenyl)-5,7-dihydropyrido[2,3-b:6,5-b']diindole (CAS No. 1415641-42-7)

(1.2 eq), $K_2CO_3$(2.0 eq), CuI (0.1 eq), and 1,10-phenanthroline (0.1 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD65-A] (yield of 69%).

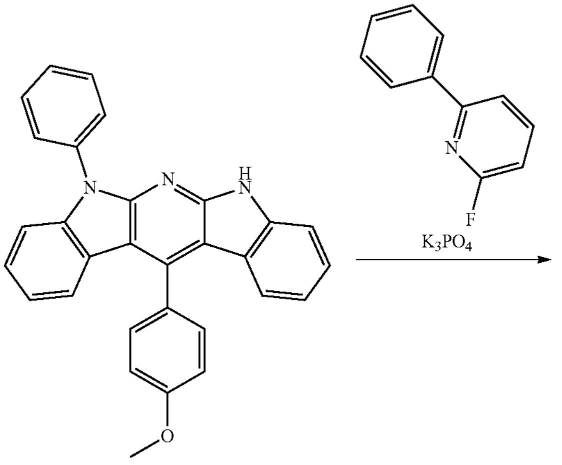

[BD65-A]

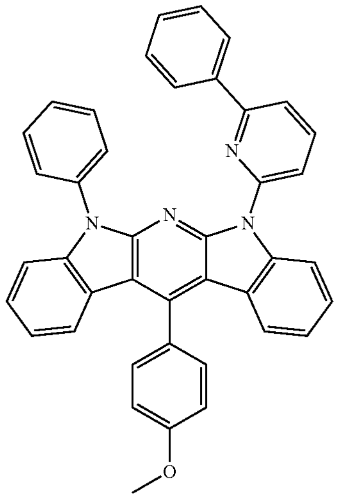

[BD65-B]

2) Synthesis of Intermediate [BD65-B]

Intermediate [BD65-A](1.0 eq), 2-fluoro-6-phenylpyridine (1.2 eq), $K_3PO_4$(2.0 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD65-B] (yield of 72%).

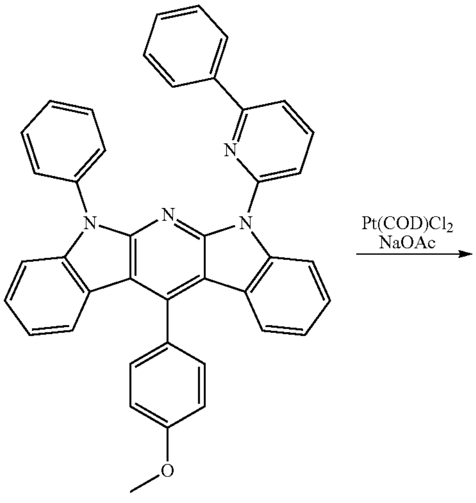

[BD65-B]

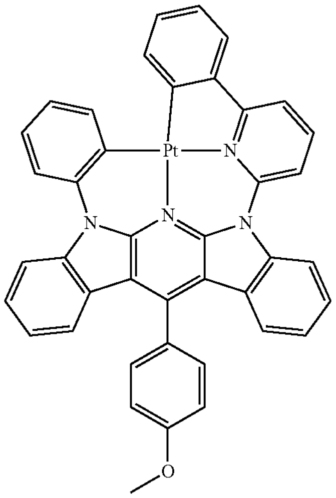

BD65

3) Synthesis of Compound BD65

Compound BD65 (yield of 37%) was obtained in the same manner as in Synthesis Example of Compound BD1, except that Intermediate [BD65-B] was used instead of Intermediate [BD1-E].

Synthesis Example 7: Synthesis of Compound BD80

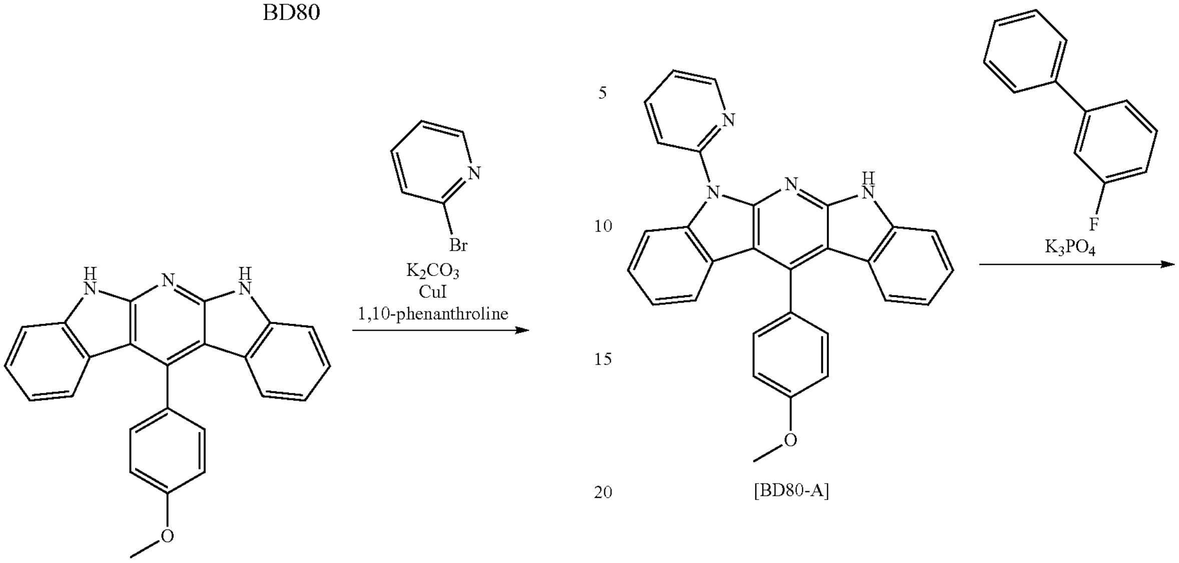

[BD80-A]

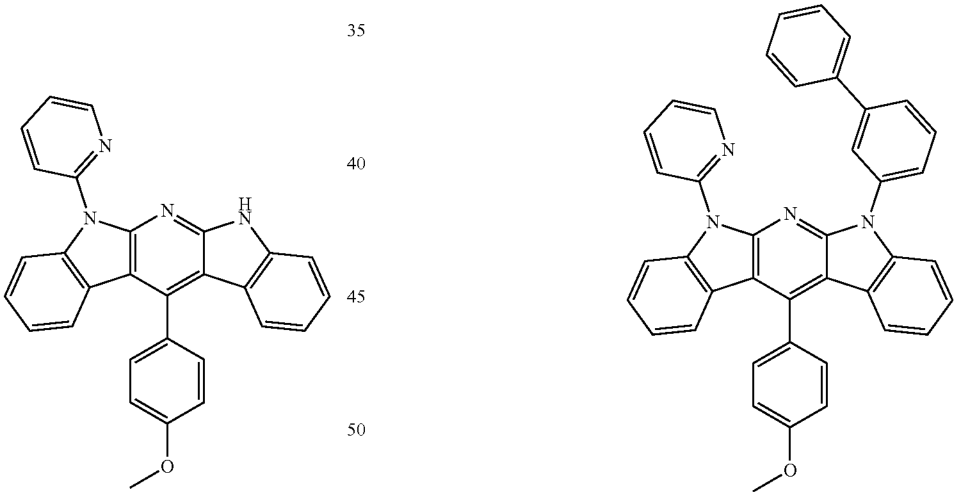

[BD80-A]

[BD80-B]

1) Synthesis of Intermediate [BD80-A]

Intermediate [BD80-A] (yield of 56%) was obtained in the same manner as in Synthesis Example of Intermediate [BD65-A], except that 2-bromopyridine was used instead of bromobenzene.

2) Synthesis of Intermediate [BD80-B]

Intermediate [BD80-A] (1.0 eq), 3-fluoro-1,1'-biphenyl (1.2 eq), and $K_3PO_4$(2.0 eq) were added to a reaction vessel and suspended in DMF (0.25 M). The reaction mixture was heated and stirred at 160° C. for 24 hours. After completion of the reaction, the reaction mixture was cooled to room temperature and extracted with distilled water and ethyl acetate. An organic layer extracted therefrom was washed with a saturated NaCl aqueous solution and dried using magnesium sulfate. A residue obtained by removing the solvent therefrom was separated by column chromatography to obtain Intermediate [BD80-B] (yield of 75%).

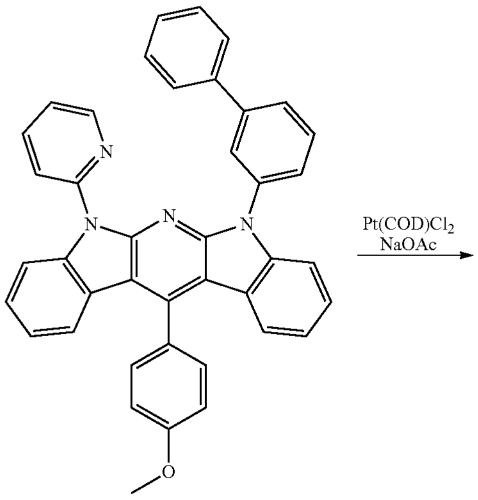

[BD80-B]

-continued

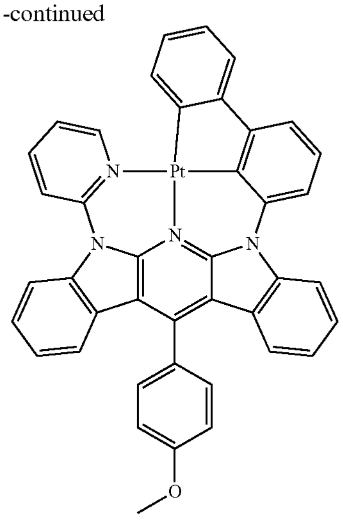

BD80

3) Synthesis of Compound BD80

Compound BD80 (yield of 32%) was obtained in the same manner as in Synthesis Example of Compound BD1, except that Intermediate [BD80-B] was used instead of Intermediate [BD1-E].

$^1$H NMR and MS/FAB of the compounds synthesized according to Synthesis Examples are shown in Table 1.

Synthesis methods for other compounds than the compounds shown in Table 1 may be easily recognized by those skilled in the technical field by referring to the synthesis paths and source material materials described above.

TABLE 1

| | | MS/FAB | |
|---|---|---|---|
| Compound | $^1$H NMR ($CDCl_3$, 400 MHz) | found | calc. |
| BD1 | 3.71(s, 3H), 7.16(t, 2H), 7.27(d, 1H), 7.31-7.35(m, 3H), 7.44-7.49(m, 3H), 7.58(d, 1H), 7.70-7.72(m, 3H), 7.75(s, 1H), 7.95(d, 2H), 8.53(d, 2H) | 682.13 | 682.65 |
| BD5 | 3.70(s, 3H), 3.81(s, 3H), 7.00(d, 2H), 7.15(t, 2H), 7.26(d, 1H), 7.30-7.34(m, 3H), 7.44(d, 1H), 7.47(d, 1H), , 7.49(d, 1H), 7.56(d, 1H), 7.70-7.74(m, 5H), 7.94(d, 2H), 8.54(d, 2H) | 788.20 | 788.77 |
| BD27 | 8.80(s, 2H), 8.56(d, 1H), 7.89-7.91 (m, 3H), 7.74(m, 2H), 7.64(d, 1H), 7.56(d, 1H), 7.48(t, 1H), 7.39(d, 1H), 7.27(m, 3H), 6.97(d, 2H), 2.46(s, 6H), 1.38(s, 9H) | 819.27 | 819.89 |
| BD36 | 8.55(s, 2H), 7.93(m, 3H), 7.82(d, 1H), 7.75(s, 1H), 7.72(d, 1H), 7.68(t, 1H), 7.58(d, 1H), 7.28-7.44(m, 8H), 7.16(m, 2H), 1.91(s, 6H), 1.44(s, 9H) | 828.24 | 828.88 |
| BD46 | 8.55(m, 3H), 8.11(d, 1H), 7.94(d, 2H), 7.83(m, 2H), 7.75(s, 1H), 7.68-7.73(m, 3H), 7.47(d, 1H), 7.31-7.38(m, 4H), 7.16(m, 2H), 6.95(t, 1H) | 679.14 | 679.65 |
| BD65 | 8.56(d. 2H), 8.15(d, 1H), 7.94(d, 2H), 7.78(d, 1H), 7.73(d, 1H), 7.70-7.72(m, 3H), 7.61 (m, 1H), 7.44-7.53(m, 5H), 7.31-7.35(m, 3H), 7.15(t, 2H), 7.02(d, 2H), 3.81(s, 3H) | 785.15 | 785.77 |
| BD80 | 8.74(d, 1H), 8.55(d, 2H), 8.15(t, 1H), 8.02(d, 1H), 7.94(d, 2H), 7.83(d, 1H), 7.68-7.78(m, 5H), 7.44-7.52(m, 3H), 7.31-7.35(m, 3H), 7.16(t, 2H), 7.01 (d, 2H), 3.80(s, 3H) | 785.17 | 785.77 |

Manufacture of Organic Light-Emitting Device

Example 1

As an anode, a glass substrate (product of Corning Inc.) with a 15 n)/cm$^2$(1,200 Å) ITO formed thereon was cut to a size of 50 mm×50 mm×0.7 mm, sonicated with isopropyl alcohol and pure water each for 5 minutes, and cleaned by exposure to ultraviolet rays and ozone for 30 minutes. The resultant structure was mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter referred to as NPB) was vacuum-deposited on the hole injection layer to form a hole transport layer having a thickness of 300 Å.

Compound BD1 (first compound), Compound ETH66 (second compound), and Compound HTH29 (third compound) were vacuum-deposited on the hole transport layer to form an emission layer having a thickness of 400 Å. In this regard, the amount of Compound BD1 was 10 wt % with respect to the total weight of compounds in the emission layer (100 wt %), and the weight ratio of Compound ETH66 and Compound HTH29 was 3:7.

Compound ETH2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and Al was vacuum-deposited thereon to form a cathode having a thickness of 3,000 Å, thereby completing the manufacture of an organic light-emitting device.

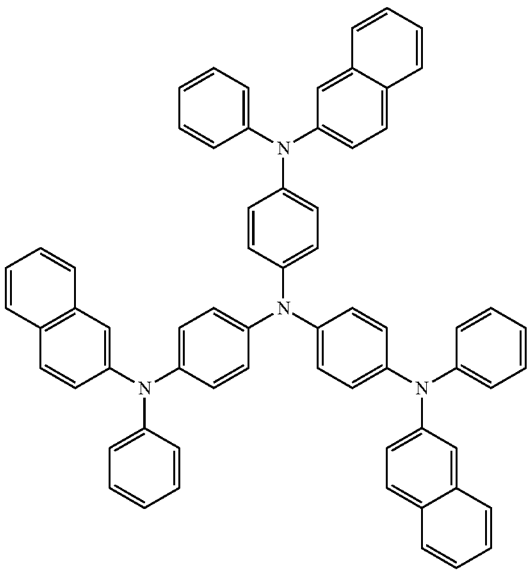

2-TNATA

-continued

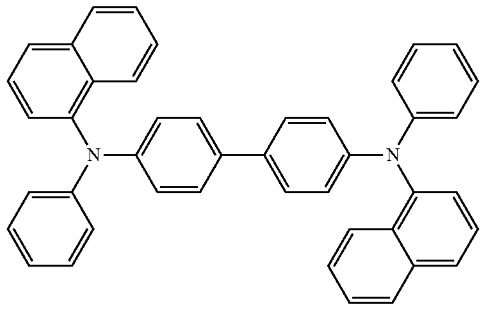

NPB

ETH66

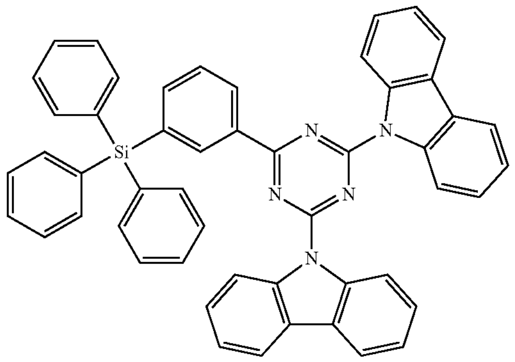

HTH29

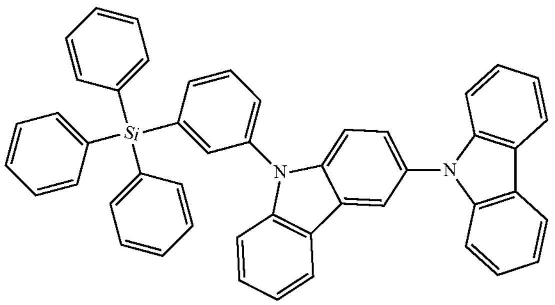

ETH2

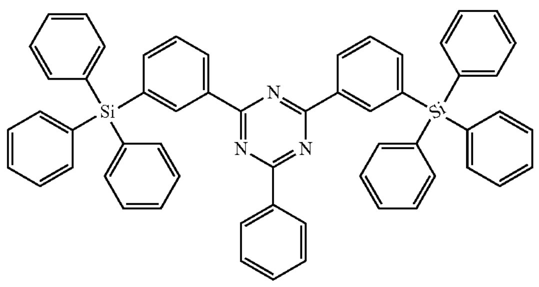

Example 2

An organic light-emitting device was manufactured in the same manner as in Example 1, except that, in forming an emission layer, Compound BD5 was used instead of Compound BD1.

Example 3

An organic light-emitting device was manufactured in the same manner as in Example 1, except that, in forming an emission layer, Compound BD27 was used instead of Compound BD1.

Example 4

An organic light-emitting device was manufactured in the same manner as in Example 1, except that, in forming an emission layer, Compound BD65 was used instead of Compound BD1.

Comparative Example 1

An organic light-emitting device was manufactured in the same manner as in Example 1, except that, in forming an emission layer, Compound A was used instead of Compound BD1.

Comparative Example 2

An organic light-emitting device was manufactured in the same manner as in Example 1, except that, in forming an emission layer, Compound B was used instead of Compound BD1.

Example 5

In forming an emission layer, the first to third compounds shown in Table 3 were respectively used as a first compound, a second compound, and a third compound. Unlike in Example 1, DFD2 was additionally used as a fourth compound.

An organic light-emitting device was manufactured in the same manner as in Example 1, except that the amount of the first compound was 10 wt % with respect to the total weight of compounds in the emission layer (100 wt %), the amount of the fourth compound was 0.5 wt % with respect to the total weight of compounds in the emission layer (100 wt %), and the weight ratio of the second compound and the third compound was 3:7.

Example 6

An organic light-emitting device was manufactured in the same manner as in Example 5, except that, in forming an emission layer, Compound BD5 was used instead of Compound BD1.

Example 7

An organic light-emitting device was manufactured in the same manner as in Example 5, except that, in forming an emission layer, Compound BD65 was used instead of Compound BD1.

Comparative Example 3

An organic light-emitting device was manufactured in the same manner as in Example 5, except that, in forming an emission layer, Compound A was used instead of Compound BD1.

Comparative Example 4

An organic light-emitting device was manufactured in the same manner as in Example 5, except that, in forming an emission layer, Compound B was used instead of Compound BD1.

A

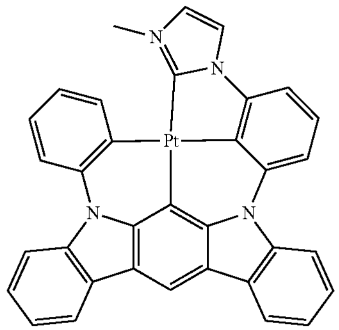

B

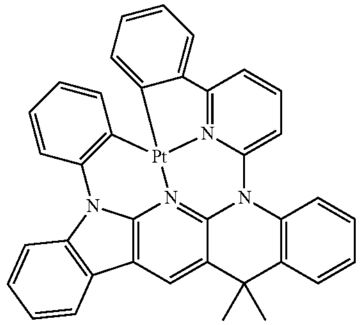

The characteristics of the organic light-emitting devices manufactured according to Examples 1 to 7 and Comparative Examples 1 to 4 were evaluated by measuring the driving voltage (V) at the luminance of 1,000 cd/$m^2$, efficiency, maximum emission wavelength (nm), and the like.

The driving voltage (V) at the luminance of 1,000 cd/$m^2$, luminescence efficiency (cd/A), maximum emission wavelength (nm), and lifespan ($LT_{95}$) were measured by using Keithley MU 236 and luminance meter PR650, and results thereof are shown in Tables 2 and 3. In Tables 2 and 3, the lifespan ($LT_{95}$) is a measure of the time (hr) taken when the luminance reaches 95% of the initial luminance.

TABLE 2

| | | Host | | | Driving | | Emission | |
|---|---|---|---|---|---|---|---|---|
| | Dopant | Second compound | Third compound | Luminance (cd/$m^2$) | voltage (V) | Efficiency (cd/A) | wavelength (nm) | Lifespan ($LT_{95}$) (h) |
| Example 1 | BD1 | ETH66 | HTH29 | 1000 | 4.2 | 20.8 | 463 | 80.6 |
| Example 2 | BD5 | ETH66 | HTH29 | 1000 | 4.1 | 21.6 | 460 | 77.3 |
| Example 3 | BD27 | ETH66 | HTH29 | 1000 | 4.4 | 20.7 | 485 | 90.1 |
| Example 4 | BD65 | ETH66 | HTH29 | 1000 | 4.0 | 24.7 | 452 | 82.4 |

TABLE 2-continued

| | | Host | | | Driving | | Emission | |
|---|---|---|---|---|---|---|---|---|
| | Dopant | Second compound | Third compound | Luminance ($cd/m^2$) | voltage (V) | Efficiency (cd/A) | wavelength (nm) | Lifespan ($LT_{95}$) (h) |
| Comparative Example 1 | A | ETH66 | HTH29 | 1000 | 4.4 | 18.7 | 482 | 64.2 |
| Comparative Example 2 | B | ETH66 | HTH29 | 1000 | 4.3 | 17.5 | 480 | 54.9 |

Referring to Table 2, it is confirmed that the organic light-emitting devices manufactured according to Examples 1 to 4 show excellent results compared to those of the organic light-emitting devices manufactured according to Comparative Examples 1 and 2.

TABLE 3

| | Dopant | | Host | | | Driving | | Emission | |
|---|---|---|---|---|---|---|---|---|---|
| | First compound | Fourth compound | Second compound | Third compound | Luminance ($cd/m^2$) | voltage (V) | Efficiency (cd/A) | wavelength (nm) | Lifespan ($LT_{95}$) (h) |
| Example 5 | BD1 | DFD2 | ETH66 | HTH29 | 1000 | 4.6 | 19.1 | 461 | 54.3 |
| Example 6 | BD5 | DFD2 | ETH66 | HTH29 | 1000 | 4.4 | 18.9 | 461 | 56.1 |
| Example 7 | BD65 | DFD2 | ETH66 | HTH29 | 1000 | 4.5 | 19.7 | 461 | 55.8 |
| Comparative Example 3 | A | DFD2 | ETH66 | HTH29 | 1000 | 4.7 | 16.7 | 461 | 49.1 |
| Comparative Example 4 | B | DFD2 | ETH66 | HTH29 | 1000 | 4.6 | 17.6 | 461 | 47.1 |

Referring to Table 3, it is confirmed that the organic light-emitting devices manufactured according to Examples 5 to 7 show excellent results compared to those of the organic light-emitting devices manufactured according to Comparative Examples 3 and 4.

A light-emitting device according to an embodiment has excellent efficiency and lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:

a first electrode;

a second electrode facing the first electrode; and an interlayer disposed between the first electrode and the second electrode, wherein the interlayer includes an emission layer, the emission layer comprises:

a first compound which is an organometallic compound represented by Formula 2;

a second compound comprising at least one of a pyrimidine group and a 1,3,5-triazine group; and a third compound represented by Formula 11, and the first compound, the second compound, and the third compound are different from one another:

[Formula 2]

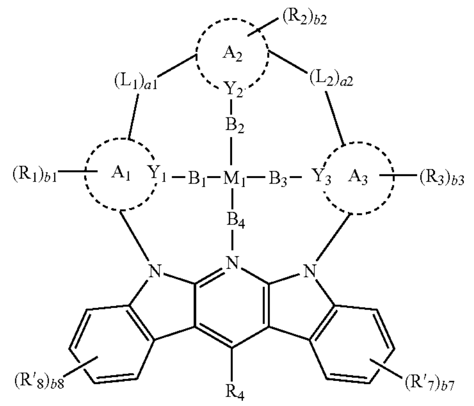

wherein in Formula 2, $M_1$ is a transition metal, ring $A_1$ to ring $A_3$ are each independently a $C_5$-$C_{60}$ carbocyclic group or a $C_1$-$C_{60}$ heterocyclic group, $L_1$ and $L_2$ are each independently a single bond, *—O—*', *—S—*', *—C($R_5$)($R_6$)—*', *—C($R_5$)=*', *=C($R_5$)—*', *—C($R_5$)=C($R_6$)—*', *—C(=O)—*', *—C(=S)—*', *—C≡C—*', *—B($R_5$)—*', *—N($R_5$)—*', *—P($R_5$)—*', *—Si($R_5$)($R_6$)—*', *—P($R_5$)($R_6$)—*', or *—Ge($R_5$)($R_6$)—*', a1 and a2 are each independently 0, 1, 2, or 3, one of a1 and a2 is 0, when a1 is 0, ring $A_1$ and ring $A_2$ are not linked to each other, when a2 is 0, ring $A_2$ and ring $A_3$ are not linked to each other, $Y_1$ to $Y_3$ are each independently a carbon atom (C) or a nitrogen atom (N), $B_1$ to $B_4$ are each independently a chemical bond, *—O—*', or *—S—*', $R_1$ to $R_6$, $R'_7$, and $R'_8$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_8$-$C_{60}$ monovalent non-aromatic condensed polycyclic group unsubstituted or substituted with at least one $R_{10a}$, a $C_1$-$C_{60}$ monovalent non-aromatic condensed heteropolycyclic group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, two neighboring substituents among $R_1$ to $R_8$ are optionally linked to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b3 are each independently an integer from 1 to 5, b7 and b8 are each independently an integer from 1 to 4, and

* and *' each indicate a binding site to a neighboring atom,

[Formula 11]

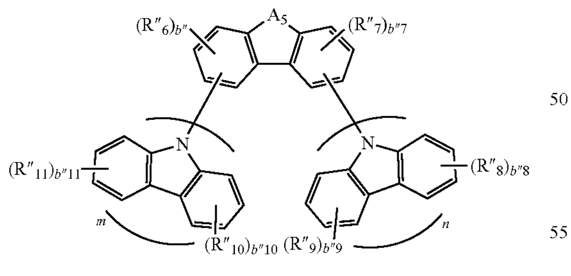

wherein in Formula 11, $A_5$ is O, S, $N(R''_{12})$, or $C(R''_{13})(R''_{14})$, m and n are each independently an integer from 0 to 4, $R''_6$ to $R''_{14}$ are each independently the same as described in connection with $R_1$ in Formula 2, and b"6 to b"11 are each independently an integer from 0 to 4, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein $M_1$ is platinum (Pt), palladium (Pd), nickel (Ni), copper (Cu), zinc (Zn), silver (Ag), gold (Au), rhodium (Rh), iridium (Ir), ruthenium (Ru), rhenium (Re), osmium (Os), titanium (Ti), zirconium (Zr), hafnium (Hf), europium (Eu), terbium (Tb), or thulium (Tm).

3. The light-emitting device of claim 1, wherein ring $A_1$ to ring $A_3$ are each independently a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

4. The light-emitting device of claim 1, wherein a1 in Formula 2 is 0.

5. The light-emitting device of claim 1, wherein ring $A_1$ to ring $A_3$ in Formula 2 are each independently a group represented by one of Formulae 2-1(1) to 2-1(35) and 2-2(1) to 2-2(25):

2-1(1)

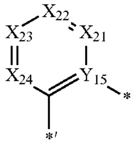

2-1(2)

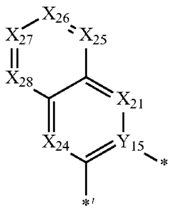

2-1(3)

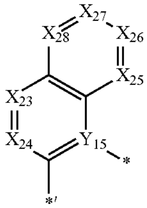

2-1(4)

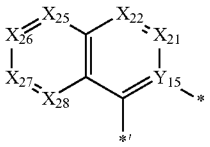

2-1(5)

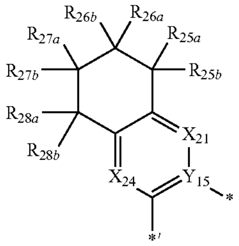

2-1(6)

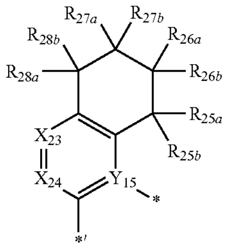

-continued 2-1(7)

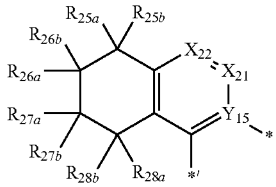

2-1(8)

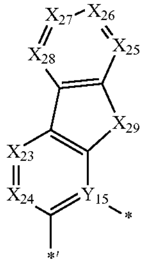

2-1(9)

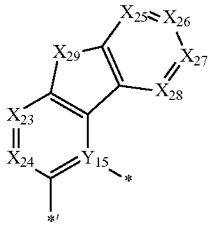

2-1(10)

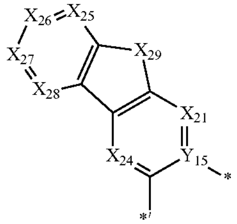

2-1(11)

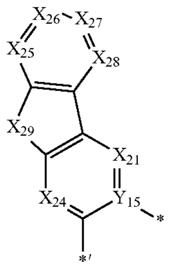

2-1(12)

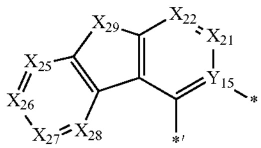

2-1(13)

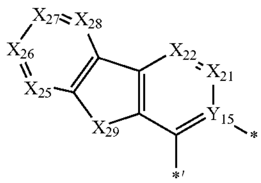

-continued
2-1(14)
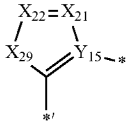
2-1(15)
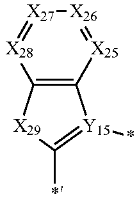
2-1(16)
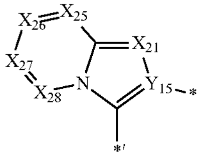
2-1(17)
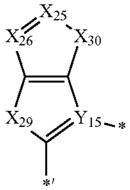
2-1(18)
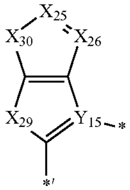
2-1(19)
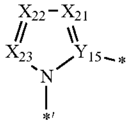
2-1(21)
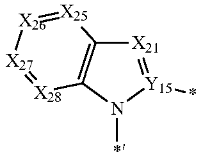
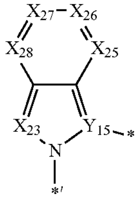
2-1(22)
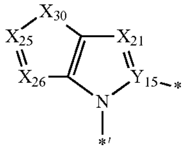
-continued
2-1(23)
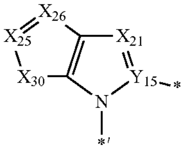
2-1(24)
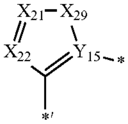
2-1(25)
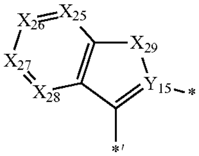
2-1(26)
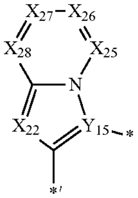
2-1(27)
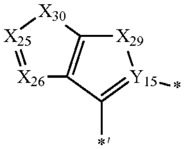
2-1(28)
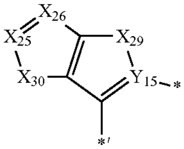
2-1(29)
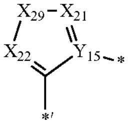
2-1(30)
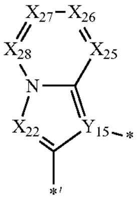
2-1(31)
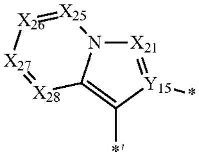

-continued
2-1(32)
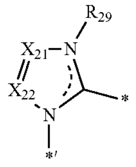
2-1(33)
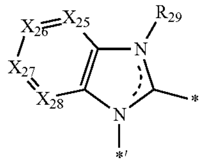
2-1(34)
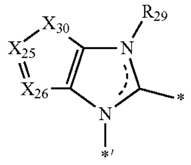
2-1(35)
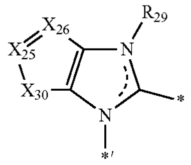
2-2(1)
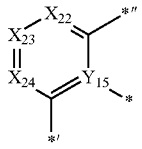
2-2(2)
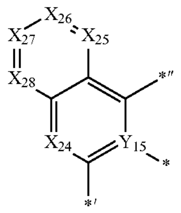
2-2(3)
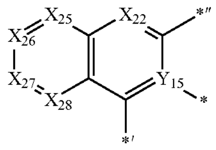
2-2(4)
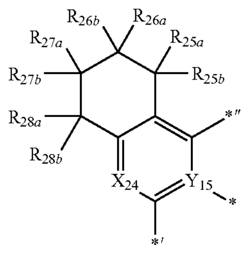
-continued
2-2(5)
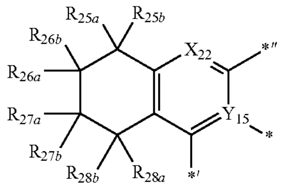
2-2(6)
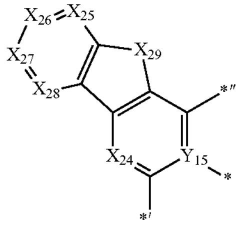
2-2(7)
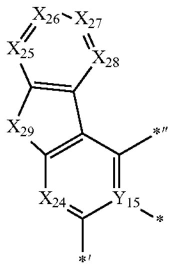
2-2(8)
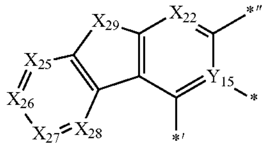
2-2(9)
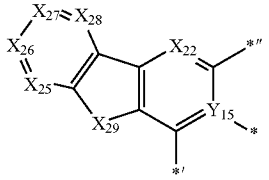
2-2(10)
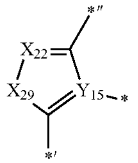
2-2(11)
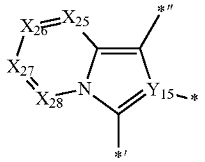
2-2(12)
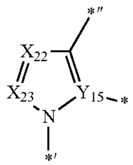

-continued 2-2(13)

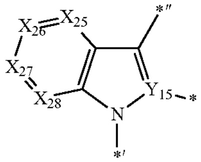

2-2(14)

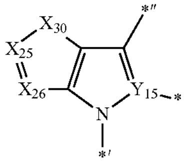

2-2(15)

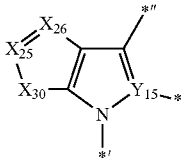

2-2(16)

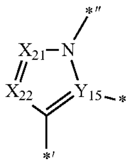

2-2(17)

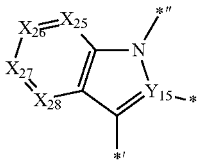

2-2(18)

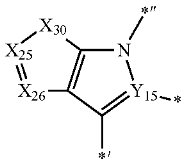

2-2(19)

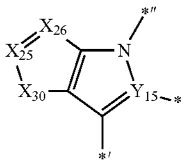

2-2(20)

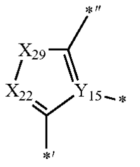

2-2(21)

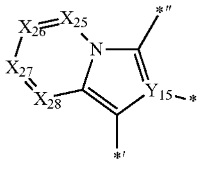

-continued 2-2(22)

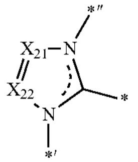

2-2(23)

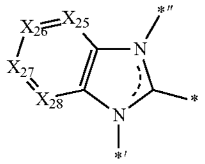

2-2(24)

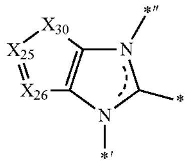

2-2(25)

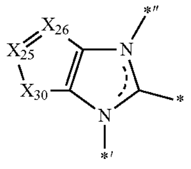

wherein in Formulae 2-1(1) to 2-1(35) and 2-2(1) to 2-2(25), $Y_{15}$ is a carbon atom (C) or a nitrogen atom (N), $X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, $X_{26}$ is N or $C(R_{26})$, $X_{27}$ is N or $C(R_{27})$, $X_{28}$ is N or $C(R_{28})$, $X_{29}$ is $C(R_{29a})(R_{29b})$, $Si(R_{29a})(R_{29b})$, $N(R_{29})$, O, or S, $X_{30}$ is $C(R_{30a})(R_{30b})$, $Si(R_{30a})(R_{30b})$, $N(R_{30})$, O, or S, $R_{21}$ to $R_{30}$ and $R_{29a}$ to $R_{30b}$ are each independently the same as described in connection with $R_1$ in Formula 1,

* indicates a binding site to B1, B2, or B3, and

*' and *" each indicate a binding site to a neighboring atom.

6. The light-emitting device of claim 1, wherein the first compound represented by Formula 2 is one selected from Compounds BD1 to BD91:

BD1

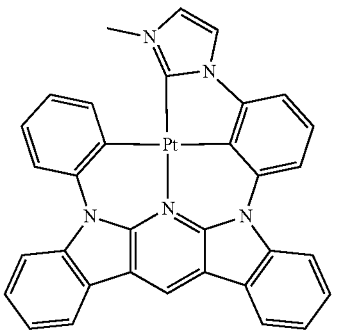

-continued
BD2
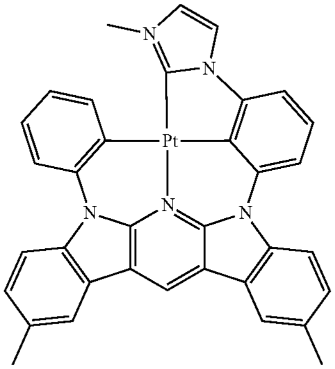
BD3
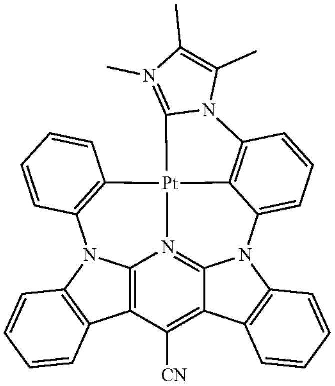
BD4
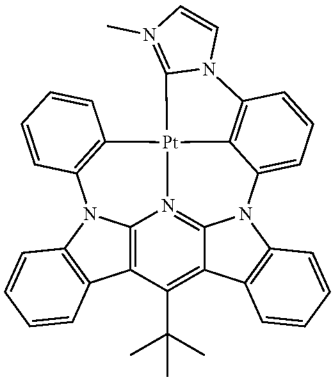
BD5
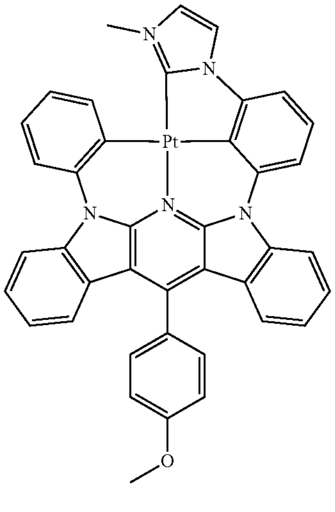
-continued
BD6
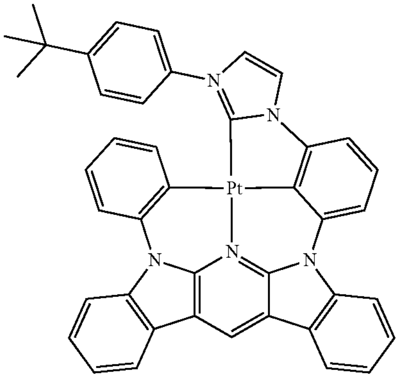
BD7
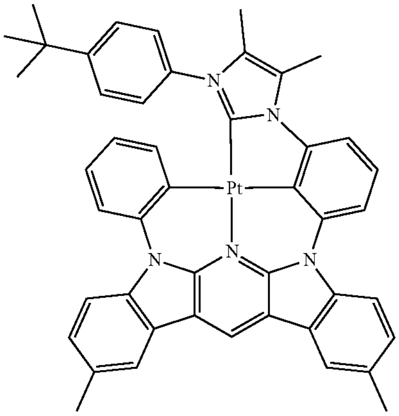
BD8
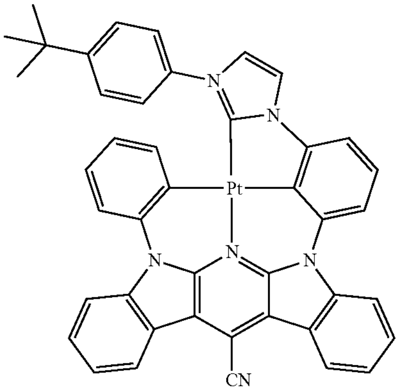
BD9
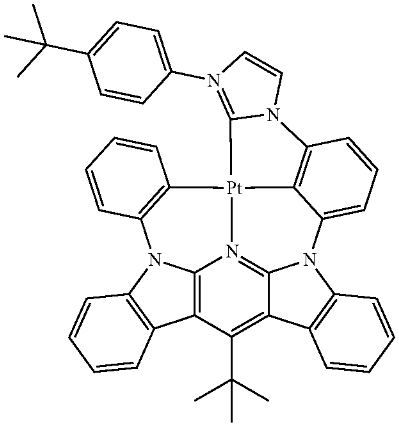

-continued
BD10
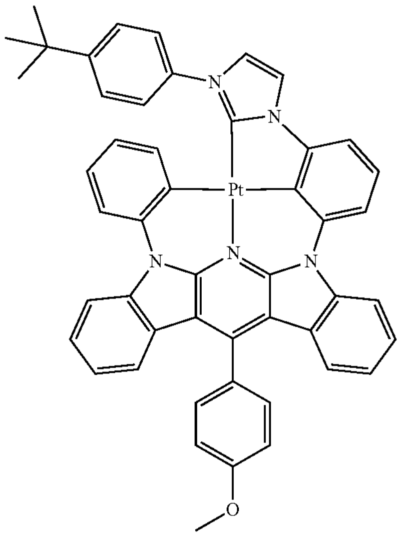
BD11
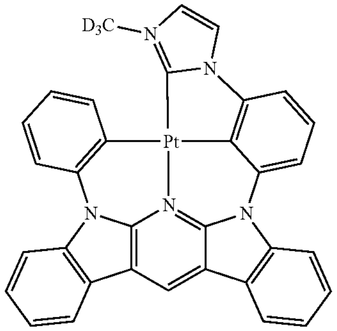
BD12
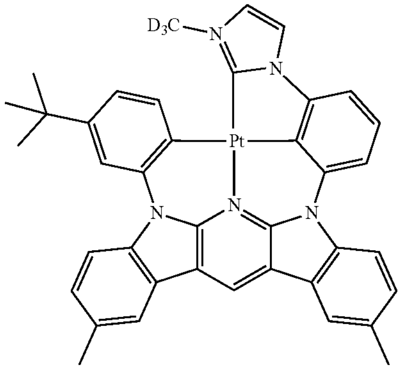
BD13
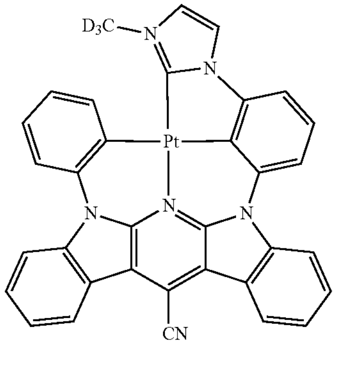
-continued
BD14
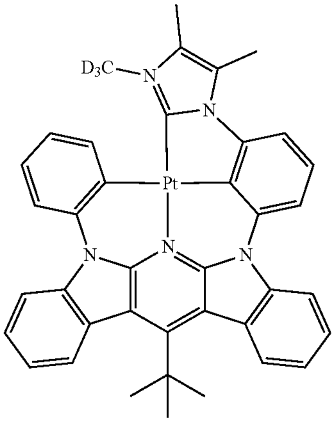
BD15
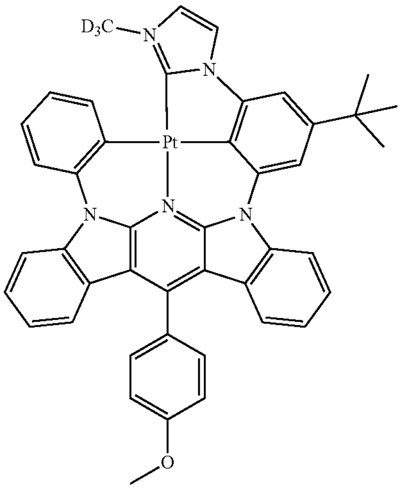
BD16
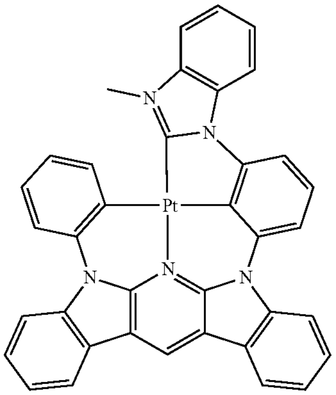

-continued
BD17
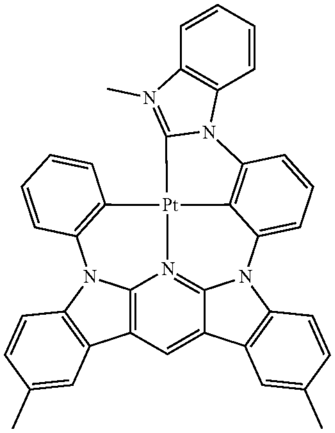
BD18
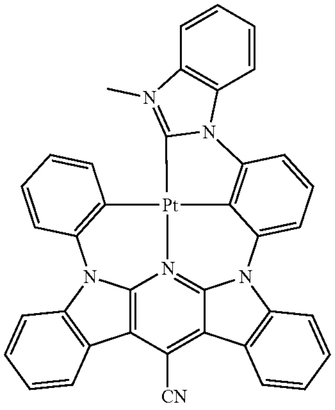
BD19
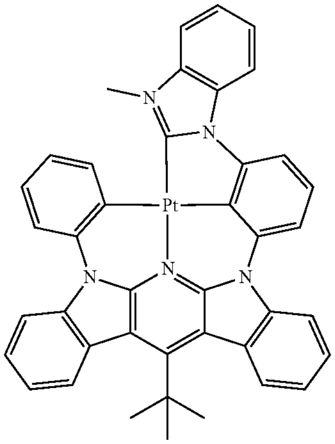
-continued
BD20
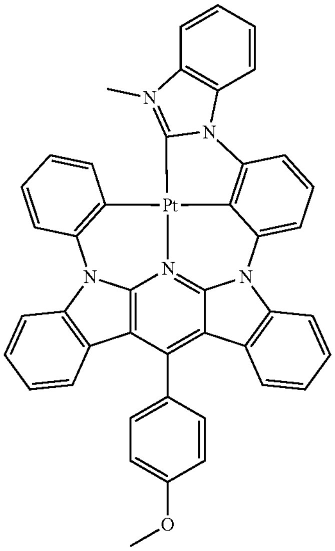
BD21
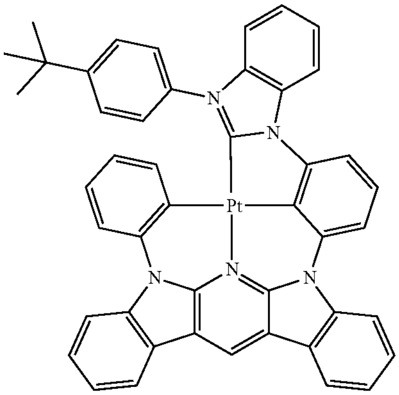
BD22
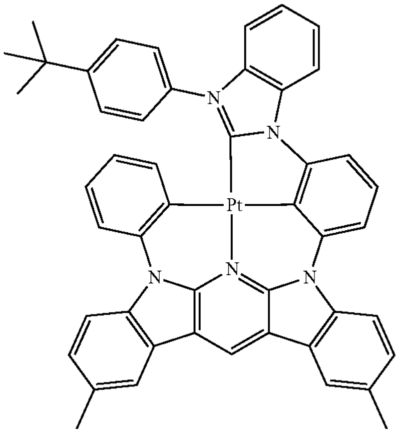

-continued
BD23
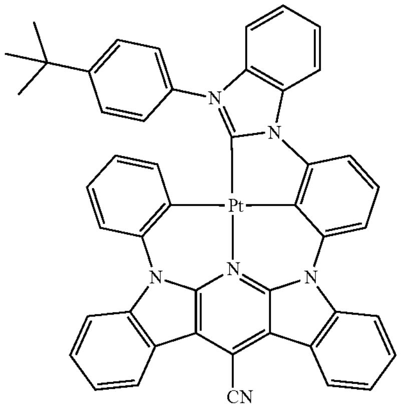
BD24
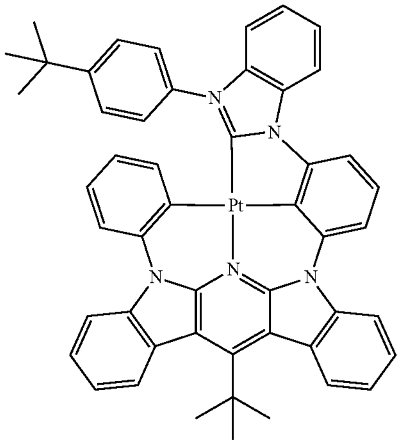
BD25
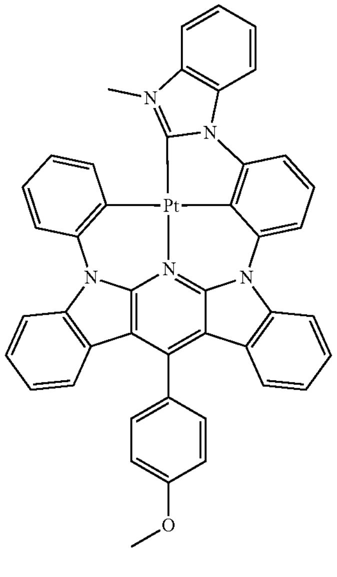
-continued
BD26
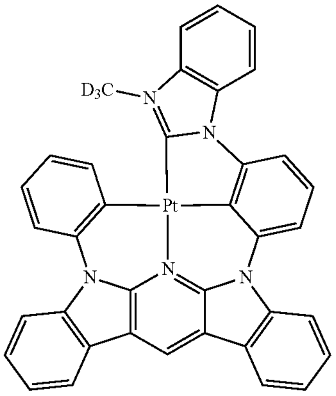
BD27
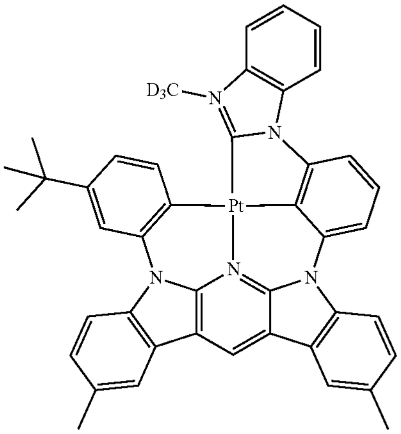
BD28
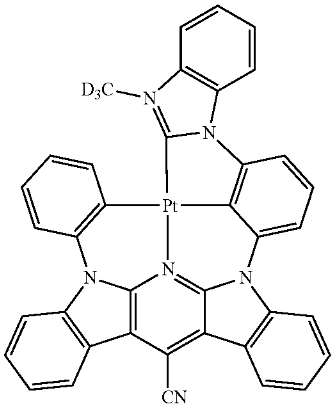

-continued
BD29
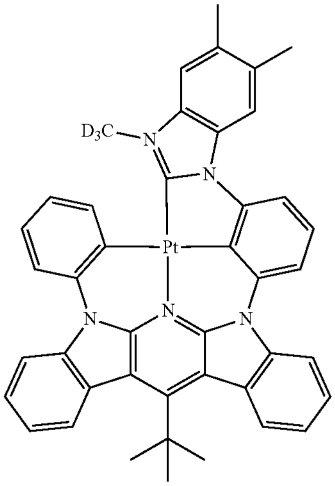
BD30
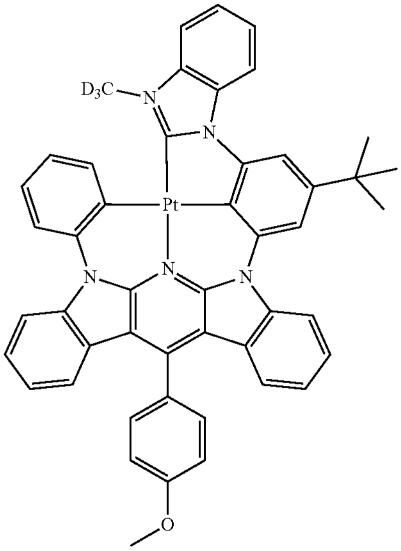
BD31
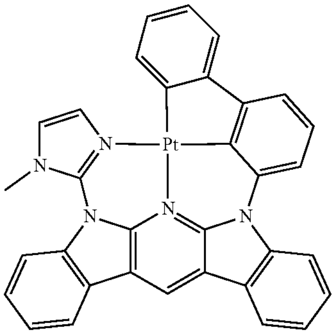
-continued
BD32
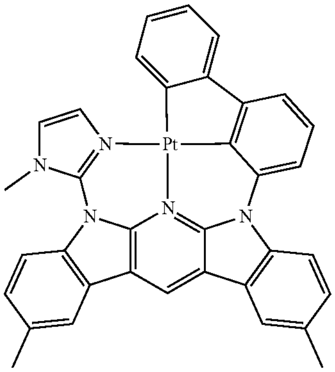
BD33
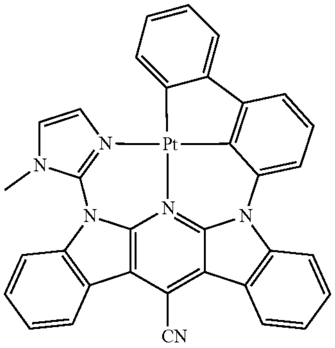
BD34
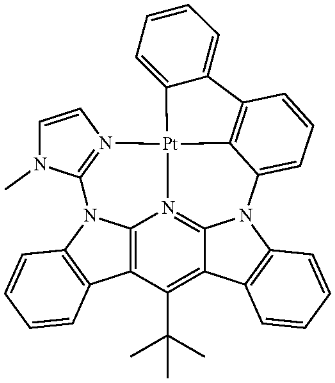
BD35
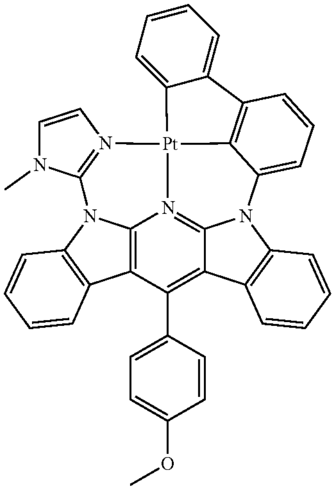

BD36
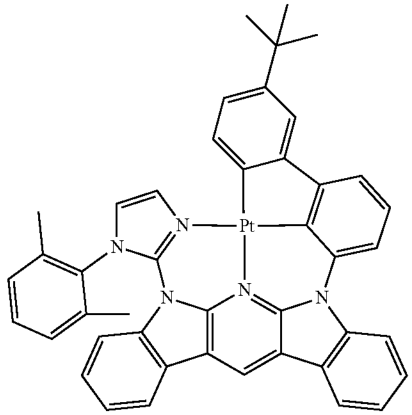
BD37
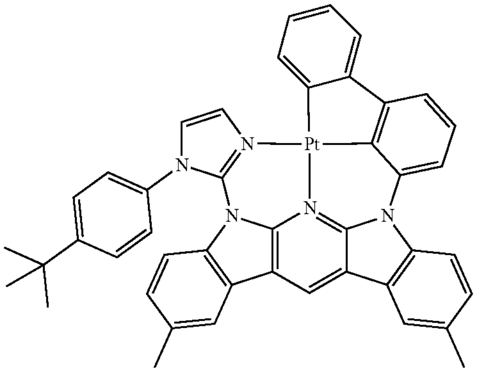
BD38
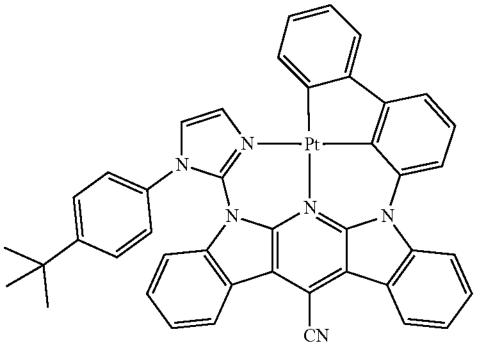
BD39
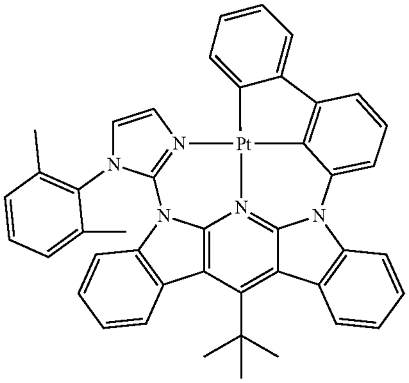
BD40
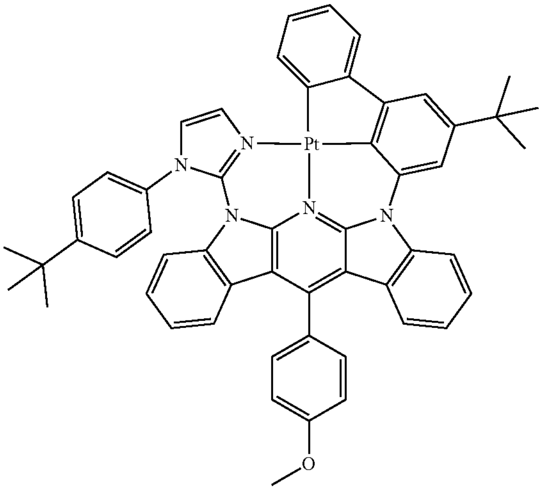
BD41
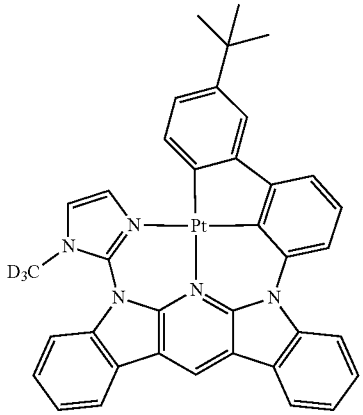
BD42
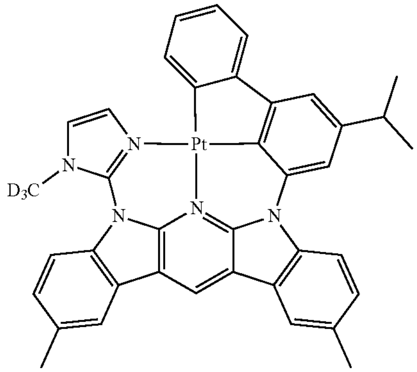

-continued
BD43
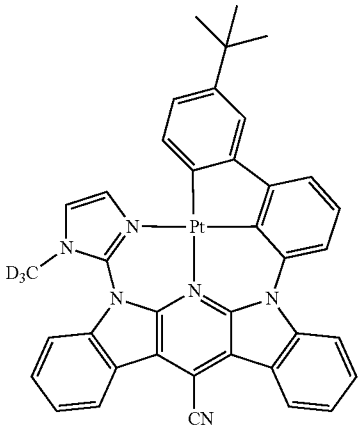
BD44
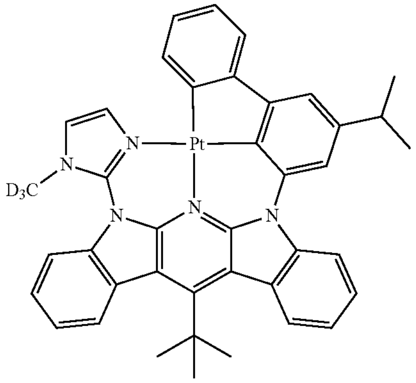
BD45
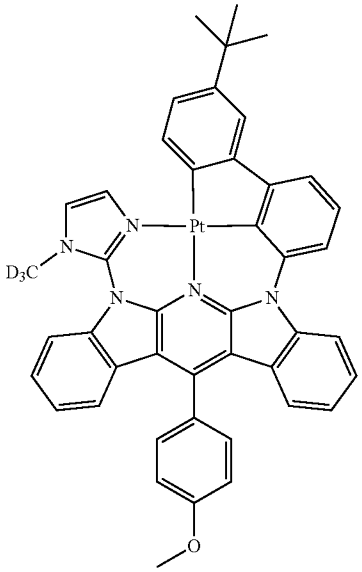
-continued
BD46
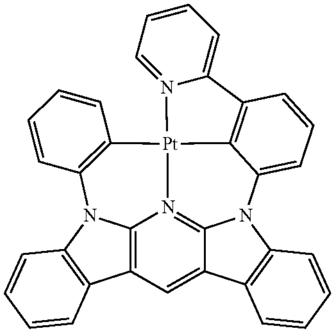
BD47
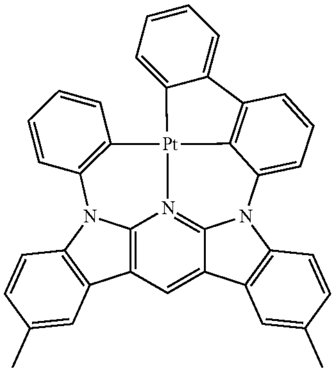
BD48
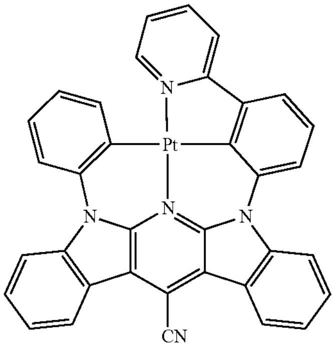
BD49
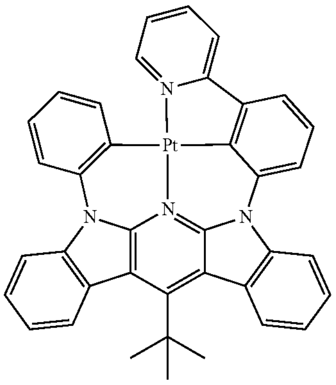

-continued
BD50
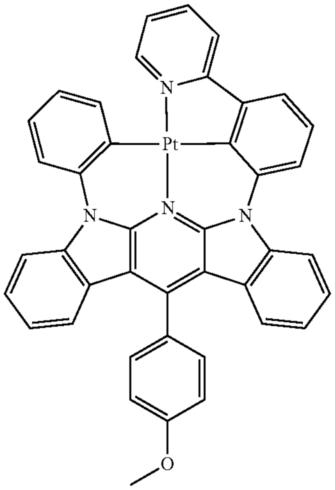
BD51
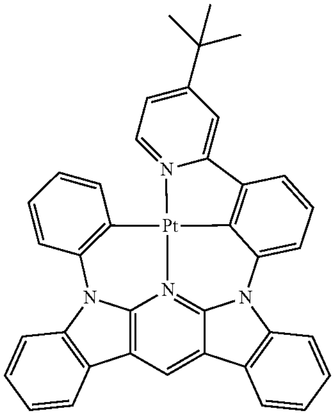
BD52
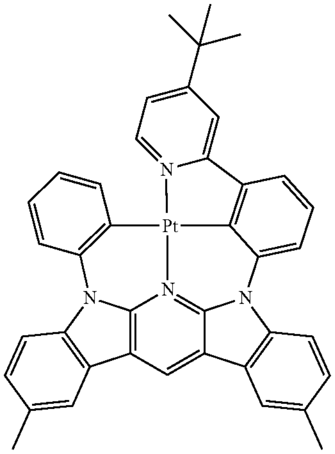
-continued
BD53
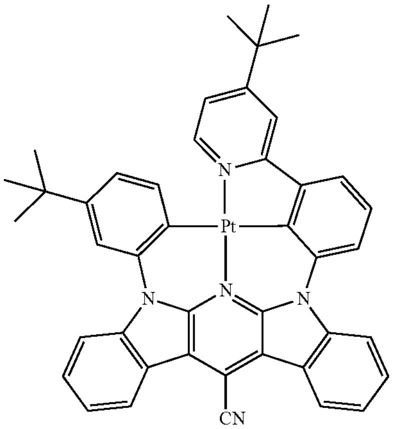
BD54
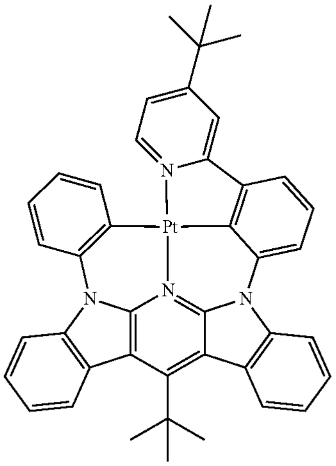
BD55
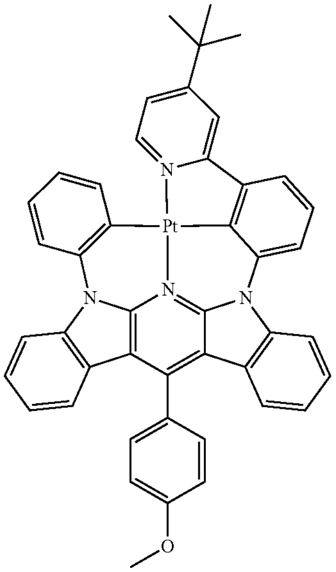

BD56
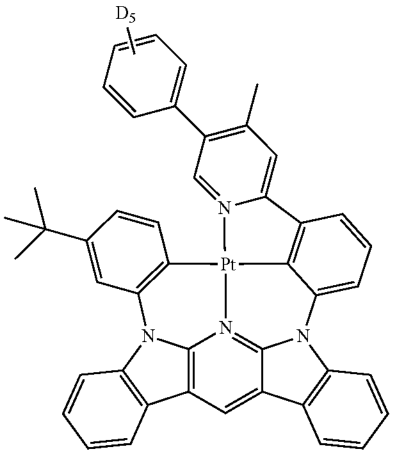
BD57
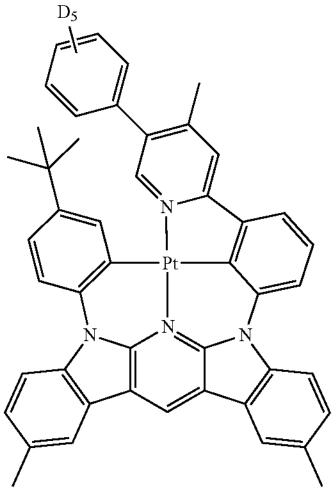
BD58
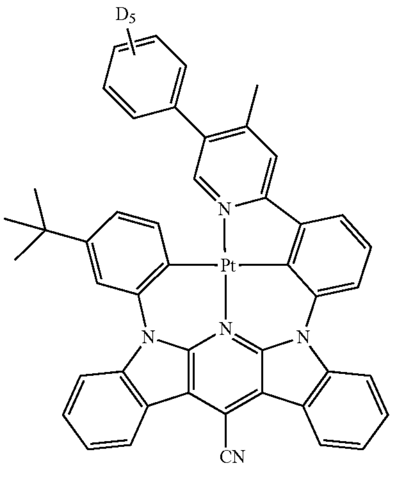
BD59
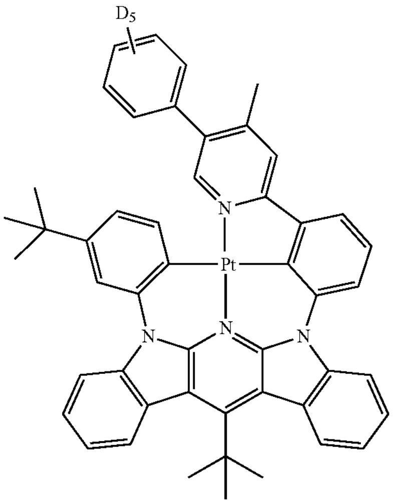
BD60
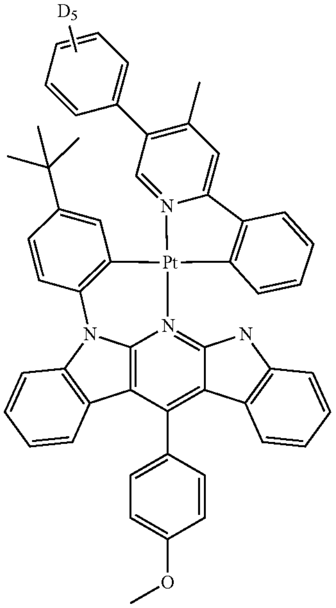
BD61
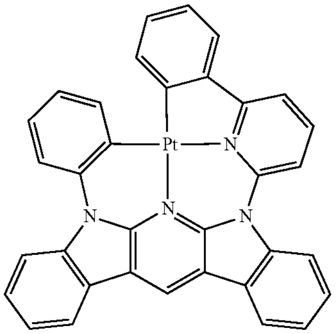

-continued
BD62
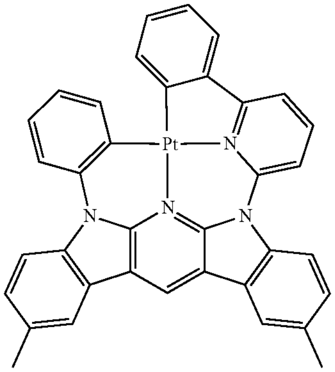
BD63
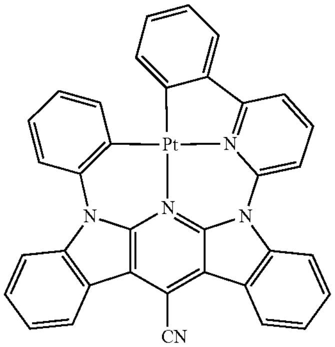
CN
BD64
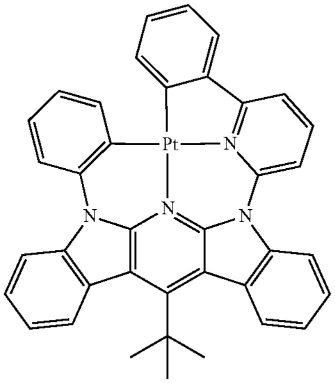
BD65
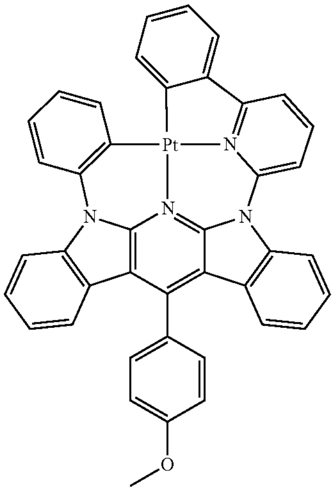
-continued
BD66
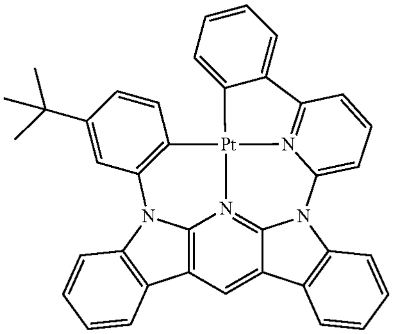
BD67
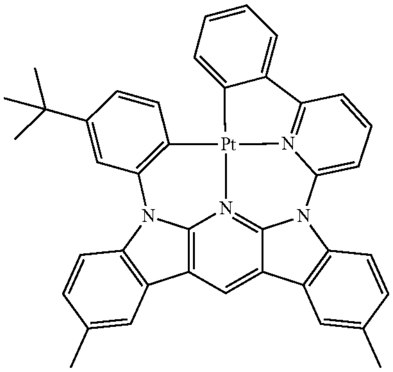
BD68
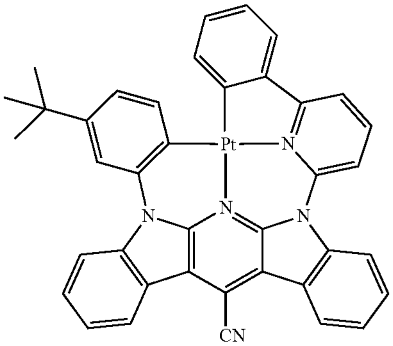
CN
BD69
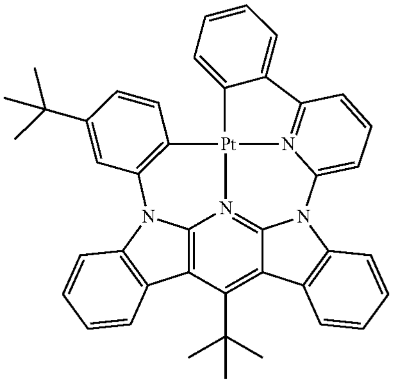

-continued
BD70
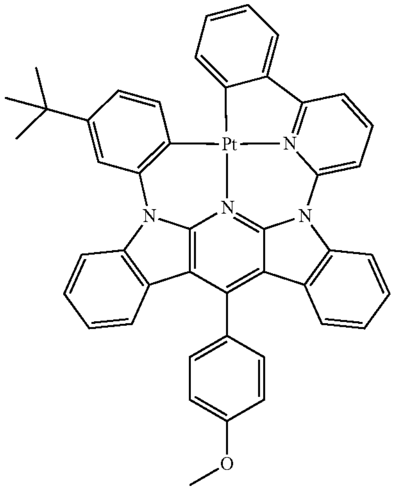
BD71
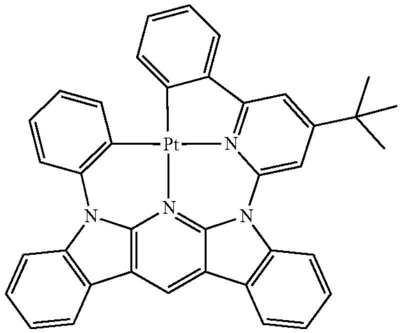
BD72
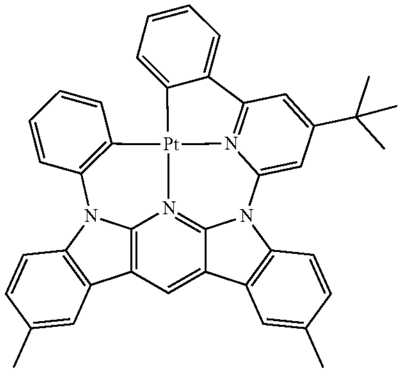
BD73
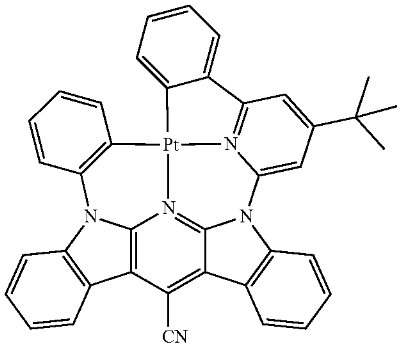
-continued
BD74
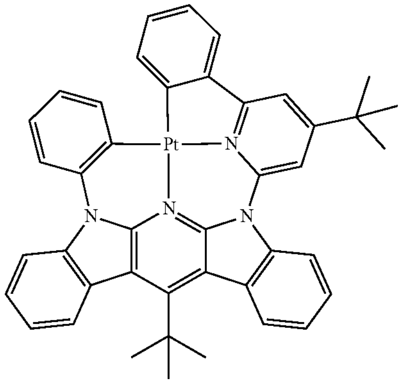
BD75
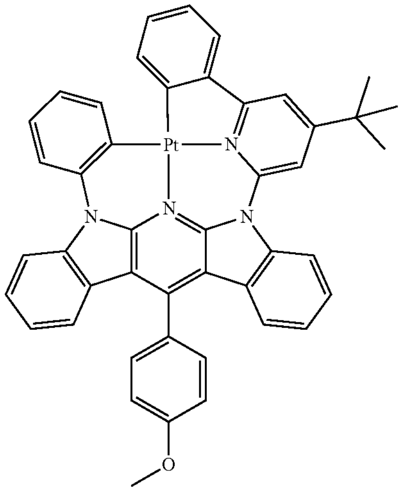
BD76
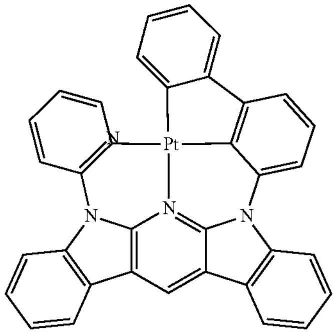
BD77
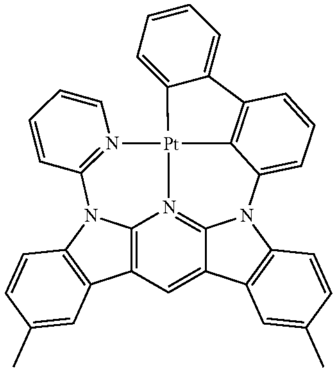

-continued
BD78
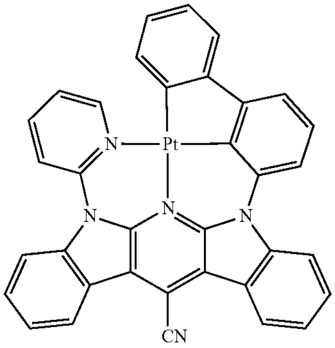
BD79
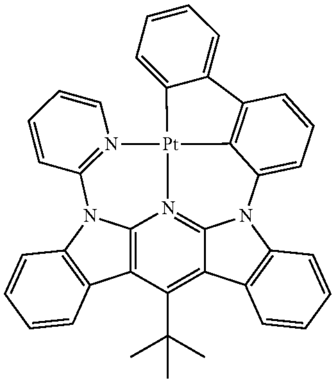
BD80
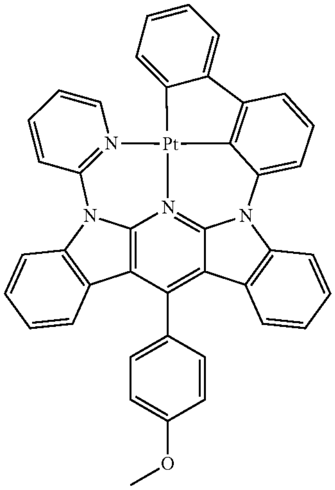
BD81
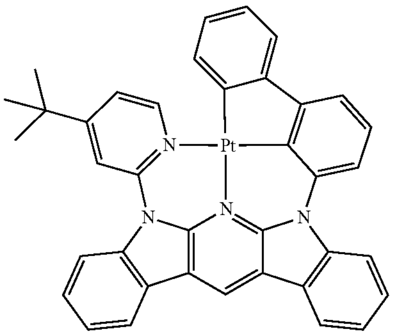
-continued
BD82
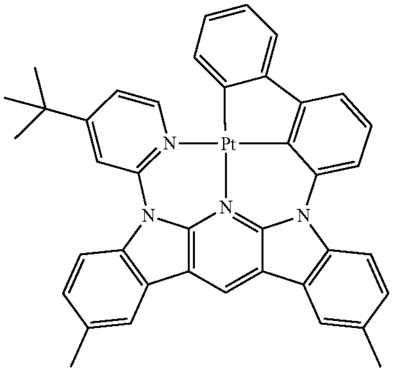
BD83
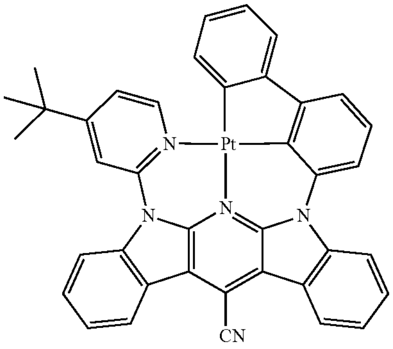
BD84
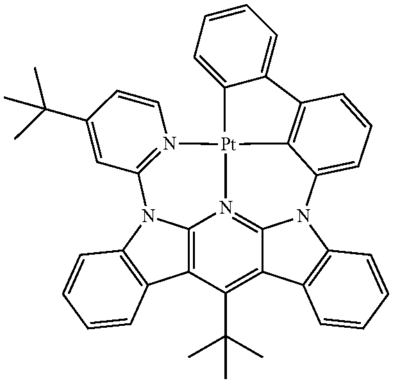
BD85
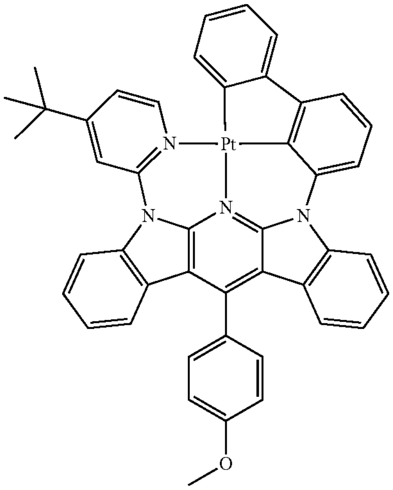

-continued

BD86

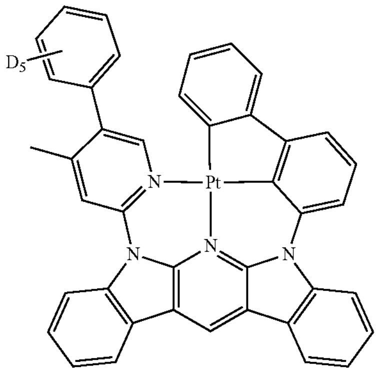

BD87

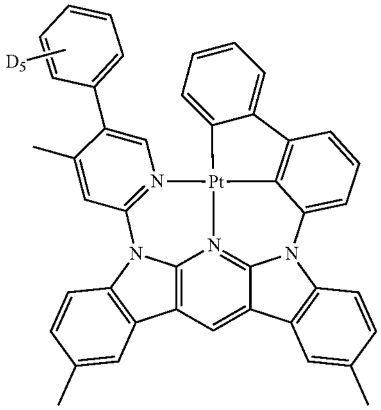

BD88

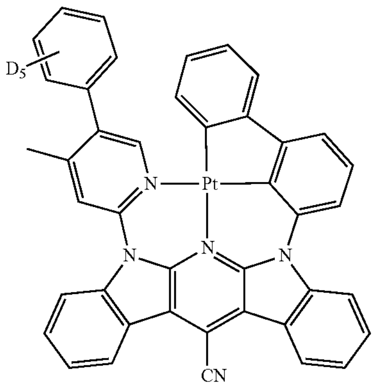

BD89

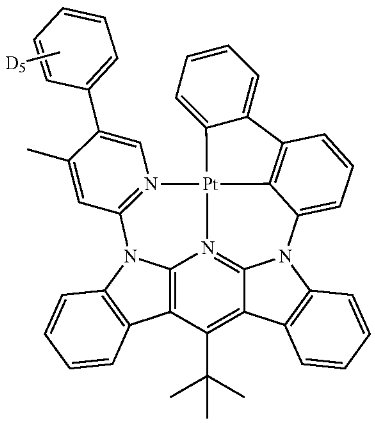

-continued

BD90

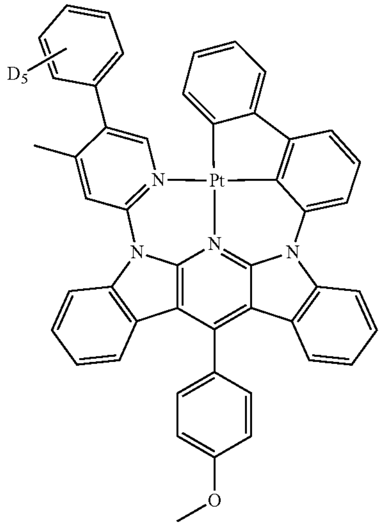

BD91

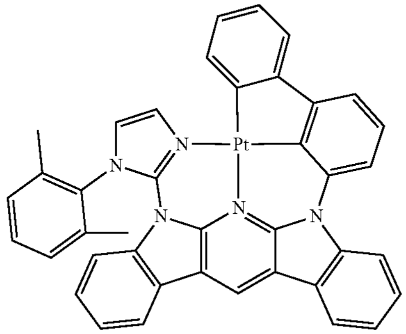

, wherein in Compounds BD1 to BD91, $D_5$ indicates that five deuterium atoms are substituted at the indicated moiety.

7. The light-emitting device of claim 1, wherein the first electrode is an anode, the second electrode is a cathode, and the interlayer further comprises:

a hole transport region disposed between the first electrode and the emission layer and comprising a hole injection layer, a hole transport layer, an emission auxiliary layer, an electron blocking layer, or a combination thereof; and/or an electron transport region disposed between the second electrode and the emission layer and comprising a hole blocking layer, an electron transport layer, an electron injection layer, or a combination thereof.

8. The light-emitting device of claim 1, wherein the emission layer comprises a fourth compound capable of emitting delayed fluorescence, the fourth compound is different from the first compound, the second compound, and the third compound, and a weight ratio of the first compound to the fourth compound is in a range of about 10:0.1 to about 10:1.0.

9. The light-emitting device of claim 1, wherein the second compound comprises a compound represented by Formula 10:

[Formula 10]

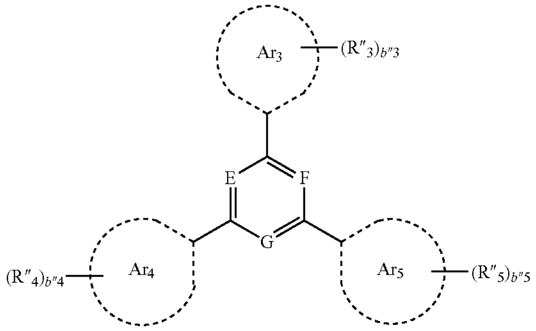

wherein in Formula 10, ring $Ar_3$ to ring Ars are each independently a $C_5$-$C_{60}$ carbocyclic group or a $C_1$-$C_{60}$ heterocyclic group, E is N or C(R"$_6$), Fis N or C(R"$_7$), G is N or C(R"$_8$), two or three of E, F, and G are each N, R"$_3$ to R"$_8$ are each independently the same as described in connection with $R_1$ in Formula 1, and b"3 to b"5 are each independently an integer from 1 to 5.

10. The light-emitting device of claim 9, wherein the second compound represented by Formula 10 is one selected from Compounds ETH1 to ETH32, ETH49 to ETH82, and ETH84:

ETH1

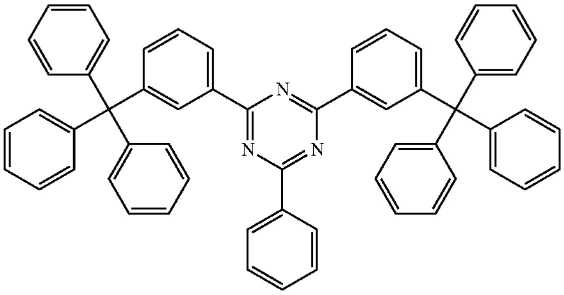

ETH2

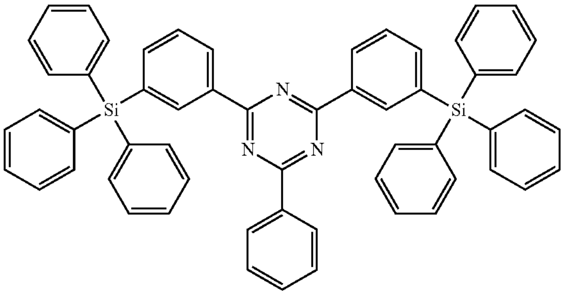

-continued

ETH3

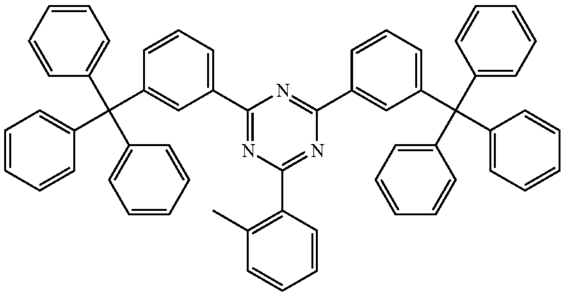

ETH4

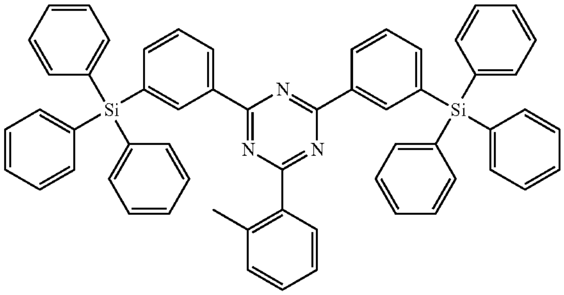

ETH5

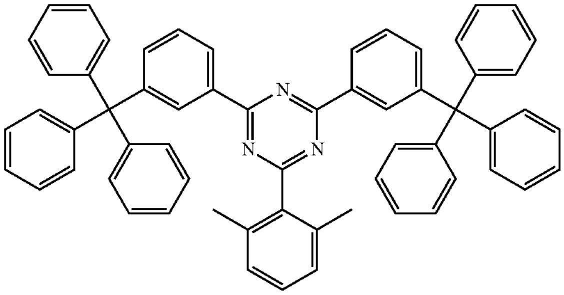

ETH6

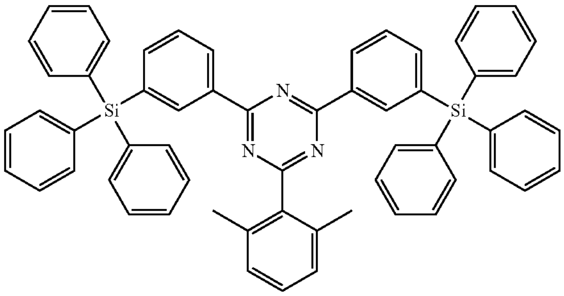

ETH7

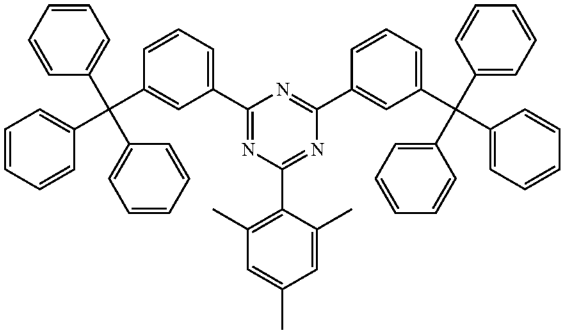

-continued
ETH8
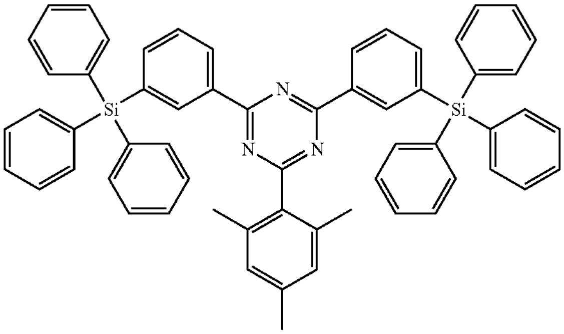
ETH9
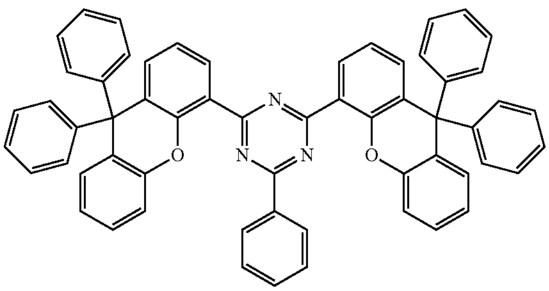
ETH10
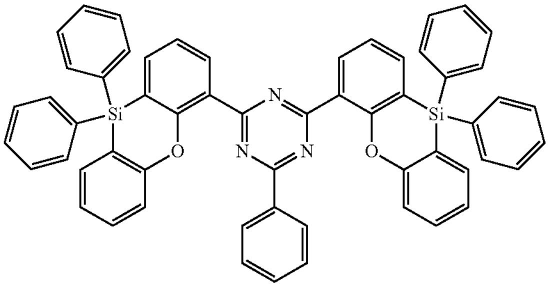
ETH11
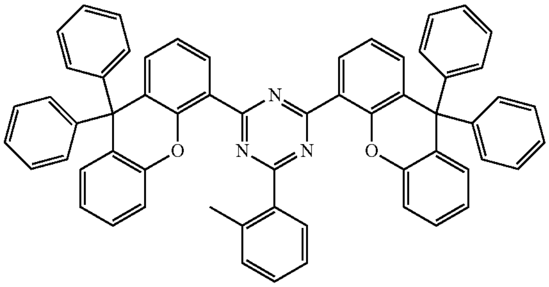
ETH12
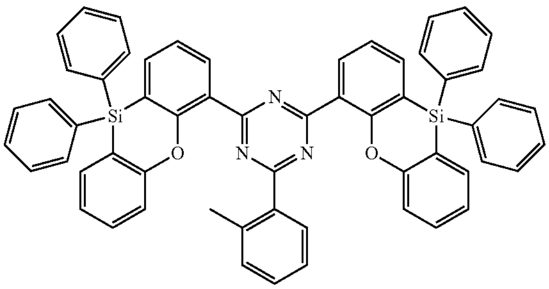
-continued
ETH13
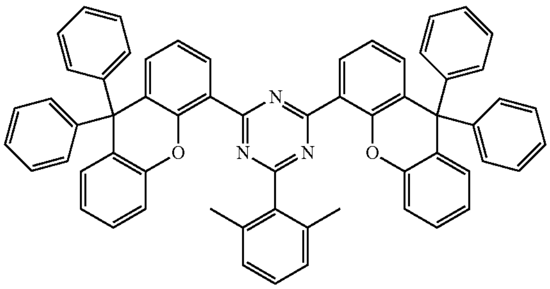
ETH14
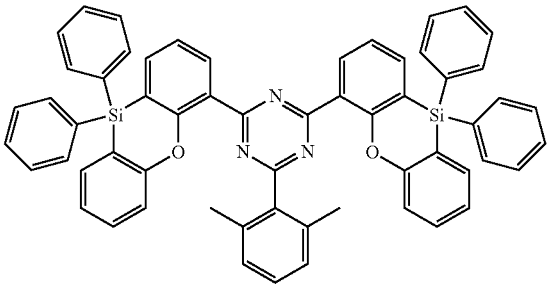
ETH15
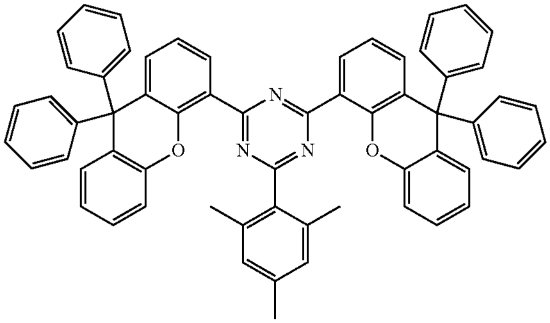
ETH16
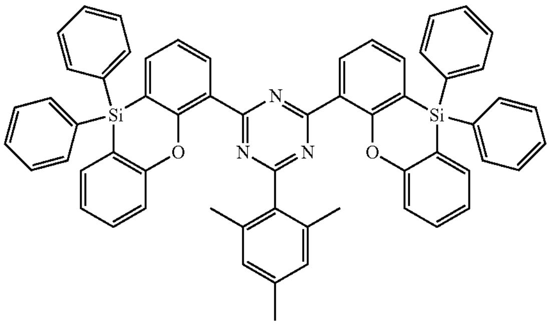
ETH17
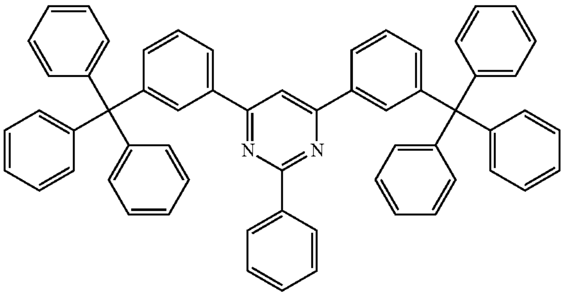

-continued
ETH18
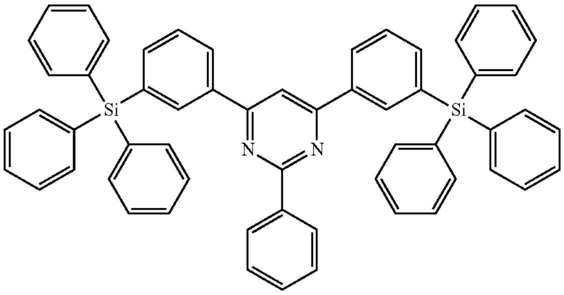
ETH19
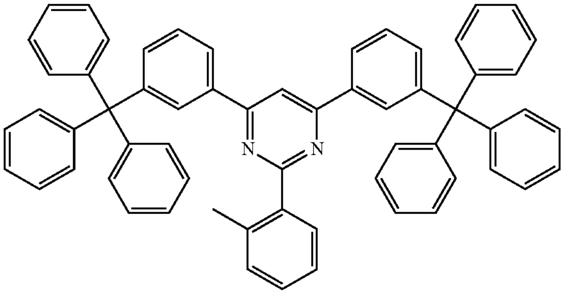
ETH20
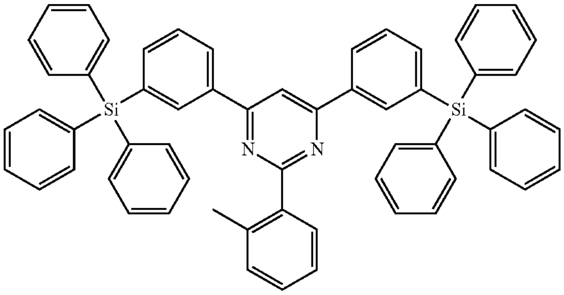
ETH21
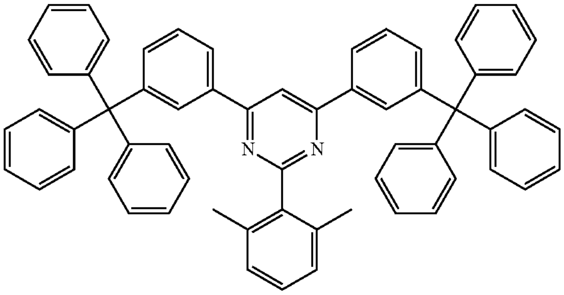
ETH22
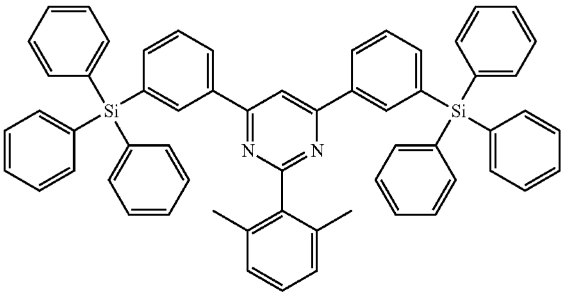
-continued
ETH23
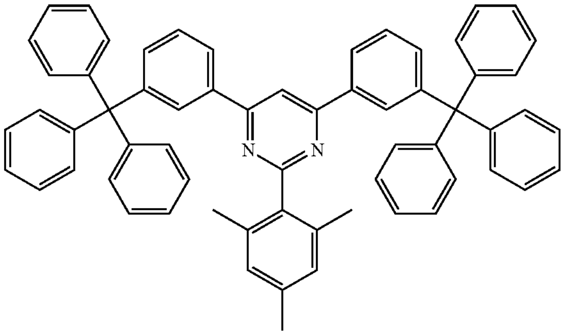
ETH24
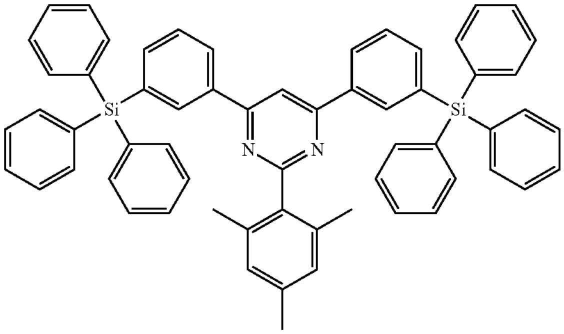
ETH25
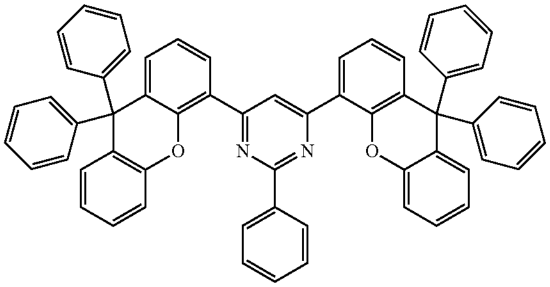
ETH26
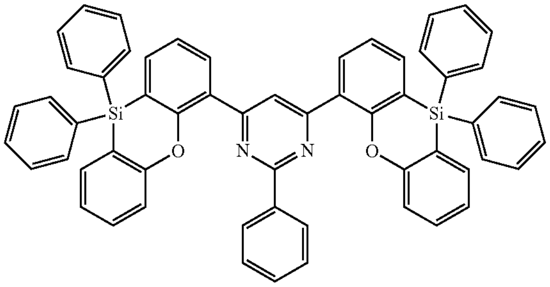
ETH27
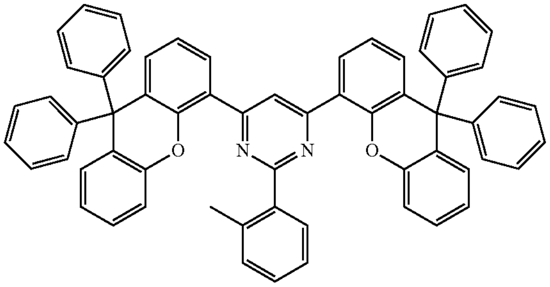

-continued
ETH28
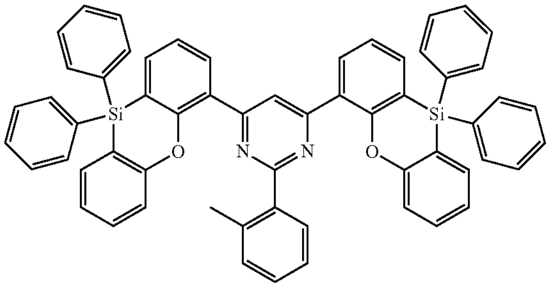
ETH29
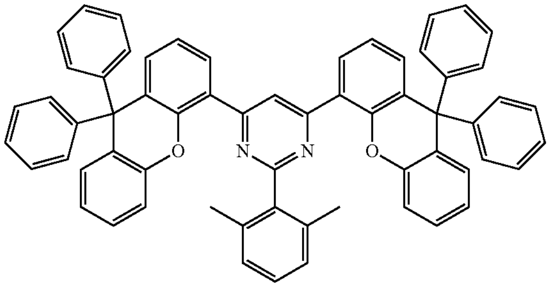
ETH30
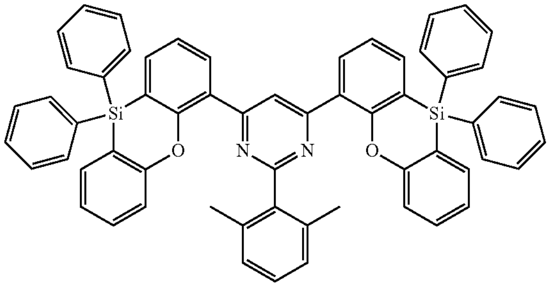
ETH31
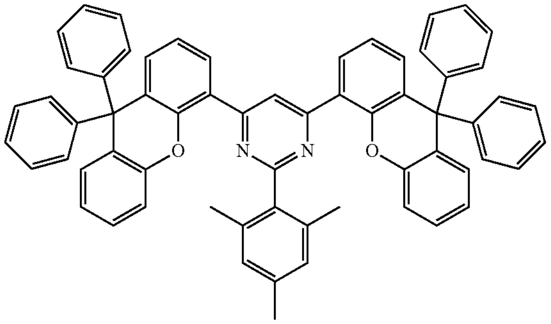
ETH32
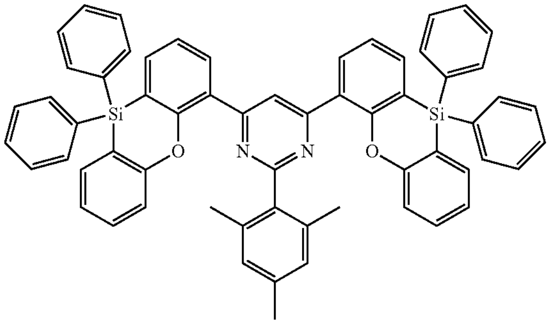
-continued
ETH49
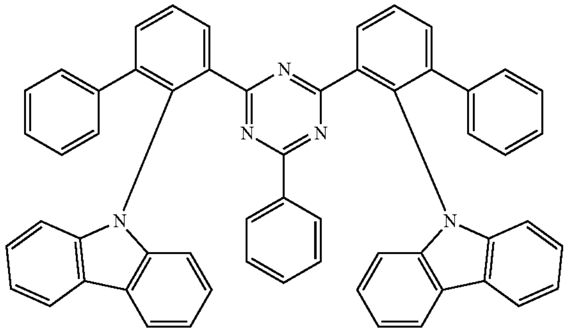
ETH50
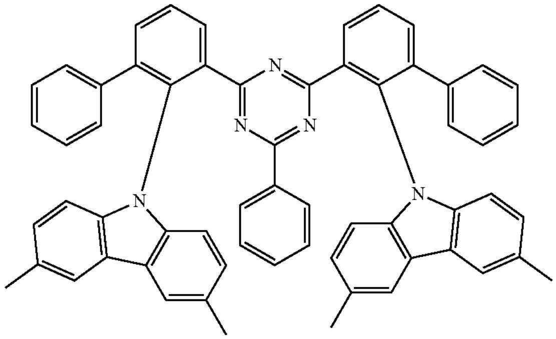
ETH51
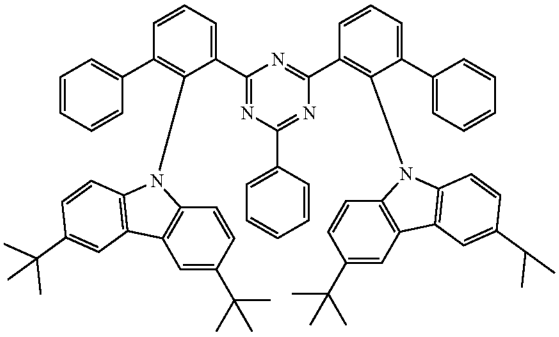
ETH52
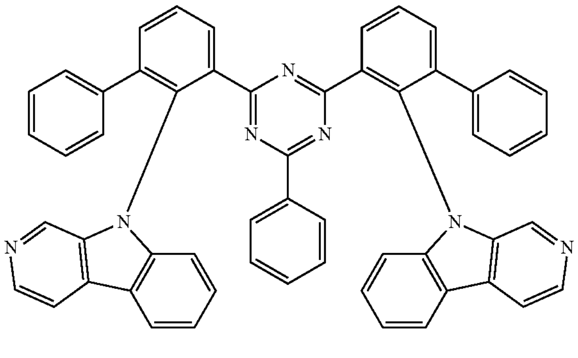

-continued
ETH53
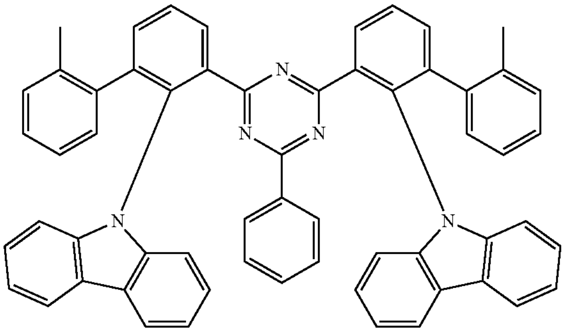
ETH54
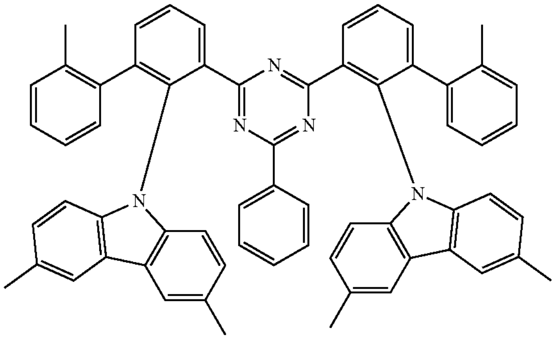
ETH55
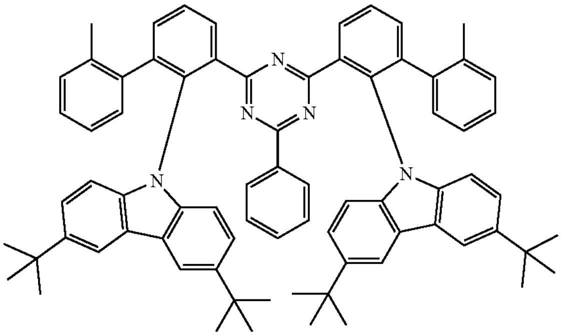
ETH56
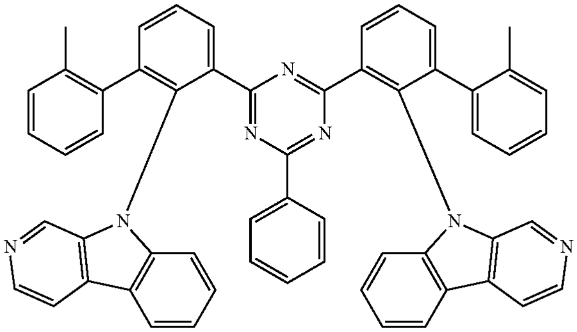
-continued
ETH57
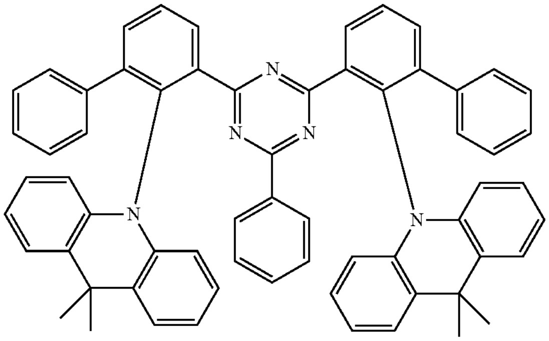
ETH58
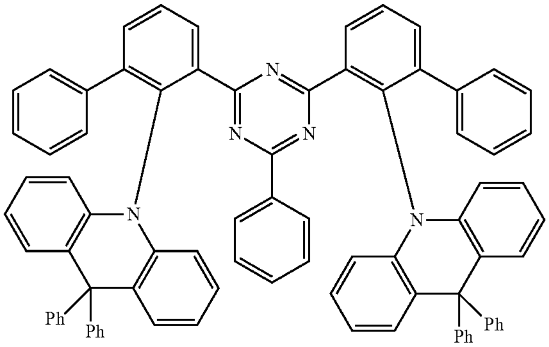
ETH59
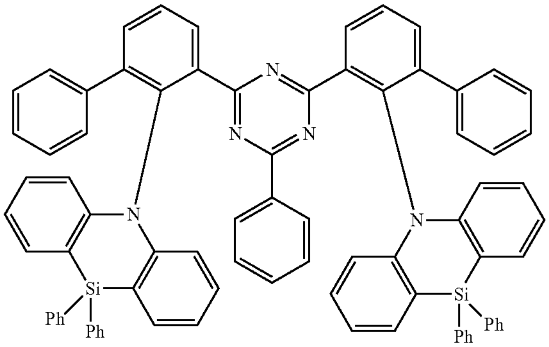
ETH60
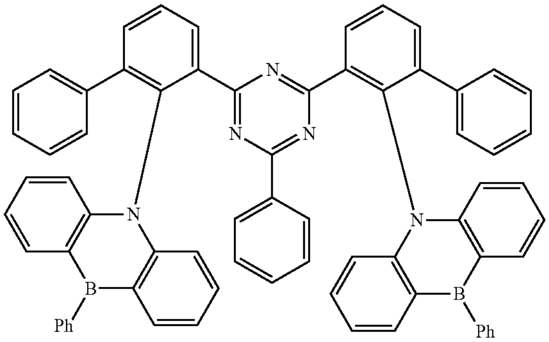

-continued
ETH61
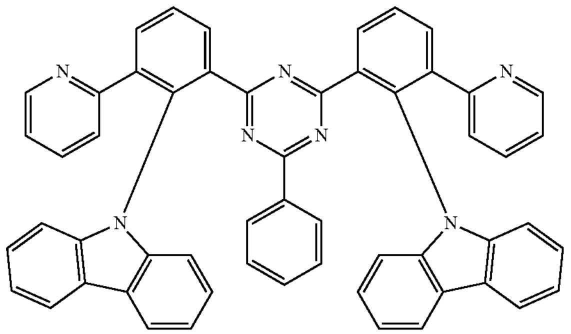
ETH62
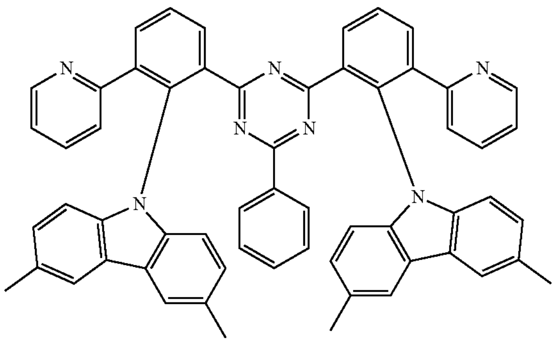
ETH63
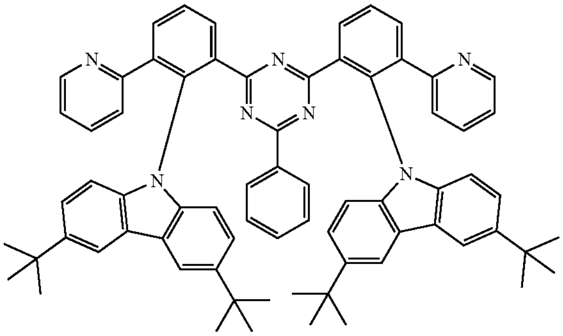
ETH64
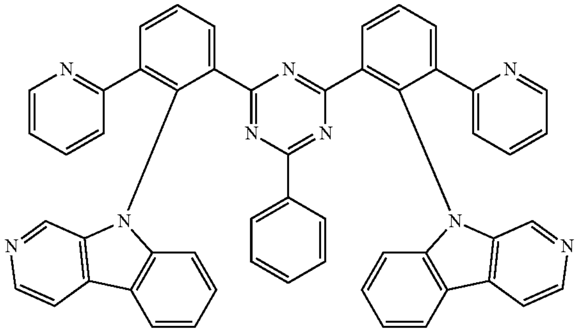
-continued
ETH65
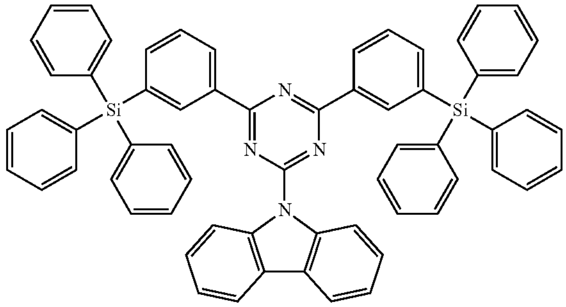
ETH66
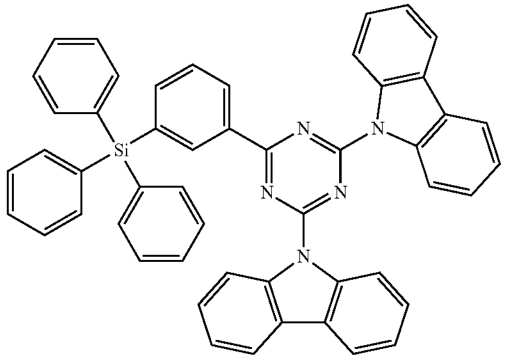
ETH67
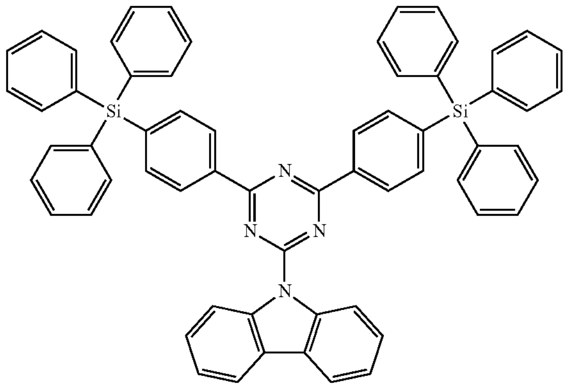
ETH68
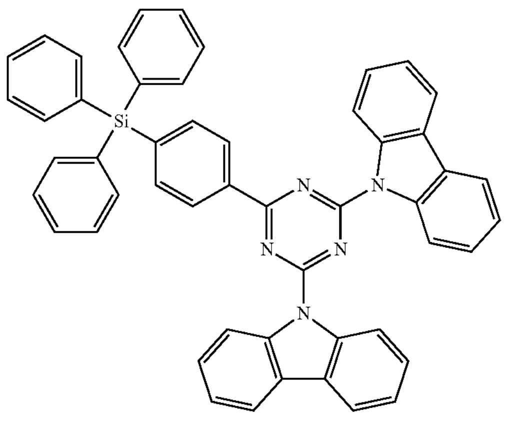

ETH69
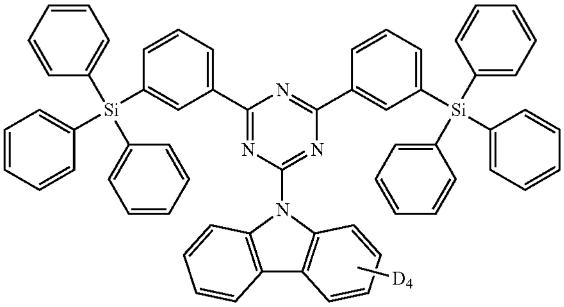
ETH70
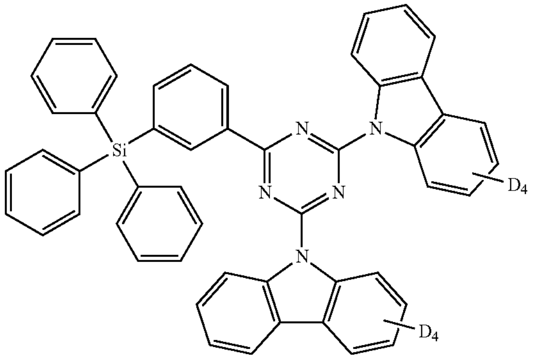
ETH71
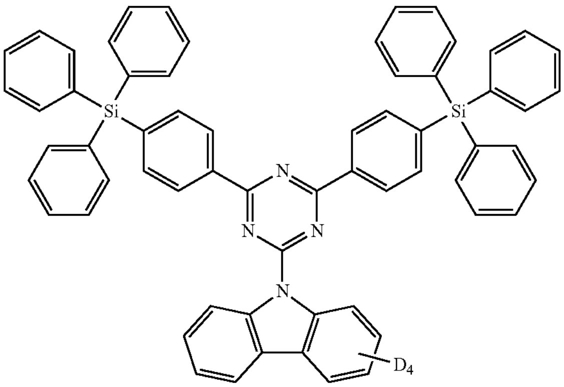
ETH72
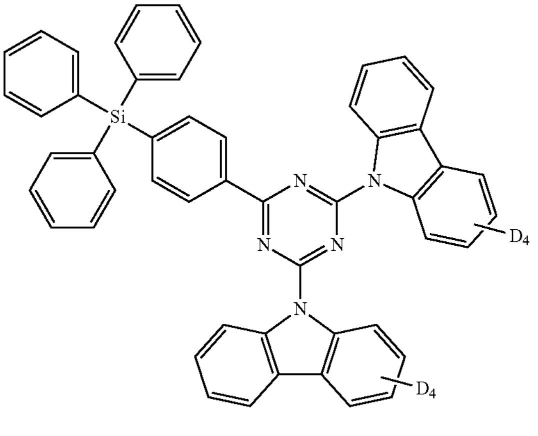
ETH73
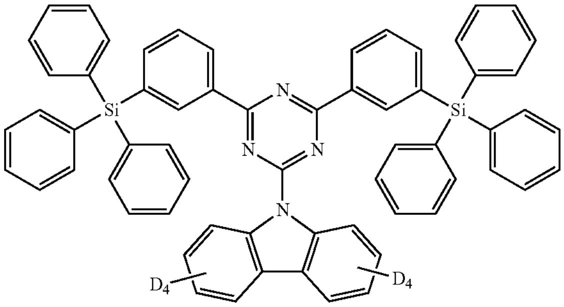
ETH74
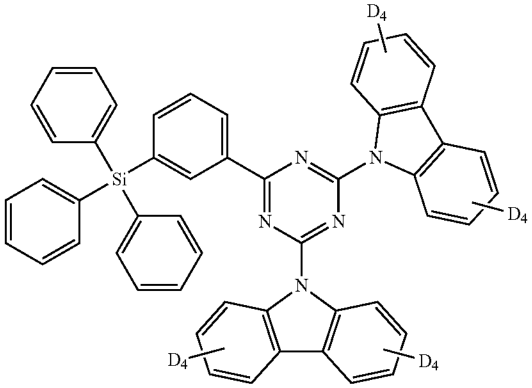
ETH75
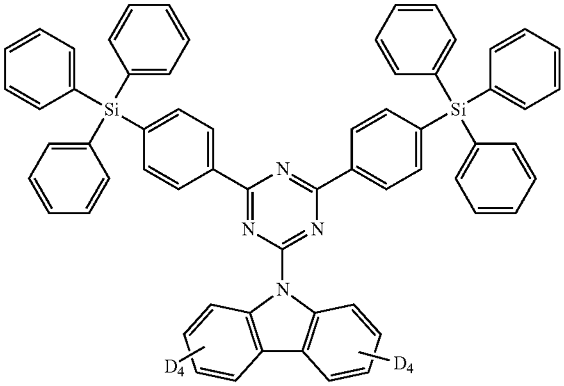
ETH76
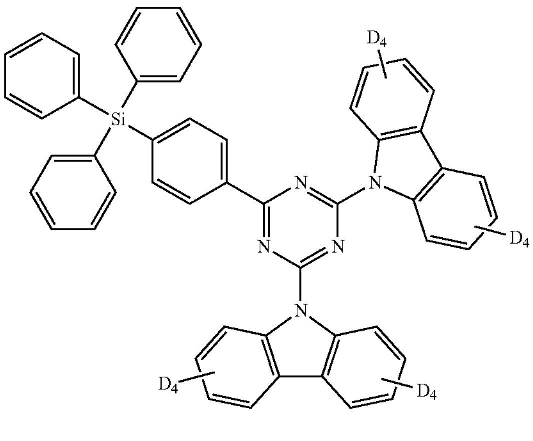

-continued
ETH77
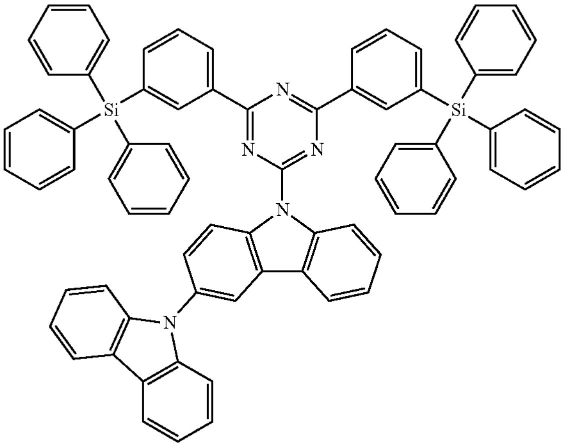
ETH78
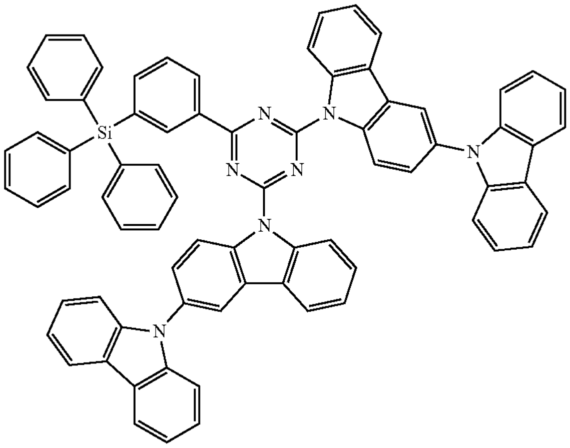
ETH79
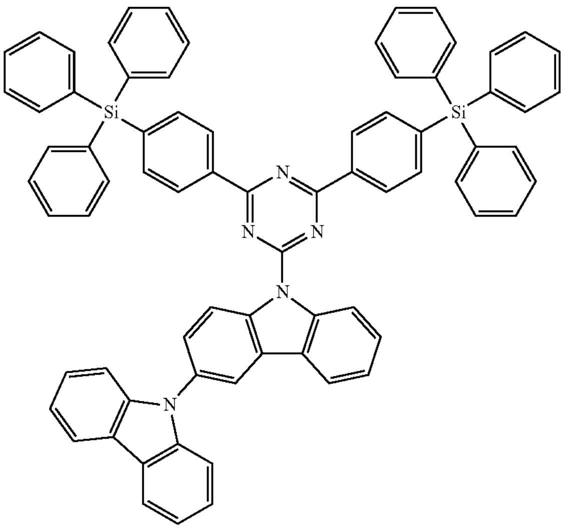
-continued
ETH80
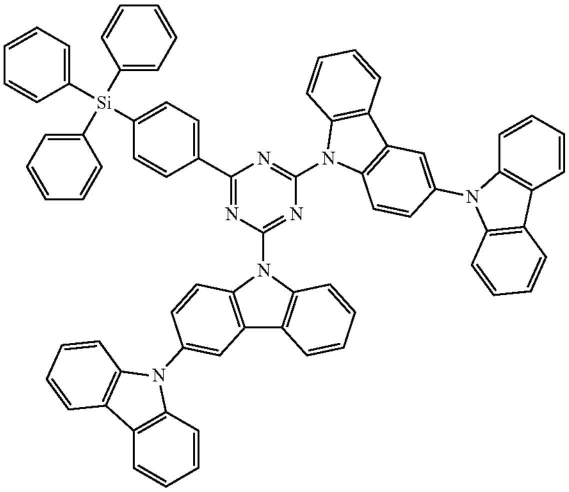
ETH81
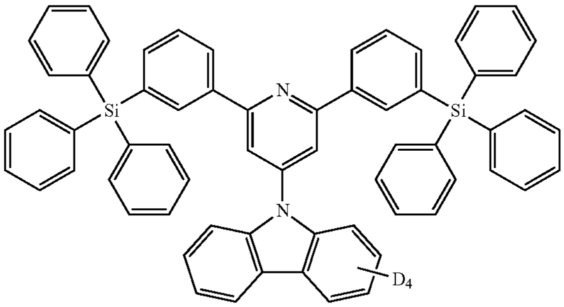
ETH82
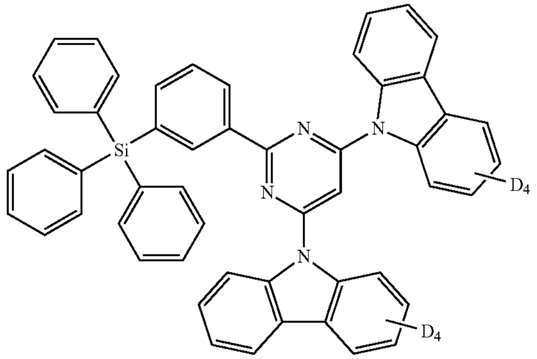

-continued

ETH84

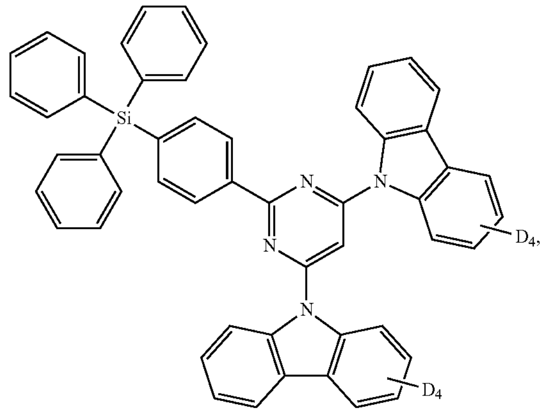

wherein in Compounds ETH1 to ETH84, $D_4$ indicates that four deuterium atoms are substituted at the indicated moiety.

11. The light-emitting device of claim 1, wherein the emission layer comprises the second compound and the third compound, and a weight ratio of the second compound to the third compound is in a range of about 3:7 to about 7:3.

12. The light-emitting device of claim 1, wherein the third compound represented by Formula 11 is one selected from Compounds HTH1 to HTH52:

HTH1

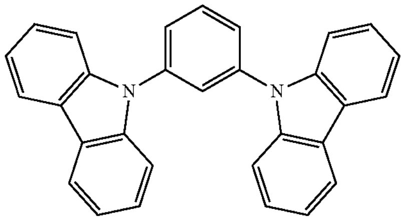

HTH2

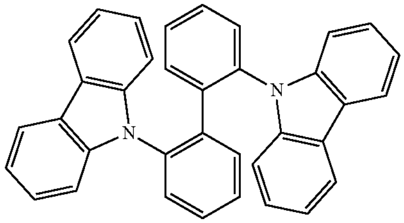

HTH3

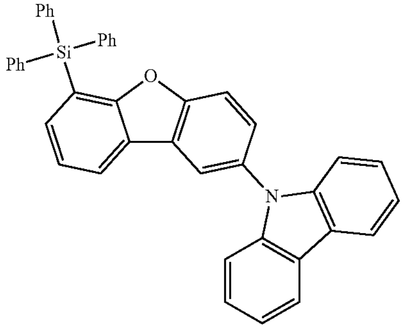

-continued

HTH4

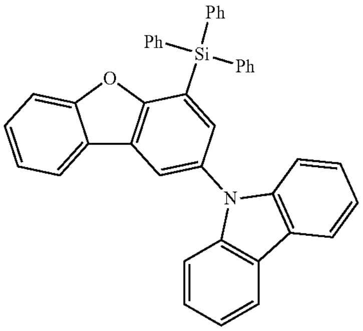

HTH5

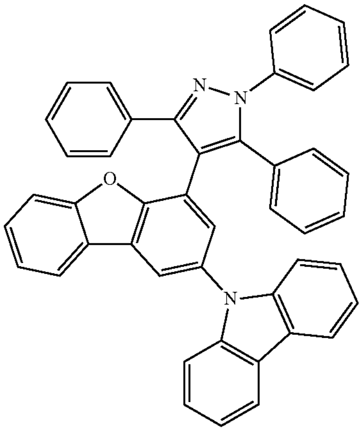

HTH6

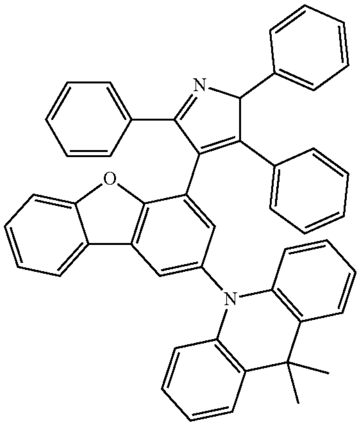

HTH7

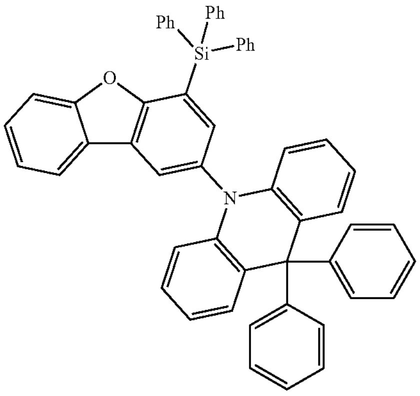

-continued
HTH8
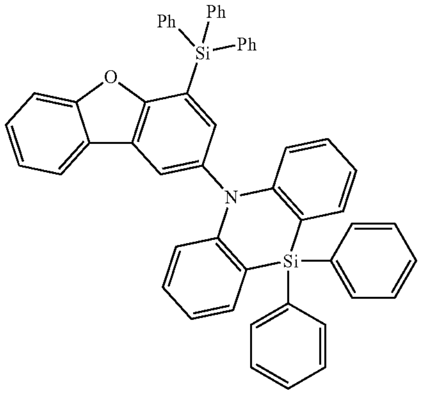
HTH9
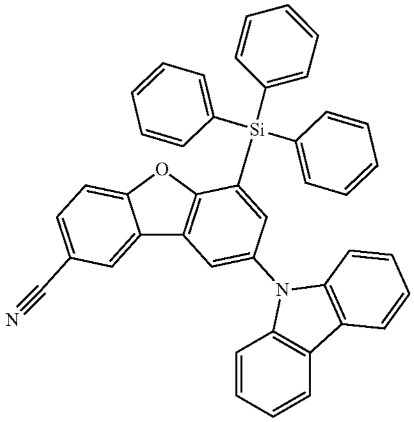
HTH10
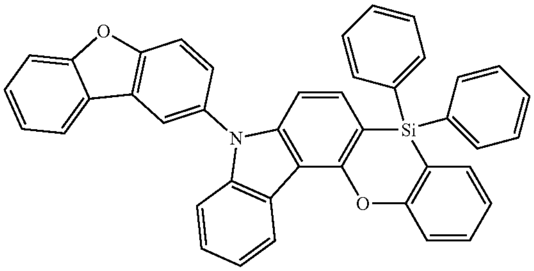
HTH11
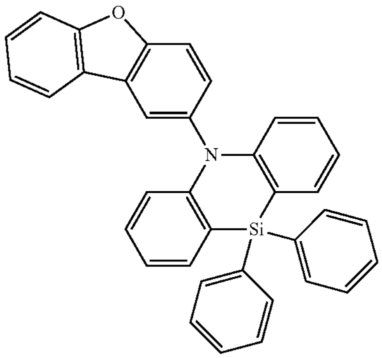
-continued
HTH12
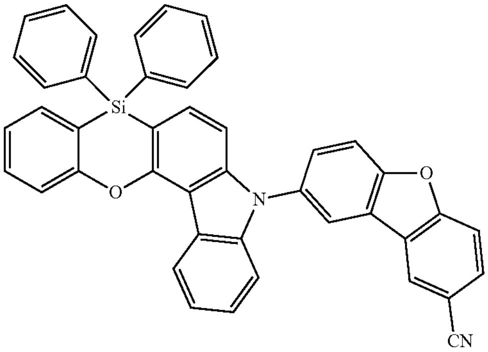
HTH13
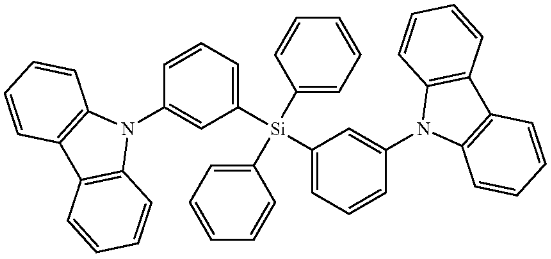
HTH14
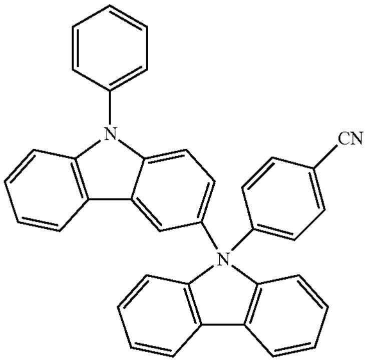
HTH15
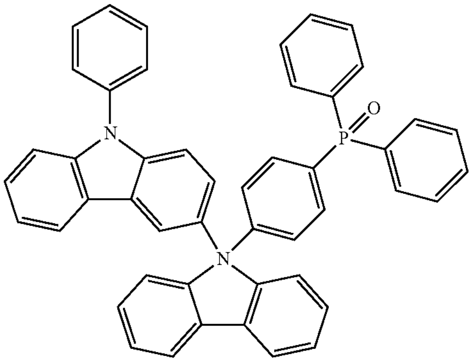

-continued
HTH16
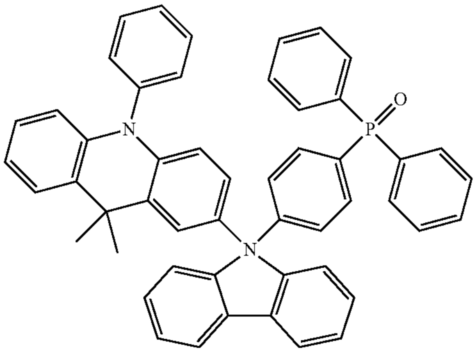
HTH17
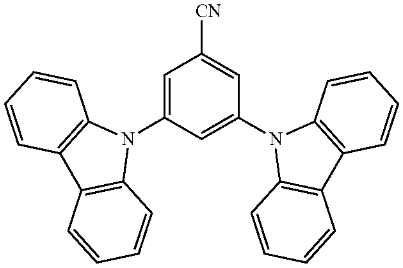
HTH18
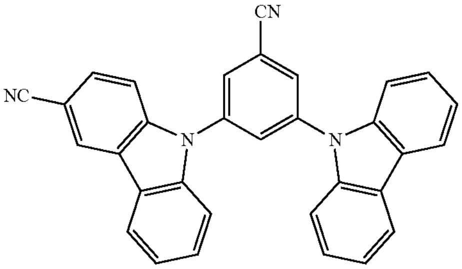
HTH19
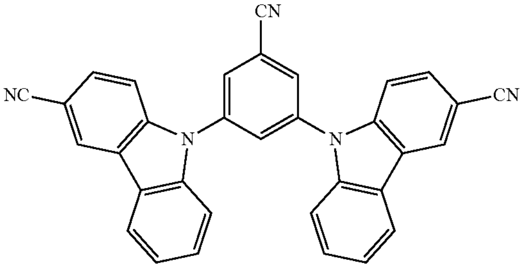
HTH20
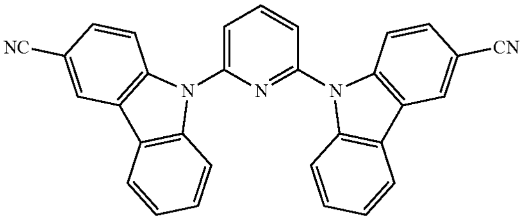
-continued
HTH21
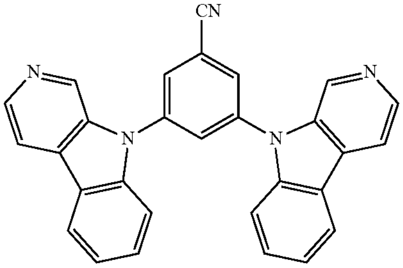
HTH22
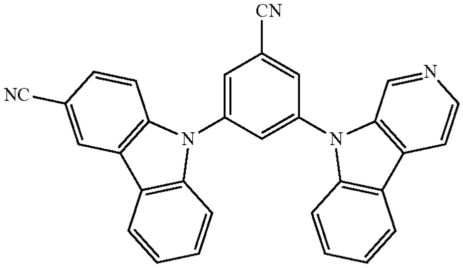
HTH23
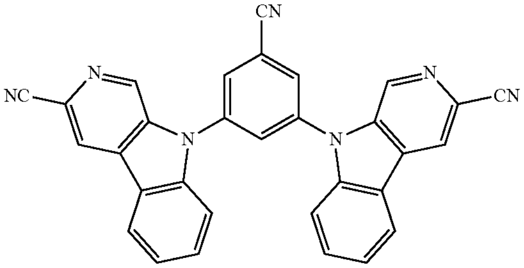
HTH24
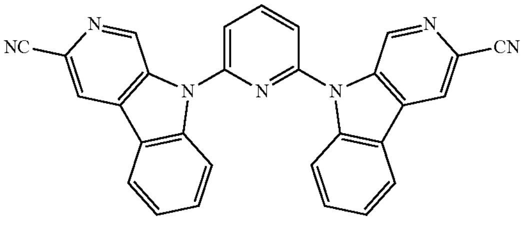
HTH25
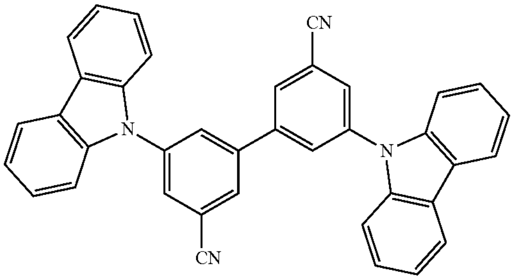

-continued
HTH26
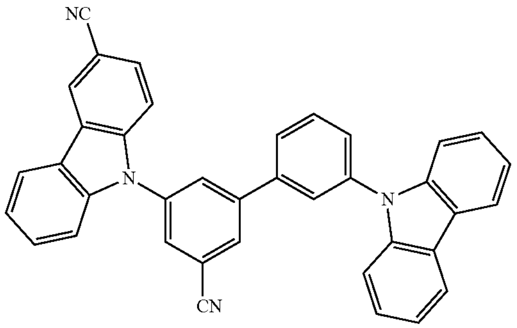
HTH27
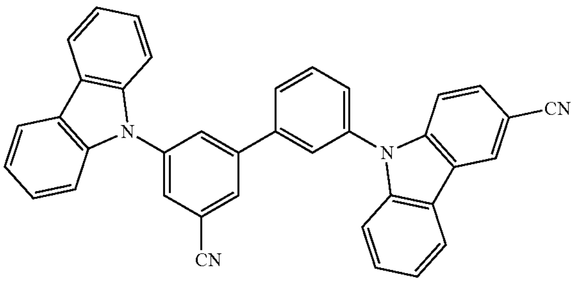
HTH28
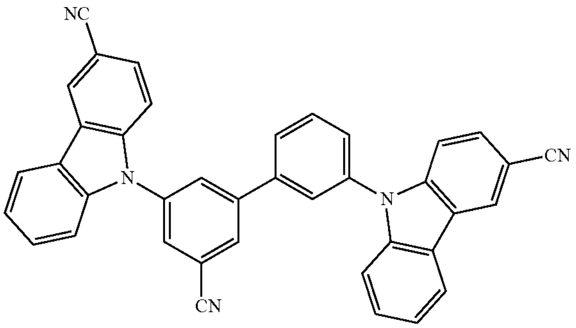
HTH29
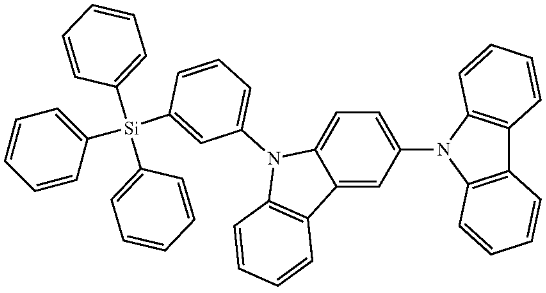
-continued
HTH30
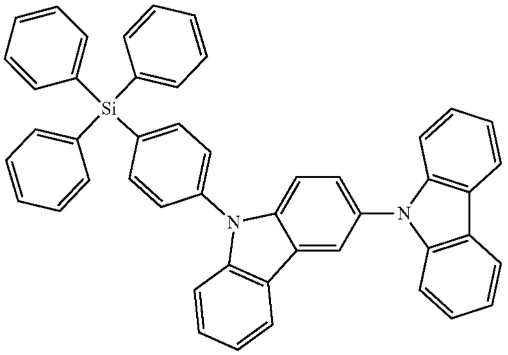
HTH31
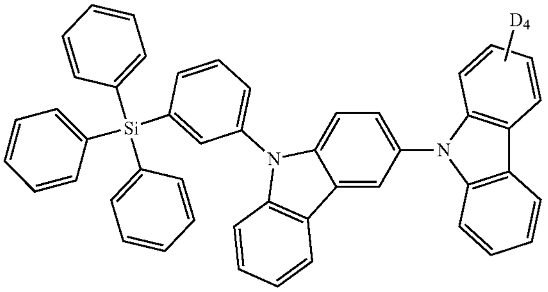
HTH32
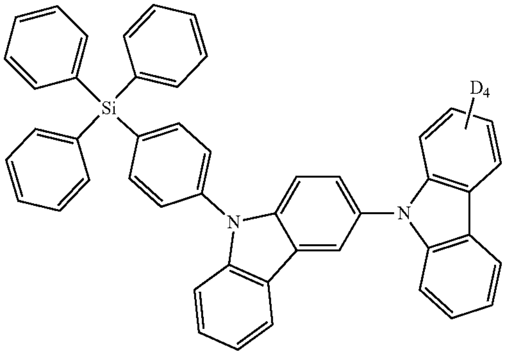
HTH33
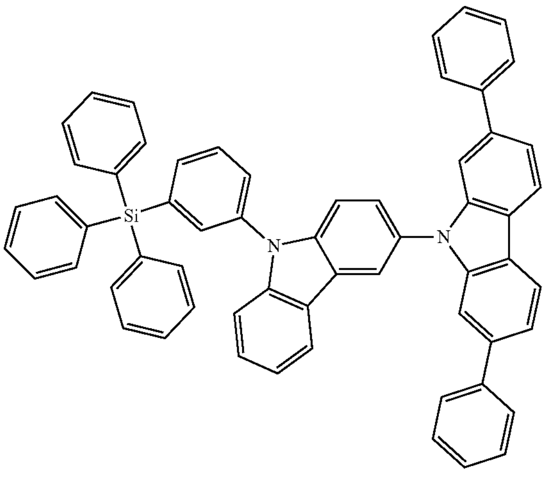

-continued
HTH34
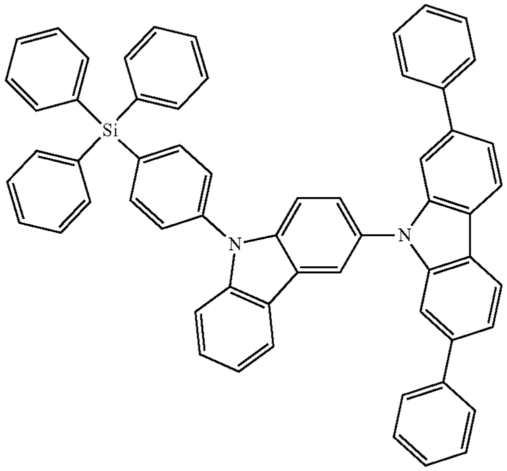
HTH35
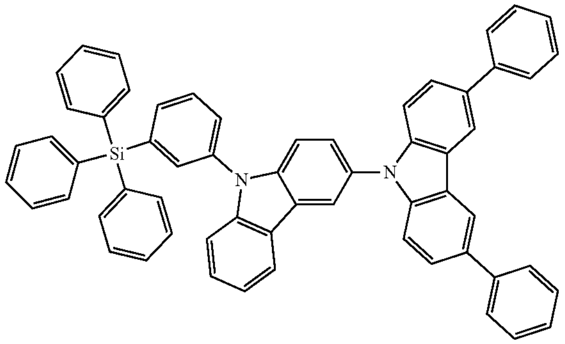
HTH36
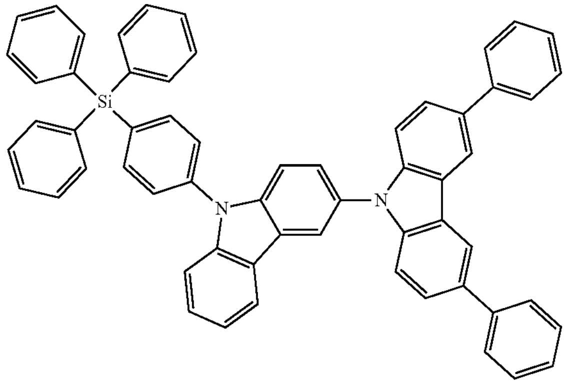
HTH37
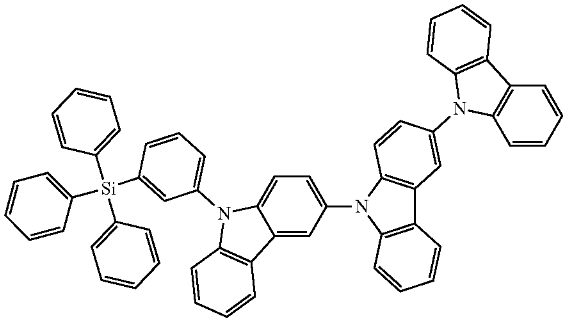
-continued
HTH38
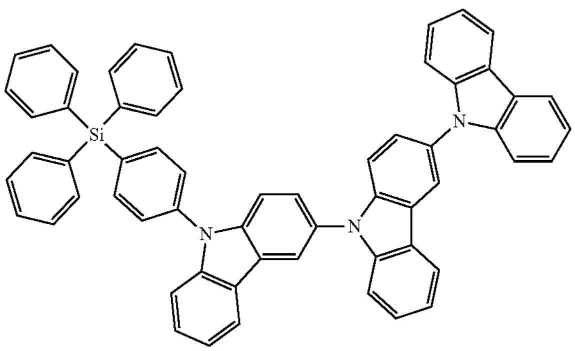
HTH39
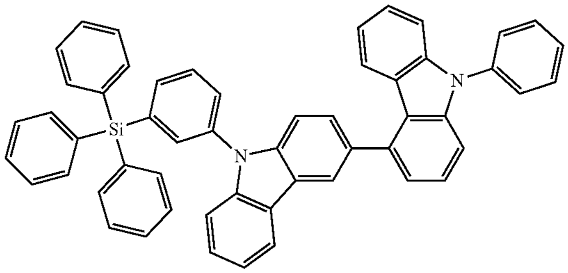
HTH40
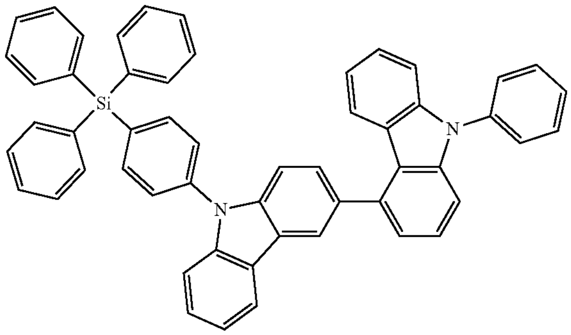
HTH41
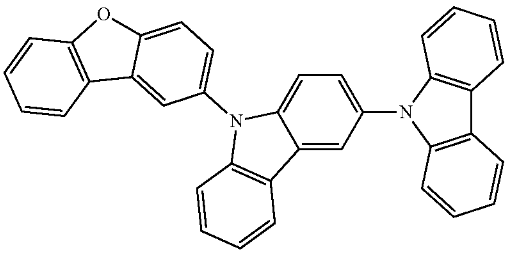
HTH42
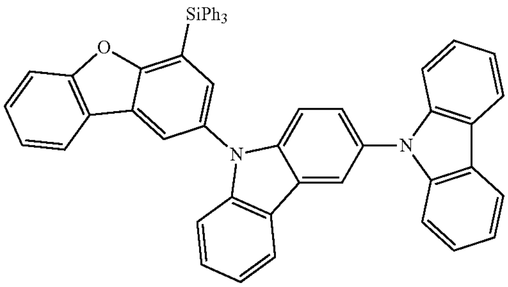

-continued
HTH43
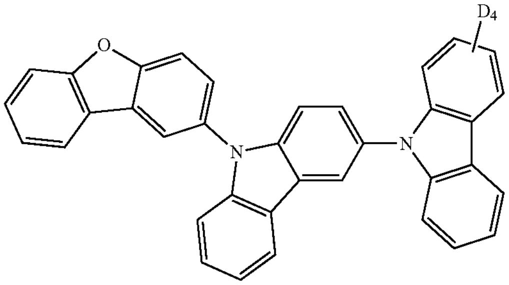
HTH44
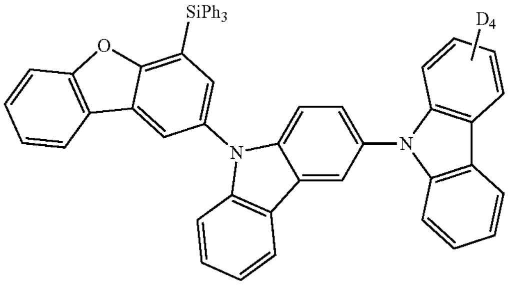
HTH45
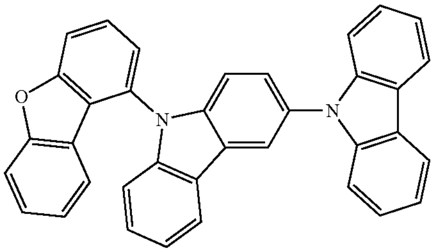
HTH46
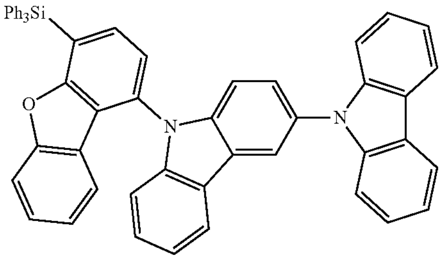
HTH47
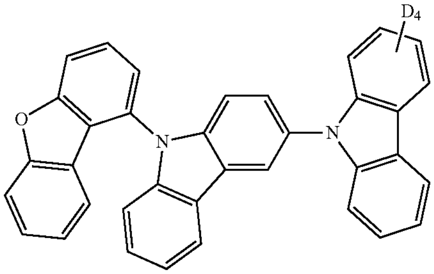
-continued
HTH48
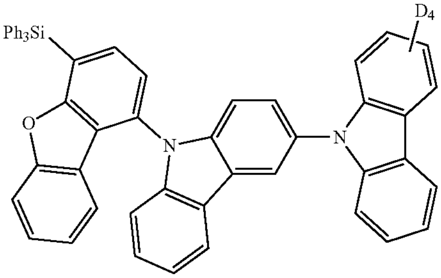
HTH49
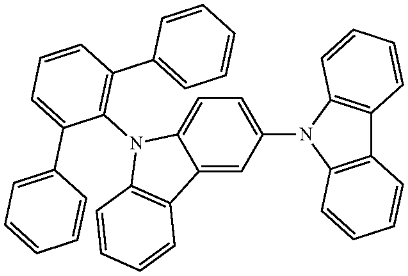
HTH50
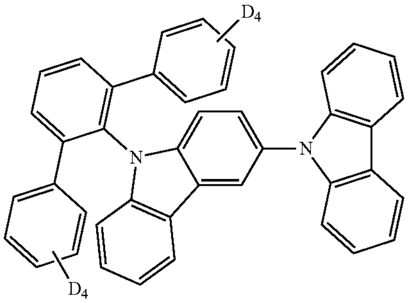
HTH51
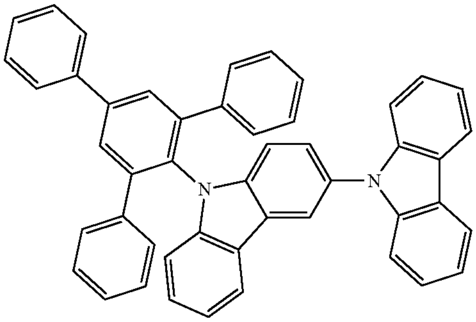
HTH52
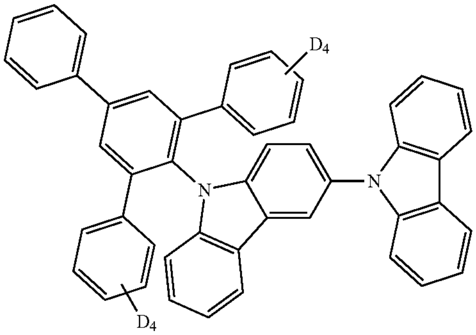

wherein in Compounds HTH1 to HTH52, $D_4$ indicates that four deuterium atoms are substituted at the indicated moiety.

13. The light-emitting device of claim 1, further comprising a fourth compound capable of emitting delayed fluorescence, wherein the fourth compound is represented by Formula 12:

[Formula 12]

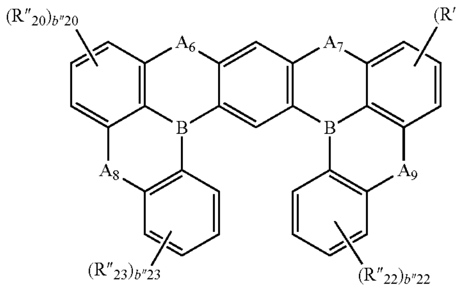

wherein in Formula 12, $A_6$ is O, S, N(R"$_{24}$), or C(R"$_{25}$)(R"$_{26}$), $A_7$ is O, S, N(R"$_{27}$), or C(R"$_{28}$)(R"$_{29}$), $A_8$ is O, S, N(R"$_{30}$), or C(R"$_{31}$)(R"$_{32}$), $A_9$ is O, S, N(R"$_{33}$), or C(R"$_{34}$)(R"$_{35}$), R"$_{20}$ to R"$_{35}$ are each independently the same as described in connection with $R_1$ in Formula 1, b"20 and b"21 are each independently an integer from 0 to 3, and b"22 and b"23 are each independently an integer from 0 to 4.

14. The light-emitting device of claim 13, wherein the fourth compound represented by Formula 12 is one selected from Compounds DFD1 to DFD12:

DFD1

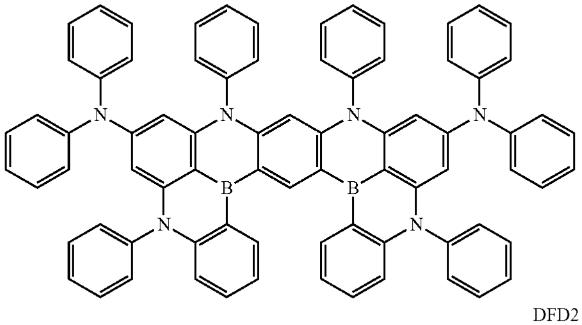

DFD2

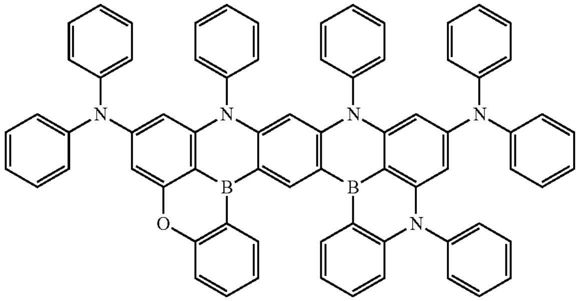

-continued

DFD3

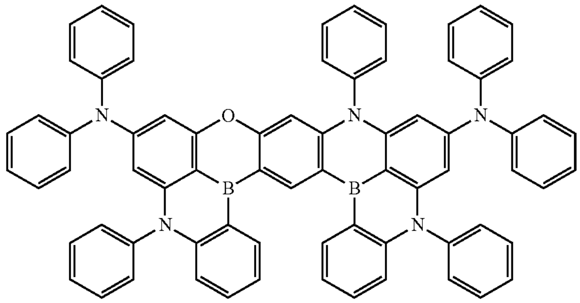

DFD4

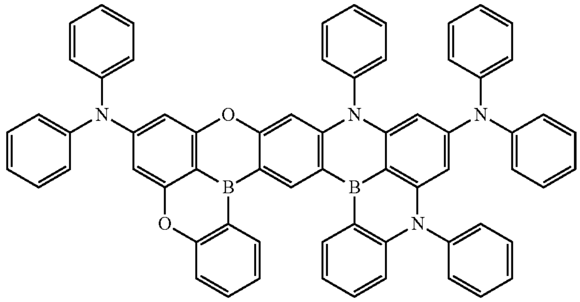

DFD5

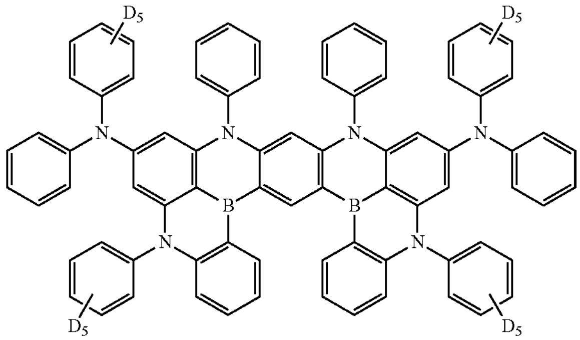

DFD6

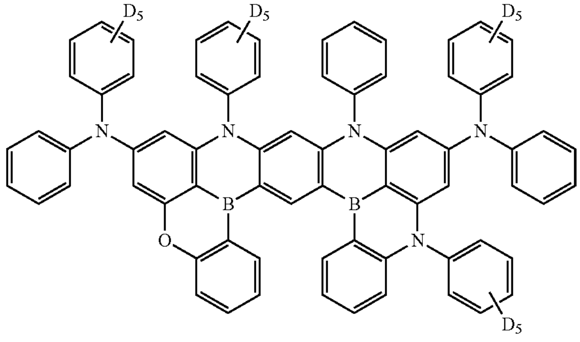

-continued

DFD7

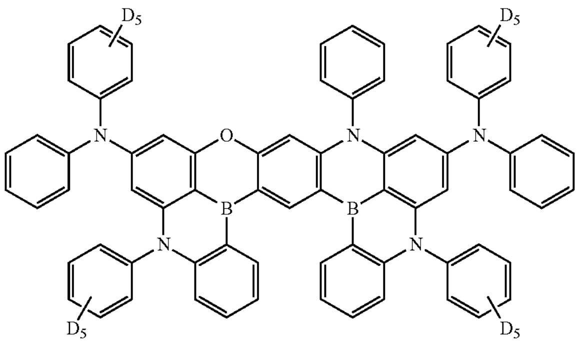

DFD8

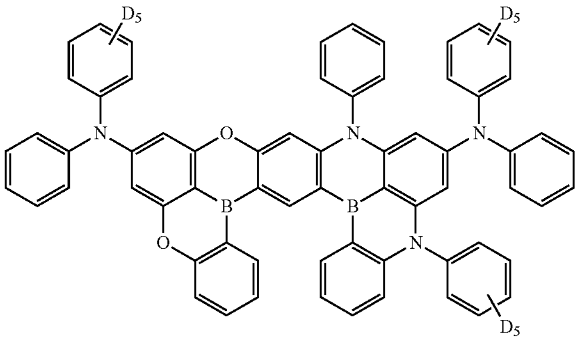

DFD9

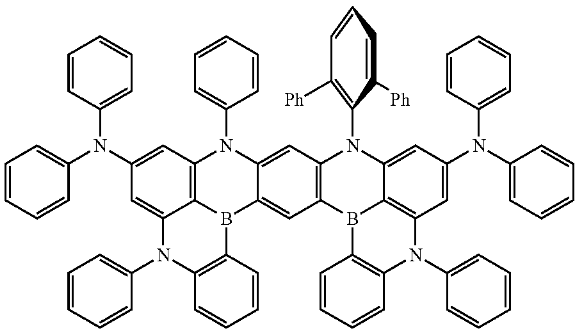

-continued

DFD10

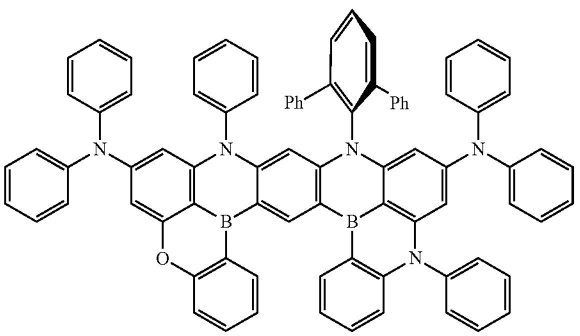

DFD11

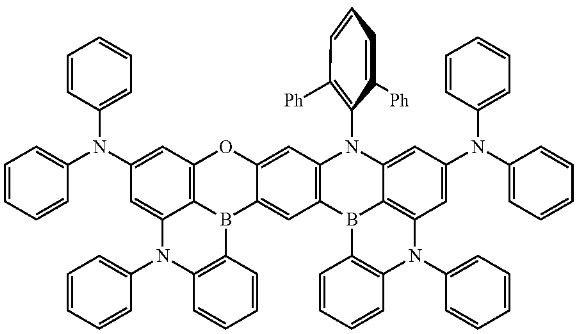

DFD12

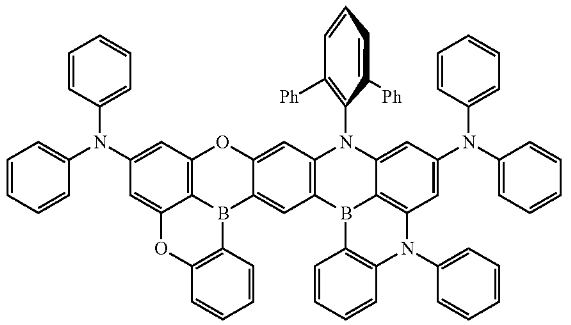

wherein in Compounds DFD1 to DFD12, $D_5$ indicates that five deuterium atoms are substituted at the indicated moiety.

15. An electronic apparatus comprising the light-emitting device of claim 1.

16. The electronic apparatus of claim 15, further comprising a thin-film transistor, wherein the thin-film transistor comprises a source electrode and a drain electrode, and the first electrode of the light-emitting device is electrically connected to at least one of the source electrode and the drain electrode of the thin-film transistor.

* * * * *